US008329317B2

(12) United States Patent
Nishizeki et al.

(10) Patent No.: US 8,329,317 B2
(45) Date of Patent: Dec. 11, 2012

(54) WHITE LIGHT EMITTING ORGANIC ELECTROLUMINESCENCE ELEMENT, DISPLAY AND ILLUMINATOR

(75) Inventors: Masato Nishizeki, Haohioji (JP); Tomohiro Oshiyama, Haohioji (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 13/049,398

(22) Filed: Mar. 16, 2011

(65) Prior Publication Data

US 2011/0204348 A1 Aug. 25, 2011

Related U.S. Application Data

(62) Division of application No. 11/632,389, filed as application No. PCT/JP2005/012584 on Jul. 7, 2005, now abandoned.

(30) Foreign Application Priority Data

Jul. 16, 2004 (JP) ................................ 2004-210330

(51) Int. Cl.
*H01L 51/54* (2006.01)

(52) U.S. Cl. ..... 428/690; 428/917; 257/40; 257/E51.05; 546/79; 313/504; 313/505; 313/506

(58) Field of Classification Search .................. 428/690, 428/917; 313/504, 505, 506; 548/304.4; 546/79; 257/40, E51.05
See application file for complete search history.

(56) References Cited

U.S. PATENT DOCUMENTS

| | | | |
|---|---|---|---|
| 2003/0080342 | A1 | 5/2003 | Igarashi |
| 2004/0102632 | A1 | 5/2004 | Thompson et al. |

FOREIGN PATENT DOCUMENTS

| | | | | |
|---|---|---|---|---|
| EP | 1539773 | | | 6/2005 |
| JP | 2001-160488 | | * | 6/2001 |
| JP | 2001-160488 | A | | 6/2001 |
| JP | 2001-319780 | A | | 11/2001 |
| JP | 2003-109758 | A | | 4/2003 |
| JP | 2003-123982 | A | | 4/2003 |
| JP | 2002-8860 | A | | 7/2003 |
| JP | 2004-152700 | | * | 5/2004 |
| JP | 2004-152700 | A | | 5/2004 |
| JP | 2004-171860 | A | | 6/2004 |
| JP | 2004-319438 | A | | 11/2004 |
| JP | 2004-47443 | A | | 8/2005 |
| WO | WO 02/15645 | | * | 2/2002 |

(Continued)

OTHER PUBLICATIONS

Hameurlaine, Ahmet et al., "Synthesis of soluble oligocarbazole derivatives", Tetrahedron Letters, 44 (2003) pp. 957-959.

(Continued)

*Primary Examiner* — Jennifer Chriss
*Assistant Examiner* — Gregory Clark
(74) *Attorney, Agent, or Firm* — Cantor Colburn LLP

(57) ABSTRACT

A white light emitting organic electroluminescent element comprising two electrodes having therebetween one or more constituting layers including a light emission layer, the one or more constituting layers comprising at least two phosphorescent compounds, wherein at least one of the phosphorescent compounds is a green light emitting ortho metalated complex; and a spectral ratio of the green light emitting ortho metalated complex in ae emission spectral distribution in a range of 400-800 nm is not less than 60%.

9 Claims, 4 Drawing Sheets

FOREIGN PATENT DOCUMENTS

| | | | |
|---|---|---|---|
| WO | 2004/017043 | A2 | 2/2004 |
| WO | 2004/045002 | A1 | 5/2004 |
| WO | 2004/053019 | A1 | 6/2004 |
| WO | 2004/101707 | A1 | 11/2004 |

OTHER PUBLICATIONS

International Search Report for International Application No. PCT/JP2005/012584 with English translation mailed on Oct. 25, 2005.
Form PTO-892 from US Office Action dated Mar. 5, 2010 for U.S. Appl. No. 11/632,389.
Japanese Office Action for Japanese Patent Application No. 2006-528973 mailing date of Mar. 6, 2012 with English Translation.
Japanese Office Action for Japanese Patent Application No. 2006-528973 mailing date of Apr. 5, 2011 with English Translation.

* cited by examiner

WHITE LIGHT EMITTING ORGANIC ELECTROLUMINESCENCE ELEMENT, DISPLAY AND ILLUMINATOR

CROSS REFERENCE TO RELATED APPLICATIONS

The present application is a divisional application of U.S. patent application Ser. No. 11/632,389, filed on 12 Jan. 2007, the entire contents of which are incorporated herein by reference. The Ser. No. 11/632,389 application is a U.S. national stage of application No. PCT/JP2005/12584, filed on 7 Jul. 2005, the entire contents of which are incorporated herein by reference and priority to which is hereby claimed. Priority under 35 U.S.C. §119(a) and 35 U.S.C. §365(b) is hereby claimed from Japanese Application No. 2004-210330, filed 16 Jul. 2004, the disclosure of which is also incorporated herein by reference.

FIELD OF THE INVENTION

The present invention relates to a white light emitting organic electroluminescent element, a display and an illuminator.

BACKGROUND OF THE INVENTION

As an emission type electronic display device, an electroluminescent device (ELD) is known. Elements constituting the ELD include an inorganic electroluminescent element and an organic electroluminescent element (hereinafter referred to also as an organic EL element). Inorganic electroluminescent element has been used for a plane light source, however, a high voltage alternating current has been required to drive the element. An organic EL element has a structure in which a light emitting layer containing a light emitting compound is arranged between a cathode and an anode, and an electron and a hole were injected into the light emitting layer and recombined to form an exciton. The element emits light, utilizing light (fluorescent light or phosphorescent light) generated by inactivation of the exciton, and the element can emit light by applying a relatively low voltage, namely, several volts to several tens of volts. The element has a wide viewing angle and a high visuality since the element is of self light emission type. Further, the element is a thin, complete solid element, therefore, the element is noted from the viewpoint of space saving and portability.

For the practical use in the future, an organic EL element is desired to emit light of high luminance with high efficiency at a lower power.

For example, disclosed is an organic EL element exhibiting higher luminance of emitting light with longer life in which a stilbene derivative, a distyrylarylene derivative or a tristyrylarylene derivative doped with a slight amount of a fluorescent compound is employed (refer to Japanese Patent No. 3093796).

Also known are: an organic EL element which has an organic light emitting layer containing 8-hydroxyquinoline aluminum complex as a host compound doped with a slight amount of a fluorescent compound (for example, refer to Japanese Patent Publication Open to Public Inspection (hereafter referred to as JP-A) No. 63-264692); and an organic EL element which has an organic light emitting layer containing 8-hydroxyquinoline aluminum complex as a host compound doped with a quinacridone type dye (for example, refer to JP-A No. 3-255190).

When light emitted through excited singlet state is used in the organic EL element as disclosed in the above Patent documents, the upper limit of the external quantum efficiency (ηext) is considered to be at most 5%, because the generation probability of excited species capable of emitting light is 25%, since the generation ratio of singlet excited species to triplet excited species is 1:3, and further, external light emission efficiency is 20%.

Since an organic EL element, employing phosphorescence through the excited triplet, has been reported by Prinston University (refer to M. A. Baldo et al., nature, 395, 151-154 (1998)), studies on materials emitting phosphorescence at room temperature have been actively carried out.

Examples are also reported in M. A. Baldo et al., Nature, 403(17), 750-753 (2000) or in U.S. Pat. No. 6,097,147.

As the upper limit of the internal quantum efficiency of the excited triplet is 100%, the light emission efficiency of the exited triplet is theoretically four times higher than that of the excited singlet. Accordingly, light emission employing the excited triplet may enable almost the same performance as a cold cathode tube, and it is attracting attention to be applied as an illuminator.

For example, S. Lamansky et al., J. Am. Chem. Soc., 123, 4304 (2001) reports that many kinds of heavy metal complexes such as iridium complexes have been synthesized and studied.

In above mentioned M. A. Baldo et al., Nature, 403(17), 750-753 (2000), an example employing tris(2-phenylpyridine)iridium as a dopant has been studied.

As other examples, M. E. Tompson et al. have reported the application of $L_2Ir(acac)$ such as $(ppy)_2Ir(acac)$ as a dopant in the 10th International Workshop on Inorganic and Organic Electroluminescence (EL '00, Hamamatsu), and Moon-Jae Youn. 0 g, Tetsuo Tsutsui et al., have reported the application of tris(2-(p-tolyl)pyridine)iridium ($Ir(ptpy)_3$), and tris(benzo[h]quinoline)iridium ($Ir(bzq)_3$) as a dopant in the 10th International Workshop on Inorganic and Organic Electroluminescence (EL '00, Hamamatsu). These metal complexes are generally referred to as an ortho metalated iridium complex.

Also in aforementioned S. Lamansky et al., J. Am. Chem. Soc., 123, 4304 (2001), an application of various iridium complexes to an organic EL elements has been examined.

In order to obtain a higher emission efficiency, Ikai et al. have reported an application of a hole transport compound as a host material of a phosphorescent compound in the 10th International Workshop on Inorganic and Organic Electroluminescence (EL '00, Hamamatsu). Also, M. E. Tompson et al., have reported an application of various electron-transport compounds as a host material of a phosphorescent compound, which is further doped with a novel iridium complex.

An ortho metalated complex having platinum as a central metal instead of iridium is also attracting attention. Many examples of this type of complex having a characteristic ligand have been known (for example, refer to Patent Documents 1-5).

Since each of the above examples is related to phosphorescent emission, the luminance, and the emission efficiency are notably improved compared to the conventional organic EL elements, however, the emission life of each element have been shorter than those of the conventional organic EL elements. It has not been fully easy for a high efficiency phosphorescent material to satisfactorily shorten the emission wavelength and to improve the emission life, and a fully satisfactory performance for the practical use has not been obtained.

In order to shorten the emission wavelength, known are the techniques in which an electron withdrawing group such as a fluorine atom, a trifluoromethyl group or a cyano group, or a ligand such as a picolinic acid or a pyrazabole ligand is introduced in phenylpyridine (for example, refer to Patent Documents 6-10). However, when these ligands are used, the emission wavelengths are shortened to attain emission of blue light and an element exhibiting a high efficiency can be obtained. However, the emission life is notably deteriorated.

Patent Document 1 Japanese Patent Publication Open to Public Inspection (hereafter referred to as JP-A) No. 2002-332291

| | |
|---|---|
| Patent Document 2 | JP-A No. 2002-332292 |
| Patent Document 3 | JP-A No. 2002-338588 |
| Patent Document 4 | JP-A No. 2002-226495 |
| Patent Document 5 | JP-A No. 2002-234894 |
| Patent Document 6 | WO 02/15645 |
| Patent Document 7 | JP-A No. 2003-123982 |
| Patent Document 8 | JP-A No. 2002-117978 |
| Patent Document 9 | JP-A No. 2003-146996 |
| Patent Document 10 | WO 04/016711 |

Non-Patent Document 1

Inorganic Chemistry, Vol. 41, No. 12, 3055-3066

Non-Patent Document 2

Aplied Physics, Letters, Vol. 79, Page 2082

Non-Patent Document 3

Aplied Physics, Letters, Vol. 83, Page 3818

Non-Patent Document 4

New Journal of Chemistry, Vol. 26, Page 1171

SUMMARY THE INVENTION

An object of the invention is to provide an organic EL element exhibiting a high luminance, a high emission efficiency and an excellent CIE chromaticity of white light emission, and a display and an illuminator employing the element.

One of the aspects of the present invention to achieve the above abject is a white light emitting organic electroluminescent element comprising two electrodes having therebetween one or more constituting layers including a light emission layer, the one or more constituting layers comprising at least two phosphorescent compounds, wherein at least one of the phosphorescent compounds is a green light emitting ortho metalated complex; and a spectral ratio of the green light emitting ortho metalated complex in ae emission spectral distribution in a range of 400-800 nm is not less than 60%.

DETAILED DESCRIPTION OF THE INVENTION

Figure 1:
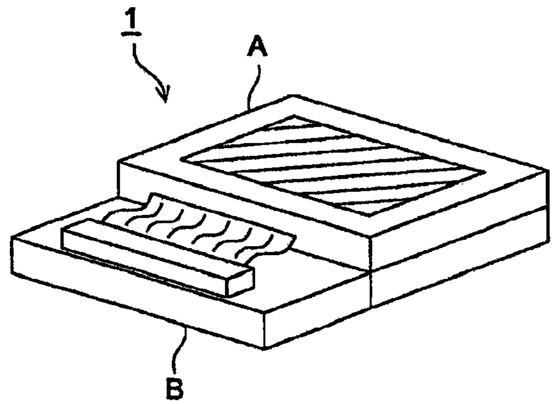
FIG. 1 is a schematic drawing illustrating an example of a display equipped with a white light emitting organic EL element.

The above-described object of the present invention has been achieved by the following structures 1-46.

(1) A white light emitting organic electroluminescent element comprising two electrodes having therebetween one or more constituting layers including a light emission layer, the one or more constituting layers comprising at least two phosphorescent compounds, wherein at least one of the phosphorescent compounds is a green light emitting ortho metalated complex; and a spectral ratio of the green light emitting ortho metalated complex in ae emission spectral distribution in a range of 400-800 nm is not less than 60%.

(2) The white light emitting organic electroluminescent element of Item (1), wherein at least one of the phosphorescent compounds is a blue light emitting ortho metalated complex; and a shortest emission peak wavelength of the blue light emitting ortho metalated complex is not more than 455 nm.

(3) The white light emitting organic electroluminescent element of Item (1) or (2), wherein at least one of the phosphorescent compounds is a red light emitting ortho metalated complex.

(4) The white light emitting organic electroluminescent element of Item (2) or (3), wherein the blue light emitting ortho metalated complex has at least one of the substructures represented by Formulas (1) to (6) or at last one of tautomers of the substructures represented by Formulas (1) to (6).

Formula (1)

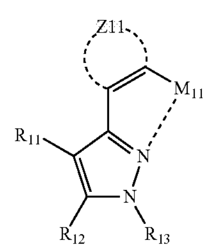

[wherein, Z11 is an atomic group necessary to form an aromatic hydrocarbon ring or an aromatic heterocyclic ring; $R_{11}$, $R_{12}$ and $R_{13}$ each are a hydrogen atom or a substituent; and $M_{11}$ is a metal belonging to one of Groups 8 to 10 of the periodic table.]

Formula (2)

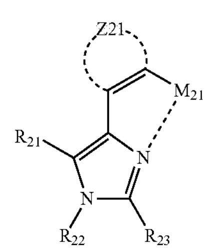

[wherein, Z21 is an atomic group necessary to form an aromatic hydrocarbon ring or an aromatic heterocyclic ring; $R_{21}$, $R_{22}$ and $R_{13}$ each are a hydrogen atom or a substituent; and $M_{21}$ is a metal belonging to one of Groups 8 to 10 of the periodic table.]

Formula (3)

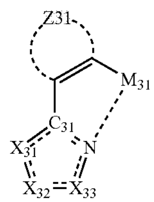

[wherein, Z31 is an atomic group necessary to form an aromatic hydrocarbon ring or an aromatic heterocyclic ring; $X_{31}$, $X_{32}$ and $X_{33}$ each are a carbon atom, —C($R_3$)—, a nitrogen atom or —N($R_3$)— (wherein, $R_3$ is a hydrogen atom or a substituent); $C_{31}$ is a carbon atom; $M_{31}$ is a metal belonging to one of Groups 8 to 10 of the periodic table; and a bond between $C_{31}$ and N, a bond between N and $X_{33}$, a bond between $X_{32}$ and $X_{33}$, a bond between $X_{31}$ and $X_{32}$, and a bond between $C_{31}$ and $X_{31}$ each are a single bond or a double bond.]

Formula (4)

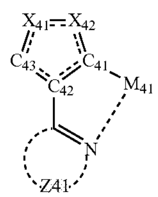

[wherein, Z41 is an atomic group necessary to form an aromatic heterocyclic ring; at least one of $X_{41}$ and $X_{42}$ is a nitrogen atom or —N($R_4$)— (wherein, $R_4$ is a hydrogen atom or a substituent); $M_{41}$ is a metal belonging to one of Groups 8 to 10 of the periodic table; $C_{41}$, $C_{42}$ and $C_{43}$ each are a carbon atom; $M_{41}$ is a metal belonging to one of Groups 8 to 10 of the periodic table; and a bond between $C_{41}$ and $C_{42}$, a bond between $C_{41}$ and $X_{42}$, a bond between $X_{41}$ and $X_{42}$, a bond between $X_{41}$ and $C_{43}$, and a bond between $C_{42}$ and $C_{43}$ each are a single bond or a double bond.]

Formula (5)

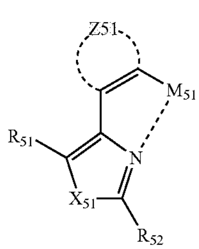

[wherein, Z51 is an atomic group necessary to form an aromatic hydrocarbon ring or an aromatic heterocyclic ring; $X_{51}$ is an oxygen atom or a sulfur atom; $R_{51}$ and $R_{52}$ each are a hydrogen atom or a substituent; and $M_{51}$ is a metal belonging to one of Groups 8 to 10 of the periodic table.]

Formula (6)

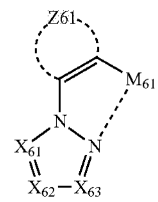

[wherein, Z61 is an atomic group necessary to form an aromatic hydrocarbon ring or an aromatic heterocyclic ring. $X_{61}$, $X_{62}$ and $X_{63}$ each are a carbon atom, —C($R_6$)—, a nitrogen atom or —N($R_6$)— (wherein, $R_6$ is a hydrogen atom or a substituent); and $M_{61}$ is a metal belonging to one of Groups 8 to 10 of the periodic table.]

(5) The white light emitting organic electroluminescent element of Item (2) or (3), wherein the blue light emitting ortho metalated complex is a platinum complex represented by Formula (7).

Formula (7)

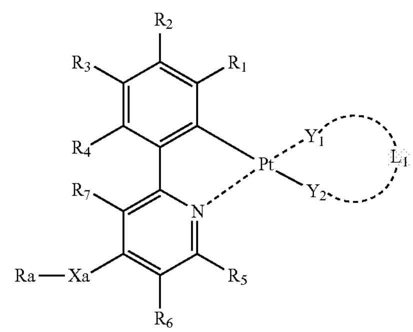

[wherein, $R_1$, $R_2$, $R_3$, $R_4$, $R_5$, $R_6$ and $R_7$ each are a hydrogen atom or a substituent, provided that, at least one of $R_1$, $R_2$, $R_3$, $R_4$, $R_5$, $R_6$ and $R_7$ is a substituent; Ra is a substituent; Xa is an oxygen atom or a sulfur atom; $Y_1$-$L_1$-$Y_1$ is a bidentate ligand; $Y_1$ and $Y_2$ each independently are an oxygen atom, a nitrogen atom, a carbon atom or a sulfur atom; and $L_1$ is an atomic group necessary to form a bidentate ligand together with $Y_1$ and $Y_2$.]

(6) The white light emitting organic electroluminescent element of Item (2) or (3), wherein the blue light emitting ortho metalated complex is a metal complex having a substructure represented by Formula (8) or (9).

Formula (8)

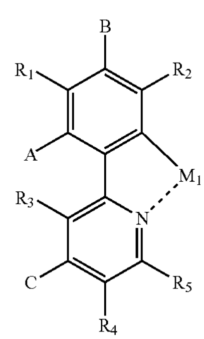

[wherein, A, B and C each are a hydrogen atom or a substituent, provided that at least two of A, B and C are represented by $-Xa-(Ra)_{na}$ (wherein Ra is a substituent, Xa is an oxygen atom, a sulfur atom or a nitrogen atom, and na is 1 or 2.), which may be the same or different; $R_1$, $R_2$, $R_3$, $R_4$ and $R_5$ each are a hydrogen atom or a substituent; and $M_1$ is an element belonging to one Groups 8 to 10 of the periodic table.]

Formula (9)

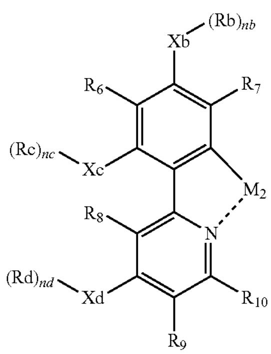

[wherein, Rb, Rc and Rd each are a substituent; Xb, Xc and Xd each are an oxygen atom, a sulfur atom or a nitrogen atom; nb, nc and nd each are 1 or 2; $R_6$, $R_7$, $R_8$, $R_9$ and $R_{10}$ each are a hydrogen atom or a substituent; and $M_2$ is an element belonging to one of Groups 8 to 10 of the periodic table.]

(7) The white light emitting organic electroluminescent element of Item (2) or (3), wherein the blue light emitting ortho metalated complex is a metal complex having a ligand represented by Formula (10), a metal complex having a substructure represented by Formula (11) or (12) or a metal complex having a tautomer of the substructure represented by Formula (11) or (12).

Formula (10)

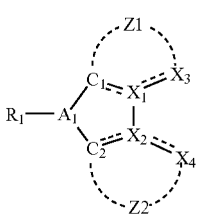

[wherein, $X_1$, $X_2$, $X_3$ and $R_4$ each independently are a carbon atom or a nitrogen atom; $C_1$ and $C_2$ each are a carbon atom; Z1 represents a group of atoms necessary to form an aromatic hydrocarbon ring or an aromatic heterocyclic ring together with $C_1$, $X_1$ and $X_3$; Z2 represents a group of atoms necessary to form an aromatic hydrocarbon ring or an aromatic heterocyclic ring together with $C_2$, $X_2$ and $X_4$; $A_1$ is a nitrogen atom or a boron atom; $R_1$ is a substituent; and a bond between $C_1$ and $X_1$, a bond between $C_2$ and $X_2$, a bond between $X_1$ and $X_3$, and a bond between $X_2$ and $X_4$ each are a single bond or a double bond.]

Formula (11)

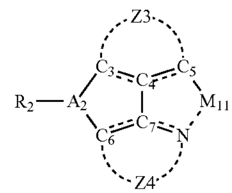

[wherein, $C_3$, $C_4$, $C_5$, $C_6$ and $C_7$ each are a carbon atom; Z3 represents a group of atoms necessary to form an aromatic hydrocarbon ring or an aromatic heterocyclic ring together with together with $C_3$, $C_4$ and $C_5$; Z4 represents a group of atoms necessary to form an aromatic heterocyclic ring together with together with $C_6$, $C_7$ and N; $A_2$ is a nitrogen atom or a boron atom; $R_2$ is a substituent; and $M_{11}$ is an element belonging to one of Groups 8 to 10 of the periodic table; and a bond between $C_3$ and $C_4$, a bond between $C_4$ and $C_5$, a bond between $C_6$ and $C_7$, and a bond between $C_7$ and N each are a single bond or a double bond.]

Formula (12)

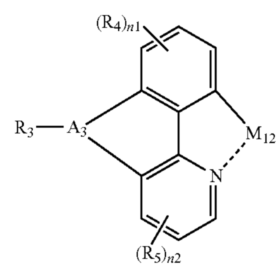

[wherein, $A_3$ is a nitrogen atom or a boron atom; $R_3$ is a substituent; $R_4$ and $R_5$ each are a substituent; n1 and n2 each are an integer of 0-3; and $M_{12}$ is an element belonging to one of Groups 8 to 10 of the periodic table.]

(8) The white light emitting organic electroluminescent element of Item (2) or (3), wherein the blue light emitting ortho metalated complex is a metal complex having a ligand represented by Formula (13), a metal complex having a substructure represented by Formula (14), a metal complex having a substructure represented by Formula (15) or a tautomer of the substructure, a metal complex having a ligand represented by Formula (16), a metal complex having a substructure represented by Formula (17) or a metal complex having a substructure represented by Formula (18).

Formula (13)

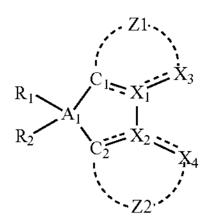

[wherein, $X_1$, $X_2$, $X_3$ and $X_4$ each independently are a carbon atom or a nitrogen atom; $C_1$ and $C_2$ each are a carbon atom; Z1 represents a group of atoms necessary to form an aromatic hydrocarbon ring or an aromatic heterocyclic ring together with $C_1$, $X_1$ and $X_3$; Z2 represents a group of atoms necessary to form an aromatic hydrocarbon ring or an aromatic heterocyclic ring together with $C_2$, $X_2$ and $X_4$; $A_1$ is a carbon atom or a silicon atom; $R_1$ and $R_2$ each independently are a hydrogen atom or a substituent; and a bond between $C_1$ and $X_1$, a bond between $C_2$ and $X_2$, a bond between $X_1$ and $X_3$, and a bond between $X_2$ and $X_4$ each are a single bond or a double bond.]

Formula (14)

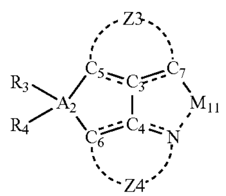

[wherein, $C_3$, $C_4$, $C_5$, $C_6$ and $X_7$ each are a carbon atom; Z3 represents a group of atoms necessary to form an aromatic hydrocarbon ring or an aromatic heterocyclic ring together with $C_5$, $C_3$ and $C_7$; Z4 represents a group of atoms necessary to form an aromatic heterocyclic ring together with $C_6$, $C_4$ and N; $A_2$ is a carbon atom or a silicon atom; $R_3$ and $R_4$ each independently are a hydrogen atom or a substituent. $M_{11}$ is an element belonging to one of Groups 8 to 10 of the periodic table; and a bond between $C_5$ and $C_3$, a bond between $C_3$ and $C_7$, a bond between $C_6$ and $C_4$, and a bond between $C_4$ and N each are a single bond or a double bond.]

Formula (15)

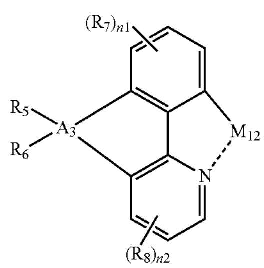

[wherein, $A_3$ is a carbon atom or a silicon atom; $R_5$ and $R_6$ each independently are a hydrogen atom or a substituent; and $R_7$ and $R_8$ each independently are a substituent; n1 and n2 each independently are an integer of 0-3; $M_{12}$ is an element belonging to one of Groups 8 to 10 of the periodic table.]

Formula (16)

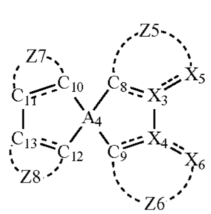

[wherein, $X_3$, $X_4$, $X_5$ and $X_6$ each independently are a carbon atom or a nitrogen atom; $C_8$-$C_{13}$ each are a carbon atom; Z5 represents a group of atoms necessary to form an aromatic hydrocarbon ring or an aromatic heterocyclic ring together with $C_8$, $X_3$ and $X_5$; Z6 represents a group of atoms necessary to form an aromatic hydrocarbon ring or an aromatic heterocyclic ring together with $C_9$, $X_4$ and $X_6$; Z7 represents a group of atoms necessary to form an aromatic hydrocarbon ring or an aromatic heterocyclic ring together with $C_{10}$ and $C_{11}$; Z8 represents a group of atoms necessary to form an aromatic hydrocarbon ring or an aromatic heterocyclic ring together with $C_{12}$ and $C_{13}$; $A_4$ is a carbon atom or a silicon atom; and a bond between $X_3$ and $X_5$, a bond between $X_4$ and $X_6$, a bond between $C_8$ and $X_3$, and a bond between $C_9$ and $X_4$, a bond between $C_{10}$ and $C_{11}$ and a bond between $C_{12}$ and $C_{13}$ each are a single bond or a double bond.]

Formula (17)

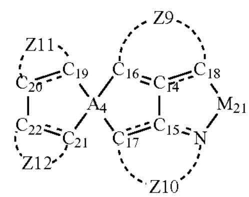

[wherein, $C_{14}$-$C_{22}$ each are a carbon atom; Z9 represents a group of atoms necessary to form an aromatic hydrocarbon ring or an aromatic heterocyclic ring together with $C_{16}$, $C_{14}$ and $C_{19}$; Z11 represents a group of atoms necessary to form an aromatic hydrocarbon ring or an aromatic heterocyclic ring together with $C_{19}$ and $C_{20}$; Z12 represents a group of atoms necessary to form an aromatic hydrocarbon ring or an aromatic heterocyclic ring together with $C_{21}$ and $C_{22}$; each are an atomic group necessary to form an aromatic hydrocarbon ring or an aromatic heterocyclic ring; Z10 represents a group of atoms necessary to form an aromatic heterocyclic ring together with $C_{17}$, $C_{15}$ and N; $A_5$ is a carbon atom or a silicon atom; $M_{21}$ is an element belonging to one of Groups 8 to 10 of the periodic table; and a bond between $C_{18}$ and $C_{14}$, a bond between $C_{14}$ and $C_{16}$, a bond between $C_{17}$ and $C_{15}$, and a bond between $C_{15}$ and N, a bond between $C_{19}$ and $C_{20}$, and a bond between $C_{21}$ and $C_{22}$ each are a single bond or a double bond.]

Formula (18)

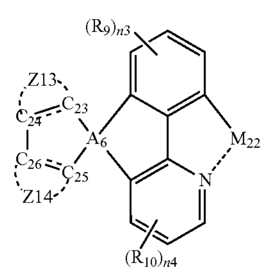

[wherein, Z13 represents a group of atoms necessary to form an aromatic hydrocarbon ring or an aromatic heterocyclic ring together with $C_{23}$ and $C_{24}$; Z14 represents a group of atoms necessary to form an aromatic hydrocarbon ring or an aromatic heterocyclic ring together with $C_{25}$ and $C_{26}$; $A_5$ is a carbon atom or a silicon atom. $R_9$ and $R_{10}$ each independently are a substituent; n3 and n4 each is an integer of 0-3; $M_{22}$ is an element belonging to one of Groups 8 to 10 of the periodic table; and a bond between $C_{23}$ and $C_{24}$, and a bond between $C_{25}$ and $C_{26}$ each are a single bond or a double bond.]

(9) The white light emitting organic electroluminescent element of Item (2) or (3), wherein the blue light emitting ortho metalated complex comprises a platinum complex selected from the group consisting of Formulas (19)-(27).

Formula (19)

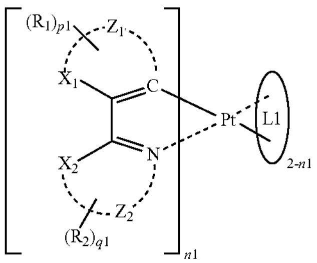

[wherein, $R_1$ and $R_2$ each are a hydrogen atom or a substituent, provided that at least one of $R_1$ and $R_2$ is the substituent; $X_1$ and $X_2$ each are a carbon atom, a nitrogen atom or a sulfur atom; and $Z_1$ and $Z_2$ each are an atomic group necessary to form an aromatic hydrocarbon ring or an aromatic heterocyclic ring; n1 is an integer of 1 or 2; L1 is a bidentate ligand when n1 is 1; and p1 and q1 each are an integer of 0-4.]

Formula (20)

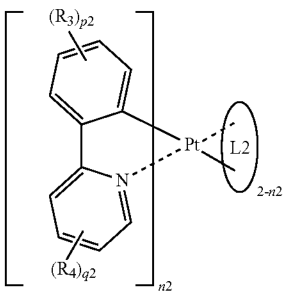

[wherein, $R_3$ and $R_4$ each are a hydrogen atom or a substituent, provided that at least one of $R_3$ and $R_4$ is the substituent; n2 is an integer of 1 or 2; L2 is a bidentate ligand when n2 is 1; and p2 and q2 each are an integer of 0-4.]

Formula (21)

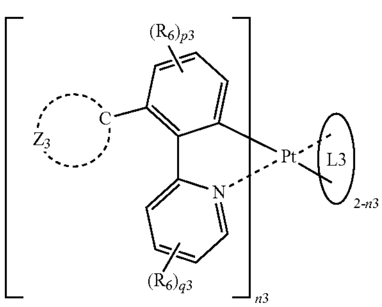

[wherein, $R_5$ and $R_6$ each are a hydrogen atom or a substituent. $Z_3$ is an atomic group necessary to form an aromatic hydrocarbon ring or an aromatic heterocyclic ring; n3 is an integer of 1 or 2; L3 is a bidentate ligand when n3 is 1; p3 is an integer of 0-3; and q3 is an integer of 0-4.]

Formula (22)

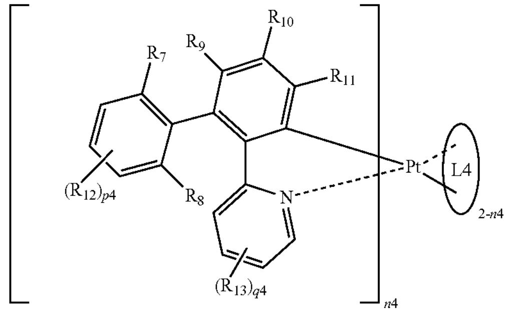

[wherein, $R_7$ and $R_8$ each are a hydrogen atom or a substituent. $R_9$-$R_{13}$ each are a hydrogen atom or a substituent, n4 is an integer of 1 or 2; and L4 is a bidentate ligand when n4 is 1; p4 is an integer of 0-3; and q4 is an integer of 0-4.]

Formula (23)

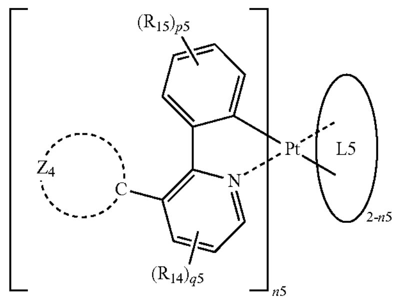

[wherein, $R_{14}$ and $R_{15}$ each are a hydrogen atom or a substituent; $Z_4$ is an atomic group necessary to form an aromatic hydrocarbon ring or an aromatic heterocyclic ring; n5 is an integer of 1 or 2; L5 is a bidentate ligand when n5 is 1; p5 is an integer of 0-4; and q5 is an integer of 0-3.]

Formula (24)

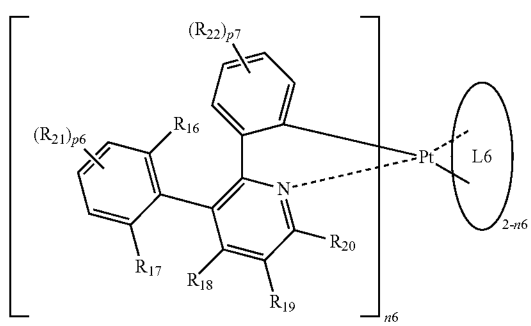

[wherein, $R_{16}$ and $R_{17}$ each are a hydrogen atom or a substituent; $R_{18}$-$R_{22}$ each are a hydrogen atom or a substituent; n6 is an integer of 1 or 2; L6 is a bidentate ligand when n6 is 1; p6 is an integer of 0-3; and q7 is an integer of 0-4.]

Formula (25)

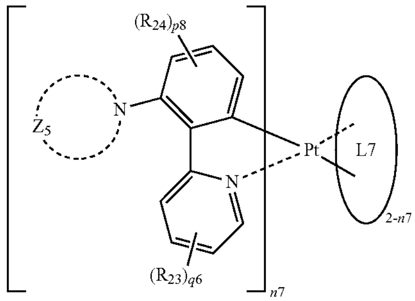

[wherein, $R_{23}$ and $R_{24}$ each are a hydrogen atom or a substituent; $Z_5$ is an atomic group necessary to form an aromatic heterocyclic ring together with a nitrogen atom; n7 is an integer of 1 or 2; L7 is a bidentate ligand when n7 is 1; p8 is an integer of 0-3; and q6 is an integer of 0-4.]

Formula (26)

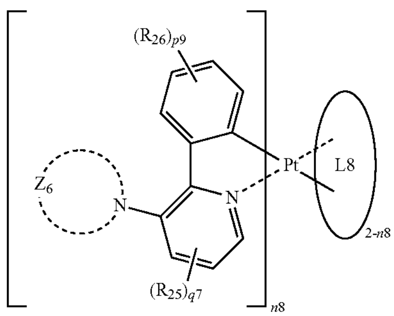

[wherein, $R_{25}$ and $R_{26}$ each are a hydrogen atom or a substituent; $Z_6$ is an atomic group necessary to form an aromatic heterocyclic ring together with a nitrogen atom; n8 is an integer of 1 or 2; L8 is a bidentate ligand when n8 is 1; p9 is an integer of 0-3; and q7 is an integer of 0-4.]

Formula (27)

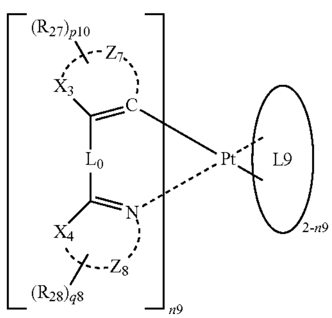

[wherein, $R_{27}$ and $R_{28}$ each are a hydrogen atom or a substituent, provided that at least one of $R_{27}$ and $R_{28}$ is the substituent; L0 is a divalent linkage group; $X_3$ and $X_4$ each are a carbon atom, a nitrogen atom, an oxygen atom or a sulfur atom; $Z_7$ and $Z_8$ each are an atomic group necessary to form an aromatic hydrocarbon ring or an aromatic heterocyclic ring; n9 is an integer of 1 or 2; L9 is a bidentate ligand when n9 is 1; and p10 and q8 each are an integer of 0-4.]

(10) The white light emitting organic electroluminescent element of claim 2 or 3, wherein the blue light emitting ortho metalated complex comprises at least one substructure selected from the group consisting of Formulas (28)-(32) or a tautomer of the substructure.

Formula (28)

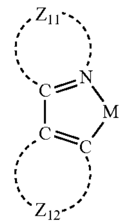

[wherein, C is a carbon atom; N is a nitrogen atom; $Z_{11}$ is an atomic group necessary to form an aromatic heterocyclic ring together with a carbon atom and a nitrogen atom; $Z_{12}$ is an atomic group necessary to form a non-aromatic ring together with a carbon atom; and M is a metal.]

Formula (29)

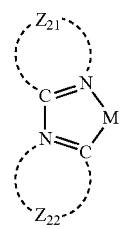

[wherein, C is a carbon atom; N is a nitrogen atom; $Z_{21}$ and $Z_{22}$ each are an atomic group necessary to form an aromatic heterocyclic ring together with a carbon atom and a nitrogen atom; and M is a metal.]

Formula (30)

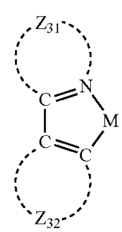

[wherein, C is a carbon atom; N is a nitrogen atom; $Z_{31}$ is an atomic group necessary to form an aromatic heterocyclic ring together with a carbon atom and a nitrogen atom; $Z_{32}$ is an atomic group comprising a carbon atom, a nitrogen atom or an oxygen atom necessary to form a 5-membered or 6-membered aromatic heterocyclic ring together with a carbon atom; and M is a metal.]

Formula (31)

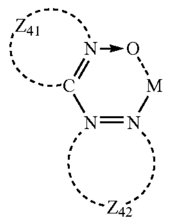

[wherein, C is a carbon atom; N is a nitrogen atom; $Z_{41}$ is an atomic group necessary to form a ring together with a carbon atom and a nitrogen atom; $Z_{42}$ is an atomic group necessary to form a ring together with a carbon atom; and M is a metal.]

Formula (32)

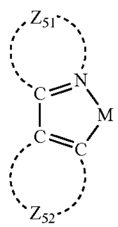

[wherein, C is a carbon atom; N is a nitrogen atom; $Z_{51}$ is an atomic group necessary to form an aromatic heterocyclic ring together with a carbon atom and a nitrogen atom; $Z_{52}$ is an atomic group to form an azulene ring together with a carbon atom; and M is a metal.]

(11) The white light emitting organic electroluminescent element of Item (2) or (3) comprising a platinum complex having a substructure represented by Formula (A) or (B).

Formula (A)

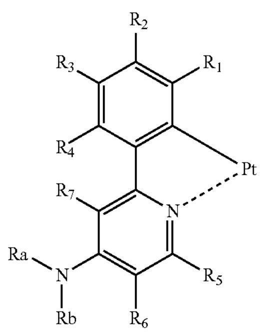

[wherein, $R_1$, $R_2$, $R_3$, $R_4$, $R_5$, $R_6$ and $R_7$ each are a hydrogen atom or a substituent, provided that at least one of $R_1$, $R_2$, $R_3$ and $R_4$ is an electron donating group; and Ra and Rb each are a substituent.]

Formula (B)

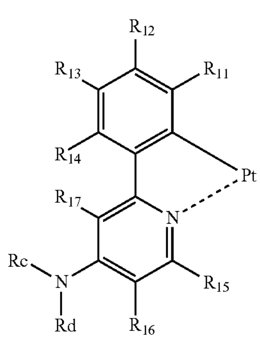

[wherein, $R_{11}$, $R_{12}$, $R_{13}$, $R_{14}$, $R_{15}$, $R_{16}$ and $R_{17}$ each are a hydrogen atom or a substituent, provided that at least one of $R_{11}$ and $R_{13}$ is an electron withdrawing group; and Rc and Rd each are a substituent.]

(12) The white light emitting organic electroluminescent element of any one of Items (2) to (11), wherein a shortest emission peak wavelength of the blue light emitting ortho metalated complex is not more than 450 nm.

(13) The white light emitting organic electroluminescent element of any one of Items (1) to (12), wherein the light emission layer or a layer adjacent to the light emission layer comprises a compound represented by Formula (33).

Formula (33)

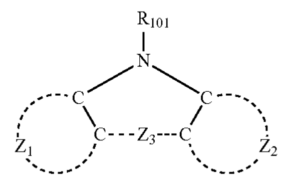

[wherein, $Z_1$ is an aromatic heterocyclic ring which may have a substituent; $Z_2$ is an aromatic heterocyclic ring or an aromatic hydrocarbon ring each of which may have a substituent; and $Z_3$ is a divalent linkage group or a single bonding arm; and $R_{101}$ is a hydrogen atom or a substituent.]

(14) The white light emitting organic electroluminescent element of Item (13), wherein $Z_1$ of the compound represented by Formula (33) is a 6-membered ring.

(15) The white light emitting organic electroluminescent element of Item (13) or (14), wherein $Z_2$ of the compound represented by Formula (33) is a 6-membered ring.

(16) The white light emitting organic electroluminescent element of any one of Items (13) to (15), wherein $Z_3$ of the compound represented by Formula (33) is a single bonding arm.

(17) The white light emitting organic electroluminescent element of any one of Items (13) to (16), wherein a molecular weight of the compound represented by Formula (33) is not less than 450.

(18) The white light emitting organic electroluminescent element of any one of Items (13) to (17), wherein the compound represented by Formula (33) is represented by Formula (33-1).

Formula (33-1)

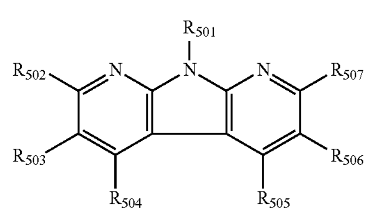

[wherein, $R_{501}$-$R_{507}$ each independently are a hydrogen atom or a substituent.]

(19) The white light emitting organic electroluminescent element of any one of Items (13) to (17), wherein the compound represented by Formula (33) is represented by Formula (33-2).

Formula (33-2)

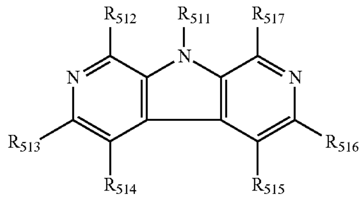

[wherein, $R_{511}$-$R_{517}$ each independently are a hydrogen atom or a substituent.]

(20) The white light emitting organic electroluminescent element of any one of Items (13) to (17), wherein the compound represented by Formula (33) is represented by Formula (33-3).

Formula (33-3)

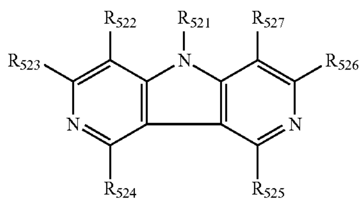

[wherein, $R_{521}$-$R_{527}$ each independently are a hydrogen atom or a substituent.]

(21) The white light emitting organic electroluminescent element of any one of Items (13) to (17), wherein the compound represented by Formula (33) is represented by Formula (33-4).

Formula (33-4)

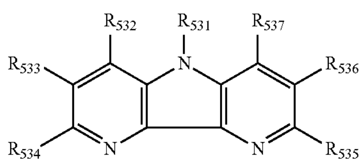

[wherein, $R_{531}$-$R_{537}$ each independently are a hydrogen atom or a substituent.]

(22) The white light emitting organic electroluminescent element of any one of Items (13) to (17), wherein the compound represented by Formula (33) is represented by Formula (33-5).

Formula (33-5)

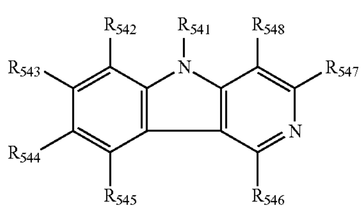

[wherein, $R_{541}$-$R_{548}$ each independently are a hydrogen atom or a substituent.]

(23) The white light emitting organic electroluminescent element of any one of Items (13) to (17), wherein the compound represented by Formula (33) is represented by Formula (33-6).

Formula (33-6)

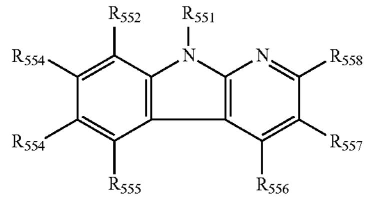

[wherein, $R_{551}$-$R_{558}$ each independently are a hydrogen atom or a substituent.]

(24) The white light emitting organic electroluminescent element of any one of Items (13) to (17), wherein the compound represented by Formula (33) is represented by Formula (33-7).

Formula (33-7)

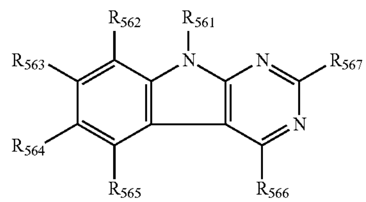

[wherein, $R_{561}$-$R_{567}$ each independently are a hydrogen atom or a substituent.]

(25) The white light emitting organic electroluminescent element of any one of Items (13) to (17), wherein the compound represented by Formula (33) is represented by Formula (33-8).

Formula (33-8)

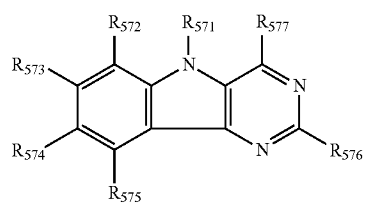

[wherein, $R_{571}$-$R_{577}$ each independently are a hydrogen atom or a substituent.]

(26) The white light emitting organic electroluminescent element of any one of Items (13) to (17), wherein the compound represented by Formula (33) is represented by Formula (33-9).

Formula (33-9)

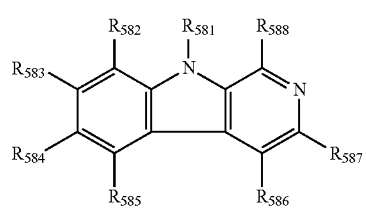

[wherein, $R_{581}$-$R_{588}$ each independently are a hydrogen atom or a substituent.]

(27) The white light emitting organic electroluminescent element of any one of Items (13) to (17), wherein the compound represented by Formula (33) is represented by Formula (33-10).

Formula (33-10)

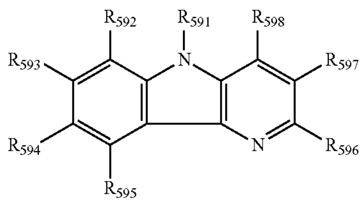

[wherein, $R_{591}$-$R_{598}$ each independently are a hydrogen atom or a substituent.]

(28) The white light emitting organic electroluminescent element of any one of Items (13) to (17), wherein the compound represented by Formula (33) has at least one of the groups represented by Formulas (34-1)-(34-10).

Formula (34-1)

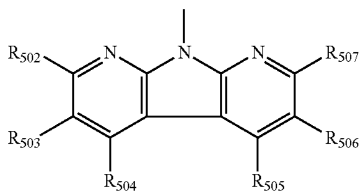

Formula (34-2)

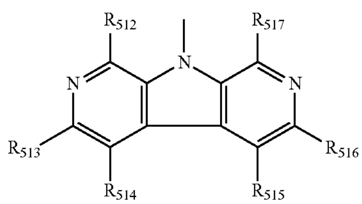

Formula (34-3)

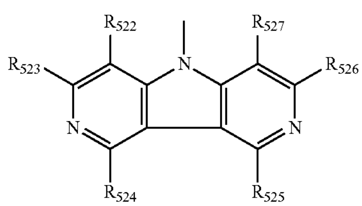

Formula (34-4)

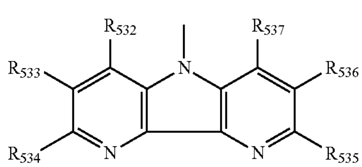

Formula (34-5)

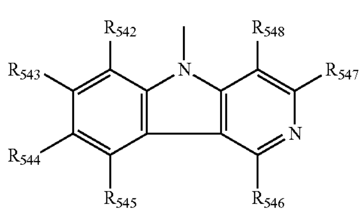

-continued

Formula (34-6)

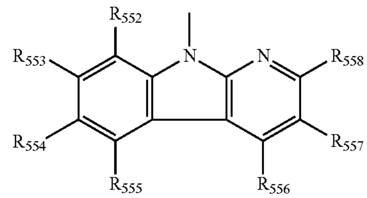

Formula (34-7)

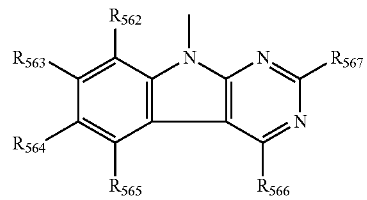

Formula (34-8)

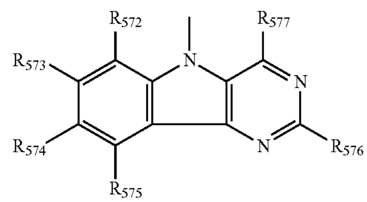

Formula (34-9)

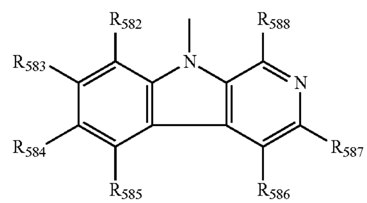

Formula (34-10)

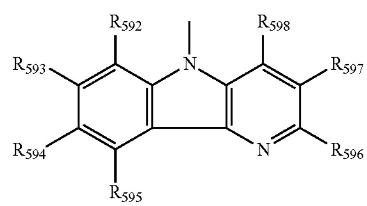

[wherein, $R_{502}$-$R_{507}$, $R_{512}$-$R_{517}$, $R_{522}$-$R_{527}$, $R_{532}$-$R_{537}$, $R_{542}$-$R_{548}$, $R_{552}$-$R_{558}$, $R_{562}$-$R_{567}$, $R_{572}$-$R_{577}$, $R_{582}$-$R_{588}$ and $R_{592}$-$R_{598}$, each independently are a hydrogen atom or a substituent, and the substituents may be the same with each other or may be different.]

(29) The white light emitting organic electroluminescent element of Item (28), wherein the compound represented by Formula (33) is represented by Formula (35).

Formula (35)

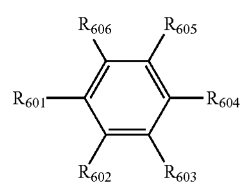

[wherein, $R_{601}$-$R_{606}$ each independently are a hydrogen atom or a substituent, provided that at least one of $R_{601}$-$R_{606}$ is a group selected from the groups represented by Formulas (34-1)-(34-10).]

(30) The white light emitting organic electroluminescent element of Item (28), wherein the compound represented by Formula (33) is represented by Formula (36).

Formula (36)

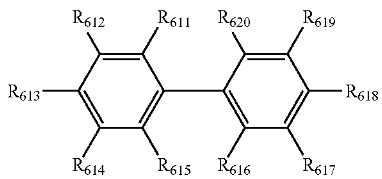

[wherein, $R_{611}$-$R_{620}$ each independently are a hydrogen atom or a substituent, provided that at least one of $R_{611}$-$R_{620}$ is one group selected from the groups represented by Formulas (34-1)-(34-10).]

(31) The white light emitting organic electroluminescent element of Item (28), wherein the compound represented by Formula (33) is represented by Formula (37).

Formula (37)

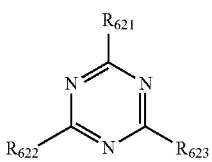

[wherein, $R_{621}$-$R_{623}$ each independently are a hydrogen atom or a substituent, however, at least one of $R_{621}$-$R_{623}$ is one group selected from the groups represented by Formulas (34-1)-(34-10).]

(32) The white light emitting organic electroluminescent element of Item (28), wherein the compound represented by Formula (33) is represented by Formula (38).

Formula (38)

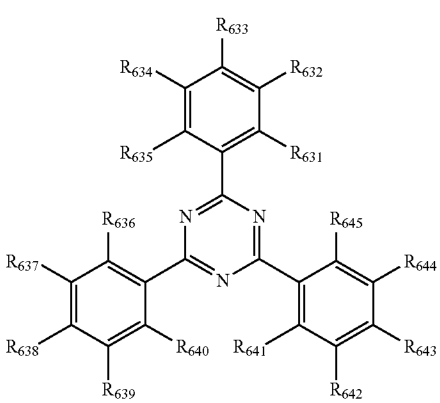

[wherein, $R_{631}$-$R_{645}$ each independently are a hydrogen atom or a substituent, provided that at least one of $R_{631}$-$R_{645}$ is one group selected from the groups represented by Formulas (34-1)-(34-10).]

(33) The white light emitting organic electroluminescent element of Item (28), wherein the compound represented by Formula (33) is represented by Formula (39).

Formula (39)

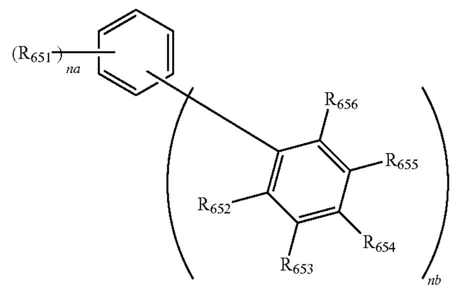

[wherein, $R_{651}$-$R_{656}$ each independently are a hydrogen atom or a substituent, provided that at least one of $R_{651}$-$R_{656}$ is one group selected from the groups represented by Formulas (34-1)-(34-10); na is an integer of 0-5; and nb is an integer of 1-6, provided that a sum of na and nb is 6.]

(34) The white light emitting organic electroluminescent element of Item (28), wherein the compound represented by Formula (33) is represented by Formula (40).

Formula (40)

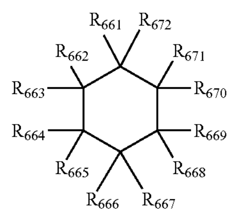

[wherein, $R_{661}$-$R_{672}$ each independently are a hydrogen atom or a substituent, provided that at least one of $R_{661}$-$R_{672}$ is one group selected from the groups represented by Formulas (34-1)-(34-10).]

(35) The white light emitting organic electroluminescent element of Item (28), wherein the compound represented by Formula (33) is represented by Formula (41).

Formula (41)

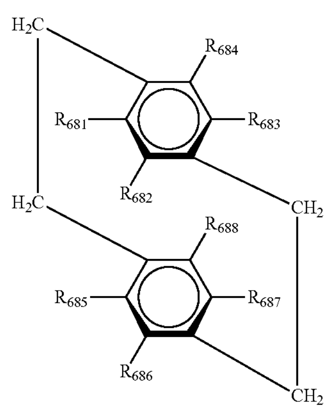

[wherein, $R_{681}$-$R_{688}$ each independently are a hydrogen atom or a substituent, provided that at least one of $R_{681}$-$R_{688}$ is one group selected from the groups represented by Formulas (34-1)-(34-10).]

(36) The white light emitting organic electroluminescent element of Item (28), wherein the compound represented by Formula (33) is represented by Formula (42).

Formula (42)

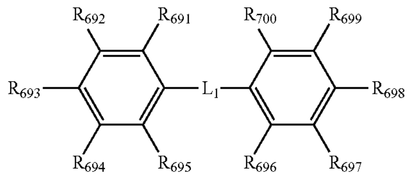

[wherein, $R_{691}$-$R_{700}$ each independently are a hydrogen atom or a substituent; $L_1$ is a divalent linkage group; at least one of $R_{691}$-$R_{700}$ is one group selected from the groups represented by Formulas (34-1)-(34-10).]

(37) The white light emitting organic electroluminescent element of any one of Items (13) to (17), wherein the compound represented by Formula (33) is represented by Formula (43).

Formula (43)

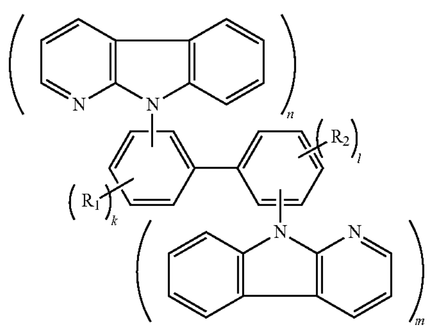

[wherein, $R_1$ and $R_2$ each independently are a hydrogen atom or a substituent; n and m each are an integer of 1-2; and k and l each are an integer of 3-4, wherein, n+k=5 and l+m=5.]

(38) The white light emitting organic electroluminescent element of any one of Items (13) to (17), wherein the compound represented by Formula (33) is represented by Formula (44).

Formula (44)

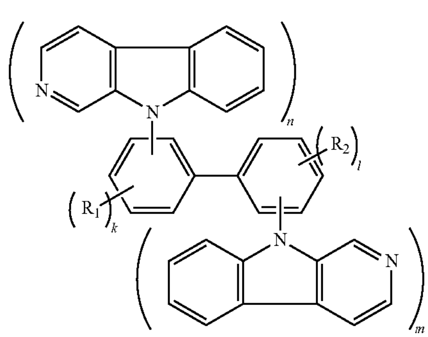

[wherein, $R_1$ and $R_2$ each independently are a hydrogen atom or a substituent; n and m each are an integer of 1-2; and k and l each are an integer of 3-4, wherein n+k=5 and l+m=5.]

(39) The white light emitting organic electroluminescent element of any one of Items (13) to (17), wherein the compound represented by Formula (33) is represented by Formula (45).

Formula (45)

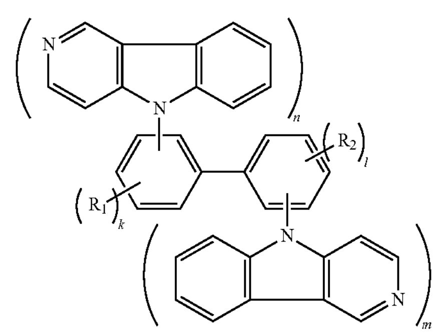

[wherein, $R_1$ and $R_2$ each independently are a hydrogen atom or a substituent; n and m each are an integer of 1-2; and k and l each are an integer of 3-4, wherein n+k=5 and l+m=5.]

(40) The white light emitting organic electroluminescent element of any one of Items (13) to (17), wherein the compound represented by Formula (33) is represented by Formula (46).

Formula (46)

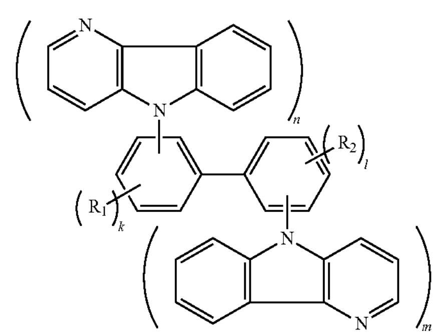

[wherein, $R_1$ and $R_2$ each independently are a hydrogen atom or a substituent; n and m each are an integer of 1-2; and k and l each are an integer of 3-4, wherein n+k=5 and l+m=5.]

(41) The white light emitting organic electroluminescent element of any one of Items (13) to (17), wherein the compound represented by Formula (33) is represented by Formula (47).

Formula (47)

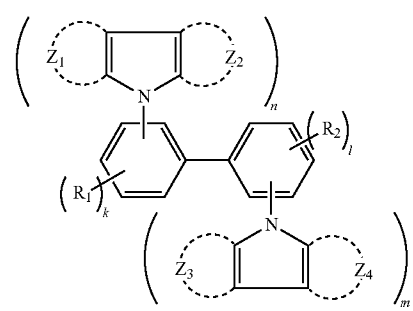

[wherein, $R_1$ and $R_2$ each independently are a hydrogen atom or a substituent; n and m each are an integer of 1-2; k and l each are an integer of 3-4, wherein, n+k=5 and l+m=5; and $Z_1$, $Z_2$, $Z_3$ and $Z_4$ each are a 6-membered aromatic heterocyclic ring comprising at least one nitrogen atom.]

(42) The white light emitting organic electroluminescent element of any one of Items (13) to (17), wherein the compound represented by Formula (33) is represented by Formula (48).

Formula (48)

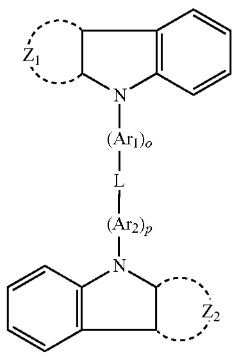

[wherein, o and p each are an integer of 1-3; $Ar_1$ and $Ar_2$ each are an arylene group or a divalent aromatic heterocyclic group; $Z_1$ and $Z_2$ each are a 6-membered aromatic heterocyclic ring comprising at least one nitrogen atom; and L is a divalent linkage group.]

(43) The white light emitting organic electroluminescent element of any one of Items (13) to (17), wherein the compound represented by Formula (33) is represented by Formula (49).

Formula (49)

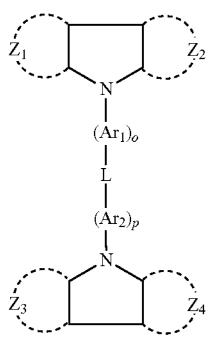

[wherein, o and p each are an integer of 1-3; $Ar_1$ and $Ar_2$ each are an arylene group or a divalent aromatic heterocyclic group; $Z_1$, $Z_2$, $Z_3$ and $Z_4$ each are a 6-membered aromatic heterocyclic ring containing at least one nitrogen atom; and L is a divalent linkage group.]

(44) The white light emitting organic electroluminescent element of Item (6), wherein the light emission layer or a layer adjacent to the emission layer comprises the two kinds or more of phosphorescent compounds.

(45) A display having the white light emitting organic electroluminescent element of any one of Items (1) to (44).

(46) An illuminator having the white light emitting organic electroluminescent element of any one of Items (1) to (44).

An organic EL element of the present invention has been able to achieve an organic EL element exhibiting high emission luminance and high emission efficiency as well as having high CIE color purity of white emission by employing an constitution described in any one of aforesaid items (1)-(7). Further, the present invention can also provide a display and an illumination utilizing the aforesaid element.

In the following, details of each constituent element according to the present invention will be explained in succession.

<Green Light Emitting, Red Light Emitting and Blue Light Emitting Ortho Metalated Complex>

Green light emitting, red light emitting and blue light emitting ortho metalated complexes according to the present invention each will now be explained.

Green light emitting, red light emitting and blue light emitting ortho metalated complexes according to the present invention each area phosphorescent compound; a layer containing each ortho metalated complex may be any layer of an organic EL element of the present invention, however, an emission layer and/or a positive hole blocking layer are preferably utilized; and in the case of the complex being contained in an emission layer, it is possible to provide an organic EL element of the present invention with effects of improving emission luminance and emission efficiency in addition to increasing CIE color purity of white emission, by utilizing the aforesaid complex as an emission dopant in the aforesaid emission layer.

<Green Light Emitting Ortho Metalated Complex>

A green light emitting ortho metal complex according to the present invention will now be explained.

A green light emitting ortho metal complex according to the present invention is a phosphorescent compound and has a spectral component ratio of said green light emitting ortho metal complex, which occupies the white emission spectral distribution of organic EL element of the present invention within a region of 400-800 nm, is not less than 60%, preferably not less than 70% and more preferably in a range of 70-85%.

The calculation method of a spectral component ratio according to the present invention will be detailed in examples described later, however, the wave forms were compared, utilizing a white emission spectrum curve obtained at the time of emission of an element and a green emission spectrum curve obtained by measurement of an element sample which had been separately prepared only from a green light emitting ortho metalated complex alone, and the ratio of an emission spectral component of a green light emitting ortho metalated complex in a white emission spectral distribution was calculated.

A green light emitting ortho metal complex according to the present invention is an ortho metalated complex which has the emission maximum wavelength in a range of 500-570 nm and is comprised of a transition metal as the central metal, and not less than 70% of energy distribution of the emission spectral is preferably in a range of 500-570 nm.

Specifically, utilized can be those having the above-described emission characteristics among ortho metalated complexes described in patents such as Japanese Translation of PCT International Application Publication No. (hereinafter referred to as JT-PCT) 2003-526876, WO 00/70655 pamphlet, JT-PCT 2002-525808, WO 01/41512 pamphlet, JT-PCT 2004-506305 and WO 02/15645 pamphlet. As the central metal, transition metals belonging to the 8-10th groups of the periodic table are preferable and Ir or Pt is specifically preferable.

Further, as a green light emitting ortho metalated complex according to the present invention, specifically preferably utilized are complexes represented by following Formula (C) or (D).

Formula (C)

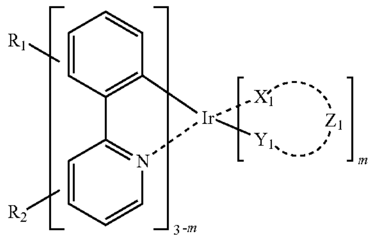

Formula (D)

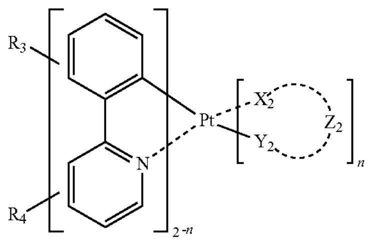

In the formulas, $X_1$, $Y_1$, $X_2$ and $Y_2$ each are an oxygen atom or a nitrogen atom; $X_1$ and $Y_1$ together with $Z_1$, $X_2$ and $Y_2$ together with $Z_2$, each form a bidentate ligand. m and n are 0 or 1. β-diketones and salicilc acid derivatives are preferable as a ligand formed by $X_1$ and $Y_1$ together with $Z_1$. Further, β-diketones, salicilc acid derivatives and picolinic acid derivatives are preferable as a ligand formed by $X_2$ and $Y_2$ together with $Z_2$.

$R_1$, $R_2$, $R_3$ and $R_4$ are a hydrogen atom or a substituent, and said substituent includes, for example, an alkyl group (such as a methyl group, an ethyl group, an isopropyl group, a hydroxyethyl group, a methoxymethyl group, a trifluoromethyl group, a t-butyl group, a pentyl group, an octyl group, a nonyl group and a decyl group), a cycloalkyl group (such as a cyclopentyl group and a cyclohexyl group), an aralkyl group (such as a benzyl group and a 2-phenetyl group), an aromatic hydrocarbon group (such as a phenyl group, a p-chlorophenyl group, a mesityl group, a tolyl group, a xylyl group, a biphenylyl group, a naphtyl group, an anthoryl group and a phenanthryl group), an aromatic heterocyclic group (such as a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolynyl group, carbazolyl group, a carbolinyl group, a diazacarbazolyl group (a diazacarbazolyl group refers to those in which any one of carbon atoms constituting a carboline ring of said carbolinyl group is substituted by a nitrogen atom) and a phthalazinyl group), an alkoxyl group (such as an ethoxy group, an isopropoxy group and a butoxy group), an aryloxy group (such as a phenoxy group and a naphthyloxy group), a cyano group, a hydroxyl group, an alkenyl group (such as a vinyl group), a styryl group, a halogen atom (such as a chlorine atom, a bromine atom, an iodine atom and a fluorine atom). These groups may be further substituted.

Among those described above, a preferable substituent includes an alkyl group having a carbon number of 1-10, an alkoxyl group having a carbon number of 1-10 and a halogen atom.

In the following, preferable green light emitting ortho metalated complexes are specifically exemplified; however, the present invention is not limited thereto.

GDM-1

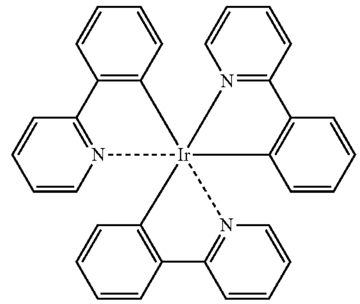

GDM-2

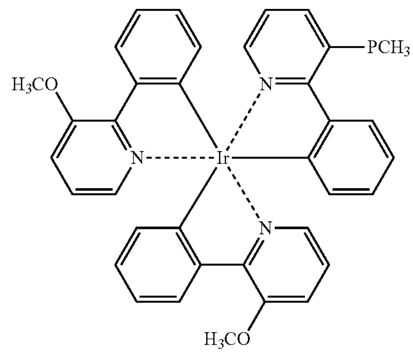

GDM-3

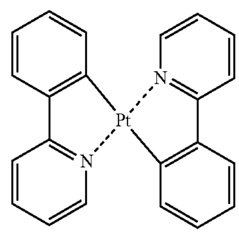

GDM-4

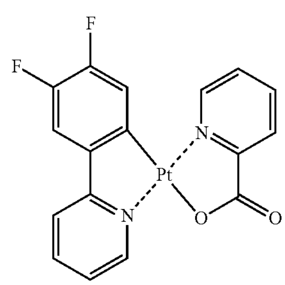

GDM-5

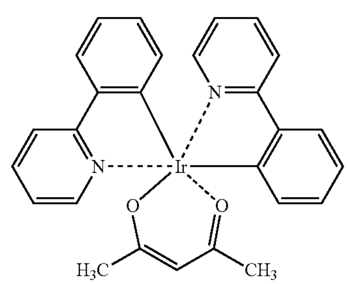

-continued

GDM-6

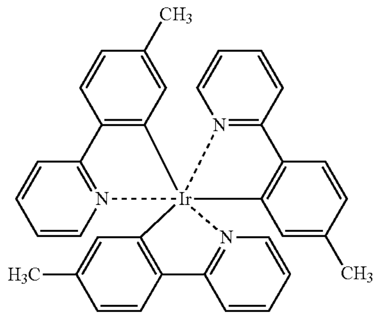

GDM-7

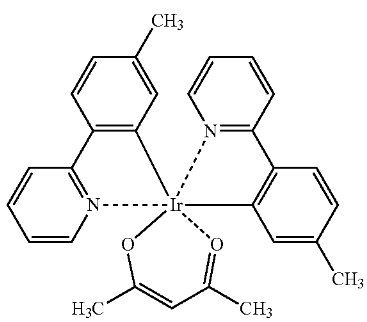

GDM-8

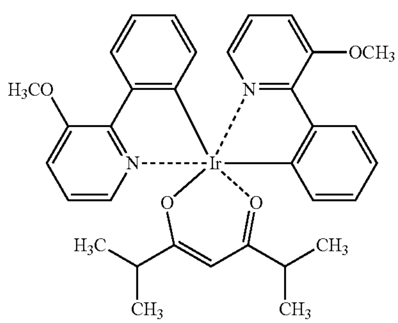

GDM-9

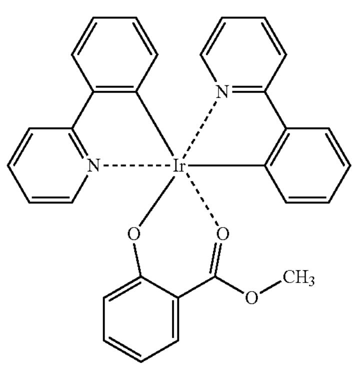

-continued

GDM-10

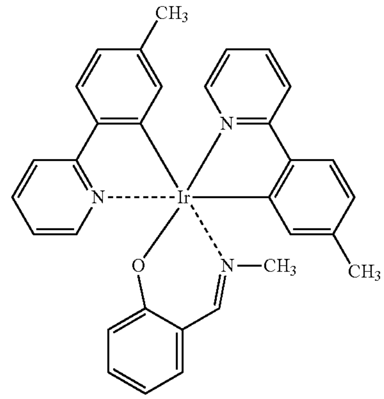

GDM-11

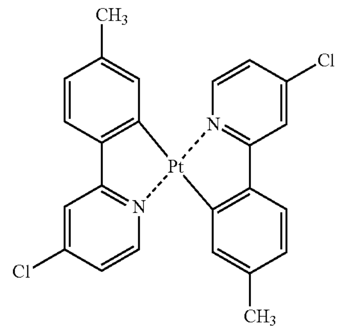

GDM-12

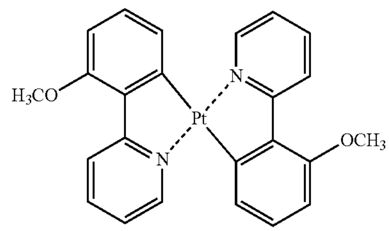

<Red Light Emitting Ortho Metalated Complex>

A red light emitting ortho metal complex according to the present invention is an ortho metalated complex, which is comprised of a transition metal as the central metal and has the maximum emission wavelength in a range of 570-650 nm, and is preferably has the maximum emission wavelength of not shorter than 590 nm. Further, not less than 70% of energy distribution of the emission spectrum is preferably in a range of not shorter than 580 nm. Specific examples of a red light emitting ortho metalated complex according to a white light emitting organic EL element of the present invention include the following compounds.

RDM-1

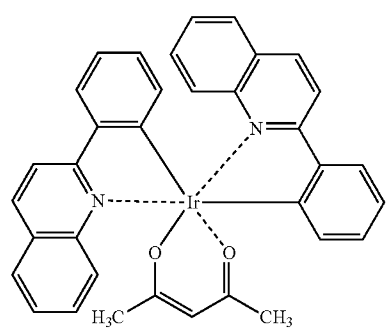

-continued

RDM-2

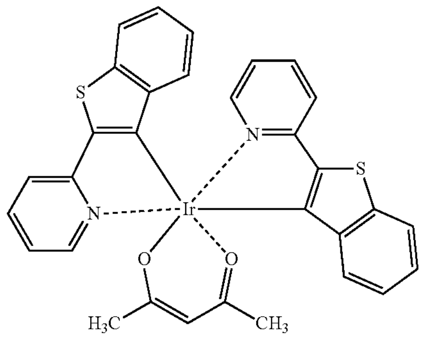

Further, as specific examples of a green light emitting ortho metalated complex and a red light emitting ortho metalated complex according to the present invention, compounds conventionally well known in the art can be utilized and utilized can be compounds described in such as J. Am. Chem. Soc. Vol. 123, pp. 4304-4312 (2001), Inorganic Chemistry, vol. 40 p. 1704 (2001), JP-A (hereinafter, JP-A refers to Japanese Patent Publication Open to Public Inspection No.) 2003-272861, JP-A 2004-111193, Japanese Patent Application Nos. 2003-150762 and 2003-150763, JP-A Nos. 2001-247859, 2001-181616, 2001-181617, 2002-175884, 2002-332291, 2002-363552, 2002-332291, 2002-338588, WO 00/70655 pamphlet, JP-A Nos. 2002-203678 and 2001-345183, WO 02/44189 pamphlet, JP-A Nos. 2002-332292, 2003-059667, 2002-332292 and 2002-252888. Further, combination use thereof is also possible.

<Blue Light Emitting Ortho Metalated Complex>

A blue light emitting ortho metalated complex according to the present invention is an ortho metalated complex which is comprised of a transition metal as the central metal and has the emission maximum wavelength in a range of 400-500 nm, and the shortest emission maximum wavelength is preferably not longer than 455 nm.

As a blue light emitting ortho metalated complex according to the present invention, complexes classified in seven types of embodiments described in any one of aforesaid items (4)-(10) are preferably utilized. In the following, said seven types of embodiments are classified into (a)-(h) and each thereof will be specifically explained.

Embodiment (a)

The case of utilizing a complex, which is provided with at least one type of partial structures represented by aforesaid Formulas (1)-(6) or at least one type of a tautomer of each partial structures represented by said Formulas (1)-(6) as a partial structure, as a blue light emitting ortho metalated complex.

A layer containing a metal complex having a partial structure of Formulas (1)-(6) or a tautomer of said Formulas (1)-(6) is preferably an emission layer and/or a positive hole blocking layer, and further, when the metal complex is contained in an emission layer, it is possible to achieve increase (higher luminance) of taking out quantum efficiency or elongation of the emission life, of an organic EL element of the present invention, by utilizing the complex as an emission dopant in an emission layer.

<Formula (1) or Tautomer of Said Formula (1)>

In Formula (1) or a tautomer of said Formula (1), an aromatic hydrocarbon ring represented by $Z_{11}$ includes such as a benzene ring, a biphenyl ring, a naphthalene ring, an azulene ring, an anthrathene ring, a phenanthrene ring, a pyrene ring, a chrysene ring, a naphthacene ring, a triphenylene ring, a o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthraathrene ring.

Preferably utilized among them is a benzene ring. Further, the aforesaid aromatic hydrocarbon ring may be provided with a substituent represented by each of $R_{11}$, $R_{12}$ and $R_{13}$ in aforesaid Formula (1).

In Formula (1) or a tautomer of said Formula (1), an aromatic hydrocarbon ring represented by $Z_{11}$ includes a furan ring, a thiophene ring, a pyridine ring, a pyridazine ring, a pyrimidine ring, a pyradine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring and a ring in which at least one of carbon atoms of a hydrocarbon ring constituting a carboline ring is further substituted by a nitrogen atom.

Preferable among them is a pyridine ring. Further, the aforesaid aromatic heterocyclic ring may be provided with a substituent represented by each of $R_{11}$, $R_{12}$ and $R_{13}$ in aforesaid Formula (1).

In Formula (1) or a tautomer of said Formula (1), a substituent represented by each of $R_{11}$, $R_{12}$ and $R_{13}$ includes, for example, an alkyl group (such as a methyl group, an ethyl group, an isopropyl group, a hydroxyethyl group, a methoxymethyl group, a trifluoromethyl group, a t-butyl group), a cycloalkyl group (such as a cyclopentyl group and a cyclohexyl group), an aralkyl group (such as a benzyl group and a 2-phenetyl group), an aromatic hydrocarbon group (such as a phenyl group, a p-chlorophenyl group, a mesityl group, a tolyl group, a xylyl group, a biphenylyl group, a naphtyl group, an anthoryl group and a phenanthryl group), an aromatic heterocyclic group (such as a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolynyl group, a carbazolyl group, a carbolinyl group, a diazacarbazolyl group (a diazacarbazolyl group refers to those in which any one of carbon atoms constituting a carboline ring of said carbolinyl group is substituted by a nitrogen atom) and a phthalazinyl group), an alkoxyl group (such as an ethoxy group, an isopropoxy group and a butoxy group), an aryloxy group (such as a phenoxy group and a naphthyloxy group), a cyano group, a hydroxyl group, an alkenyl group (such as a vinyl group), a styryl group, a halogen atom (such as a chlorine atom, a bromine atom, an iodine atom and a fluorine atom). These groups may be further provided with a substituent.

Among them, in the present invention, at least one of the above-described groups represented by $R_{11}$, $R_{12}$ and $R_{13}$ is preferably the above-described aromatic hydrocarbon group or aromatic heterocyclic group.

In Formula (1) or a tautomer of said Formula (1), $M_{11}$ is a metal (may be either a metal atom or an ion) belonging to the 8th-10th groups of the periodic table, however, preferably utilized among them are platinum (Pt) and iridium (Ir). Further, in a metal complex having Formula (1) or a tautomer of said Formula (1) as a partial structure, $M_{11}$ may be either a metal atom or an ion.

In the present invention, a metal complex is formed by forming a coordination bond between Formula (1) or a tautomer of said Formula (1) (also referred to as complex formation) and a central metal (also may be an ion) represented by $M_{11}$.

<Formula (2) or Tautomer of Said Formula (2)>

In Formula (2) or a tautomer of said Formula (2), an aromatic hydrocarbon ring represented by $Z_{21}$ is identical with an aromatic hydrocarbon ring represented by $Z_{11}$ in Formula (1) or a tautomer of said Formula (1).

In Formula (2) or a tautomer of said Formula (2), an aromatic heterocyclic ring represented by $Z_{21}$ is identical with an aromatic heterocyclic ring represented by $Z_{11}$ in Formula (1) or a tautomer of said Formula (1).

In Formula (2) or a tautomer of said Formula (2), a substituent represented by each of $R_{21}$, $R_{22}$ and $R_{23}$ is identical with a substituent represented by each of $R_{11}$, $R_{12}$ and $R_{13}$ in Formula (1) or a tautomer of said Formula (1).

In Formula (2) or a tautomer of said Formula (2), a metal (also may be an ion), which is represented by $M_{21}$ and belongs to the 8th-10th groups of the periodic table, is identical with a metal (also may be an ion), which is represented by $M_{11}$ and belongs to the 8th-10th groups of the periodic table, in Formula (1) or a tautomer of said Formula (1).

<Formula (3) or Tautomer of Said Formula (3)>

In Formula (3) or a tautomer of said Formula (3), an aromatic hydrocarbon ring represented by $Z_{31}$ is identical with an aromatic hydrocarbon ring represented by $Z_{11}$ in Formula (1) or a tautomer of said Formula (1).

In Formula (3) or a tautomer of said Formula (3), an aromatic heterocyclic ring represented by $Z_{31}$ is identical with an aromatic heterocyclic ring represented by $Z_{11}$ in Formula (1) or a tautomer of said Formula (1).

In Formula (3) or a tautomer of said Formula (3), a substituent represented by $R_3$ of —N($R_3$), which is represented by each of $X_{31}$, $X_{32}$ and $X_{33}$, is identical with a substituent represented by each of $R_{11}$, $R_{12}$ and $R_{13}$ in Formula (1) or a tautomer of said Formula (1).

In Formula (3) or a tautomer of said Formula (3), a metal (also may be an ion), which is represented by $M_{31}$ and belongs to the 8th-10th groups of the periodic table, is identical with a metal (also may be an ion), which is represented by $M_{11}$ and belongs to the 8th-10th groups of the periodic table, in Formula (1) or a tautomer of said Formula (1).

<Formula (4) or Tautomer of Said Formula (4)>

In Formula (4) or a tautomer of said Formula (4), an aromatic heterocyclic ring represented by $Z_{41}$ is identical with an aromatic heterocyclic ring represented by $Z_{11}$ in Formula (1) or a tautomer of said Formula (1).

In Formula (4) or a tautomer of said Formula (4), a substituent represented by each of $X_{41}$ $X_{42}$ and $X_{43}$ is identical with a substituent represented by each of $R_{11}$ $R_{12}$ and $R_{13}$ in Formula (1) or a tautomer of said Formula (1).

In Formula (4) or a tautomer of said Formula (4), a metal (also may be an ion), which is represented by $M_{41}$ and belongs to the 8th-10th groups of the periodic table, is identical with a metal (also may be an ion), which is represented by $M_{11}$ and belongs to the 8th-10th groups of the periodic table, in Formula (1) or a tautomer of said Formula (1).

<Formula (5) or Tautomer of Said Formula (5)>

In Formula (5) or a tautomer of said Formula (5), an aromatic hydrocarbon ring represented by $Z_{51}$ is identical with an aromatic hydrocarbon ring represented by $Z_{11}$ in Formula (1) or a tautomer of said Formula (1).

In Formula (5) or a tautomer of said Formula (5), an aromatic heterocyclic ring represented by $Z_{51}$ is identical with an aromatic heterocyclic ring represented by $Z_{11}$ in Formula (1) or a tautomer of said Formula (1).

In Formula (5) or a tautomer of said Formula (5), a substituent represented by each of $R_{51}$ and $R_{52}$ is identical with a substituent represented by each of $R_{11}$, $R_{12}$ and $R_{13}$ in Formula (1) or a tautomer of said Formula (1).

In Formula (5) or a tautomer of said Formula (5), a metal (also may be an ion), which is represented by $M_{51}$ and belongs to the 8th-10th groups of the periodic table, is identical with a metal (also may be an ion), which is represented by $M_{11}$ and belongs to the 8th-10th groups of the periodic table, in Formula (1) or a tautomer of said Formula (1).

<Formula (6) or Tautomer of Said Formula (6)>

In Formula (6) or a tautomer of said Formula (6), an aromatic hydrocarbon ring represented by $Z_{61}$ is identical with an aromatic hydrocarbon ring represented by $Z_{11}$ in Formula (1) or a tautomer of said Formula (1).

In Formula (6) or a tautomer of said Formula (6), an aromatic heterocyclic ring represented by $Z_{61}$ is identical with an aromatic heterocyclic ring represented by $Z_{11}$ in Formula (1) or a tautomer of said Formula (1).

In Formula (6) or a tautomer of said Formula (6), a metal (also may be an ion), which is represented by $M_{61}$ and belongs to the 8th-10th groups of the periodic table, is identical with a metal (also may be an ion), which is represented by $M_{11}$ and belongs to the 8th-10th groups of the periodic table, in Formula (1) or a tautomer of said Formula (1).

In the following, specific examples of a metal complex, which is provided with aforesaid Formulas (1)-(6) or a tautomer of said Formulas (1)-(6) as a partial structure, will be shown, however the present invention is not limited thereto.

1-1

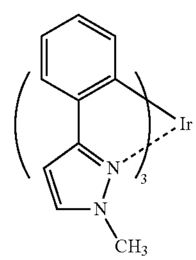

1-2

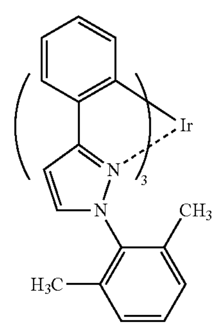

1-3

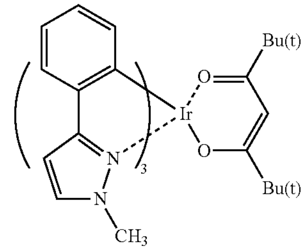

-continued
1-4
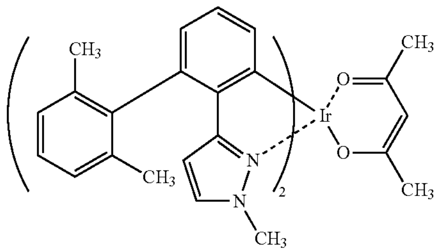
1-5
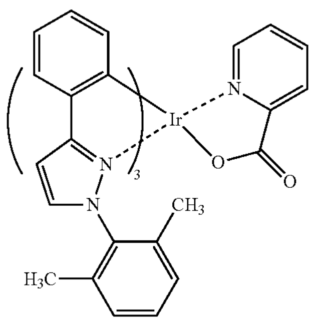
1-6
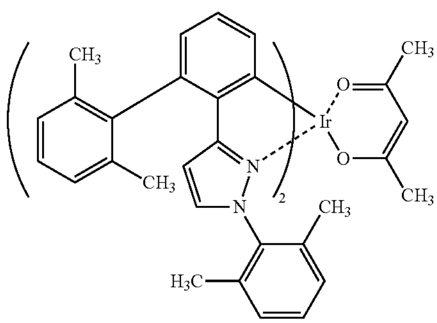
1-7
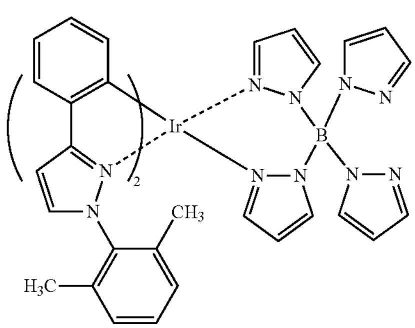
1-8
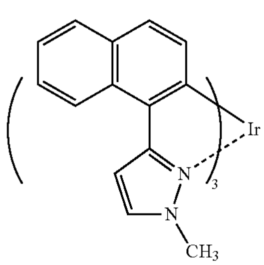
-continued
1-9
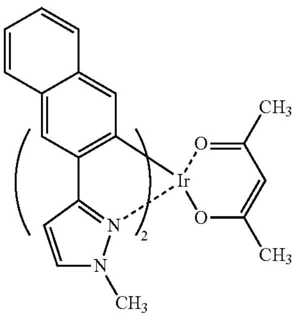
1-10
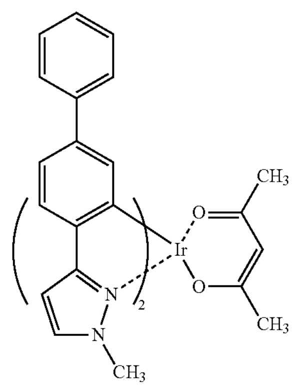
1-11
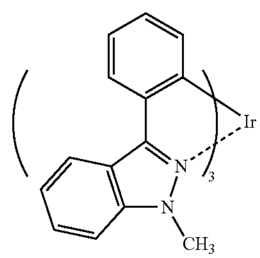
1-12
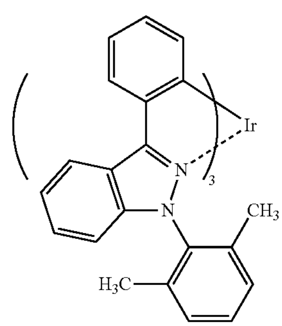
1-13
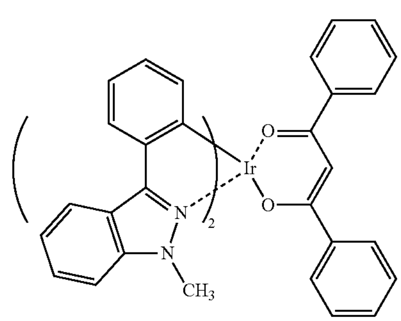

-continued
1-14
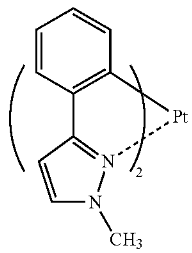
1-15
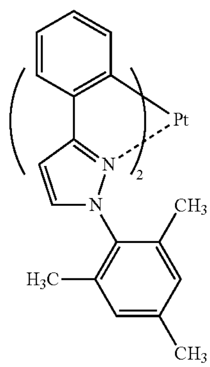
1-16
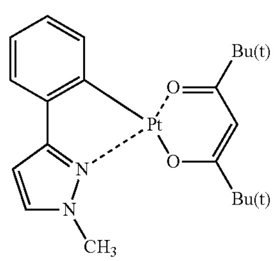
1-17
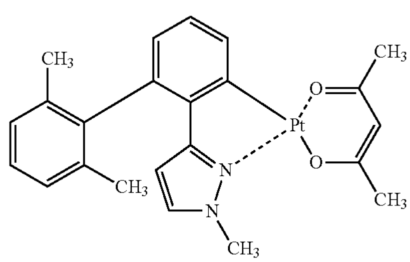
1-18
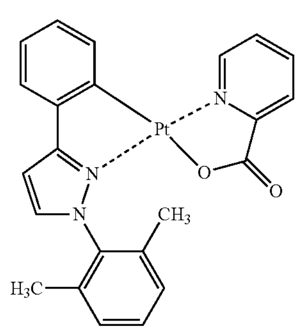
-continued
1-19
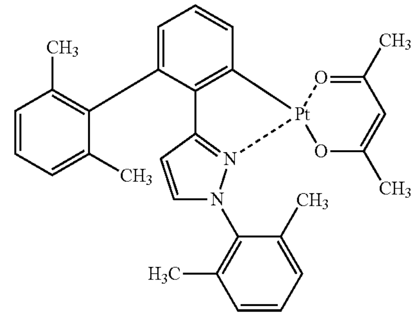
1-20
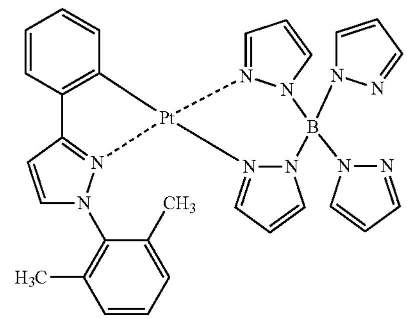
1-21
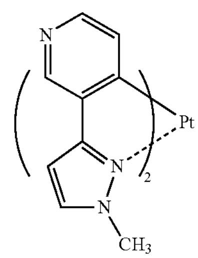
1-22
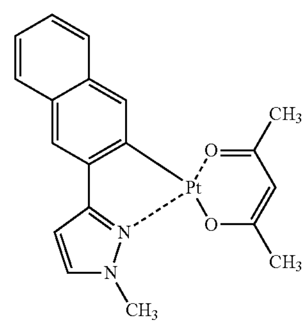
1-23
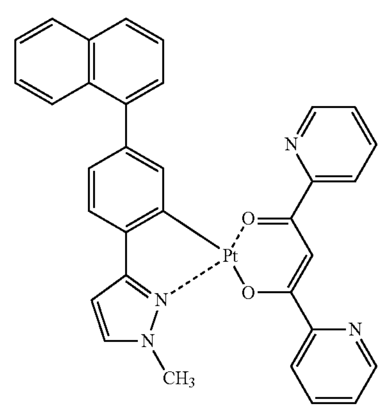

-continued
1-24
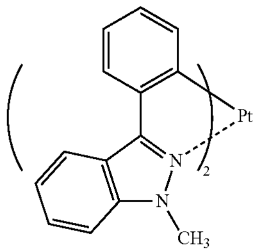
1-25
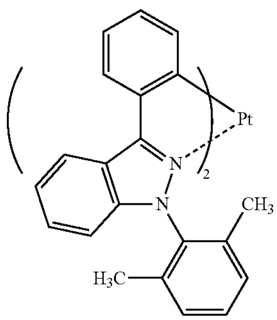
1-26
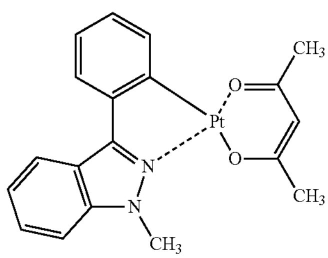
2-1
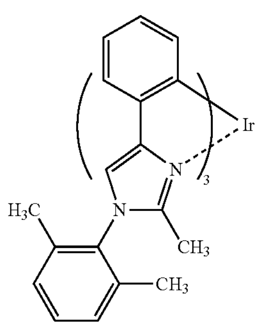
2-2
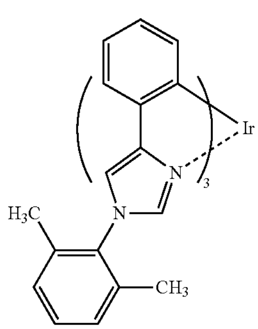
-continued
2-3
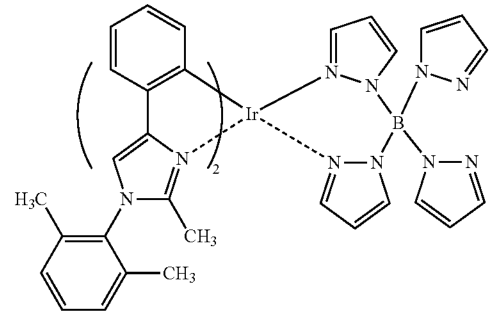
2-4
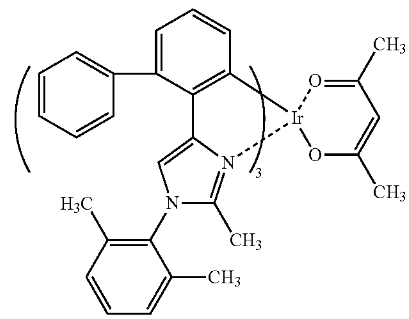
2-5
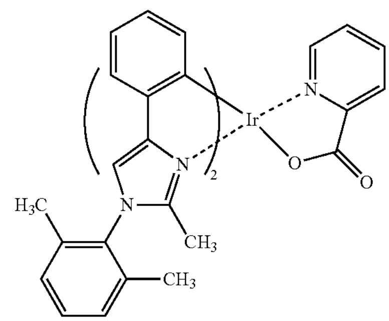
2-6
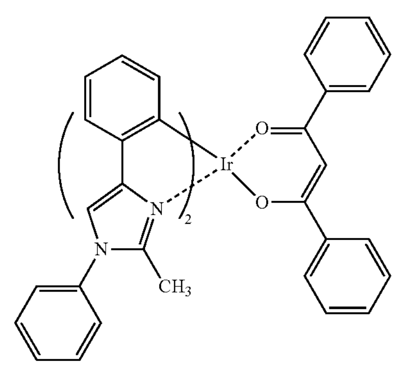
2-7
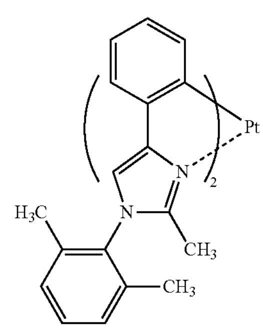

-continued
2-8
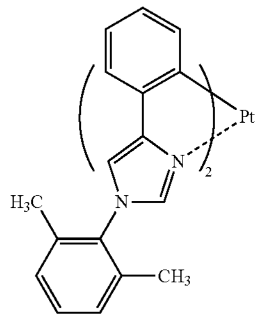
2-9
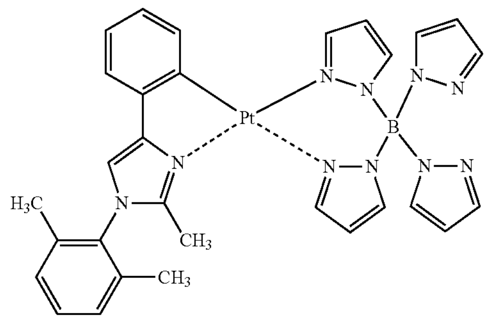
2-10
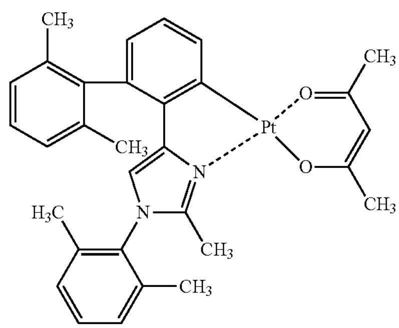
2-11
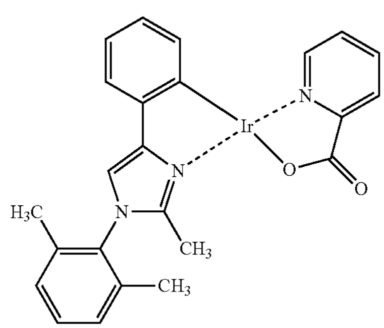
2-12
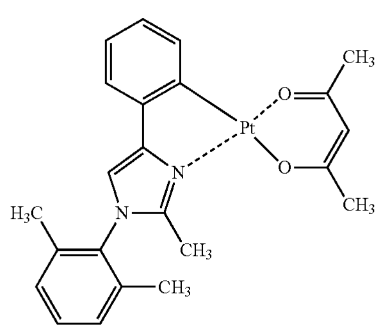
-continued
2-13
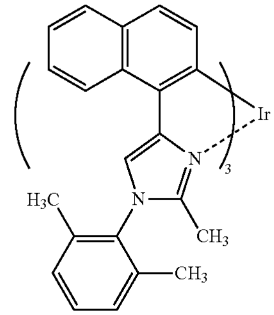
2-14
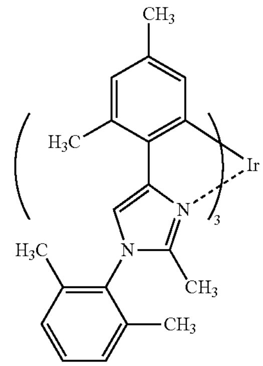
2-15
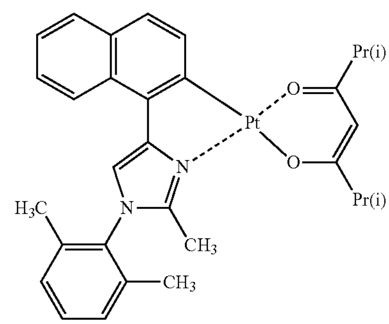
2-16
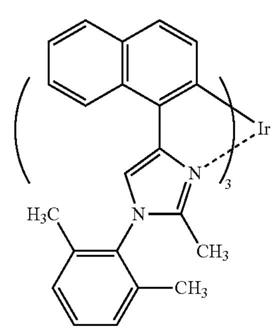

-continued
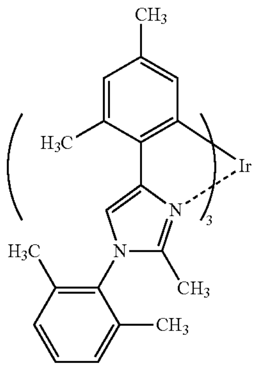
2-17
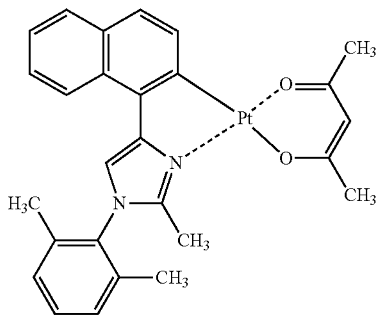
2-18
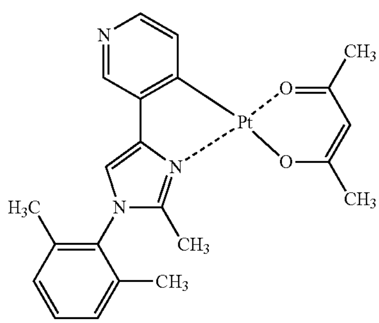
2-19
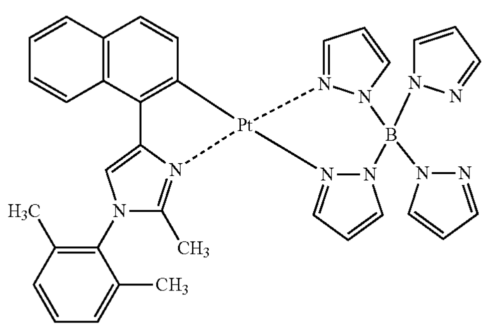
2-20
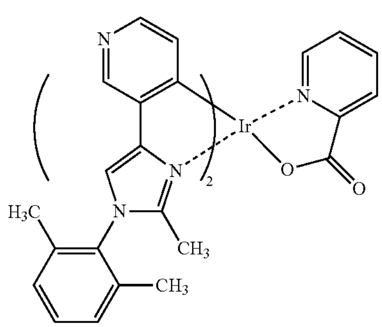
2-21
-continued
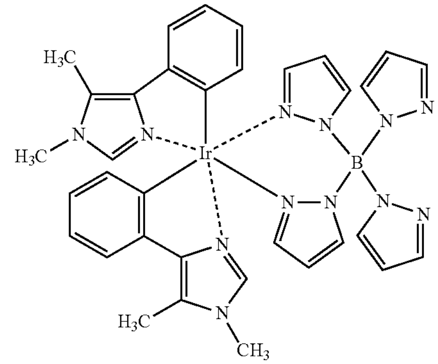
2-22
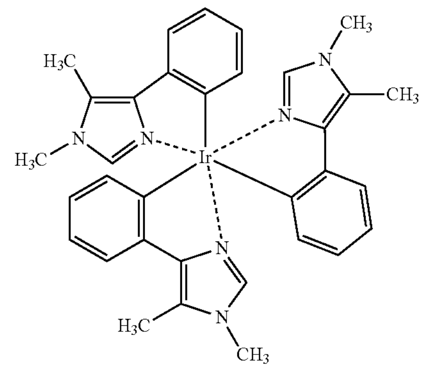
2-23
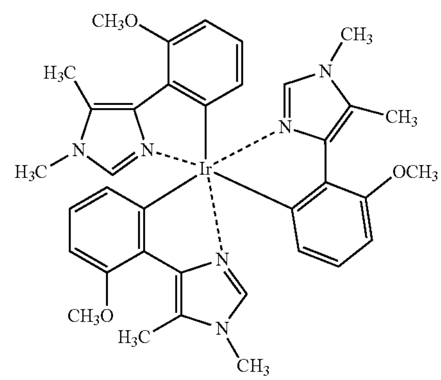
2-24
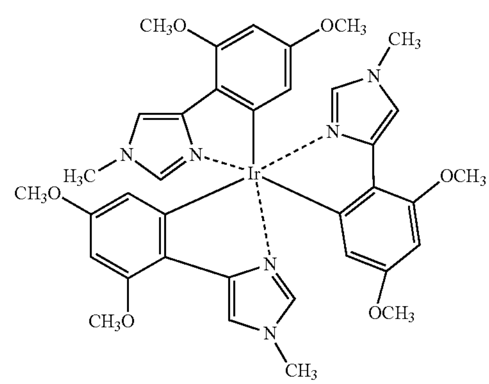
2-25

-continued
2-26
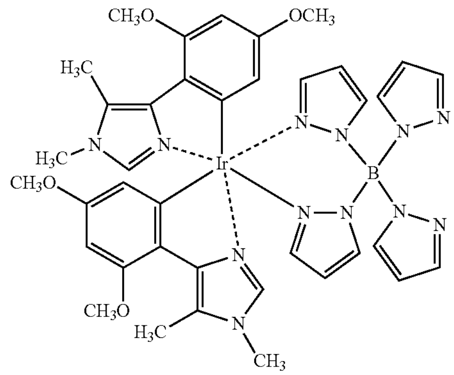
2-27
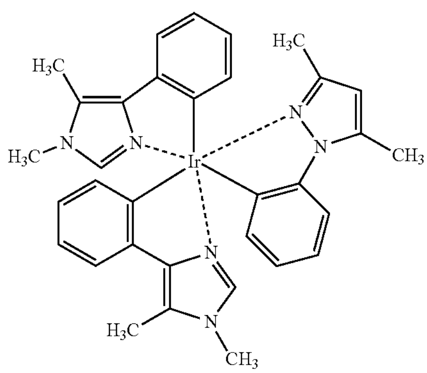
2-28
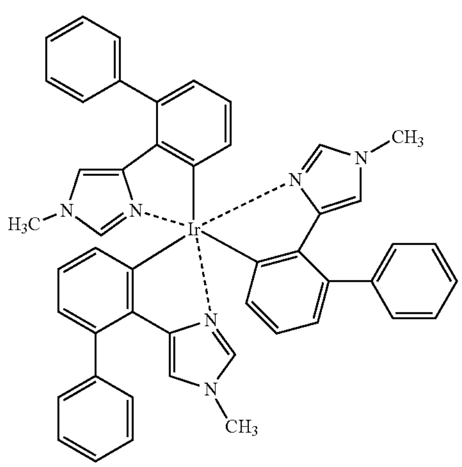
-continued
2-29
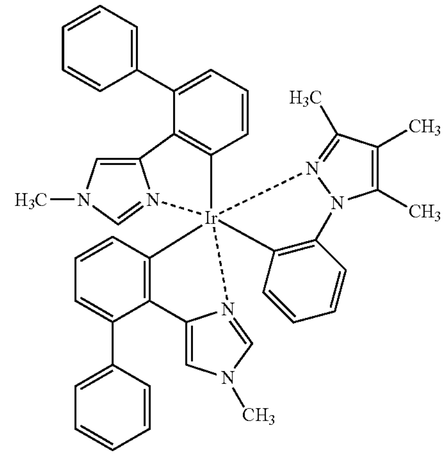
2-30
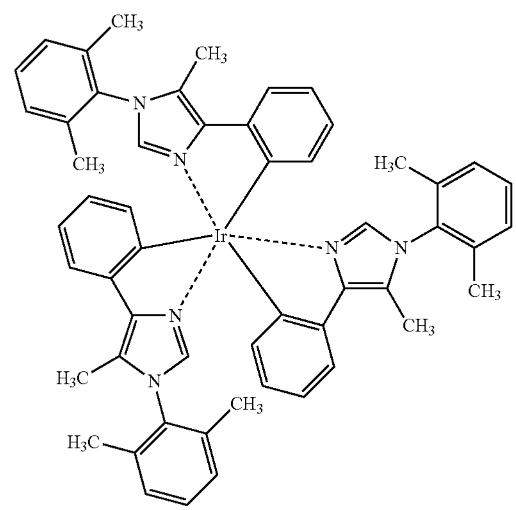
2-31
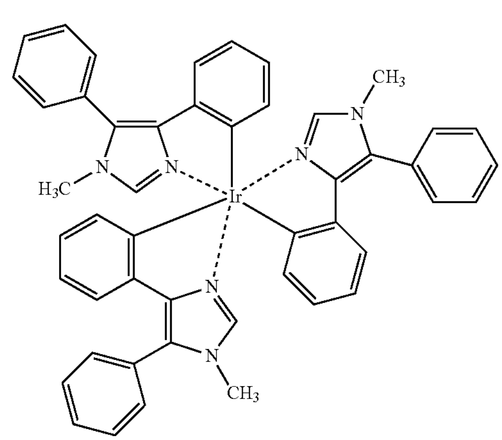

-continued
2-32
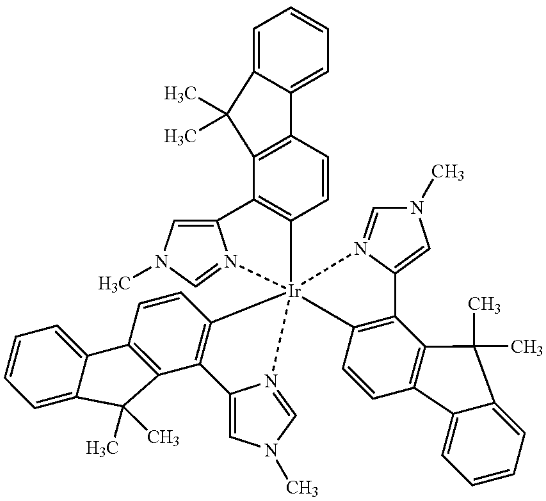
2-33
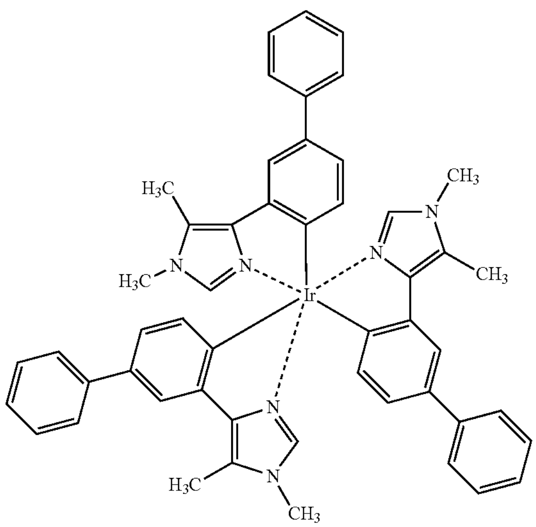
2-34
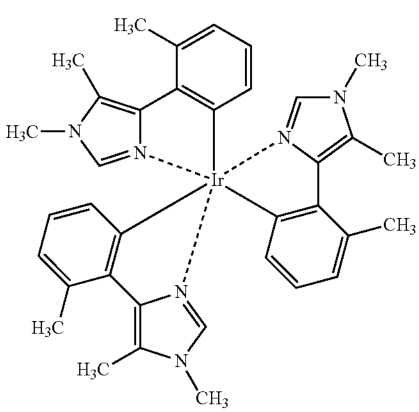
-continued
2-35
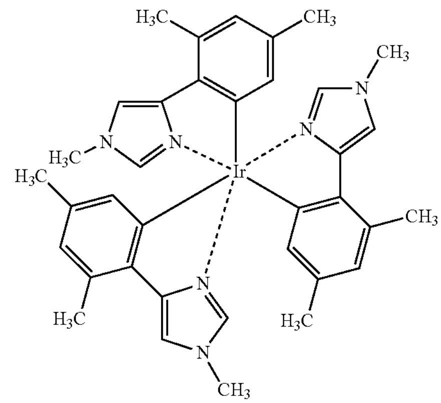
2-36
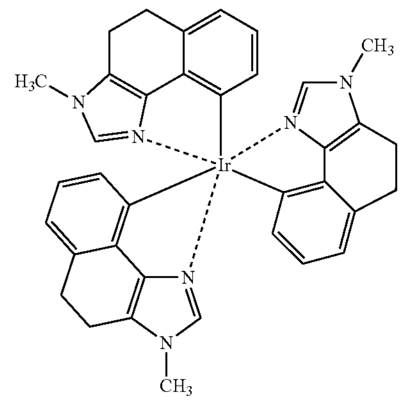
2-37
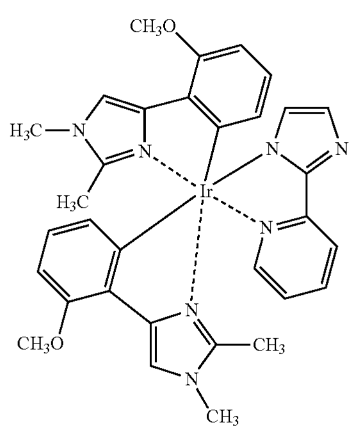

-continued
2-38
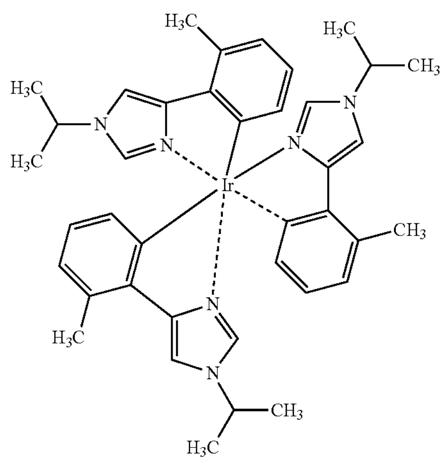
2-39
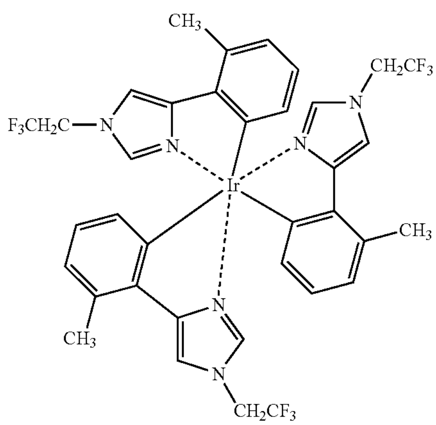
2-40
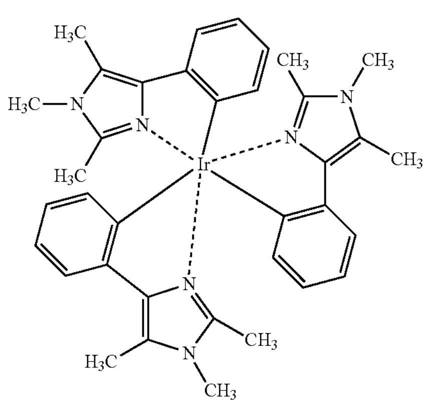
-continued
2-41
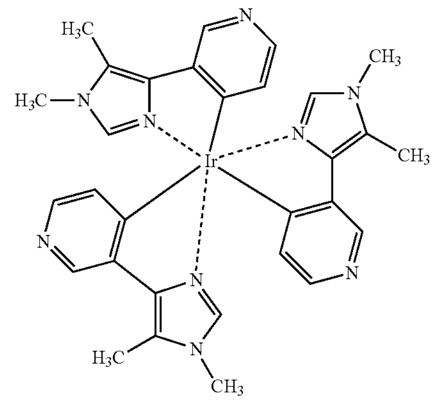
2-42
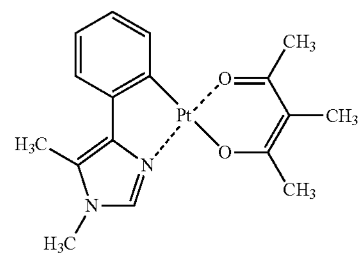
2-43
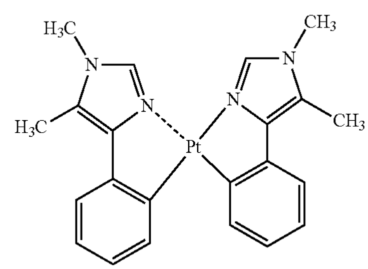
2-44
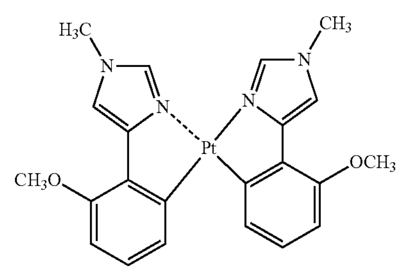
2-45
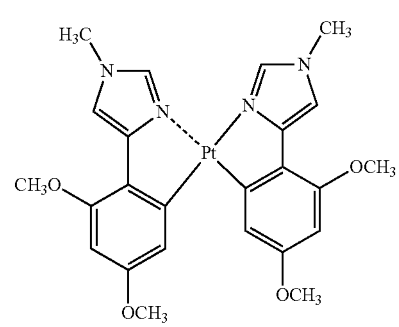

2-46
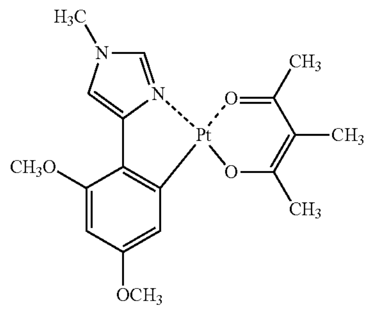
2-47
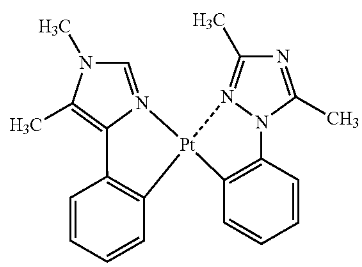
2-48
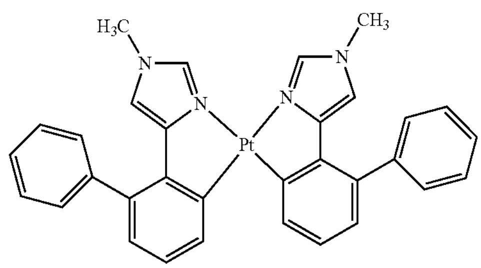
2-49
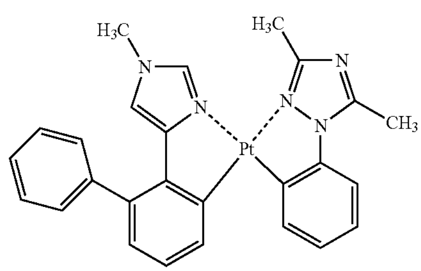
2-50
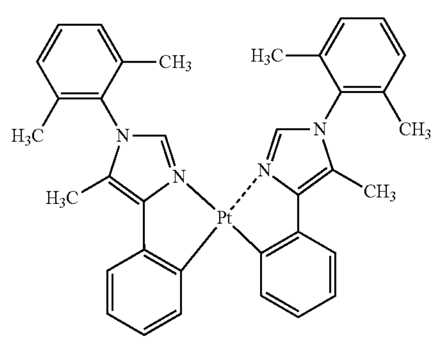
2-51
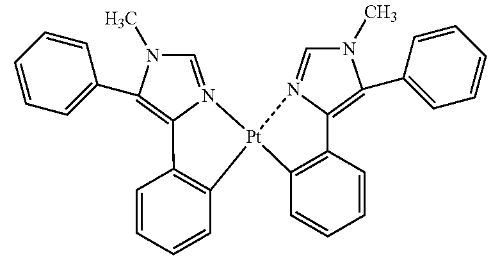
2-52
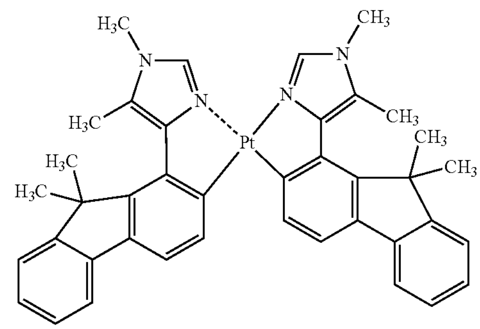
2-53
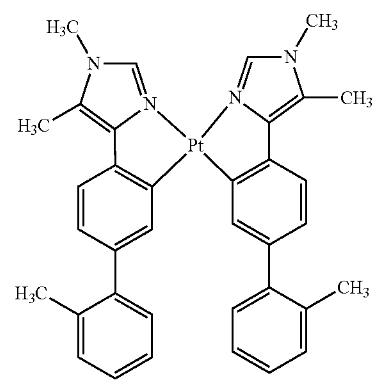
2-54
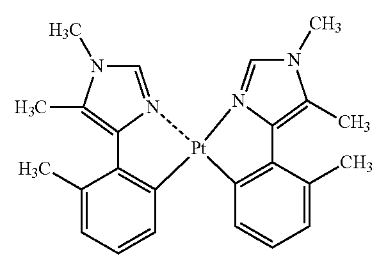
2-55
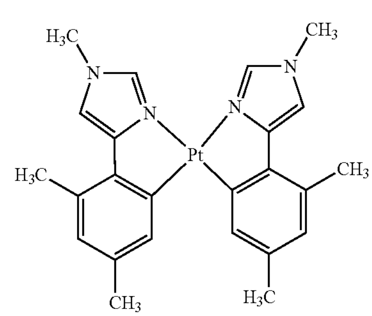

-continued
2-56
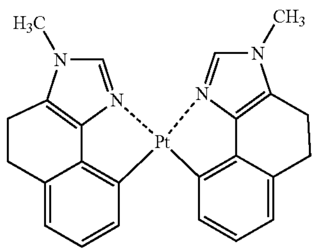
2-57
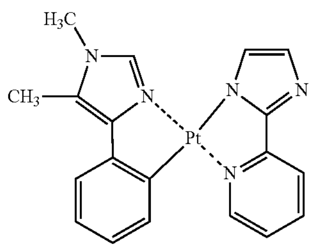
2-58
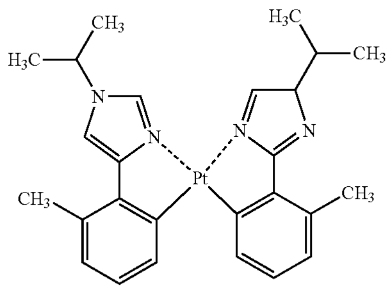
2-59
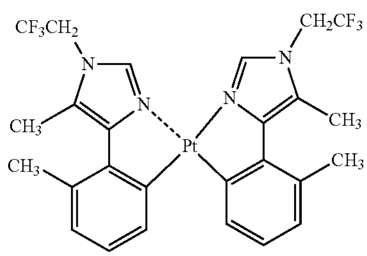
2-60
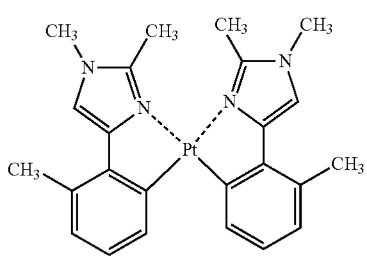
2-61
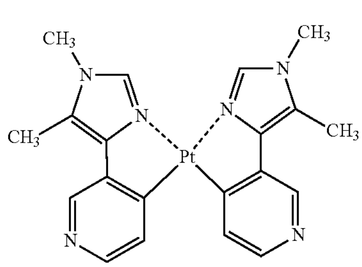
-continued
3-1
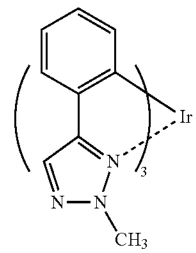
3-2
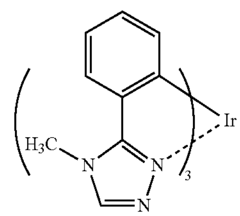
3-3
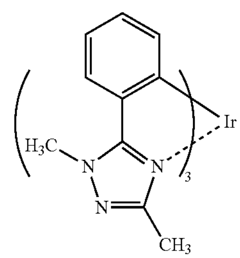
3-4
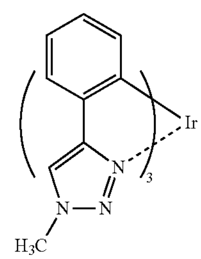
3-5
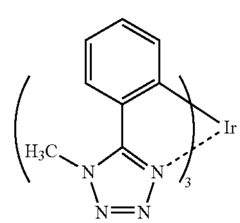
3-6
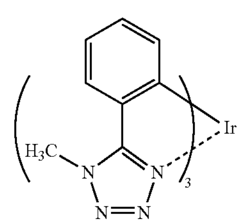

3-7
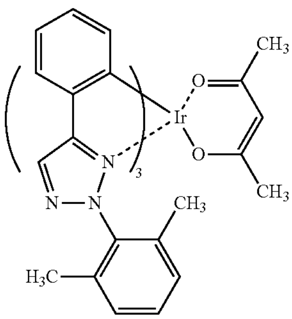
3-8
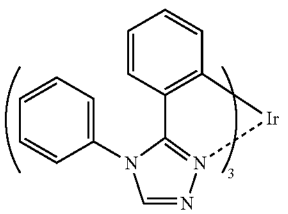
3-9
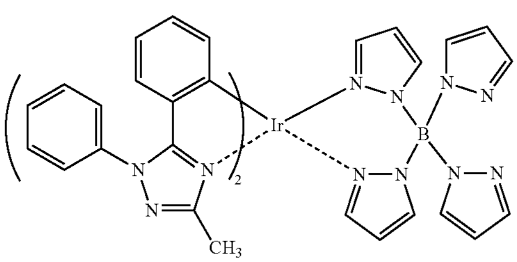
3-10
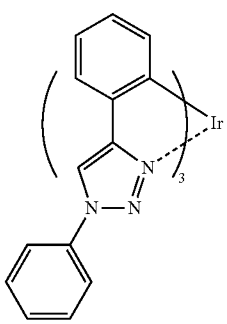
3-11
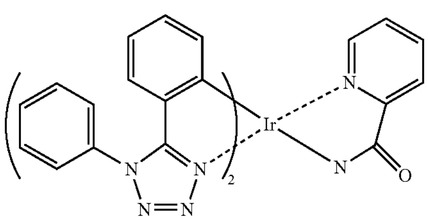
3-12
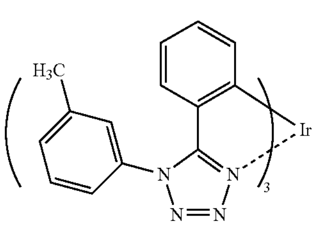
3-13
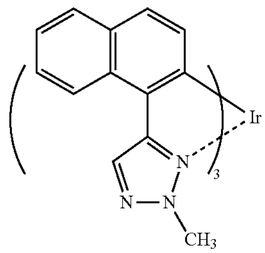
3-14
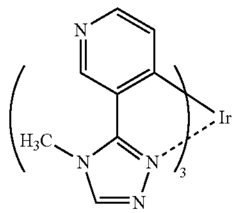
3-15
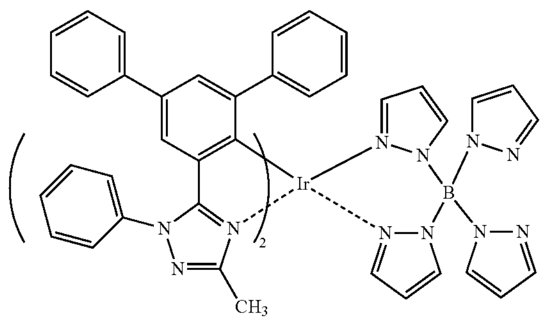
3-16
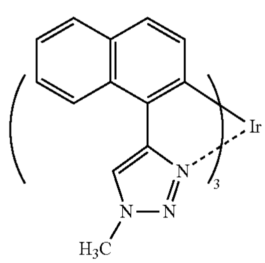
3-17
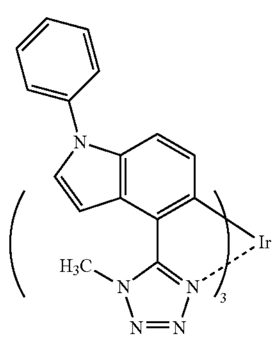

-continued
3-18
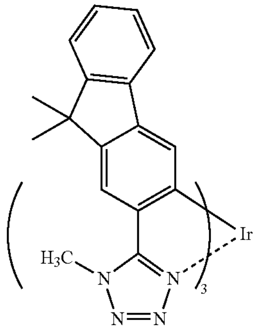
3-19
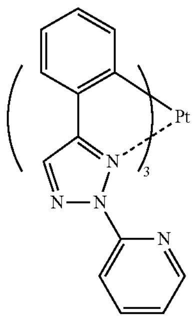
3-20
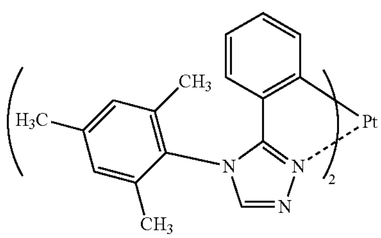
3-21
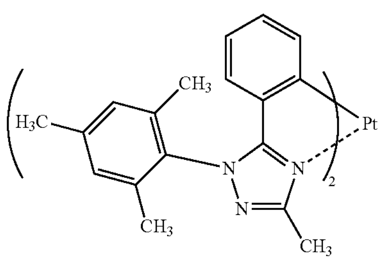
3-22
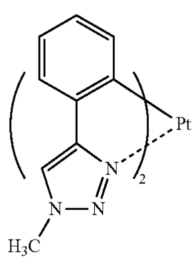
3-23
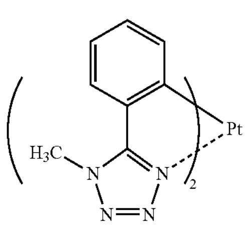
-continued
3-24
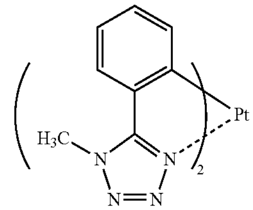
3-25
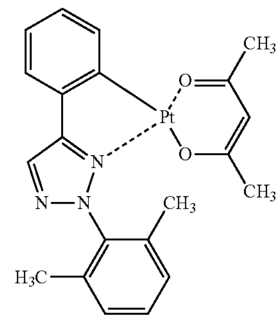
3-26
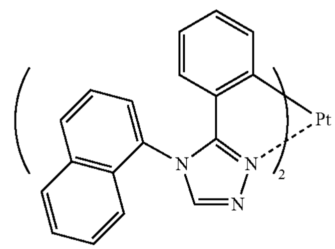
3-27
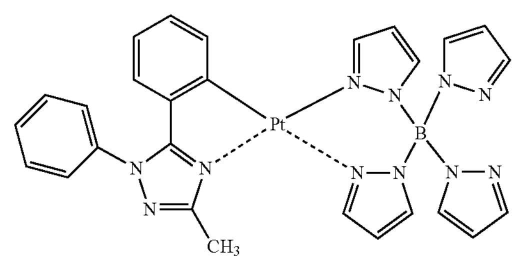
3-28
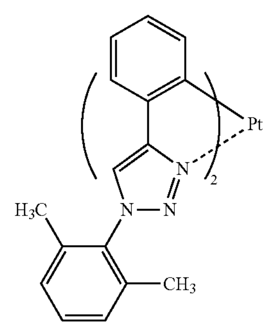
3-29
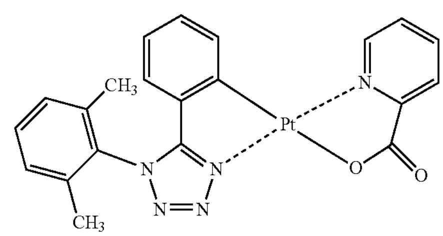

-continued
3-30
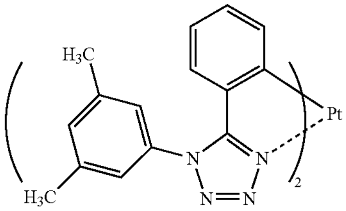
3-31
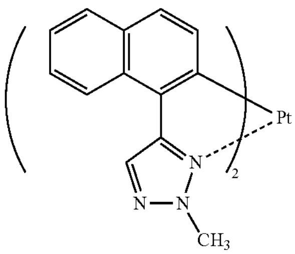
3-32
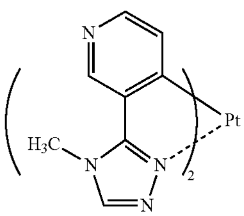
3-33
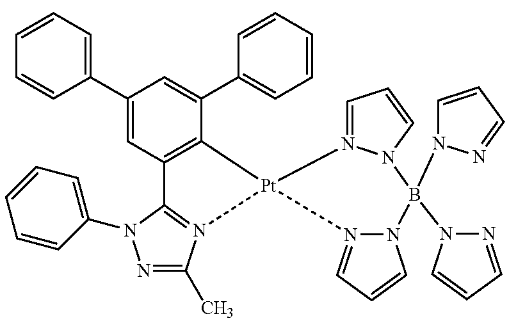
3-34
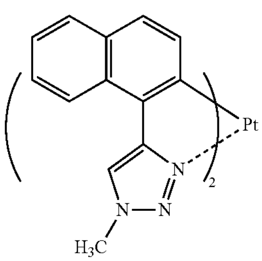
3-35
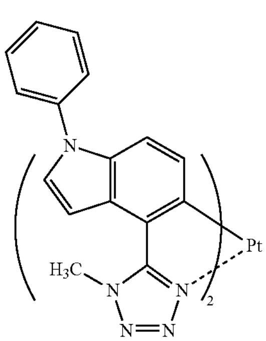
-continued
3-36
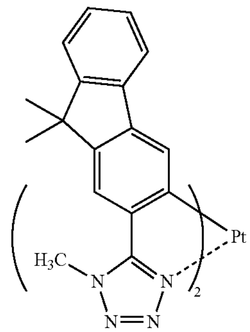
3-37
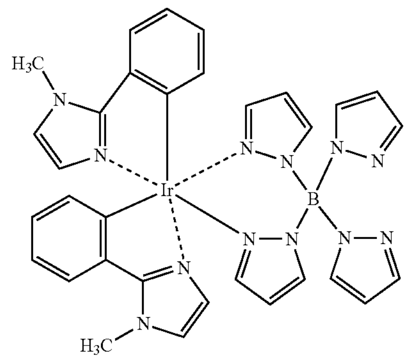
3-38
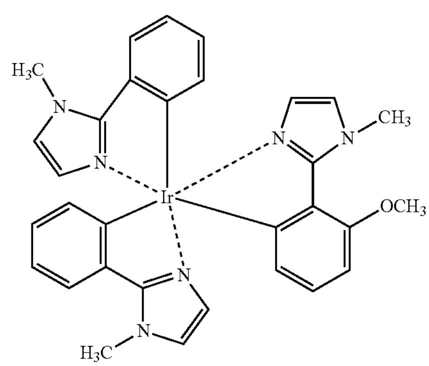
3-39
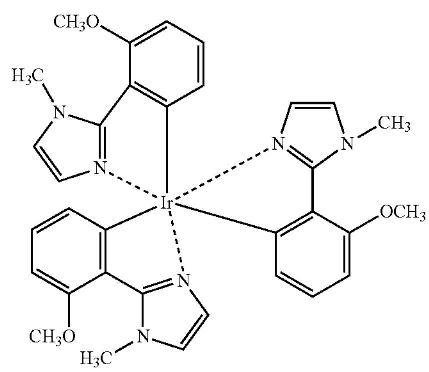

-continued
3-40
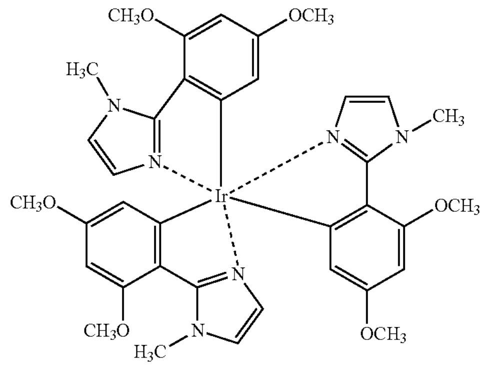
3-41
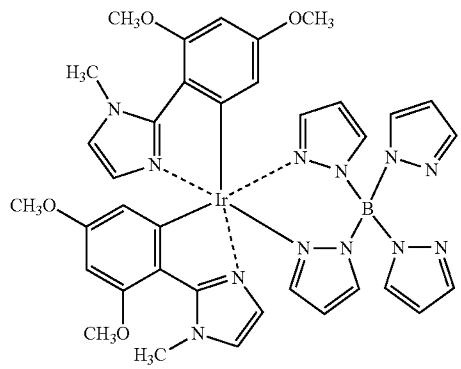
3-42
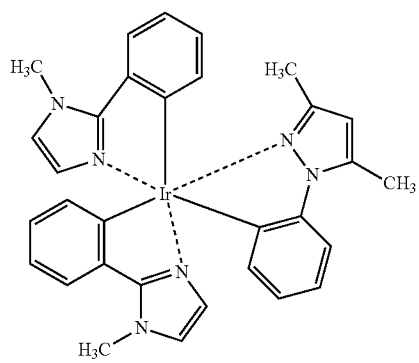
3-43
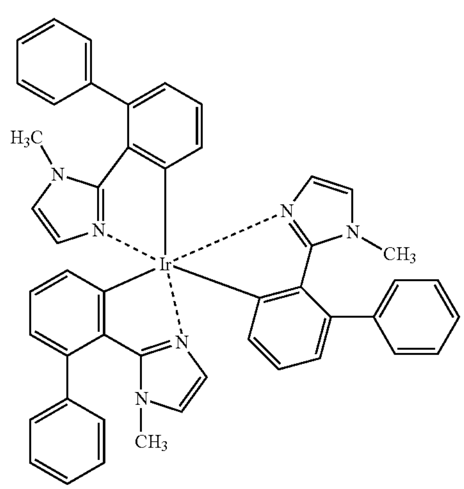
-continued
3-44
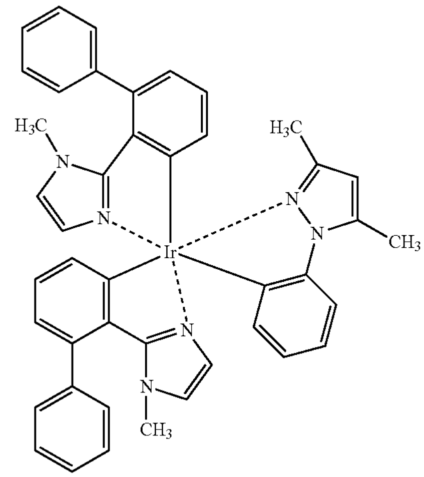
3-45
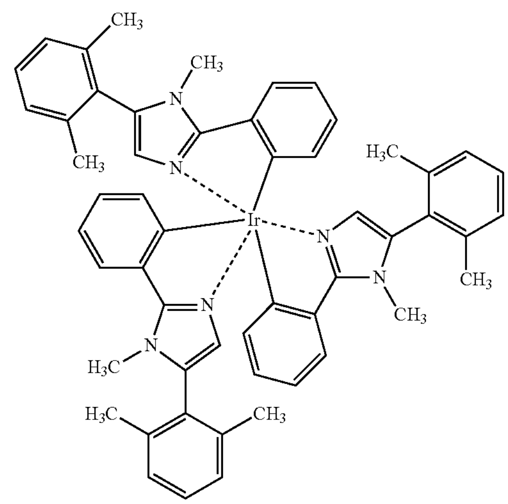
3-46
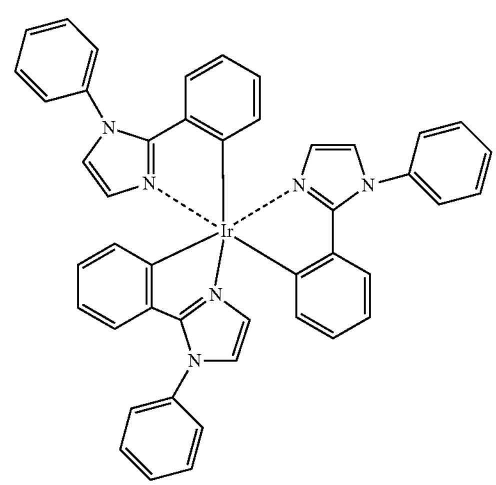

-continued
3-47
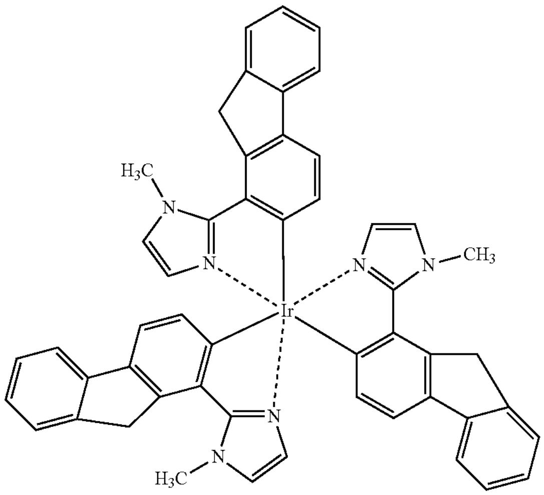
3-48
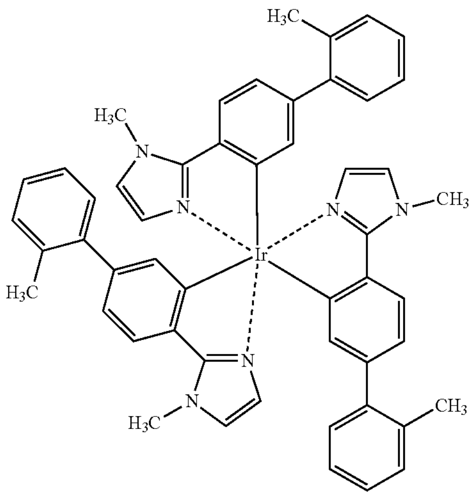
3-49
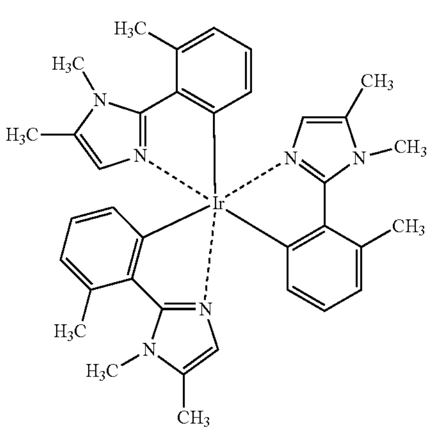
-continued
3-50
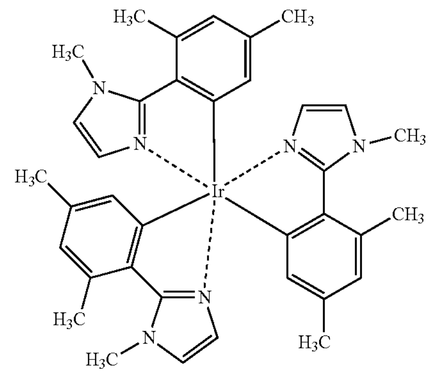
3-51
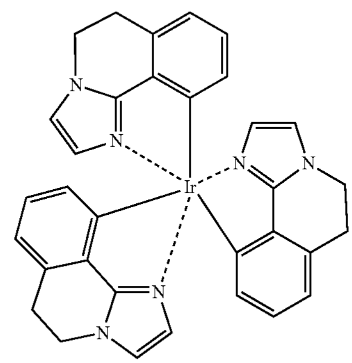
3-52
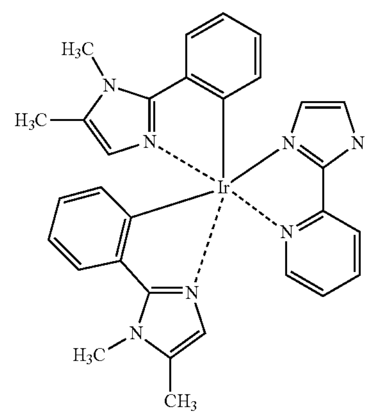
3-53
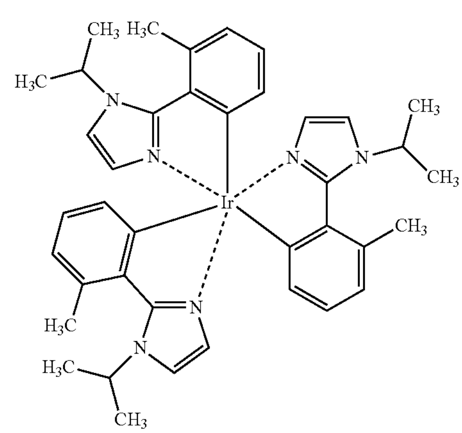

-continued
3-54
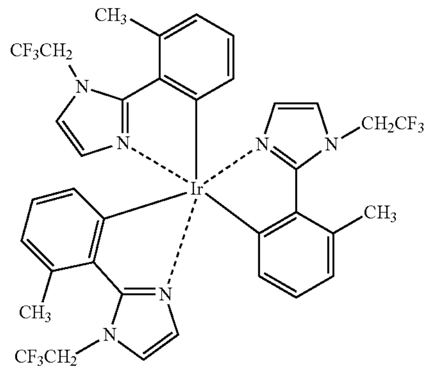
3-55
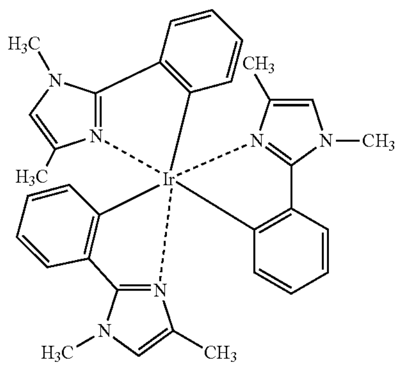
3-56
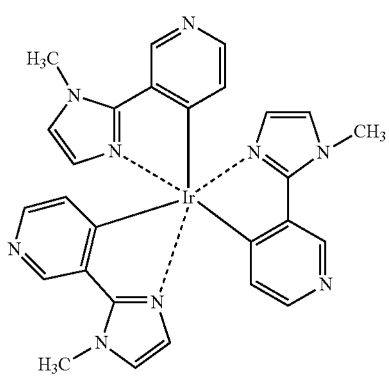
3-57
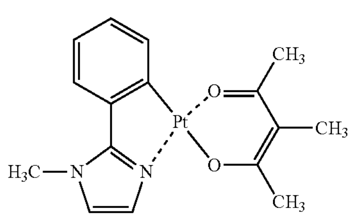
3-58
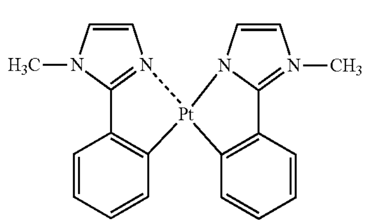
-continued
3-59
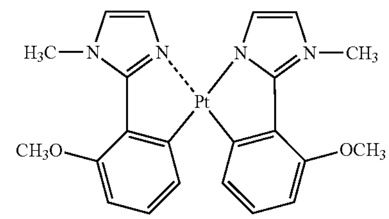
3-60
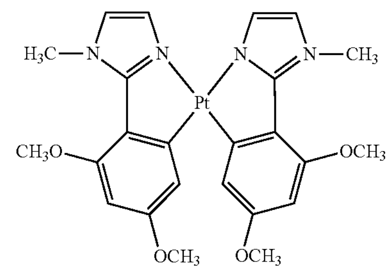
3-61
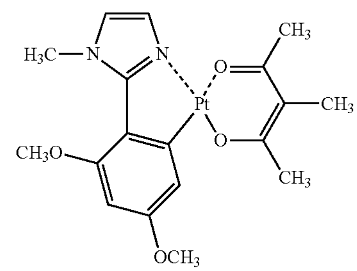
3-62
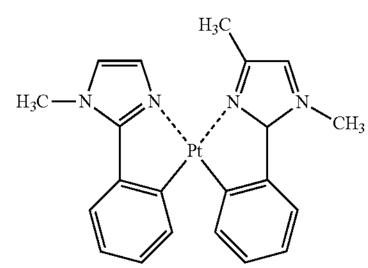
3-63
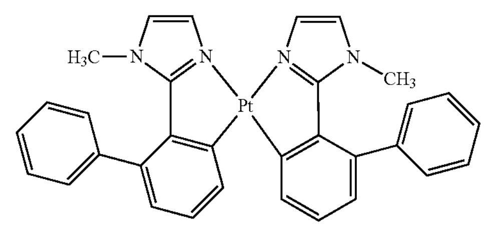
3-64
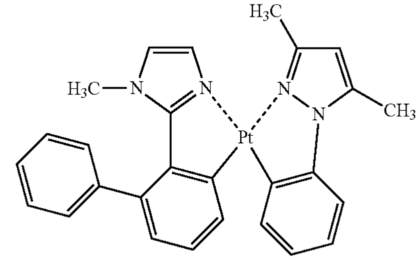

-continued
3-65
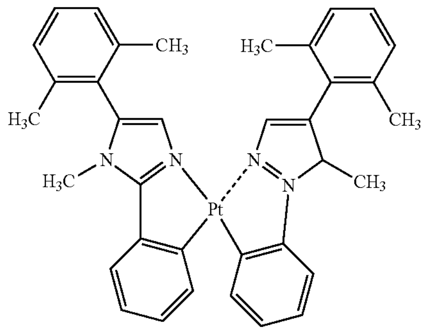
3-66
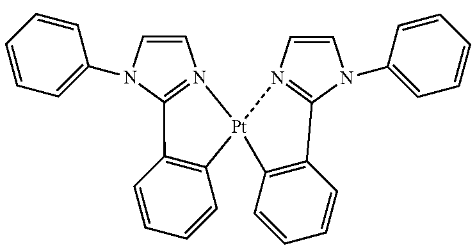
3-67
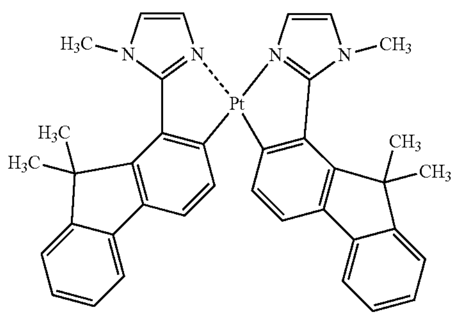
3-68
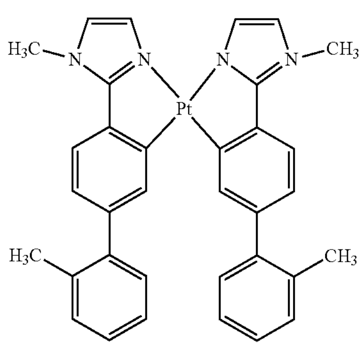
3-69
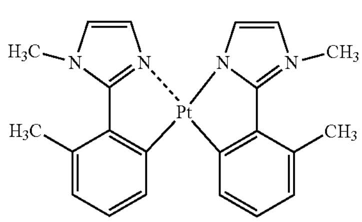
-continued
3-70
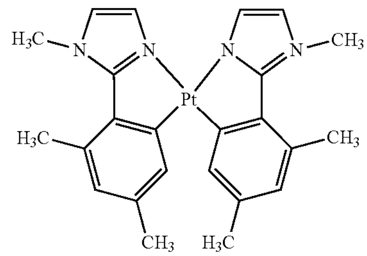
3-71
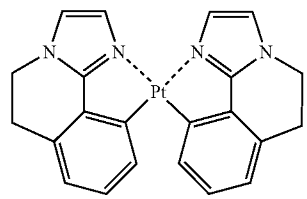
3-72
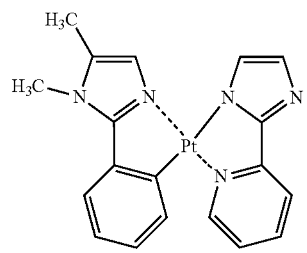
3-73
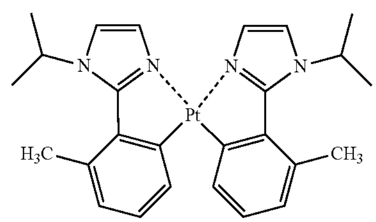
3-74
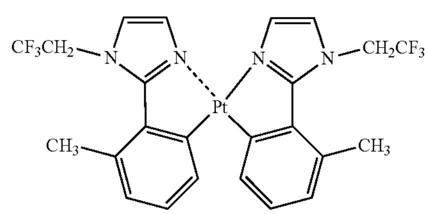
3-75
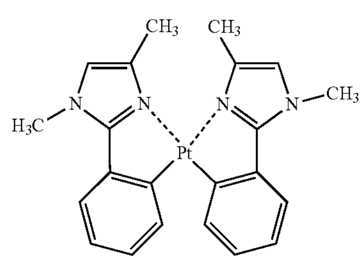
3-76
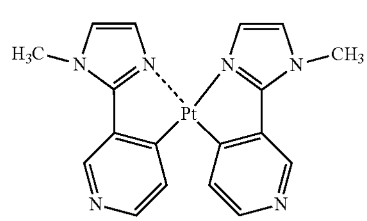

-continued
4-1
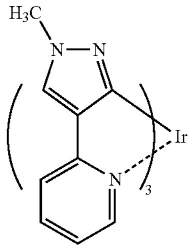
4-2
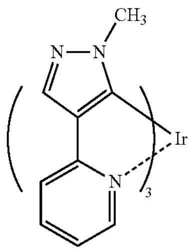
4-3
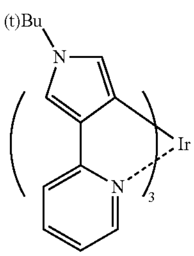
4-4
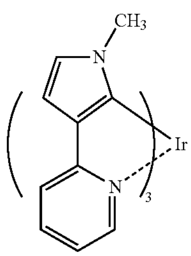
4-5
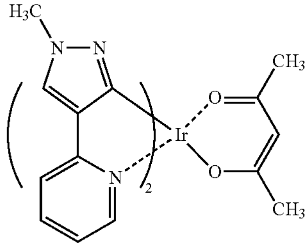
4-6
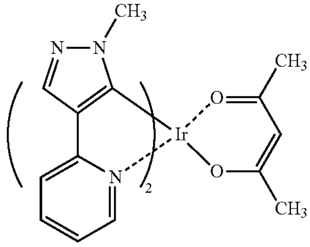
-continued
4-7
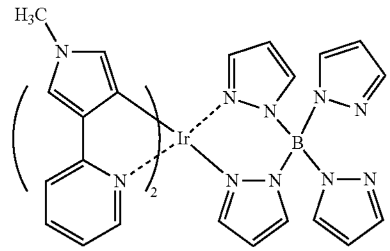
4-8
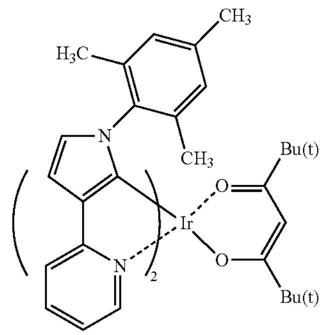
4-9
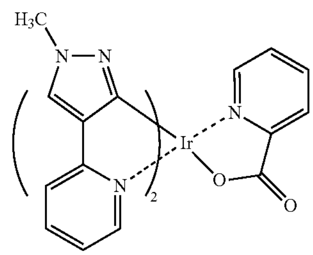
4-10
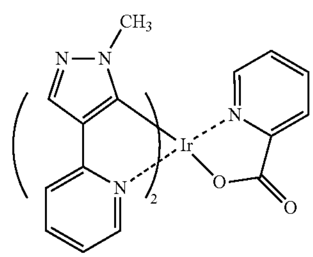
4-11
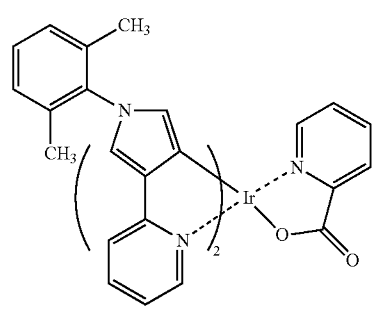

-continued
4-12
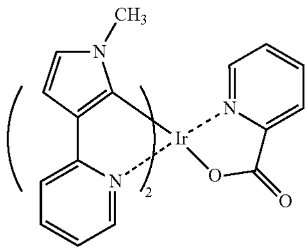
4-13
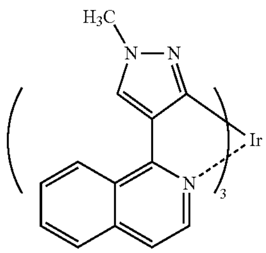
4-14
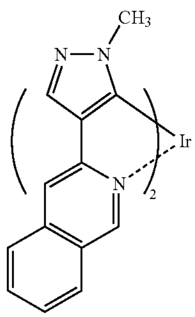
4-15
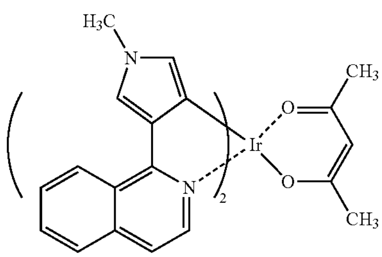
4-16
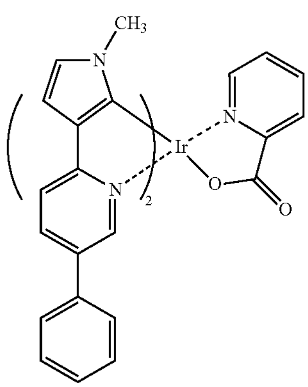
-continued
4-17
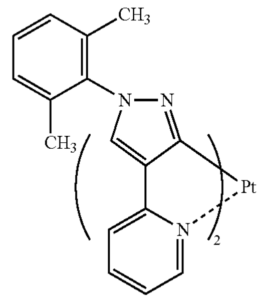
4-18
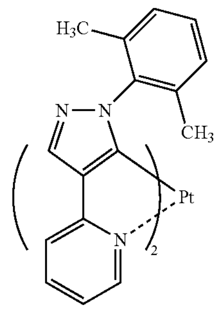
4-19
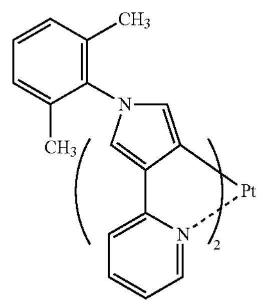
4-20
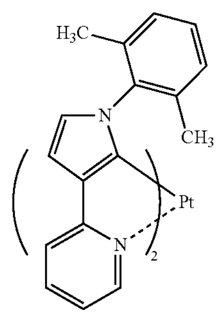
4-21
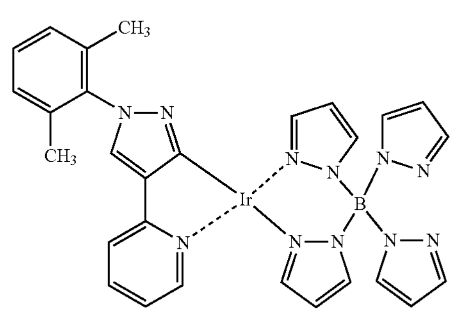

4-22
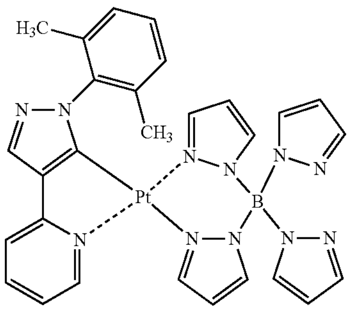
4-23
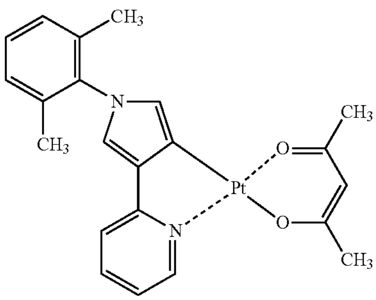
4-24
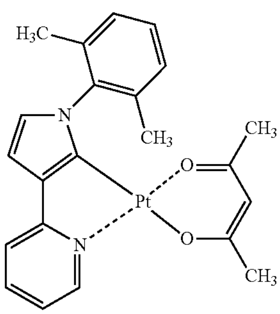
4-25
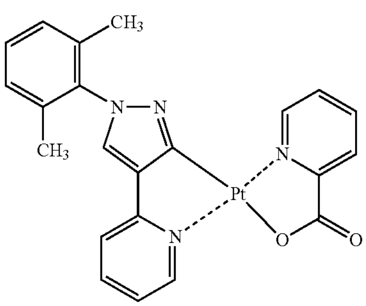
4-26
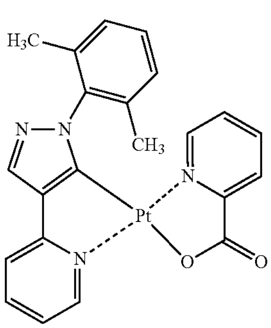
4-27
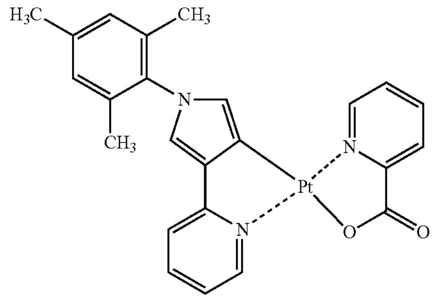
4-28
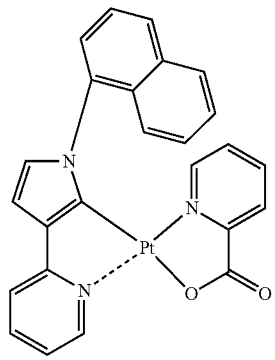
4-29
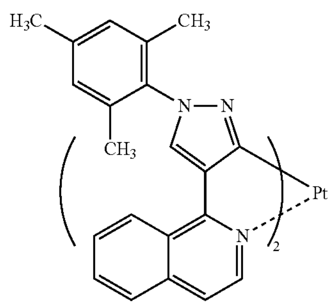
4-30
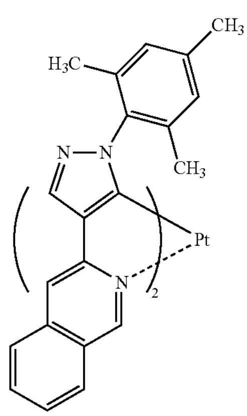

-continued
4-31
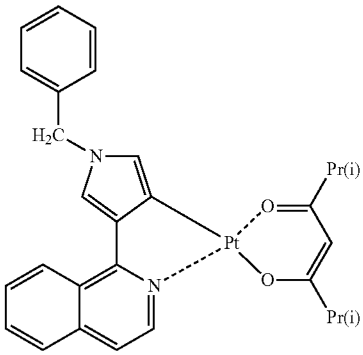
4-32
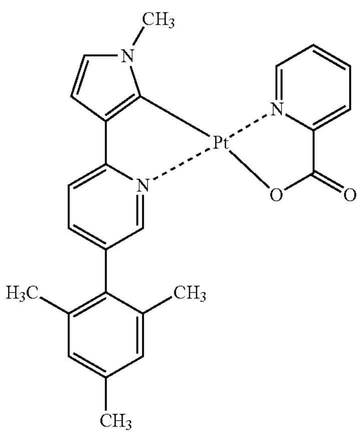
5-1
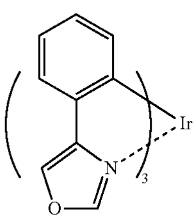
5-2
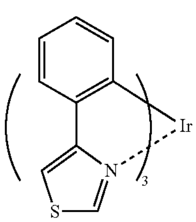
5-3
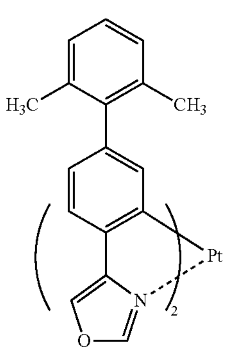
-continued
5-4
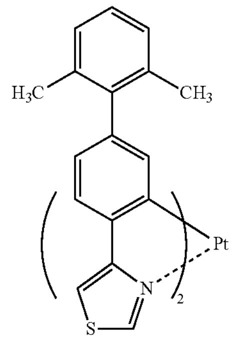
5-5
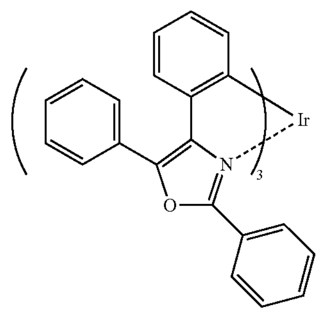
5-6
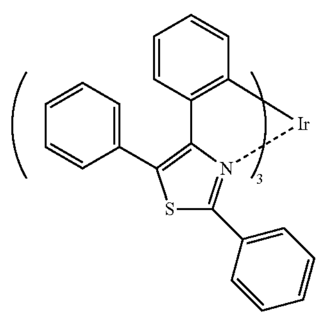
5-7
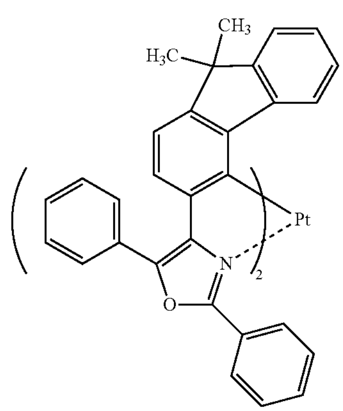

-continued
5-8
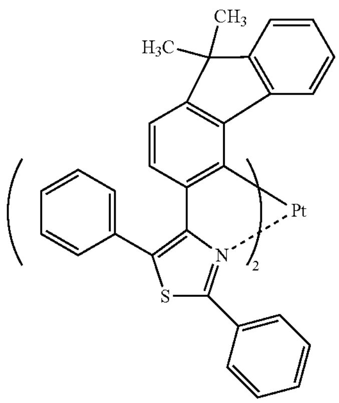
5-9
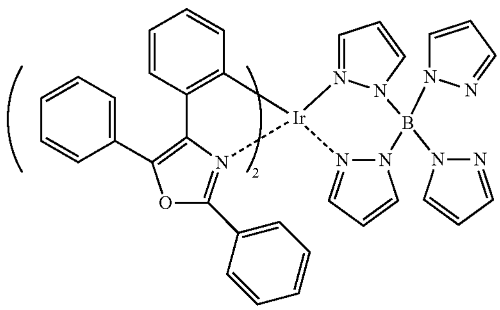
5-10
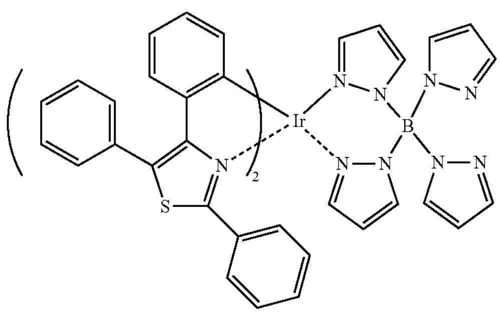
5-11
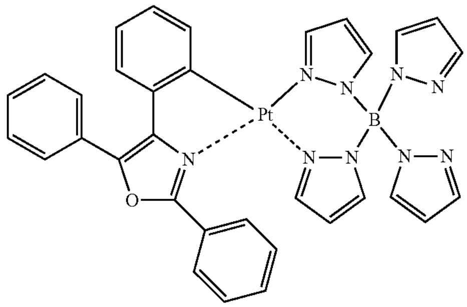
-continued
5-12
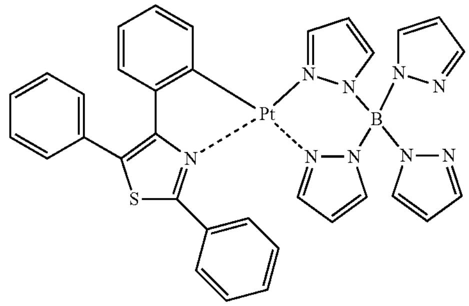
5-13
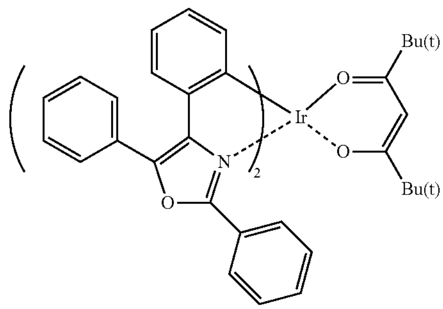
5-14
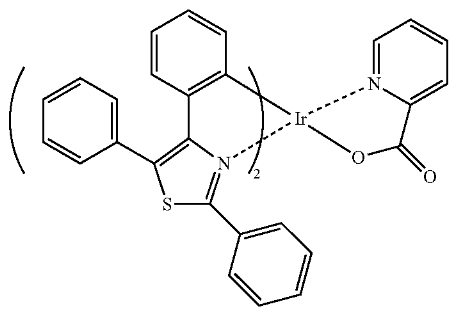
5-15
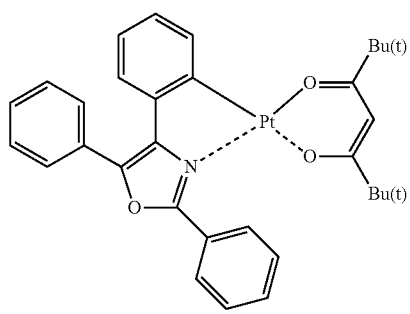
5-16
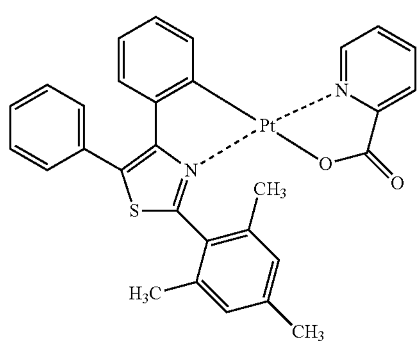

-continued
6-1
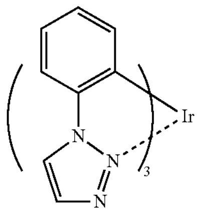
6-2
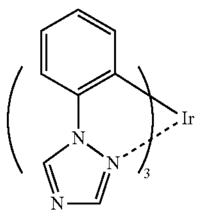
6-3
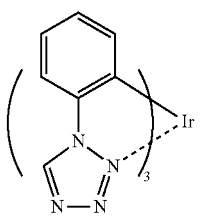
6-4
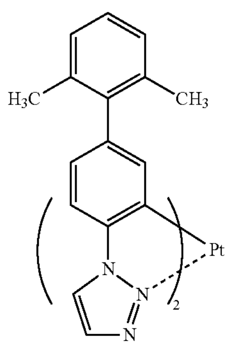
6-5
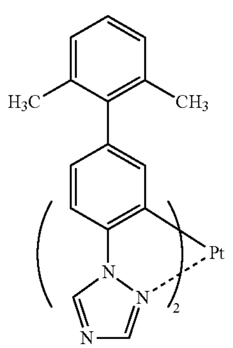
-continued
6-6
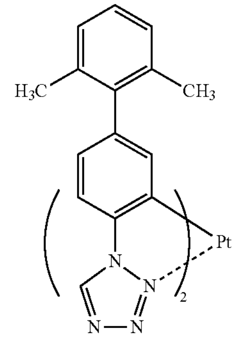
6-7
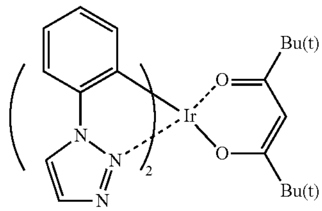
6-8
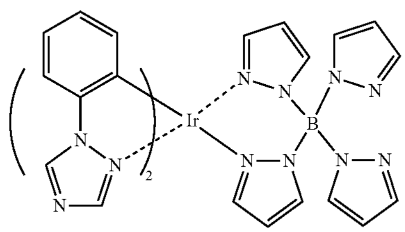
6-9
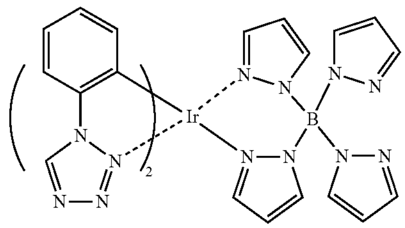
6-10
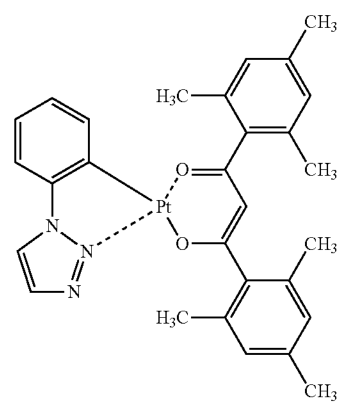

-continued 6-11

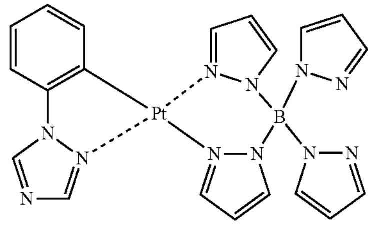

6-12

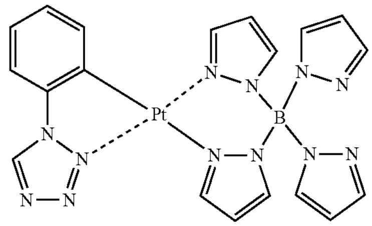

6-13

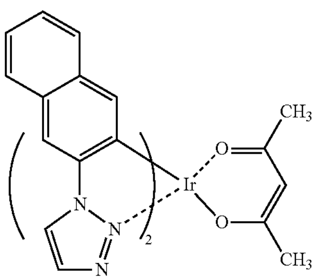

6-14

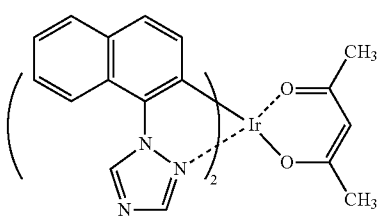

6-15

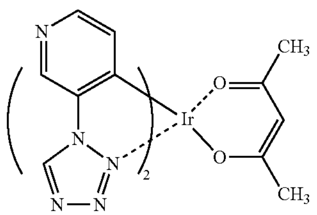

6-16

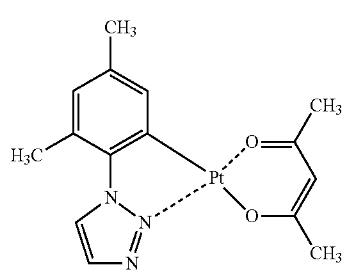

-continued 6-17

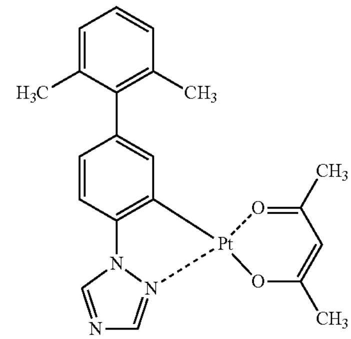

6-18

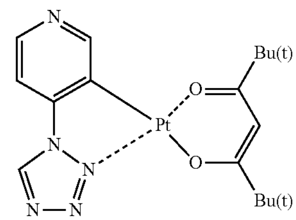

Embodiment (b)

The case in which a platinum complex represented by aforesaid Formula (7) is utilized as a blue light emitting ortho metalated complex.

<Metal Complex Represented by Formula (7)>

A platinum complex represented by Formula (7) according to the present invention will now be explained.

In Formula (7), $R_1$, $R_2$, $R_3$, $R_4$, $R_5$, $R_6$ and $R_7$ are a hydrogen atom or a substituent, however, at least of them is necessarily a substituent. Even in the case that at least two of $R_1$, $R_2$, $R_3$, $R_4$, $R_5$/$R_6$ and $R_7$ are substituents, they never form a ring by bonding to each other. Further, Ra is a substituent, and Xa is an oxygen atom or a sulfur atom.

In Formula (7), a substituent represented by aforesaid Ra is not specifically limited and includes an alkyl group (such as a methyl group, an ethyl group, an isopropyl group and a tert-butyl group), a cycloalkyl group (such as a cyclohexyl group, a cyclopentyl group and a cyclopropyl group), an alkenyl group (such as a vinyl group, an allyl group and a 2-butenyl group), an alkynyl group (such as an ethynyl group and a propynyl group), an aryl group (such as a phenyl group, a 2-naphthyl group, a 2-pyridyl group, a 2-thienyl group and a 3-furyl group) and a heterocyclic group (a N-morpholyl group and a 2-tetrahydrofuranyl group).

Among them, Ra is preferably an alkyl group having a carbon number of 1-30, and Ra-Xa- is preferably an alkoxy group or an alkylthio group.

Further, a substituent represented by aforesaid $R_1$-$R_7$ includes, for example, an alkyl group (such as a methyl group, an isopropyl group and a t-butyl group), a cycloalkyl group (such as a cyclopentyl group and a cyclopropyl group), an alkenyl group (such as vinyl group, an allyl group and a 2-butenyl group), an alkynyl group (such as ethynyl group and a propynyl group), an aryl group (such as a phenyl group, a 2-naphthyl group, a 9-phenanthryl group, a 2-pyridyl group, a mesityl group, a carbazolyl group, a fluorenyl group, a 2-thienyl group and a 3-furyl group), a heterocyclic group (such as a N-morpholyl group and a 2-tetrahydrofuranyl group), an amino group, an alkylamino group (such as dimethylamino group and a diphenylamino group), a halogen atom (such as a fluorine atom, a chlorine atom, a bromine atom and an iodine atom), an alkoxy group (such as a methoxy group, an ethoxy group and an isopropoxy group), an aryloxy group (such as a phenoxy group and a perfluorophenoxy group), an acylamino group (such as an acetamido group and a benzoylamido group), a sulfonamido group (such as a methanesulfonamido group, a butanesulfonamido group and a benzenesulfonamido group), a carboalkoxy group (such as a carboethoxy group), an aryloxy carbonyl group (such as a phenoxy carbonyl group), an acyloxy group (such as an acetoxy group and a benzoyloxy group), an alkylthio group (such as a methylthio group), a cyano group and a fluorohydrocarbon group (such as a trifluoromethyl group and a pentafluorophenyl group).

In Formula (7), $Y_1$-$L_2$-$Y_2$ is a bidentate ligand; $Y_1$ and $Y_2$ each independently are an oxygen atom, a nitrogen atom, a carbon atom or a sulfur atom; and $L_1$ together with $Y_1$ and $Y_2$ is an atomic group necessary to form a bidentate ligand.

Specific examples of a bidentate ligand represented by $Y_1$-$L_2$-$Y_2$ are not specifically limited; however, are preferably derivatives of such as phenylpyridine, acetic acid, acetyl acetone, a thiocarbamic acid derivative, 2-acylphenol and picolinic acid, which may be provided with a substituent.

Further, as at least one substituent, which is preferably introduced at 3p-6p positions of the aforesaid structure together with such as the aforesaid alkoxy group and alkylthio group and not to form a ring by bonding to each other, is a group represented by $R_1$, $R_2$, $R_3$ and $R_2$ in Formula (7), and at least one of the substituents represented by $R_1$-$R_4$ is preferably an electron donating substituent. Further, more preferable are the case in which at least two types are electron donating substituents.

Further, most preferable is the case, in which $R_2$ and $R_4$ in Formula (7) are electron donating substituents.

As an electron donating substituent among the aforesaid groups includes an alkyl group, an alkoxy group and an alkylamino group.

Next, preferable as these substituents are a halogen atom and more preferably a fluorine atom among them. It is considered that since a fluorine atom has a π doner property, it may work like an electron doner, the effect of which can provide preferable element abilities.

In the following, with respect to a platinum complex represented by aforesaid Formula (7) utilized in the present invention, specific examples will be listed, however, the present invention is not limited thereto.

1

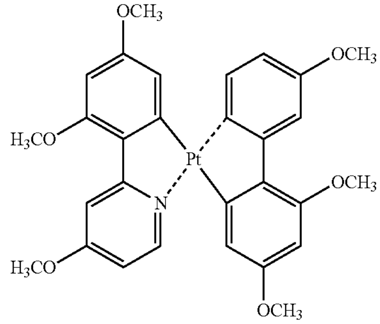

-continued

2

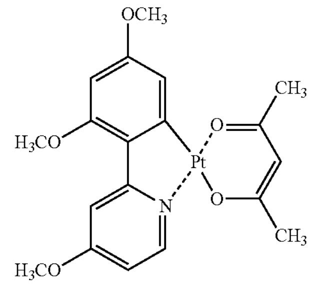

3

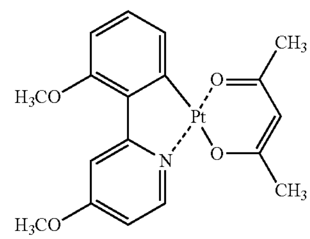

4

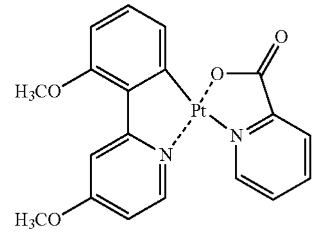

5

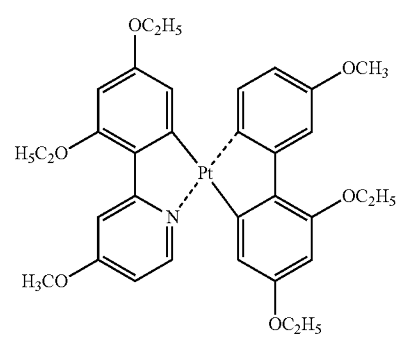

6

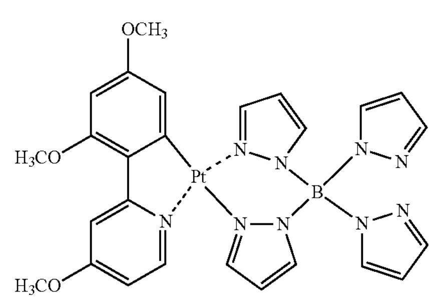

-continued
7
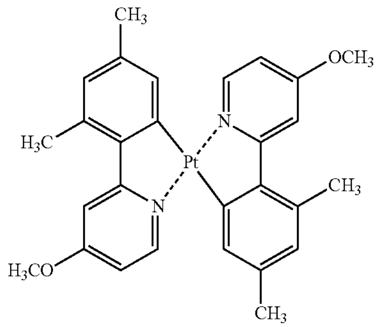
8
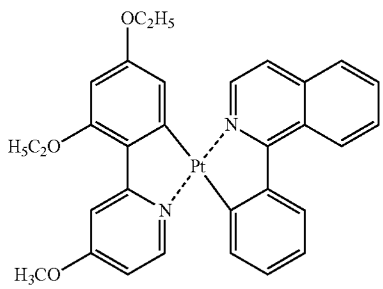
9
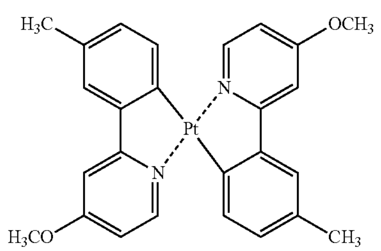
10
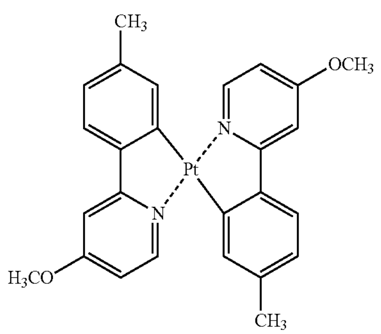
11
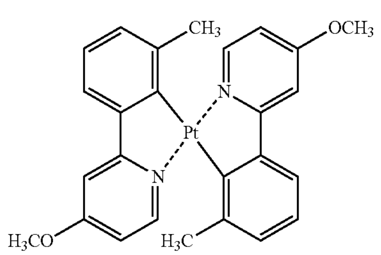
-continued
12
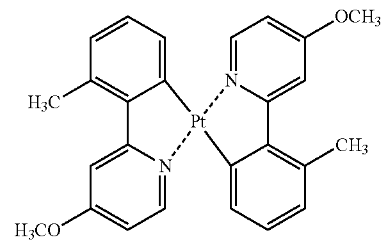
13
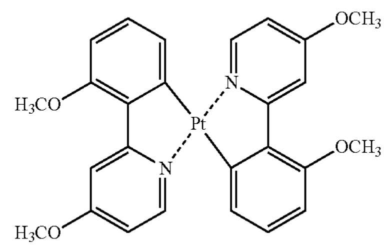
14
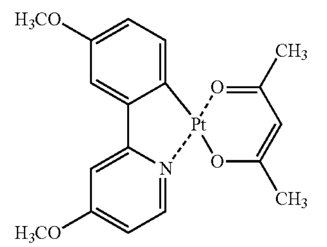
15
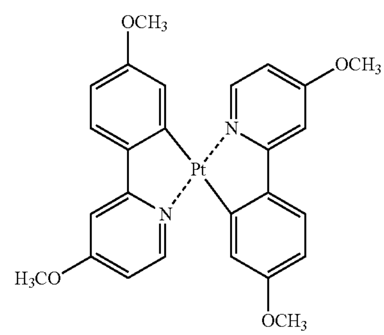
16
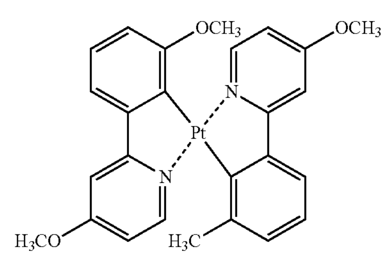
17
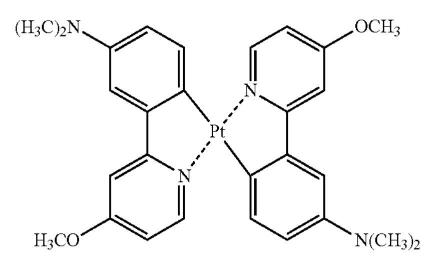

-continued
18
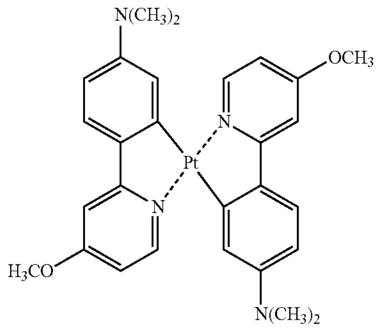
19
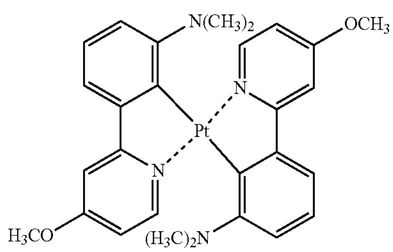
20
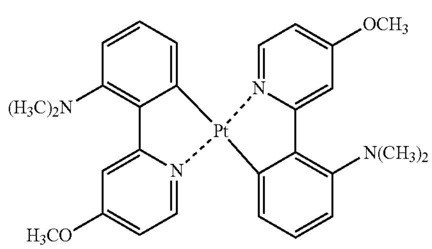
21
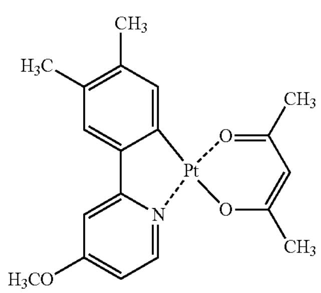
22
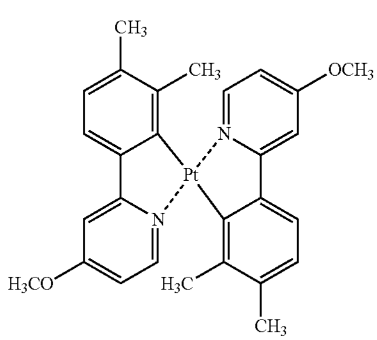
-continued
23
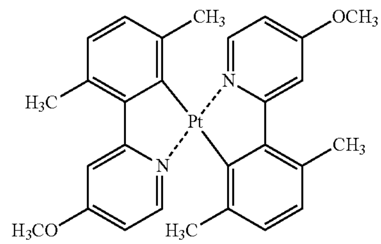
24
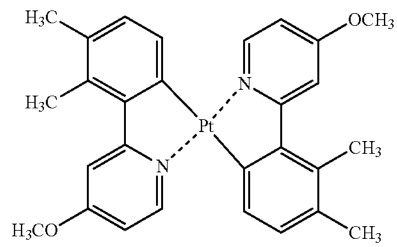
25
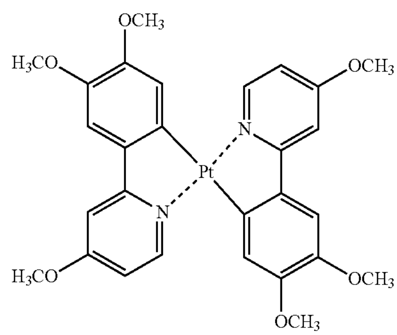
26
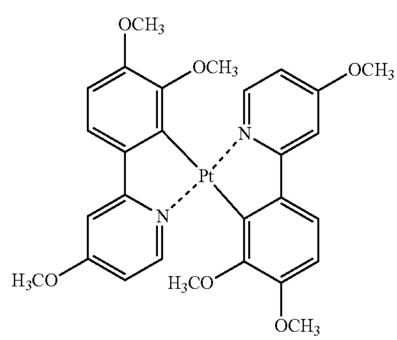
27
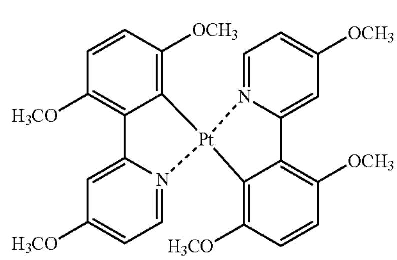

-continued
28
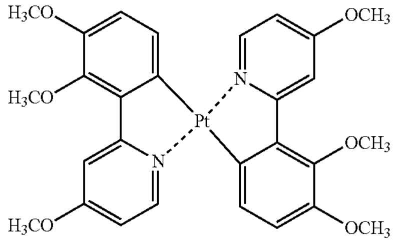
29
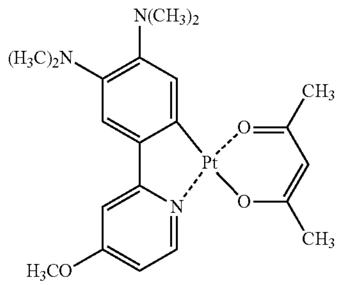
30
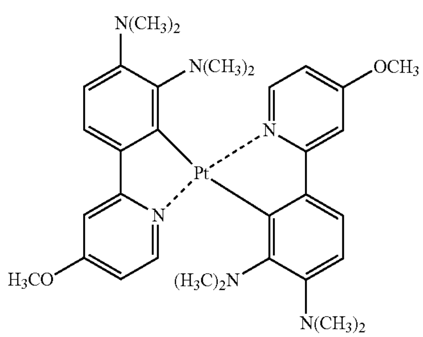
31
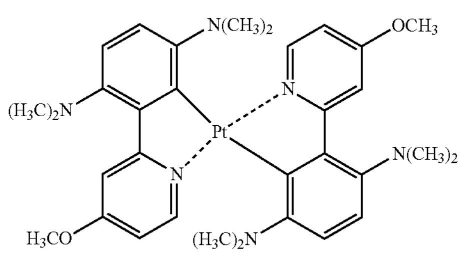
32
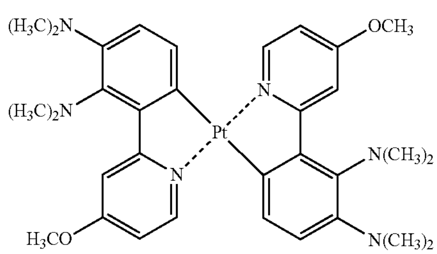
-continued
33
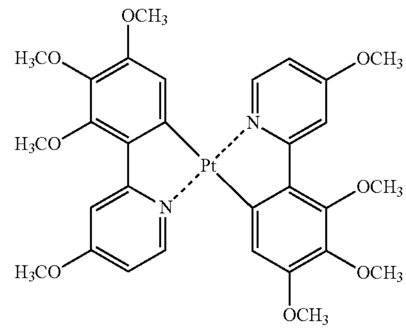
34
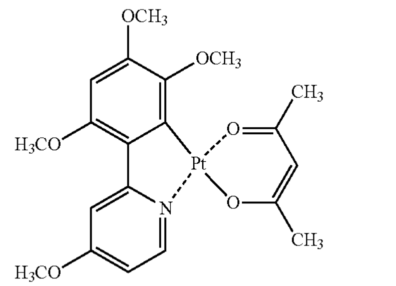
35
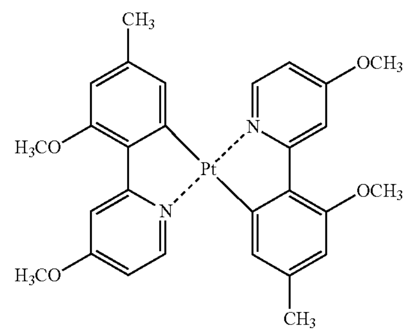
36
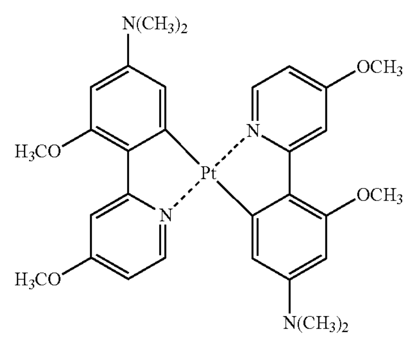
37
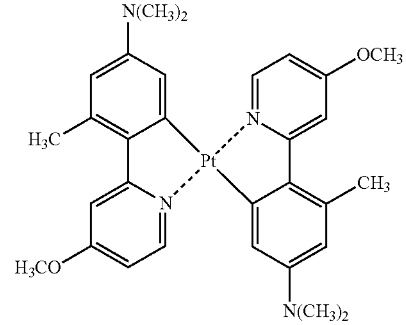

-continued
38
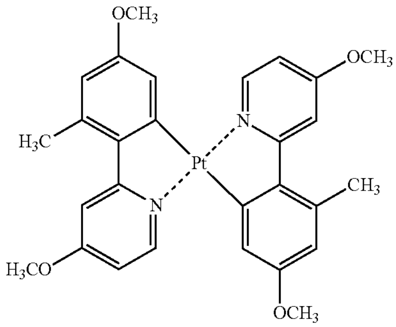
39
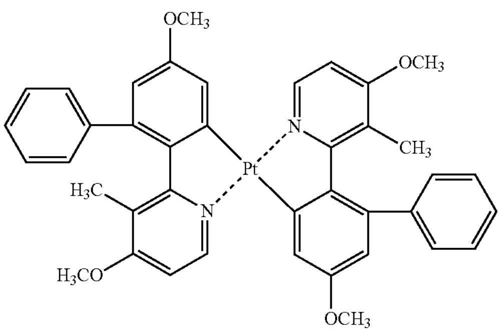
40
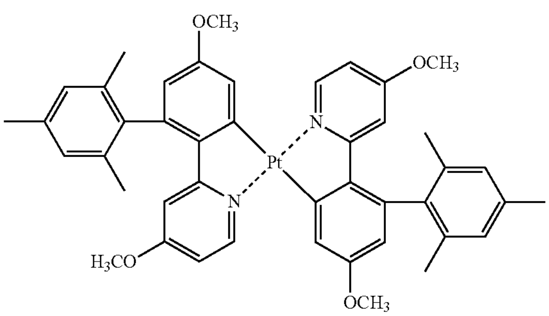
41
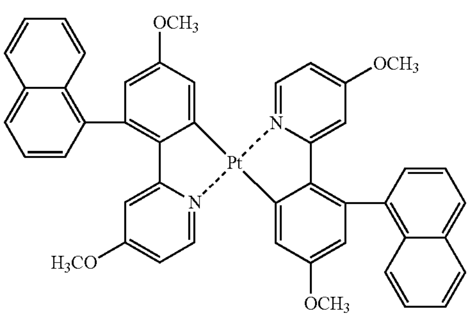
42
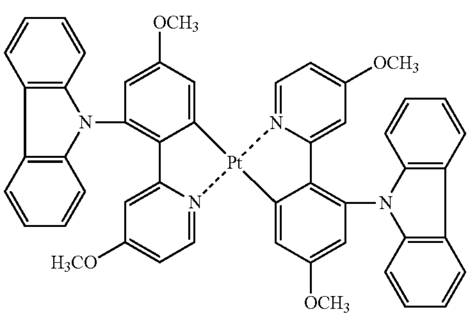
-continued
43
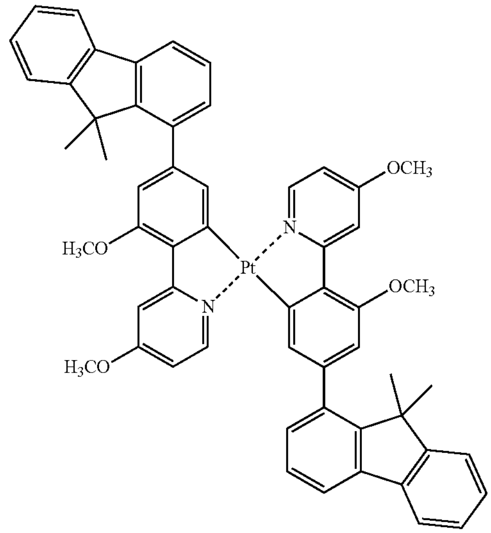
44
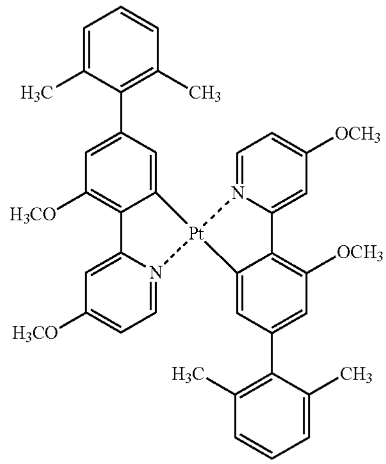
45
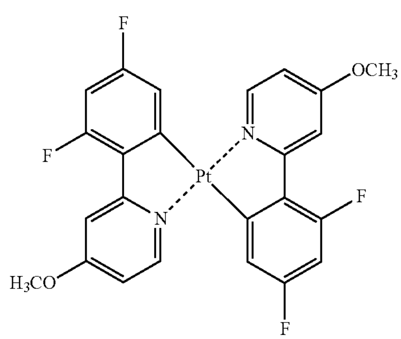
46
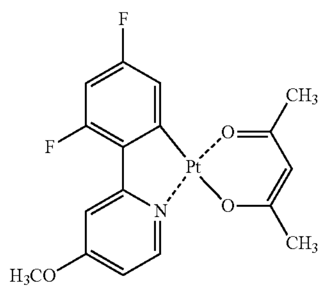

-continued
47
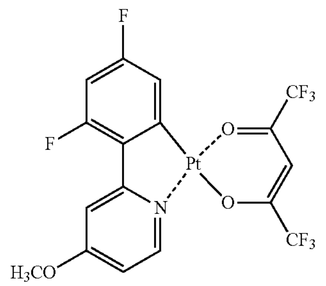
48
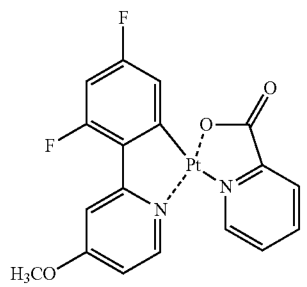
49
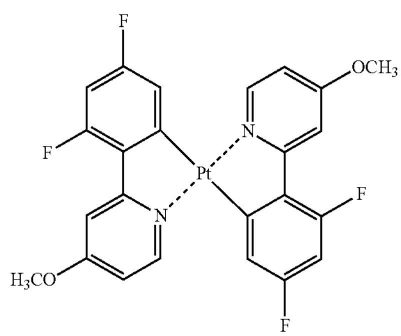
50
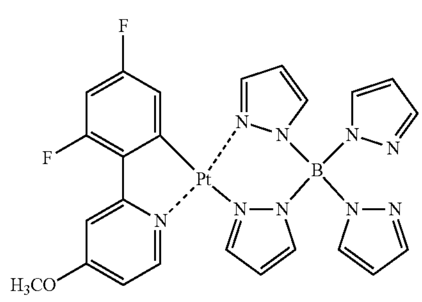
51
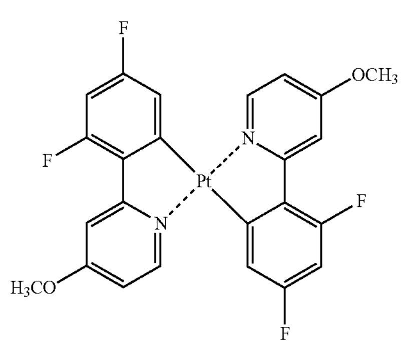
-continued
52
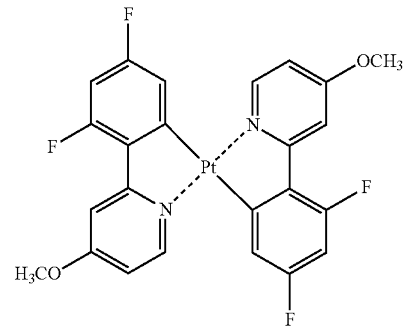
53
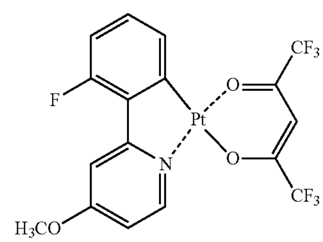
54
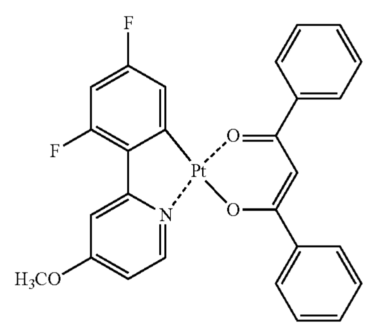
55
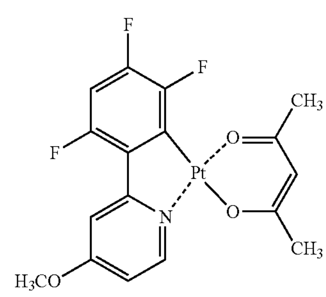
56
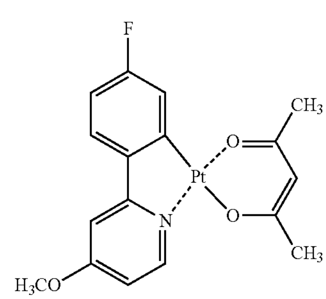

-continued
57
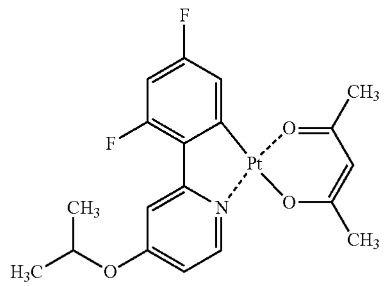
58
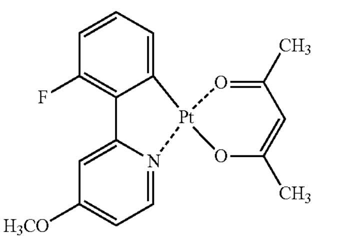
59
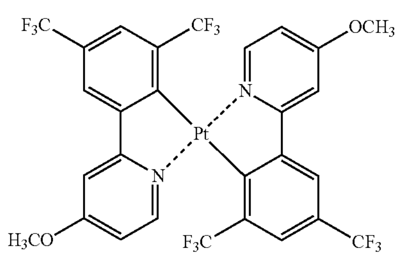
60
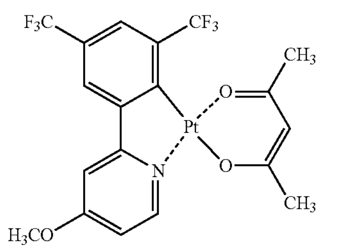
61
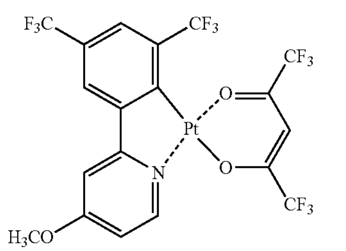
62
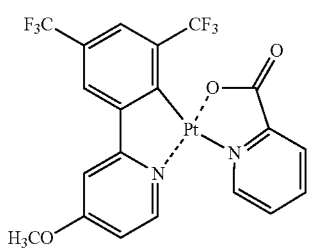
-continued
63
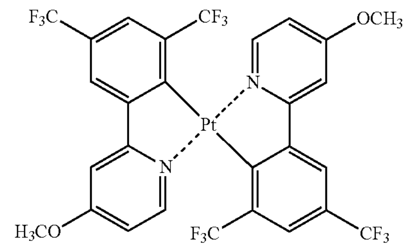
64
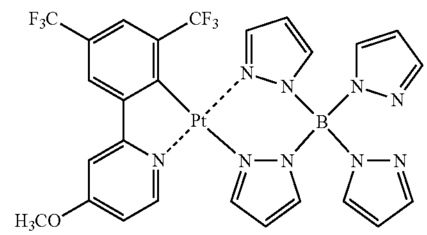
65
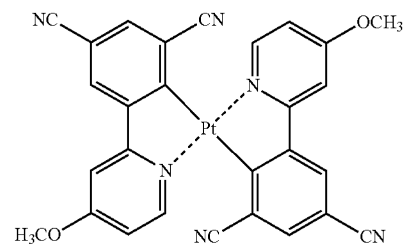
66
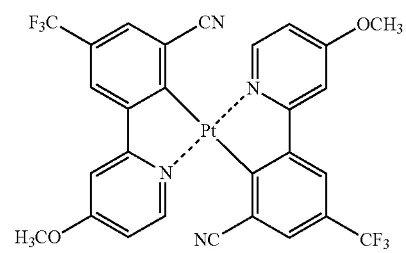
67
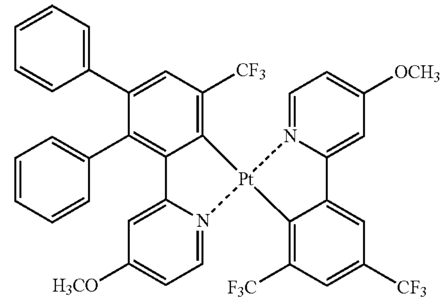
68
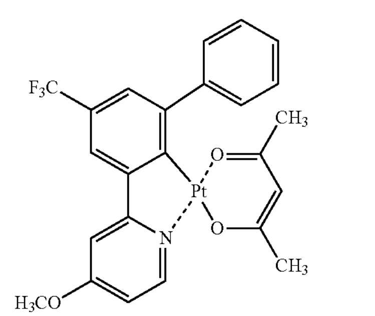

-continued
69
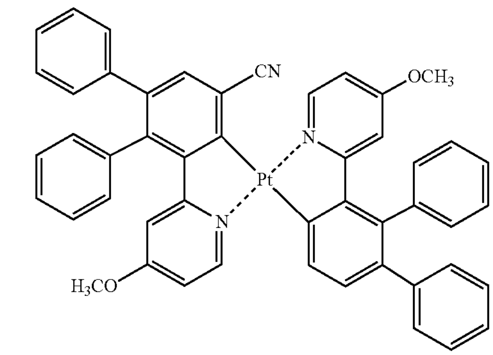
70
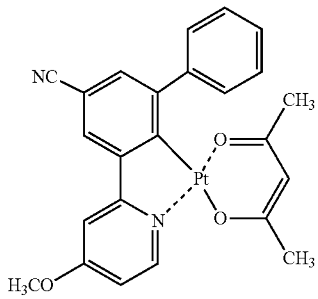
71
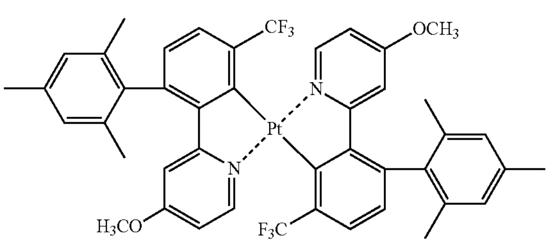
72
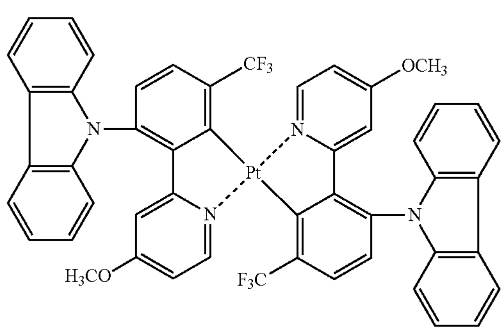
73
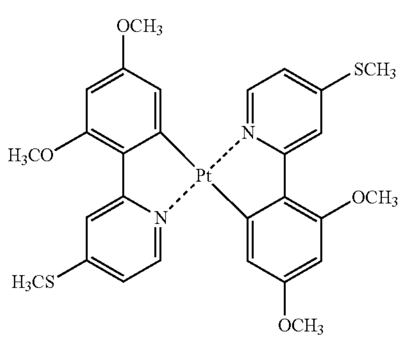
-continued
74
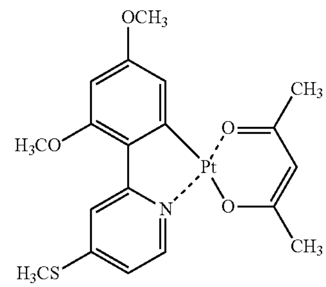
75
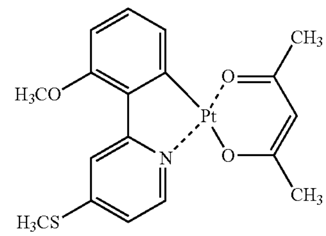
76
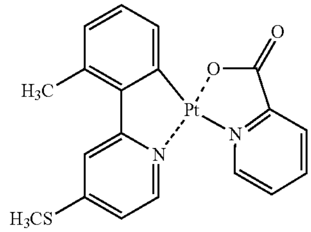
77
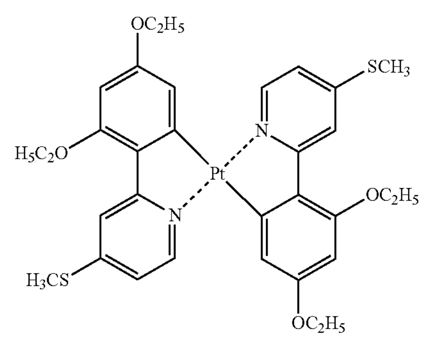
78
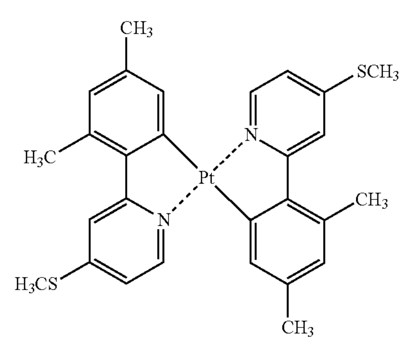

-continued
79
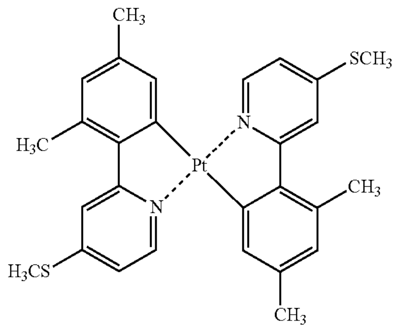
80
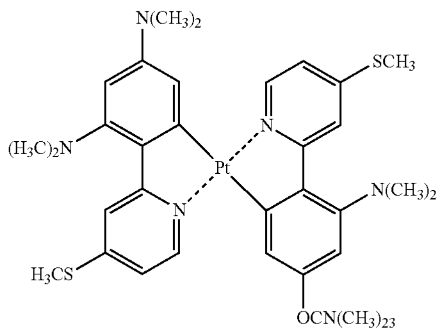
81
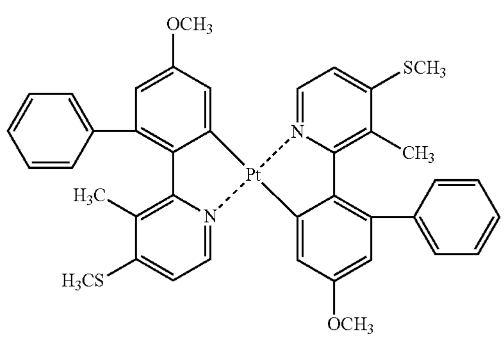
82
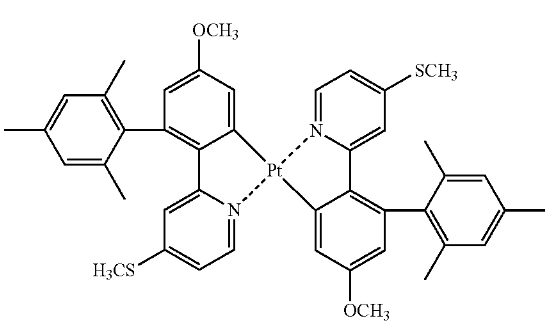
-continued
83
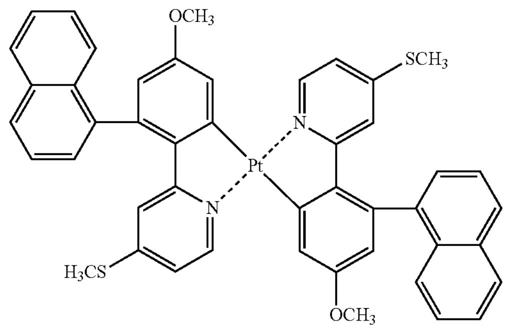
84
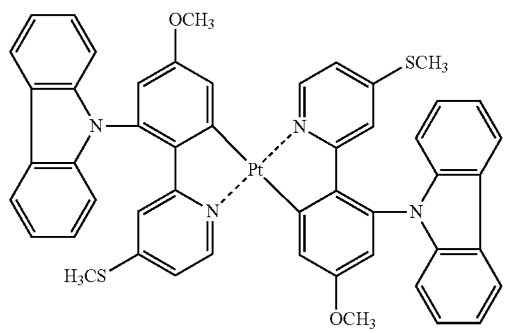
85
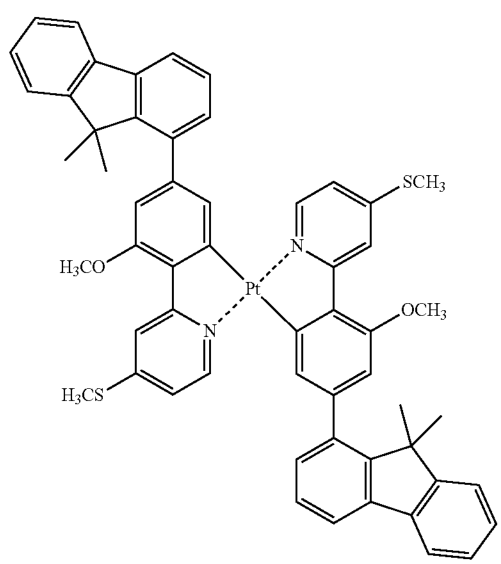

-continued
86
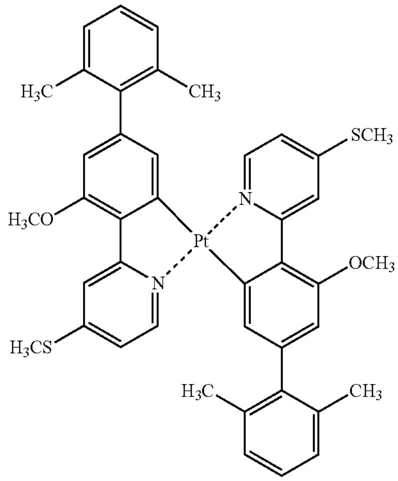
87
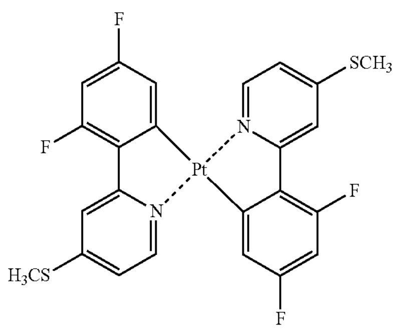
88
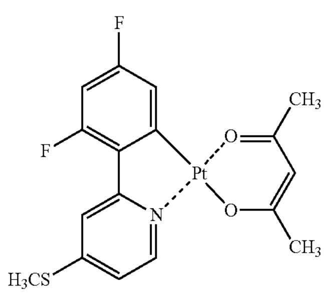
89
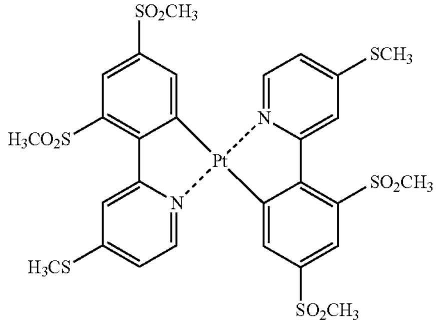
-continued
90
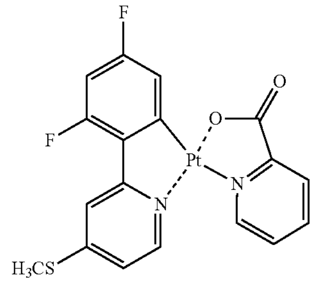
91
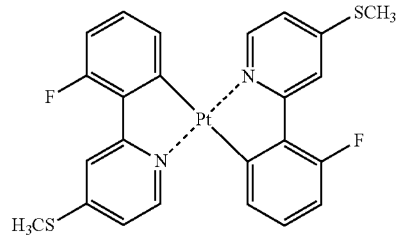
92
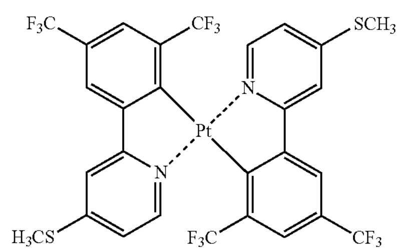
93
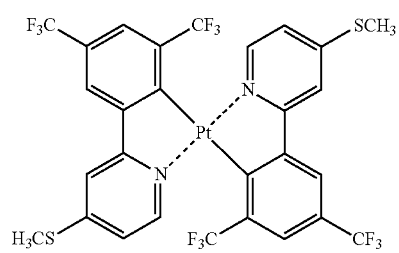
94
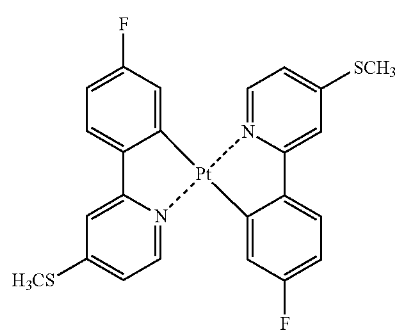

-continued

95

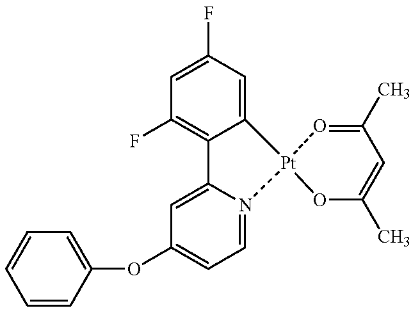

96

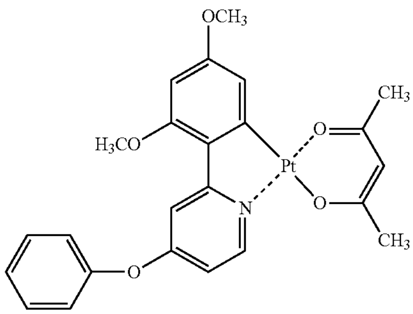

97

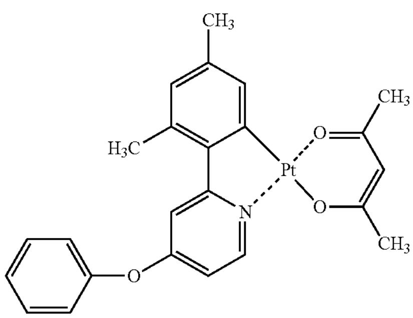

98

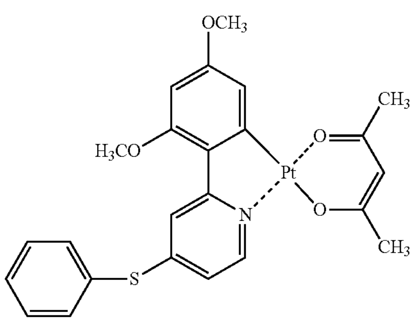

99

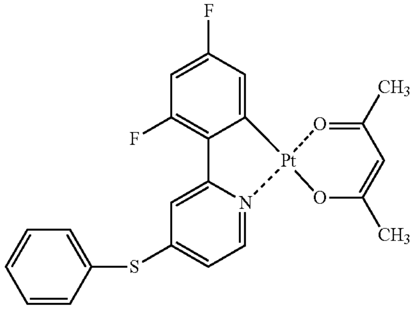

-continued

100

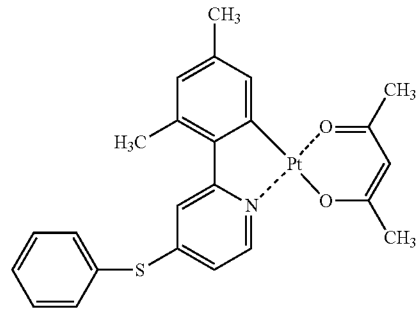

Embodiment (c)

The case in which a platinum complex represented by each of aforesaid Formulas (8) and (9) as a blue light emitting ortho metalated complex.

<Metal Complex Represented by Formula (8)>

A metal complex represented by aforesaid Formula (8) according to the present invention will now be explained.

In Formula (8), A, B and C are a hydrogen atom or a substituent, however, at least two of them are represented by aforesaid Formula (2) and may be different from each other. A substituent represented by A, B and C is not specifically limited and preferably includes an alkyl group (such as a methyl group, an isopropyl group and a tert-butyl group), a cycloalkyl group (such as cyclohexyl group, a cyclopentyl group and a cyclopropyl group), an alkenyl group (such as vinyl group, an allyl group, a 2-butenyl group), an alkynyl group (such as an ethynyl group and a propynyl group), an aryl group (such as a phenyl group, a 2-naphthyl group, a 9-phenanthryl group, a 2-pyridyl group, a 2-thienyl group, a 3-furyl group, a mesityl group, a carbazolyl group and a fluorenyl group), a heterocyclic group (such as a N-morpholyl group and a 2-tetrahydrofuranyl group), an amino group (such as a dimethylamino group and a diphenylamino group), a halogen atom (such as chlorine atom, a bromine atom and iodine atom), an alkoxy group (a methoxy group, an ethoxy group and an isopropoxy group), an aryloxy group (such as a phenoxy group, perfluorophenoxy group), an alkylthio group (such as methylthio group, an ethylthio group, a propylthio group, a pentylthio group, a hexylthio group, an octylthio group and dodecylthio group), an arylthio group (such as a phenylthio group and a naphthylthio group), a cyano group, a fluorohydrocarbon group (such as a trifluoromethyl group and a pentafluorophenyl group), a cyano group, a fluororhydrocarbon group (such as trifluoromethyl group, pentafluorophenyl group), a silyl group (such as a triphenylsylyl and trimethylsilyl). Specifically preferable among them are an amino group, an alkoxy group, an aryloxy group, an aryl group, an alkylthio group, an arylthio group and an aryl group. Most preferable are an amino group, an alkoxy group and an alkylthio group.

In Formula (8), $R_1$, $R_2$, $R_3$, $R_4$ and $R_5$ are a hydrogen atom or a substituent. Substituents represented by $R_1$, $R_2$, $R_3$, $R_4$ and $R_5$ are identical with those explained above as substituents represented by A, B and C.

In Formula (8), $M_1$ is an element belonging to the 8th, 9th or 10th group of the periodic table. Elements belonging to the 8th, 9th or 10th group of the periodic table are preferably ruthenium, rhodium, palladium, osmium, iridium and platinum and most preferably iridium and platinum.

In Formula (2), Ra is a substituent. The substituents represented by Ra are identical with those explained as substituents represented by aforesaid A, B and C. Specifically preferable among them is an alkyl group.

In Formula (8), Xa is an oxygen atom, a sulfur atom or a nitrogen atom. na is 1 or 2.

In Formula (8), the case, in which all of A, B and C are Formula (2), is most preferred.

In Formula (8), when two of A, B, and C are Formula (2), the case, in which Formula (2) substitutes at 4 and 6p positions, is most preferable, and the case, in which Formula (2) substitutes at 4 and 4p positions, is preferable.

<Metal Complex Represented by Formula (9)>

A metal complex represented by Formula (9) according to the present invention will now be explained.

In Formula (9), Rb, Rc and Rd are a substituent, and the substituents represented by Rb, Rc and Rd are identical with those explained as substituents represented by A, B and C in aforesaid Formula (8). Substituents of Ra, Rc and Rd are preferably an alkyl group.

In Formula (9), Xb, Xc and Xd are an oxygen atom, a sulfur atom or a nitrogen atom. The combination of Xb, Xc and Xd is preferably (1) Xd is a nitrogen atom, and Xb and Xc are an oxygen atom; (2) Xd is a sulfur atom, and Xb and Xc are an oxygen atom; or (3) Xb, Xc and Xd are an oxygen atom.

In Formula (9), nb, nc and nd are 1 or 2.

In Formula (9), $R_6$, $R_7$, $R_8$, $R_9$ and $R_{10}$ are a hydrogen atom or a substituent. The substituent represented by $R_6$, $R_7$, $R_8$, $R_9$ and $R_{10}$ are identical with those explained as substituent represented by A, B and C in aforesaid Formula (8).

In Formula (9), $M_2$ is an element belonging to the 8th, 9th or 10th group of the periodic table. Elements belonging to the 8th, 9th or 10th group of the periodic table are preferably ruthenium, rhodium, palladium, osmium, iridium and platinum and most preferably iridium and platinum.

In the following, specific examples of complexes represented by Formula (8) or (9) will be listed; however, the present invention is not limited thereto.

I-1

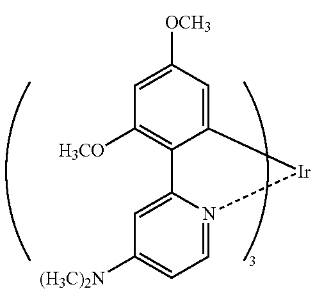

I-2

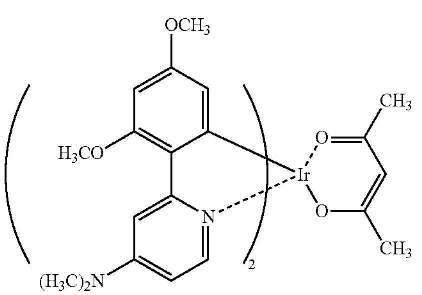

-continued

I-3

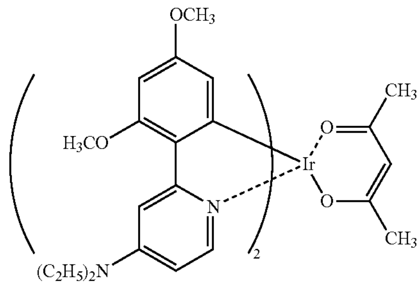

I-4

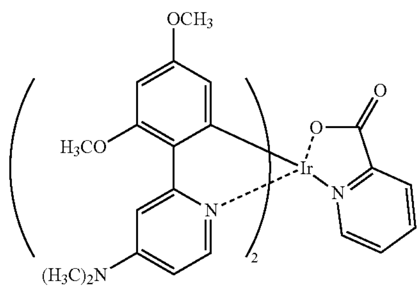

I-5

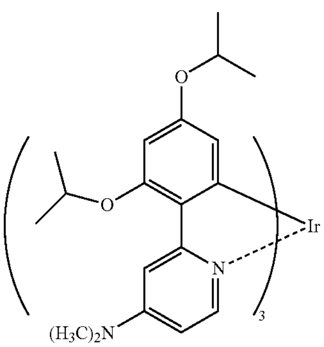

I-6

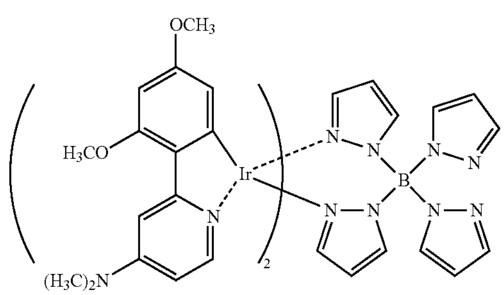

I-7

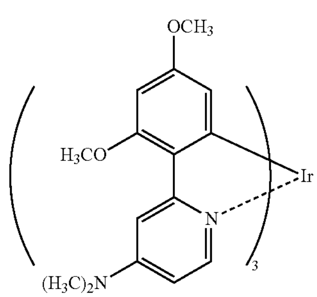

-continued
I-8
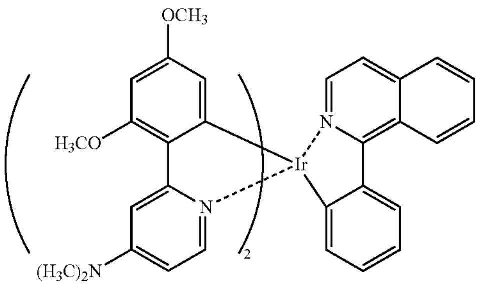
I-9
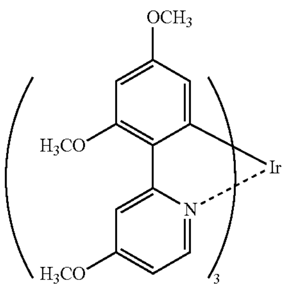
I-10
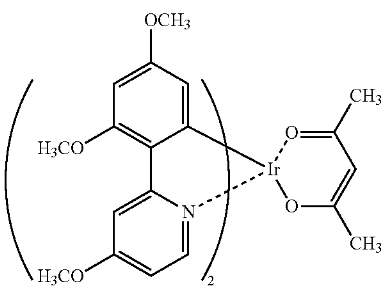
I-11
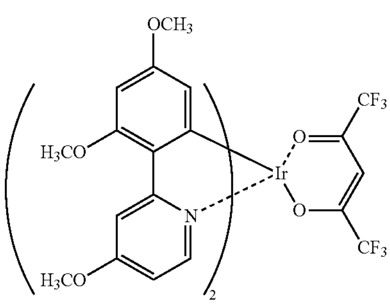
I-12
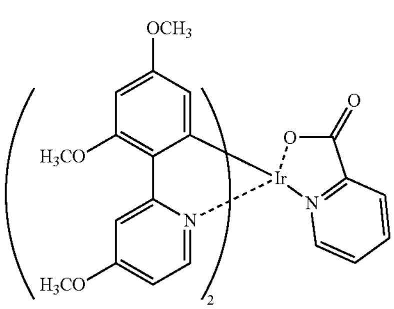
-continued
I-13
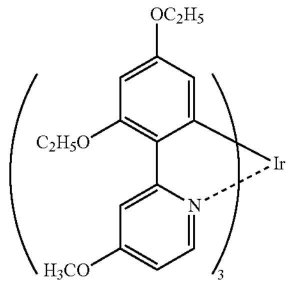
I-14
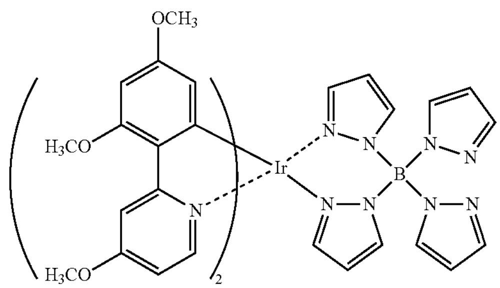
I-15
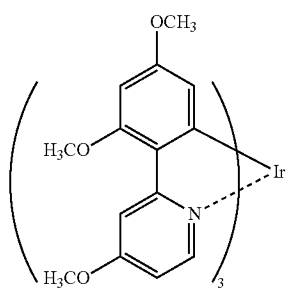
I-16
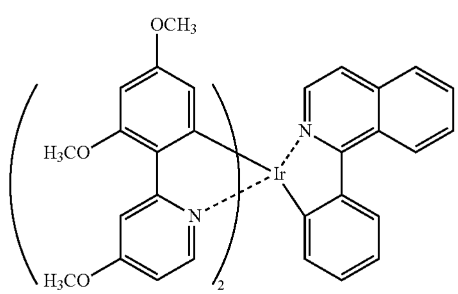
I-17
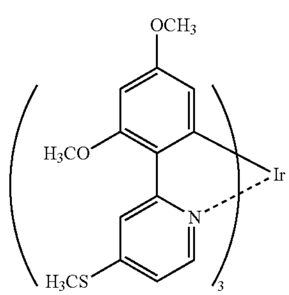

I-18
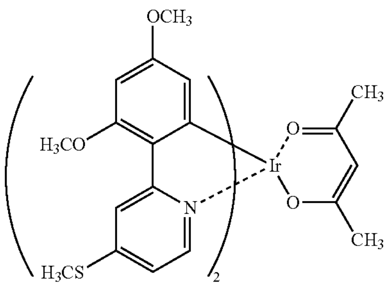
I-19
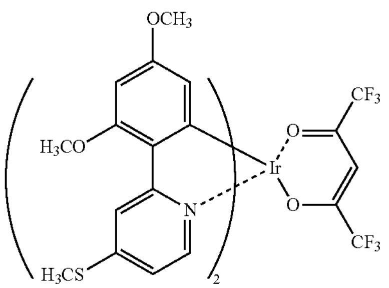
I-20
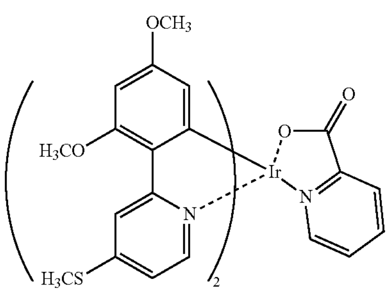
I-21
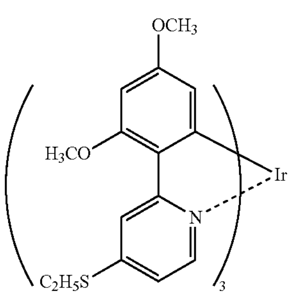
I-22
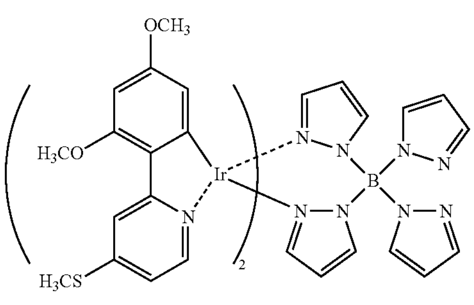
I-23
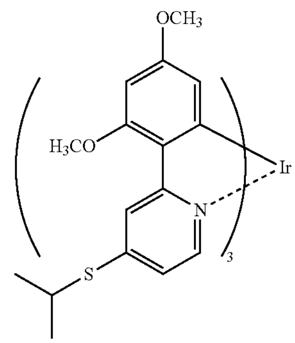
I-24
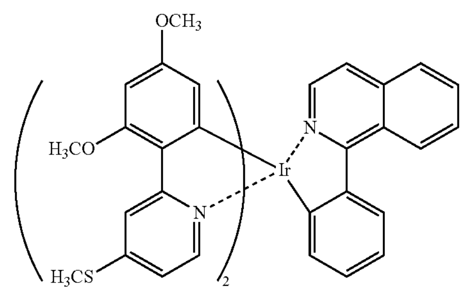
I-25
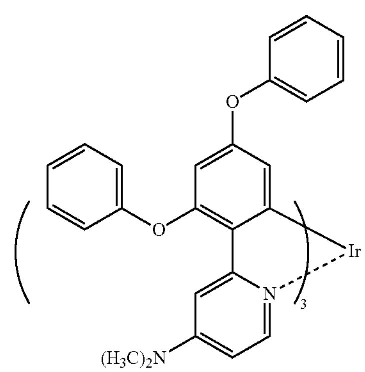
I-26
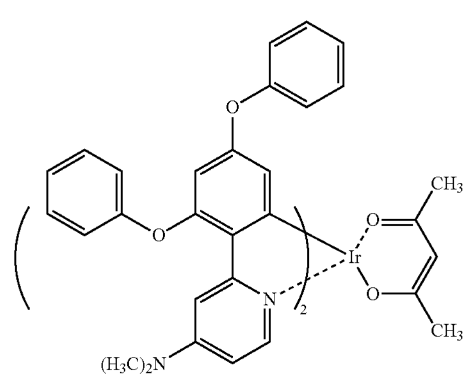

-continued
I-27
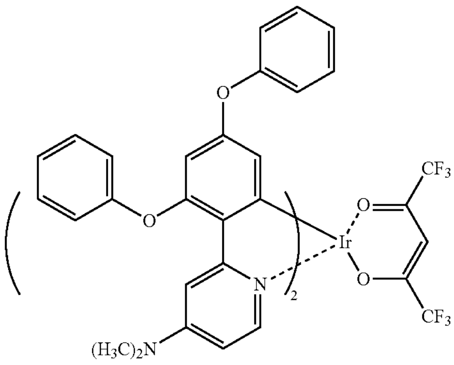
I-28
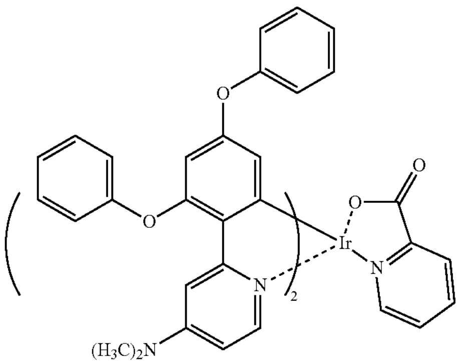
I-29
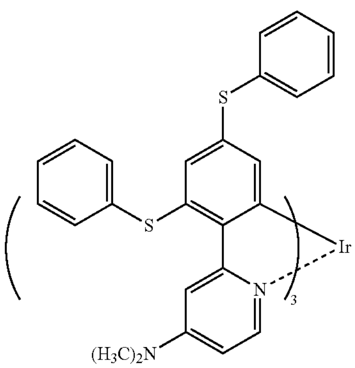
I-30
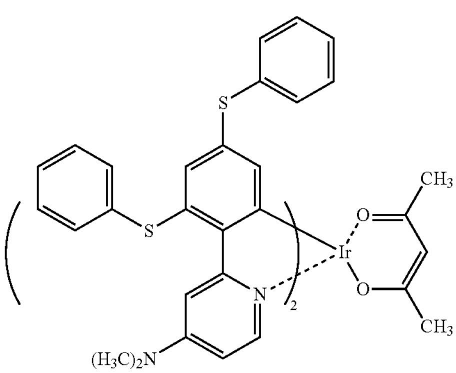
-continued
I-31
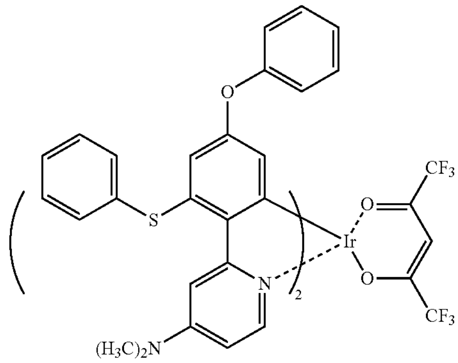
I-32
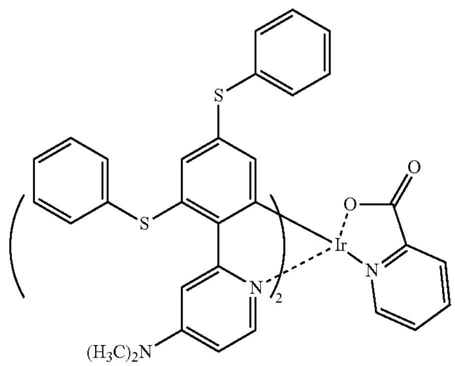
I-33
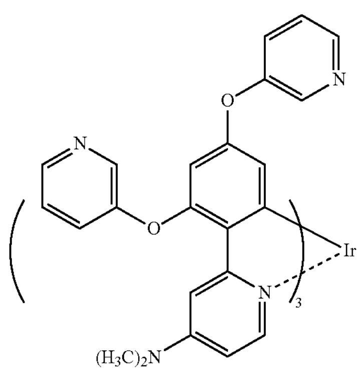
I-34
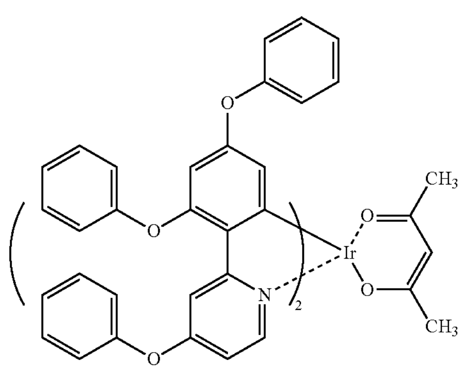

-continued
I-35
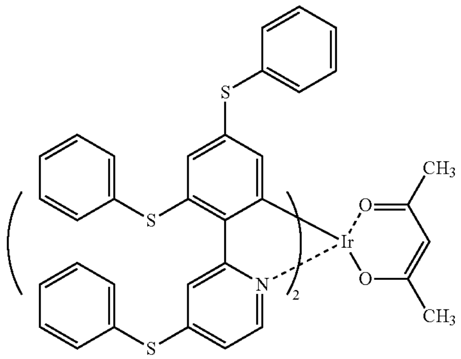
I-36
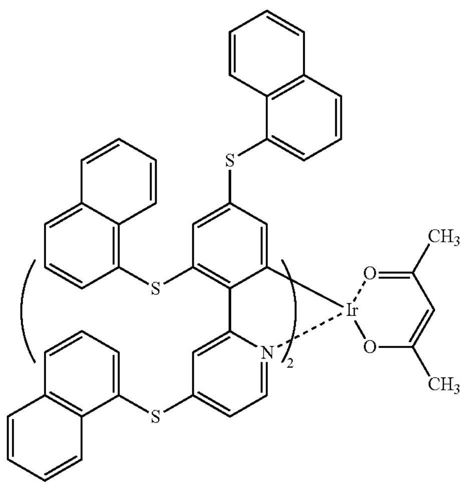
I-37
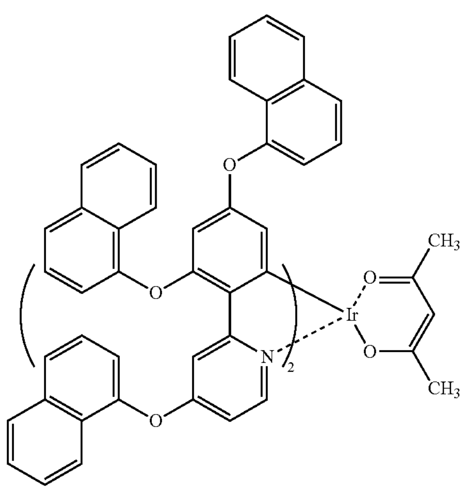
I-38
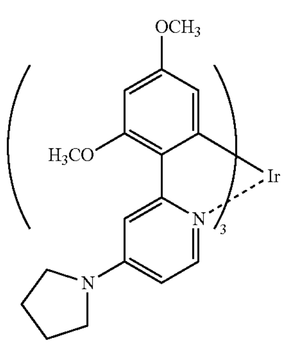
-continued
I-39
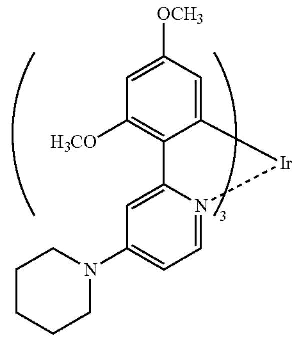
I-40
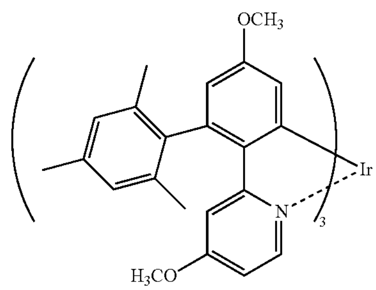
I-41
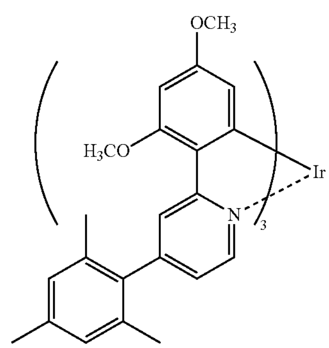
I-42
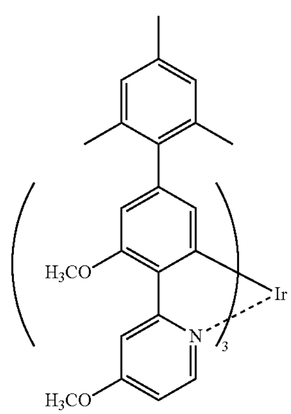

-continued
I-43
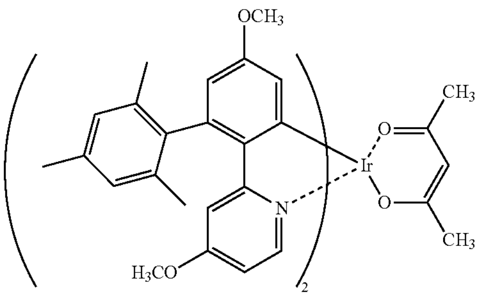
I-44
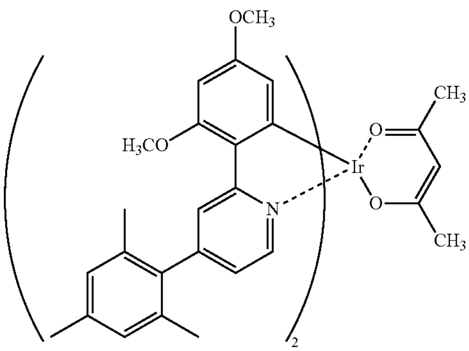
I-45
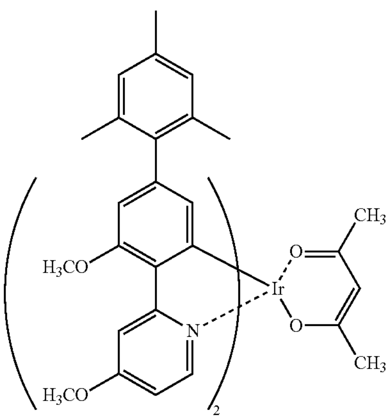
I-46
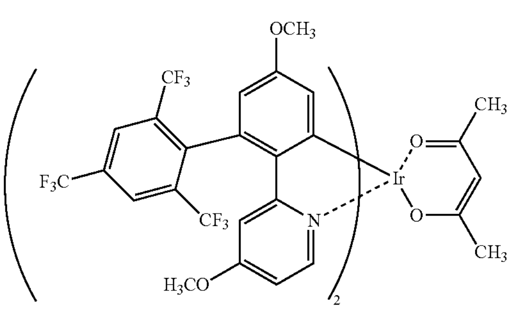
-continued
I-47
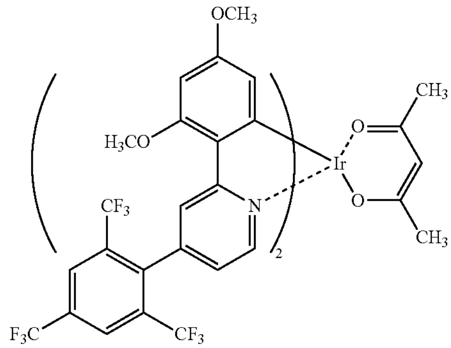
I-48
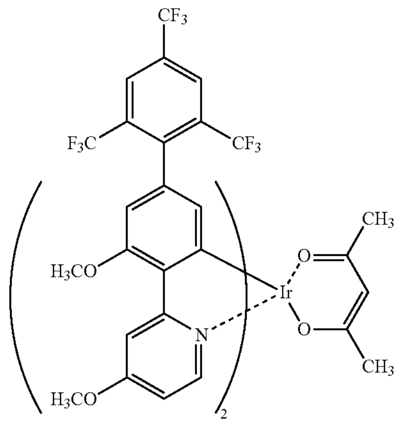
I-49
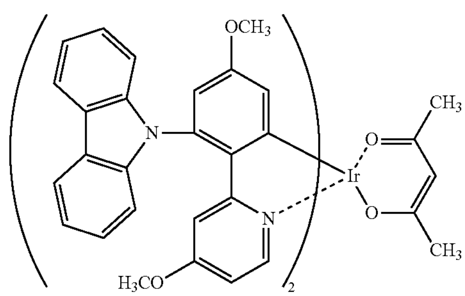
I-50
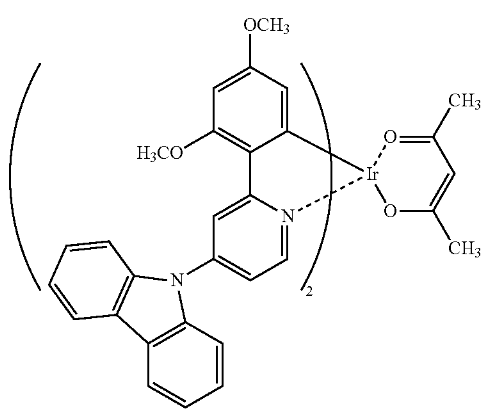

-continued
I-51
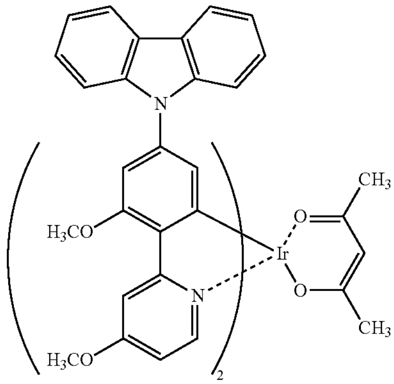
I-52
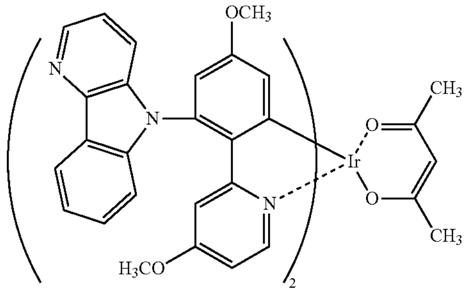
I-53
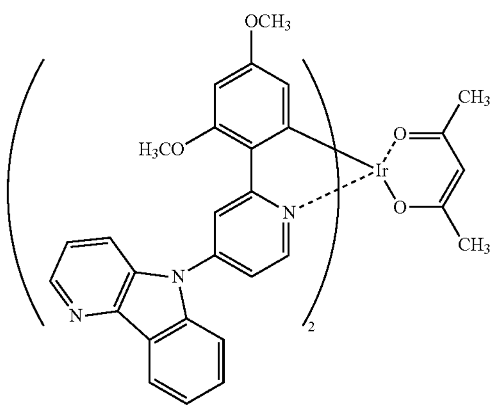
I-54
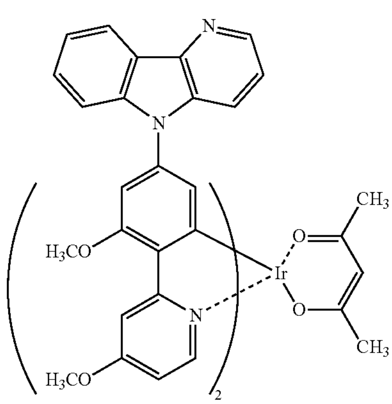
-continued
I-55
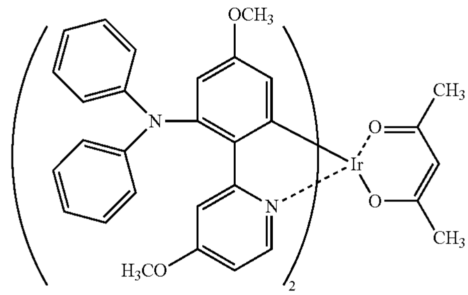
I-56
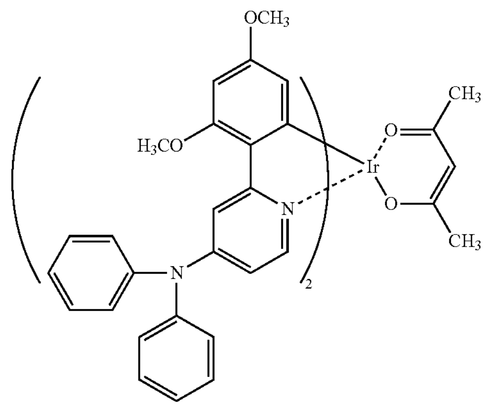
I-57
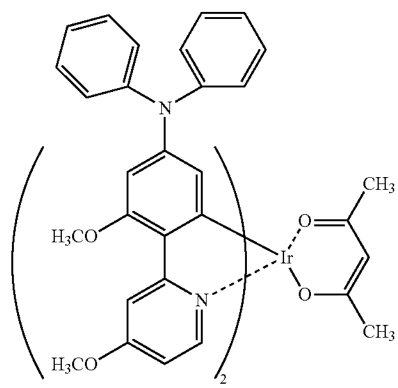
I-58
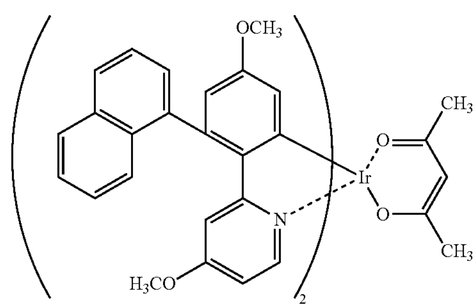

I-59
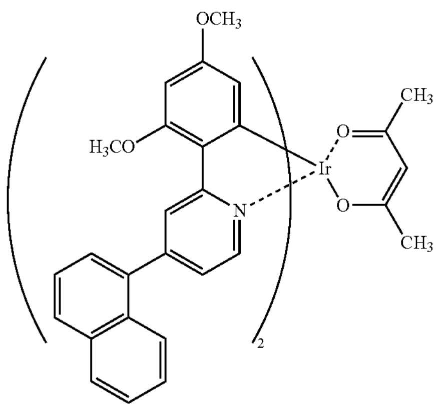
I-60
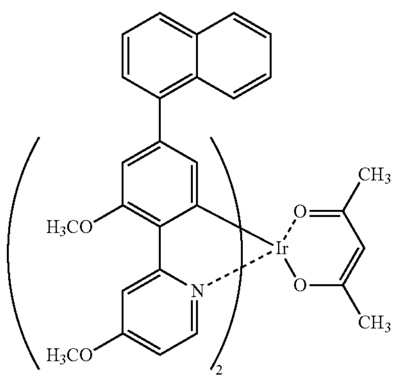
I-61
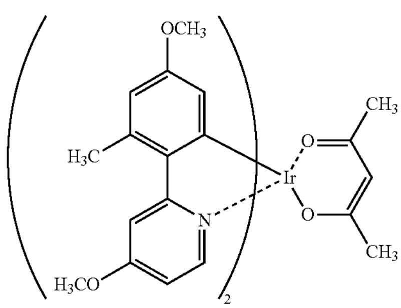
I-62
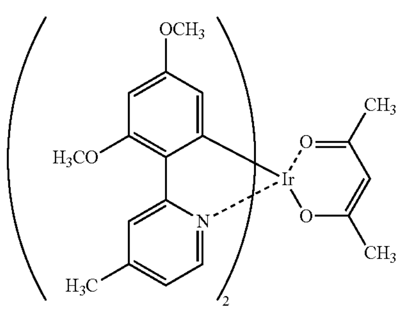
I-63
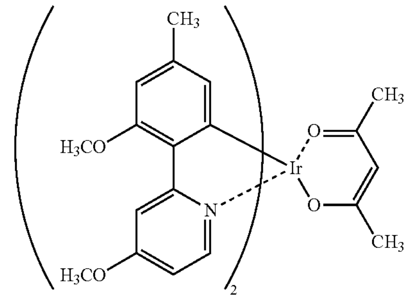
I-64
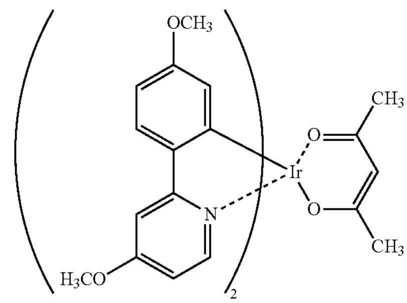
I-65
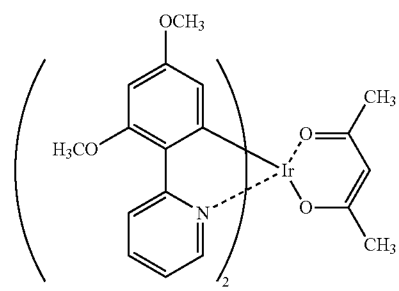
I-66
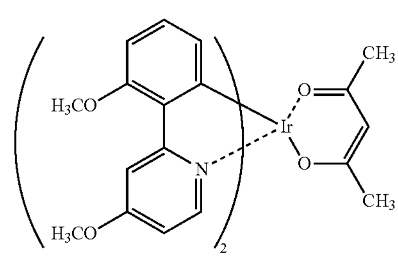
P-1
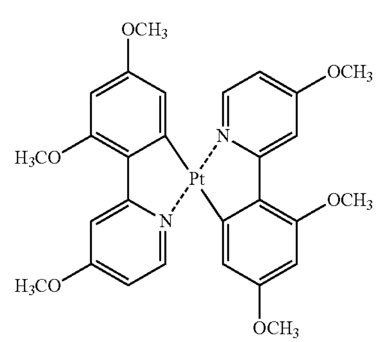

-continued
P-2
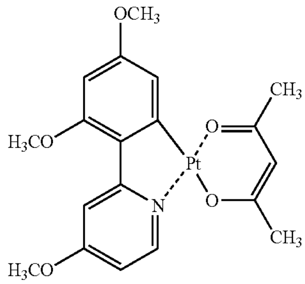
P-3
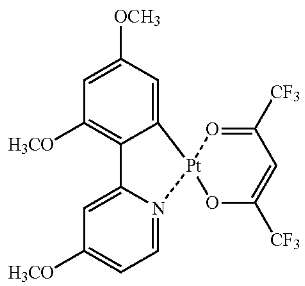
P-4
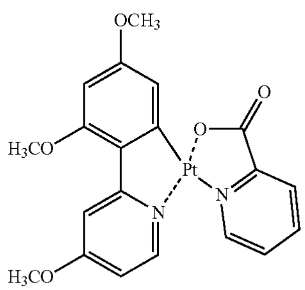
P-5
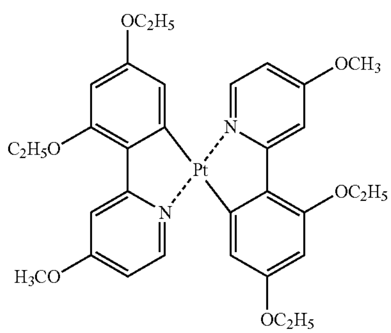
P-6
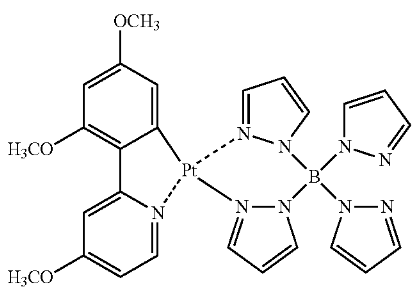
-continued
P-7
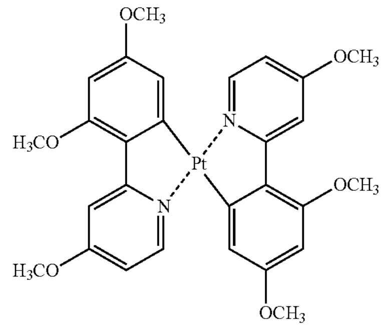
P-8
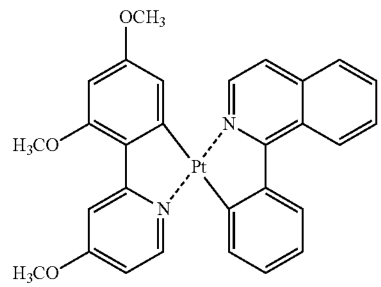
P-9
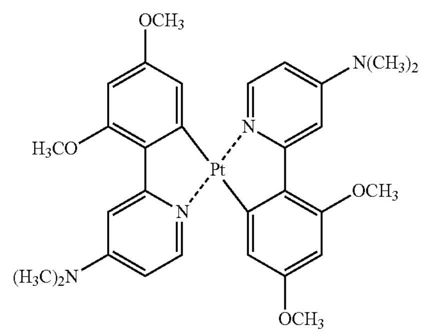
P-10
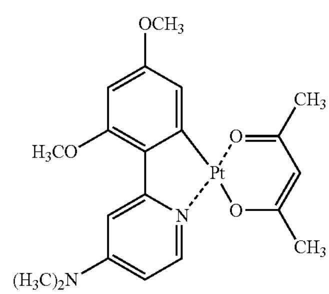
P-11
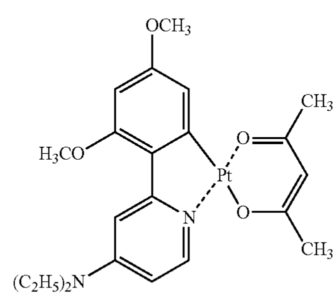

-continued
P-12
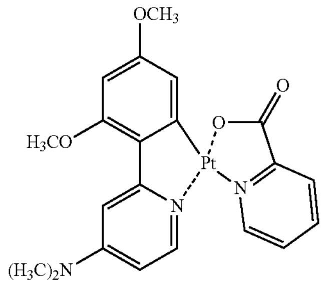
P-13
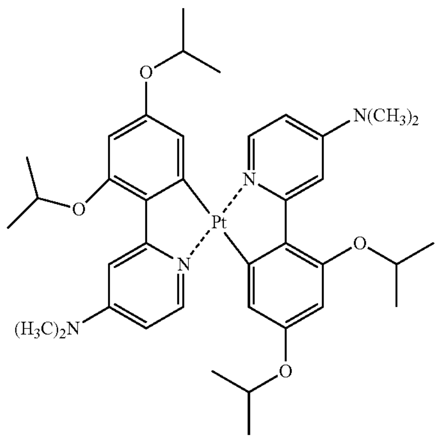
P-14
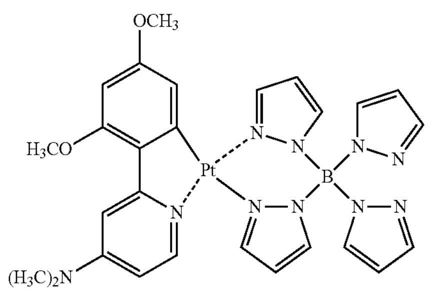
P-15
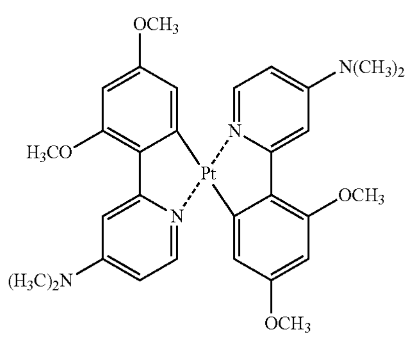
P-16
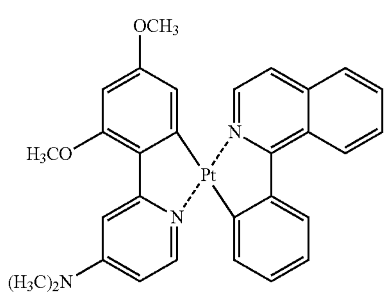
-continued
P-17
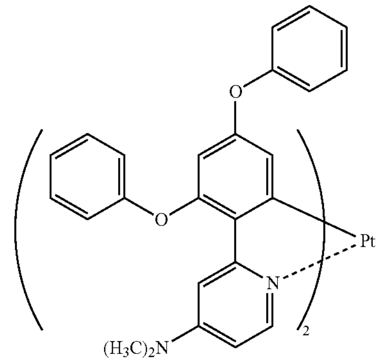
P-18
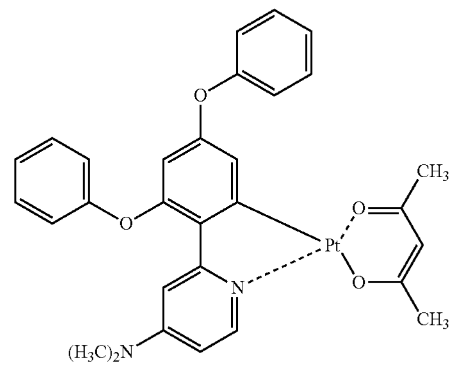
P-19
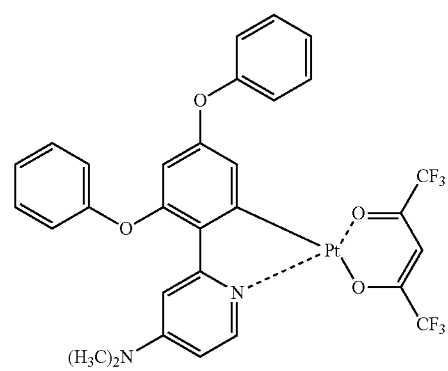
P-20
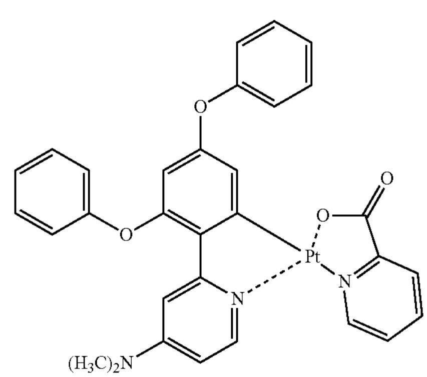

-continued
P-21
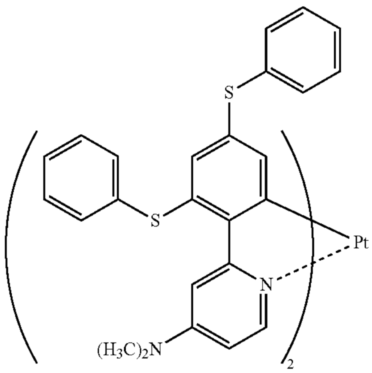
P-22
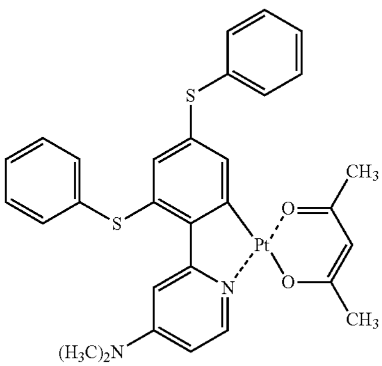
P-23
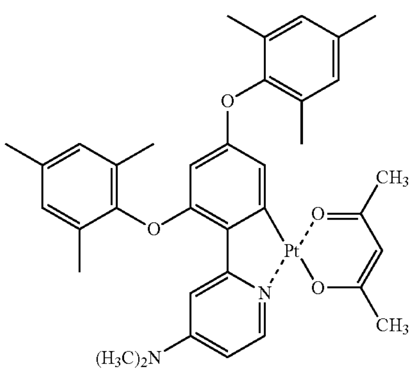
P-24
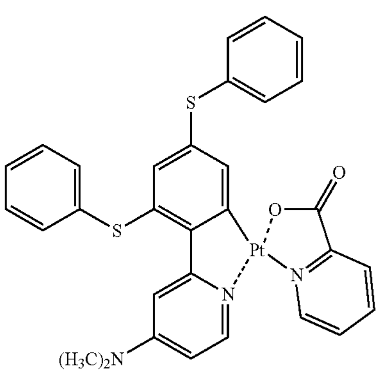
-continued
P-25
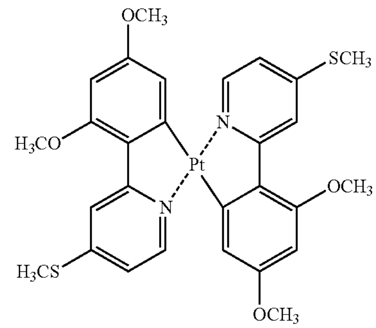
P-26
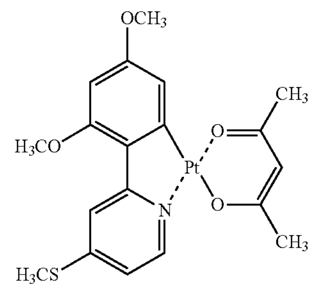
P-27
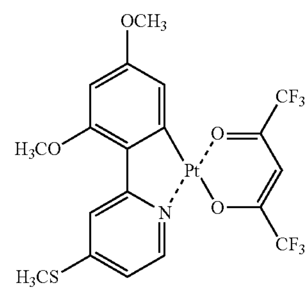
P-28
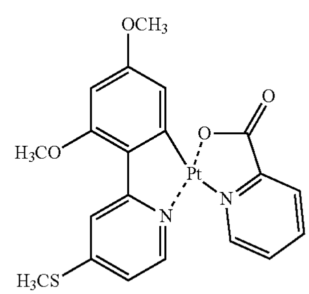
P-29
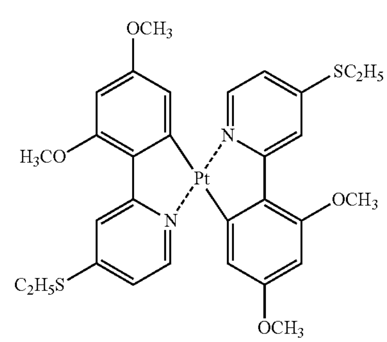

-continued
P-30
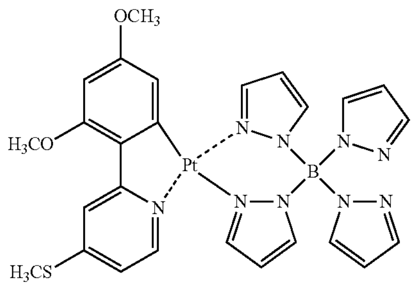
P-31
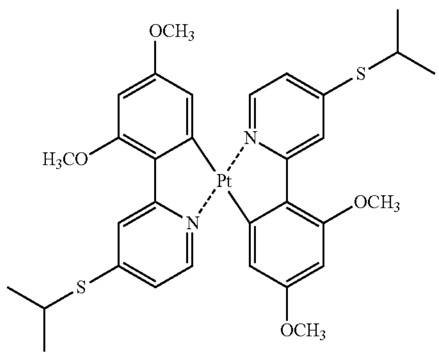
P-32
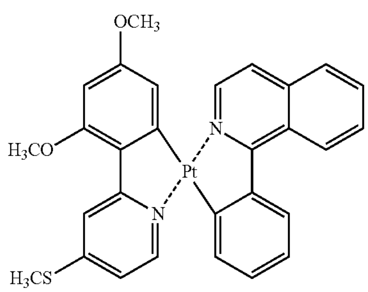
P-33
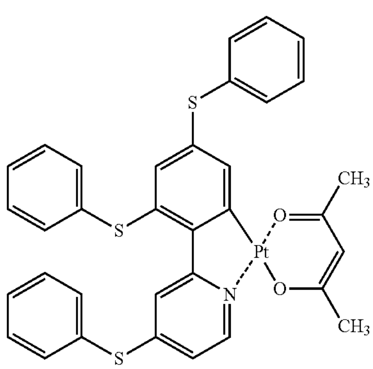
-continued
P-34
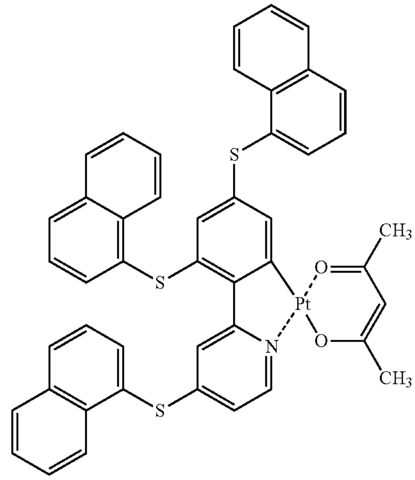
P-35
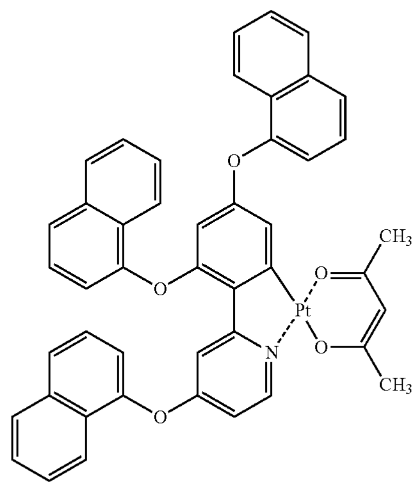
P-36
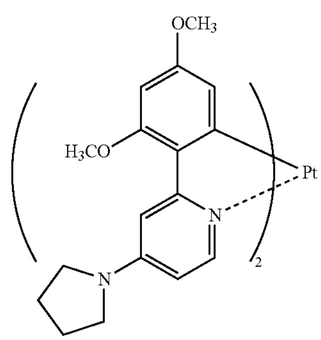
P-37
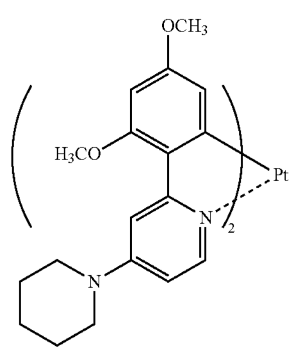

-continued
P-38
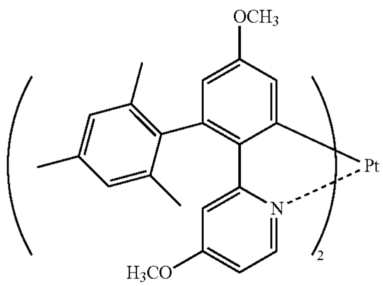
P-39
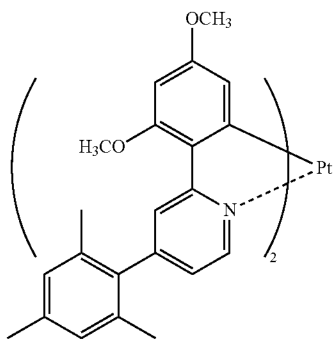
P-40
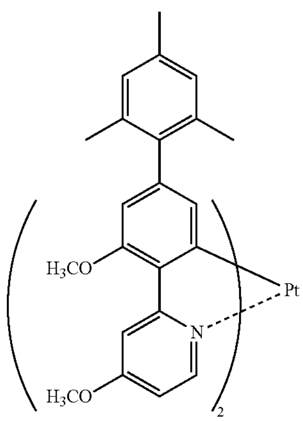
P-41
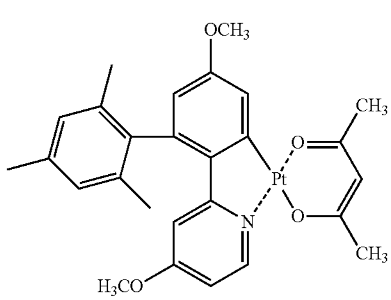
-continued
P-42
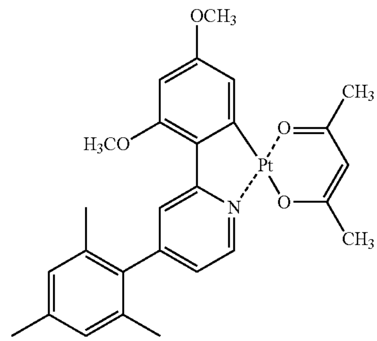
P-43
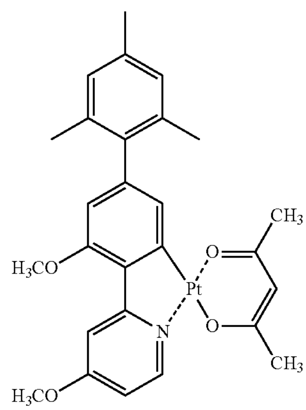
P-44
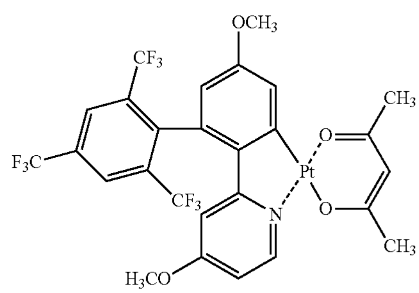
P-45
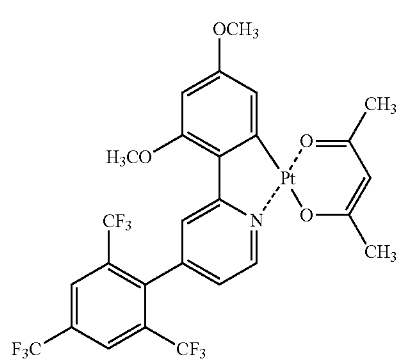

-continued
P-46
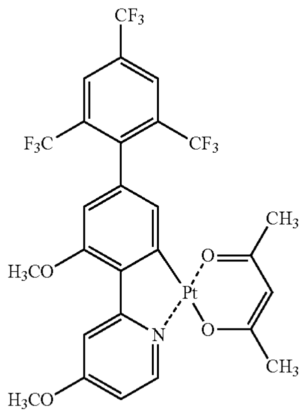
P-47
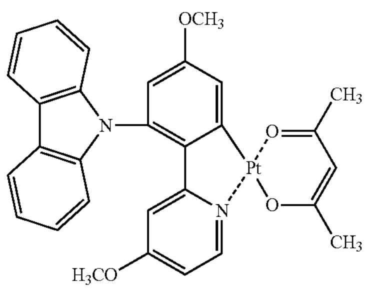
P-48
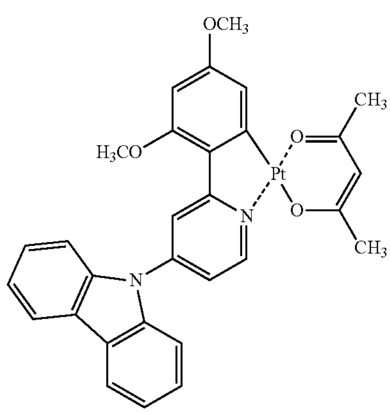
P-49
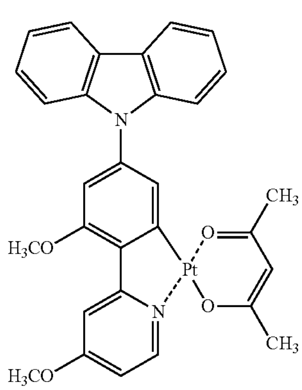
-continued
P-50
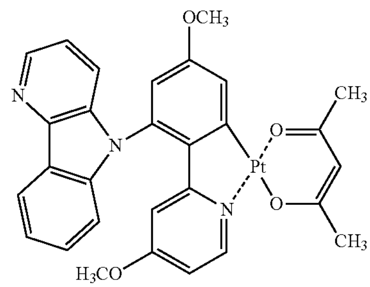
P-51
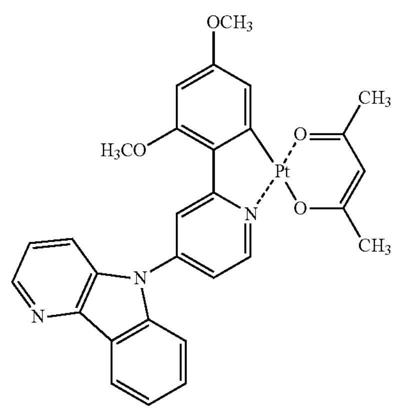
P-52
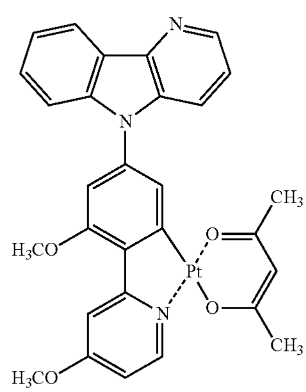
P-53
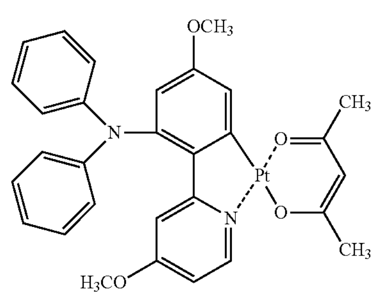

-continued
P-54
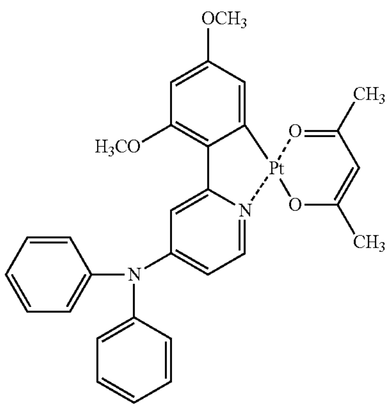
P-55
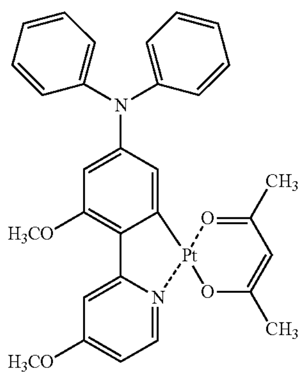
P-56
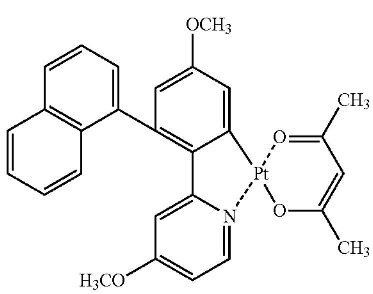
P-57
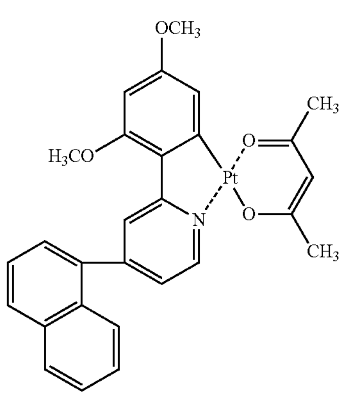
-continued
P-58
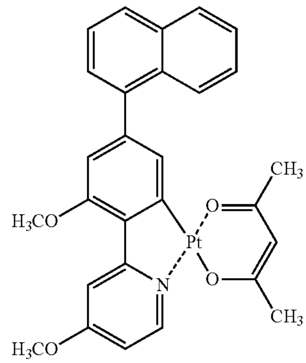
P-59
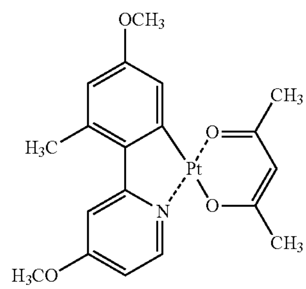
P-60
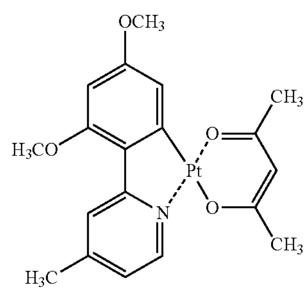
P-61
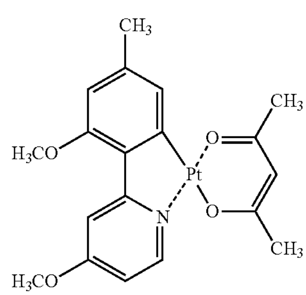
P-62
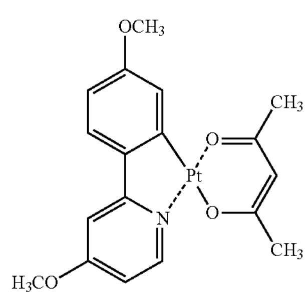

-continued
P-63
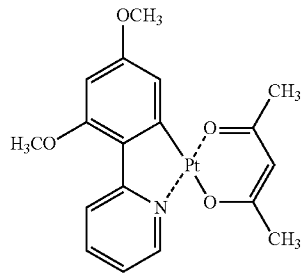
P-64
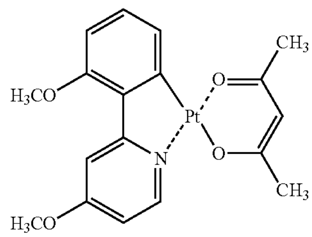
r-1
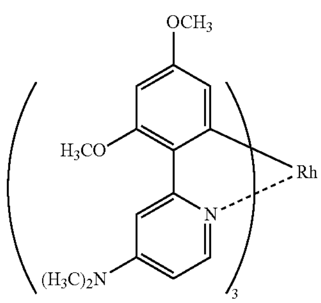
r-2
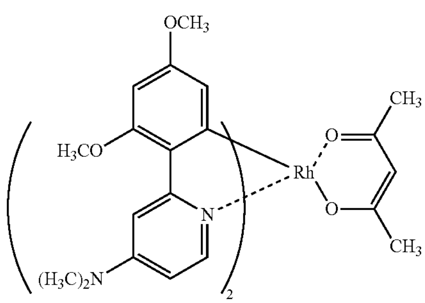
r-3
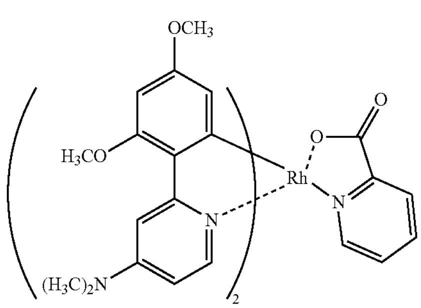
-continued
r-4
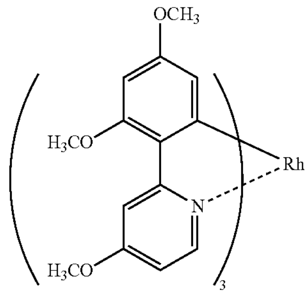
r-5
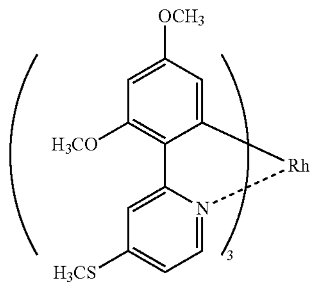
r-6
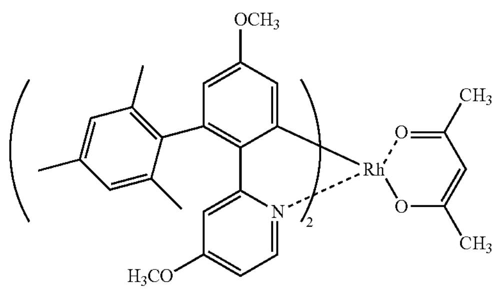
r-7
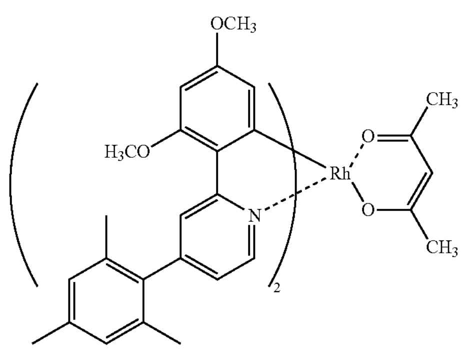
r-8
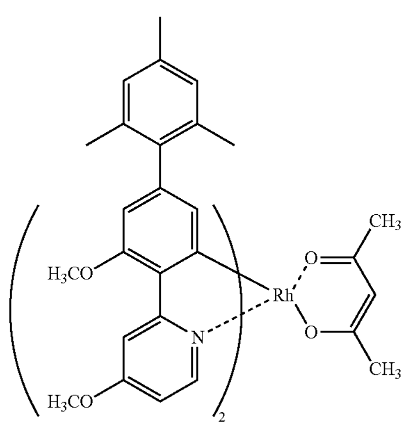

-continued r-9

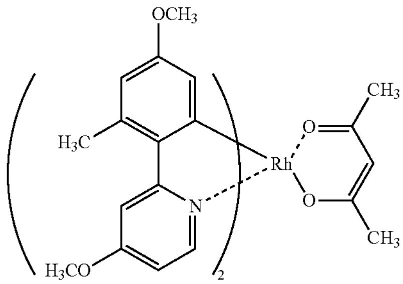

r-10

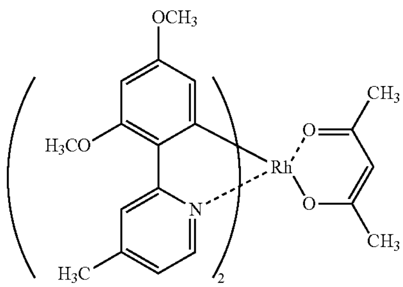

r-11

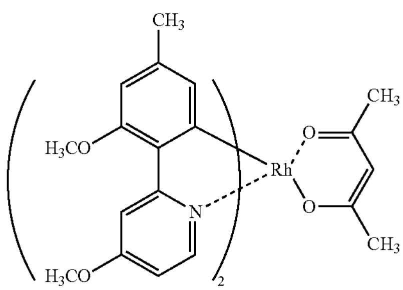

Embodiment (d)

The case in which a metal complex having a ligand represented by aforesaid Formula (10), a metal complex having a partial structure represented by following Formula (11) or (12), or a metal complex having a tautomer of each partial structure represented by said Formula (11) or (12) is utilized as a blue light emitting ortho metalated complex.

<Metal Complex Having Ligand Represented by Formula (10)>

A metal complex having a ligand represented by Formula (10) will now be explained.

First, a ligand represented by Formula (10) will be explained.

In Formula (10), an aromatic hydrocarbon ring which is formed by each of $Z_1$ together with $C_1$, $X_1$ and $X_3$, $Z_2$ together with $C_2$, $X_2$ and $X_4$, includes such as a benzene ring, a biphenyl ring, a naphthalene ring, an azulene ring, an anthrathene ring, a phenanthrene ring, a pyrene ring, a chrisene ring, a naphthacene ring, a triphenylene ring, an o-terphenyl ring, a m-terphenyl ring, a p-terphenyl ring, an acenaphtene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthraathrene ring.

Preferably utilized among them is a benzene ring. Further, the aforesaid aromatic hydrocarbon ring may be provided with a substituent represented by $R_1$ in aforesaid Formula (10), which will be described later.

In Formula (10), an aromatic heterocyclic ring, which is formed by each of $Z_1$ together with $C_1$, $X_1$ and $X_3$, and $Z_2$ together with $C_2$, $X_2$ and $X_4$ includes such as a furan ring, a thiophene ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring and a ring in which at least one of carbon atoms of a hydrocarbon ring, which constitutes a carboline ring, is substituted by a nitrogen atom.

Preferable among them is a pyridine ring. Further, the aforesaid aromatic heterocyclic ring may be provided with a substituent represented by $R_1$ in aforesaid Formula (10), which will be described later.

In Formula (10), a substituent represented by $R_1$ includes, for example, an alkyl group (such as a methyl group, an ethyl group, an isopropyl group, a hydroxyethyl group, a methoxymethyl group, a trifluoromethyl group and a t-butyl group), a cycloalkyl group (such as a cyclopentyl group and a cyclohexyl group), an aralkyl group (such as a benzyl group and a 2-phenetyl group), an aromatic hydrocarbon group (such as a phenyl group, a p-chlorophenyl group, a mesityl group, a tolyl group, a xylyl group, a biphenylyl group, a naphtyl group, an anthoryl group and a phenanthryl group), an aromatic heterocyclic group (such as a furyl group, a thienyl group, a pyridyl group, a pyridazinyl group, a pyridinyl group, a pyrimidinyl, a pyradinyl group, a triazinyl group, an imidazolyl group, a pyrazolyl group, a thiazolyl group, a quinazolynyl group, a carbazolyl group and a phthalazinyl), an alkoxyl group (such as a methoxy group, an ethoxy group, an isopropoxy group and a butoxy group), an aryloxy group (such as a phenoxy group and a naphthyloxy group), a cyano group, a hydroxyl group, an alkenyl group (such as a vinyl group), a styryl group, a halogen atom (such as a chlorine atom, a bromine atom, an iodine atom and a fluorine atom). These groups may be further substituted.

Among them, in the present invention, at least one of groups represented by aforesaid $R_1$ is preferably the above-described aromatic hydrocarbon group or aromatic heterocyclic group.

A coordination bond is formed (also referred to as complex formation) between a ligand represented by Formula (10) and a central metal (may be either a metal or an ion) resulting in formation of a metal complex.

Herein, when a coordination bond is formed between the aforesaid ligand and a central metal (which will be described later), a coordination bond or a covalent bond is preferably formed with $X_3$ and/or $X_4$ among atoms which constitute a ligand represented by aforesaid Formula (10).

<Metal Complex Having Formula (11) or Tautomer Thereof as Partial Structure>

A metal complex according to the present invention, which is provided with Formula (11) or a tautomer thereof as a partial structure, will now be explained.

In Formula (11), an aromatic hydrocarbon ring formed by $Z_3$ together with $C_3$, $C_4$ and $C_5$ is identical with an aromatic hydrocarbon ring formed by $Z_1$ together with $C_1$, $X_1$ and $X_3$ in Formula (10).

In Formula (11), an aromatic heterocyclic ring formed by $Z_3$ together with $C_3$, $C_4$ and $C_5$ is identical with an aromatic hydrocarbon ring formed by $Z_1$ together with $C_1$, $X_1$ and $X_3$ in Formula (10).

In Formula (11), an aromatic heterocyclic ring, which is formed by $Z_4$ together with $C_6$, $C_7$ and N includes such as a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring and a ring in which at least one of carbon atoms of hydrocarbon rings, which constitutes a carboline ring, is further substituted by a nitrogen atom. Further, the aforesaid aromatic heterocyclic ring may be provided with a substituent represented by $R_1$ in aforesaid Formula (10).

In Formula (11), a substituent represented by $R_2$ is identical with a substituent represented by $R_1$ in aforesaid Formula (10).

In Formula (11), an element represented by $M_{11}$ belonging to the 8th-10th groups of the periodic table is preferably such as platinum (Pt) and iridium (Ir). Further, in Formula (11), $M_{11}$ may be either a metal or an ion.

<Metal Complex Having Formula (12) or Tautomer Thereof as Partial Structure>

A metal complex, according to the present invention, which is provided with Formula (12) or a tautomer thereof as a partial structure, will now be explained.

In Formula (12), a substituent represented by $R_3$ is identical with a substituent represented by $R_1$ in aforesaid Formula (10).

In Formula (12), a substituent represented by $R_4$ and $R_5$ is identical with a substituent represented by $R_1$ in aforesaid Formula (10).

In Formula (12), an element represented by $M_{12}$ belonging to the 8th-10th groups of the periodic table is preferably such as platinum (Pt) and iridium (Ir). Further, in Formula (12), $M_{12}$ may be either a metal or an ion.

In the following, specific examples of a metal complex having a ligand represented by Formula (10), a metal complex having a partial structure represented by aforesaid Formula (11) or (12), or a metal complex having a tautomer of each partial structure represented by said Formula (11) or (12) will be listed, however, the present invention is not limited thereto.

P-1

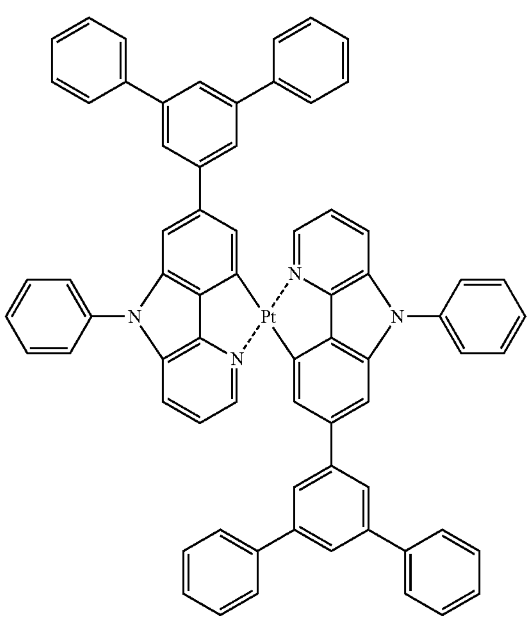

-continued

P-2

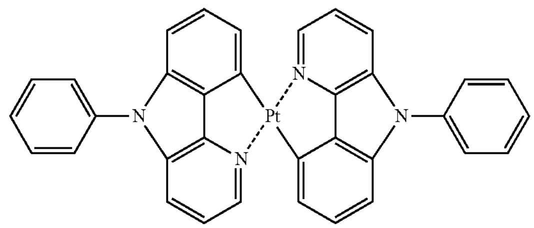

P-3

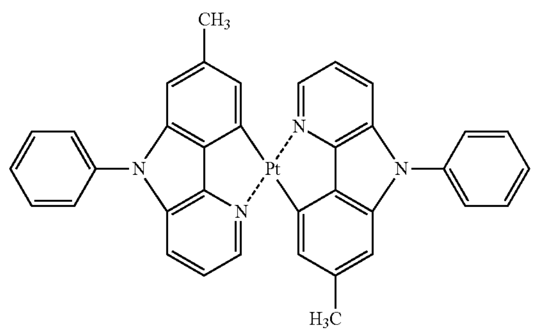

P-4

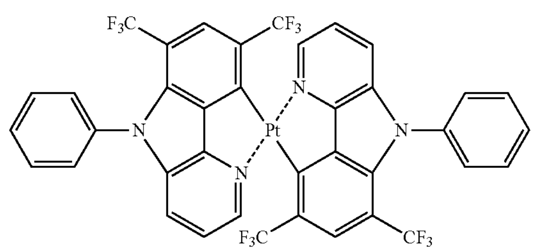

P-5

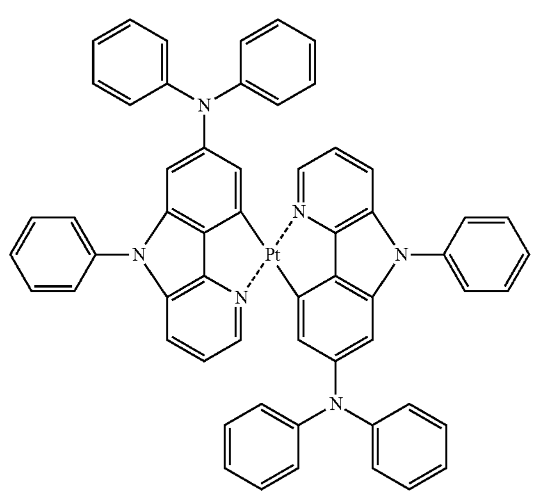

P-6
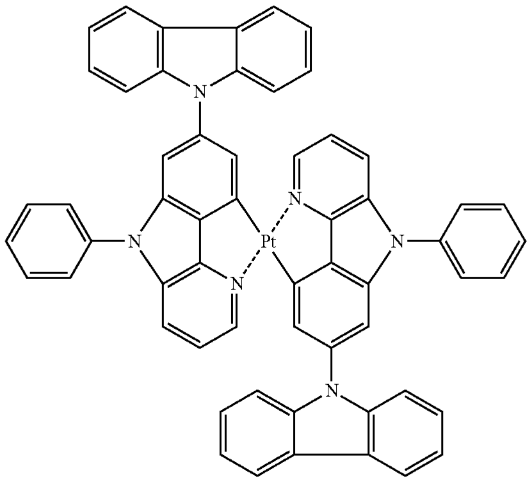
P-7
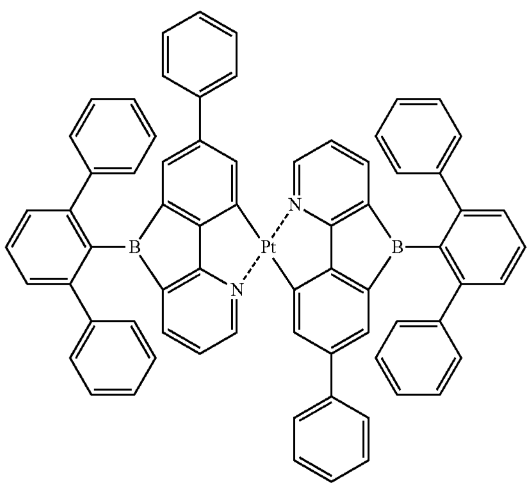
P-8
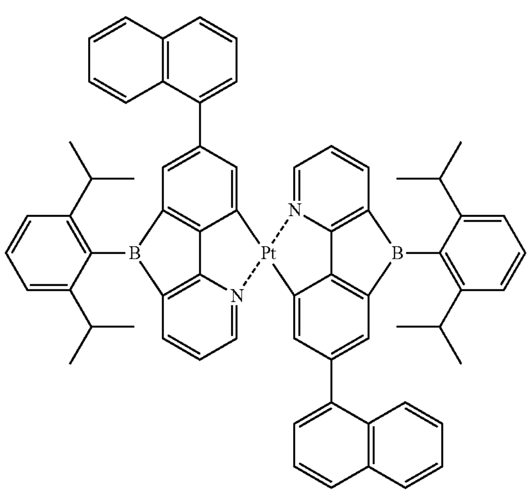
P-9
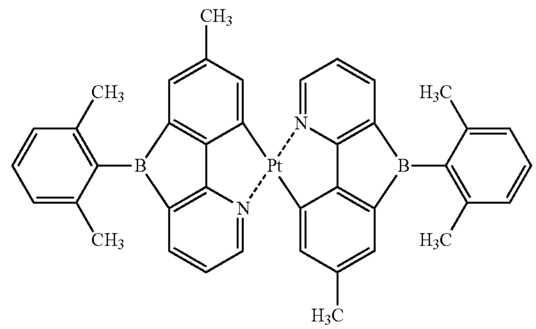
P-10
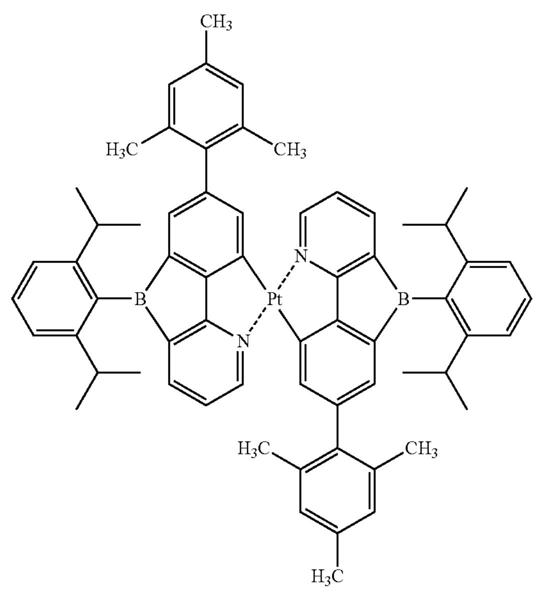
P-11
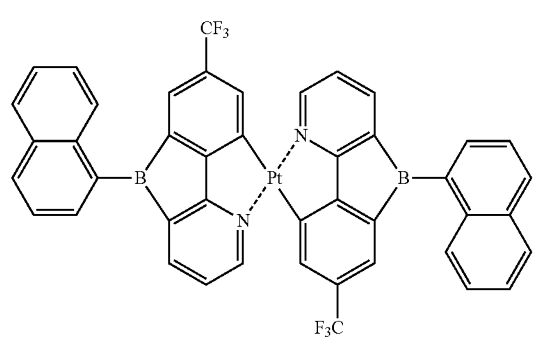

-continued
P-12
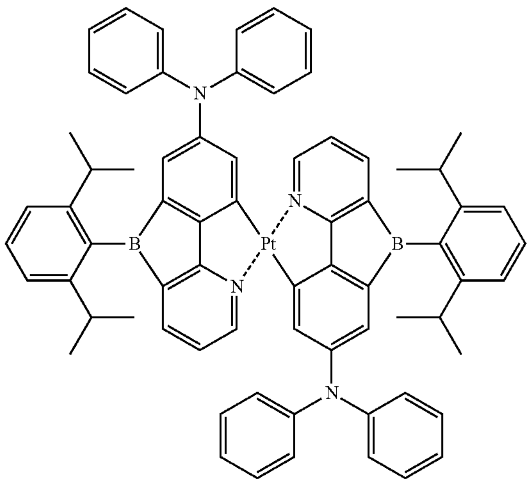
P-13
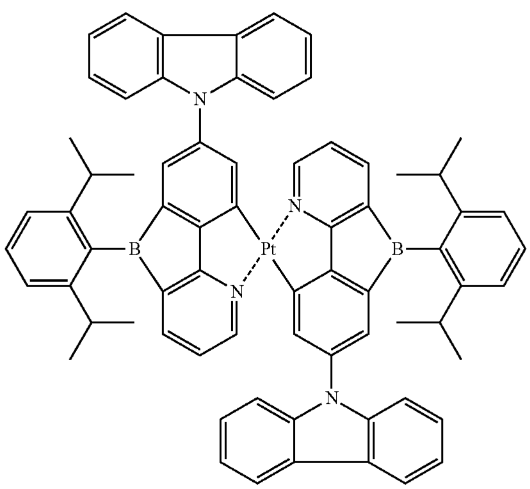
P-14
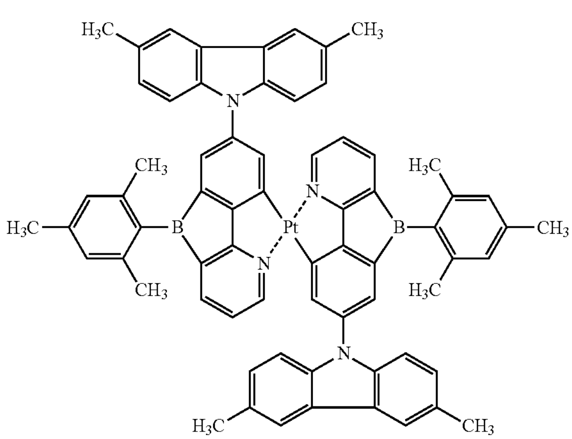
-continued
P-15
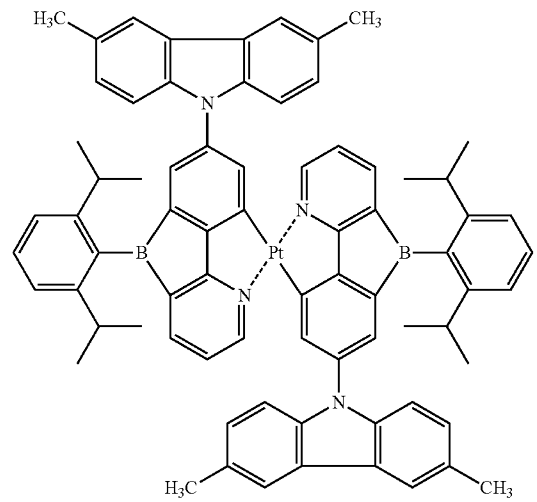
P-16
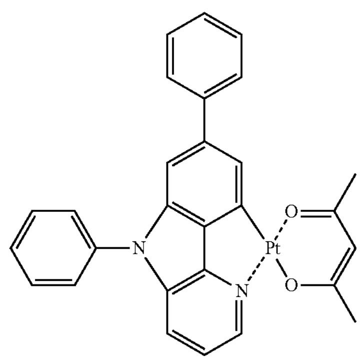
P-17
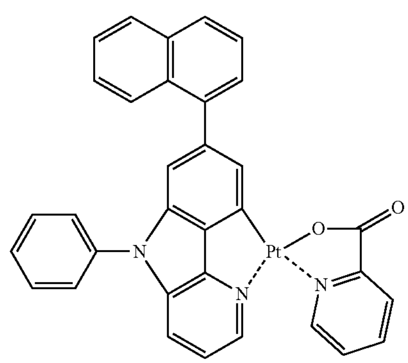
P-18
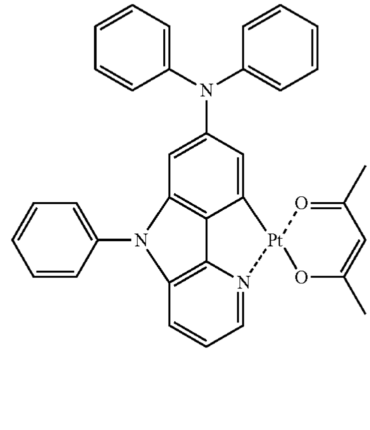

-continued
P-19
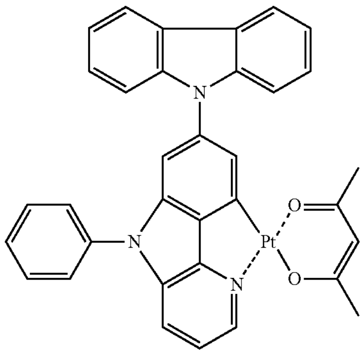
P-20
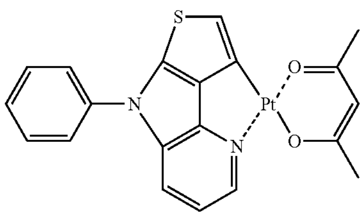
P-21
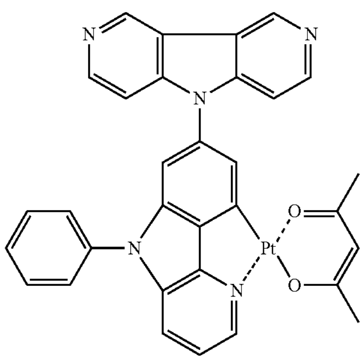
P-22
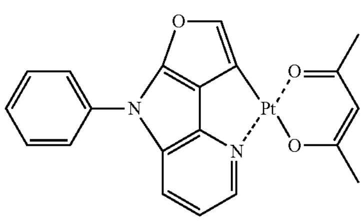
P-23
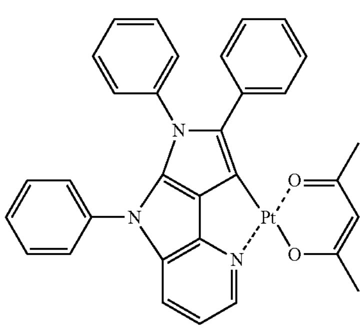
-continued
P-24
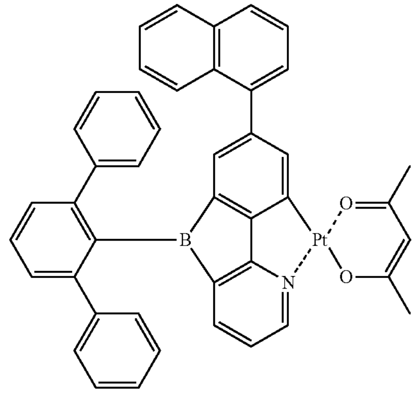
P-25
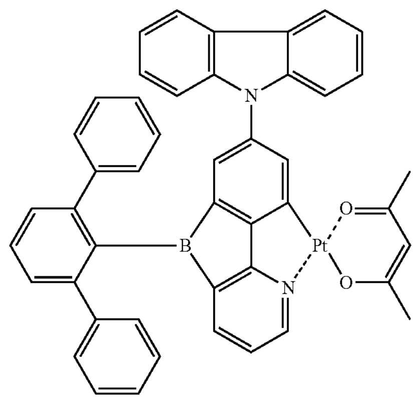
P-26
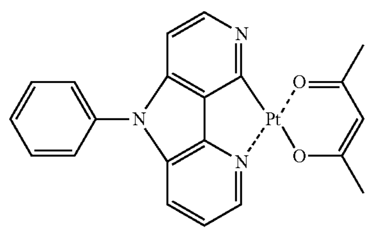
P-27
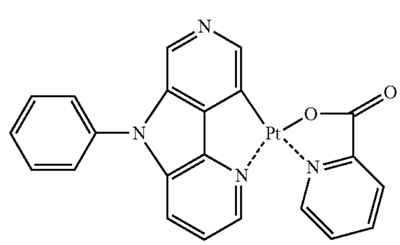
P-28
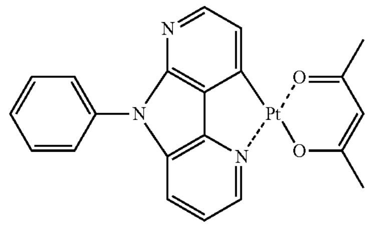

-continued
P-29
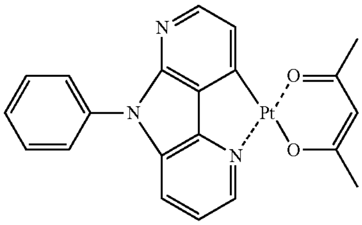
P-30
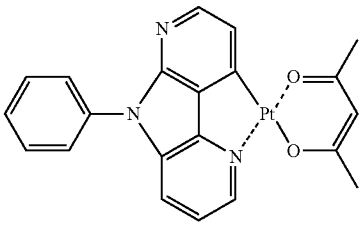
P-31
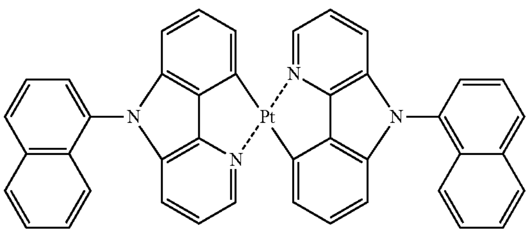
P-32
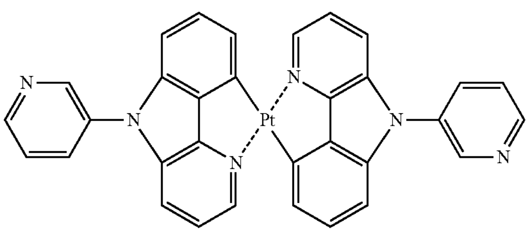
P-33
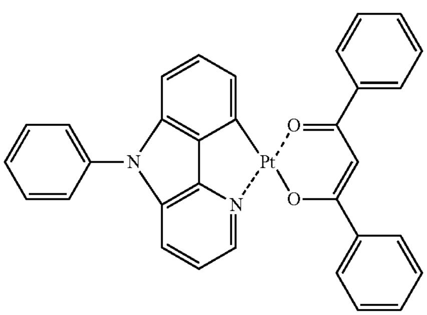
P-34
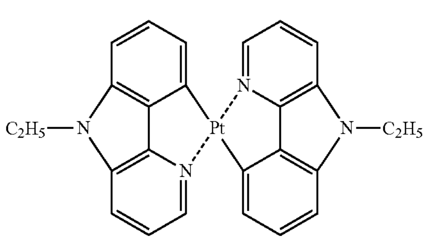
-continued
P-35
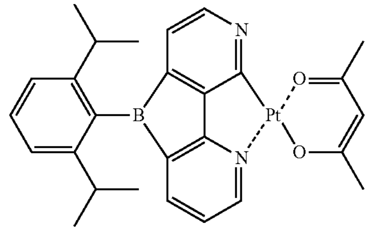
P-36
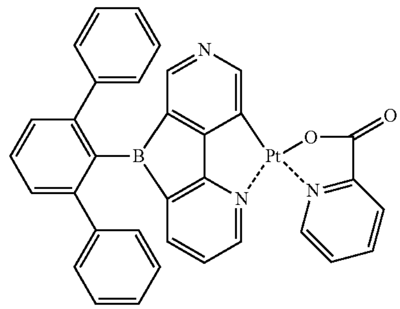
P-37
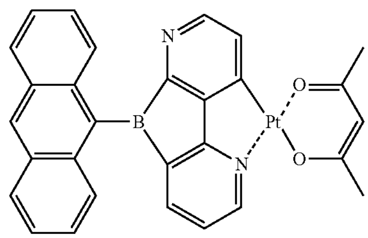
P-38
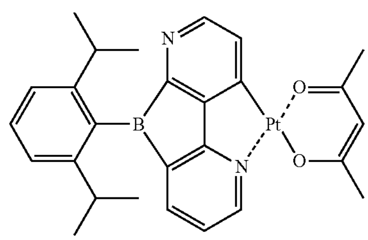
P-39
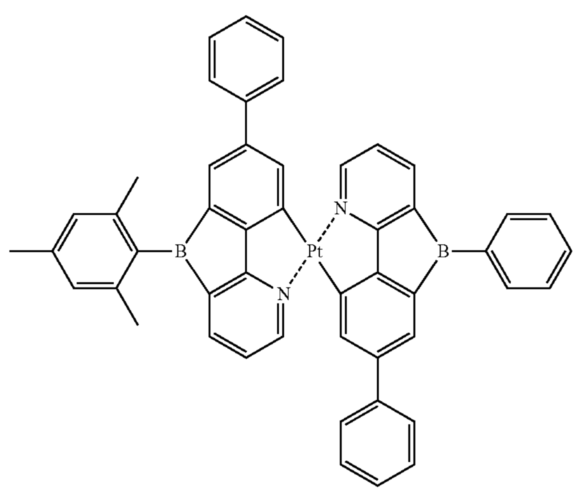

P-40
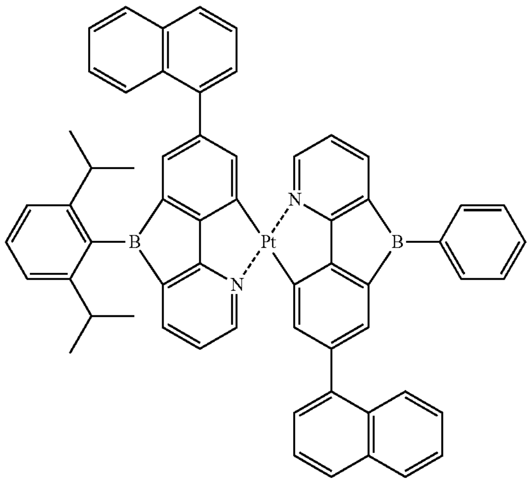
P-41
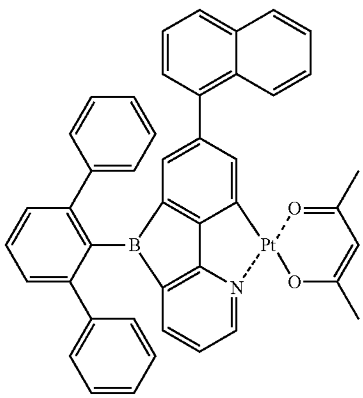
P-42
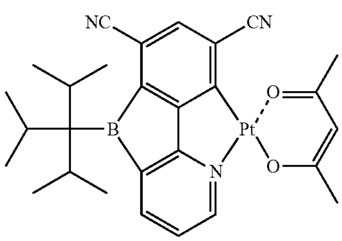
P-43
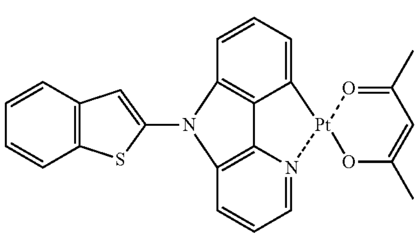
P-44
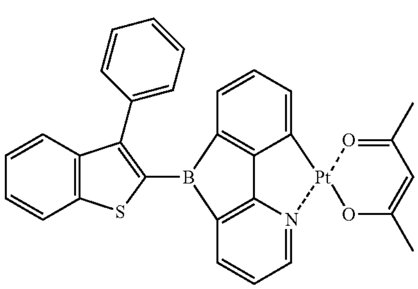
P-45
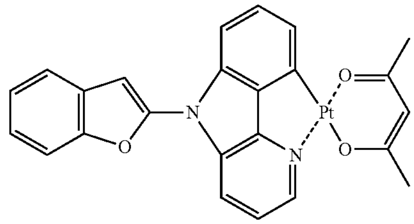
P-46
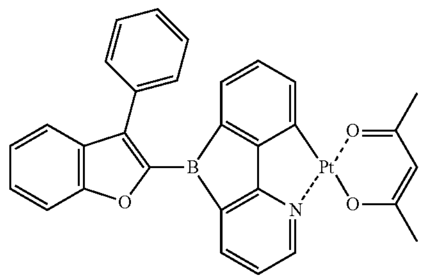
P-47
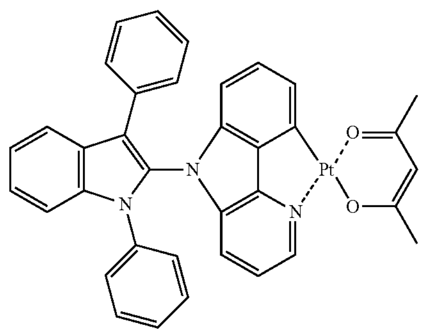
P-48
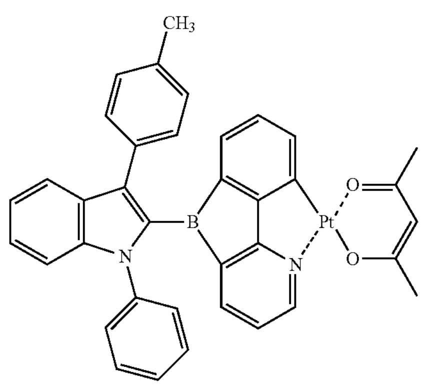
P-49
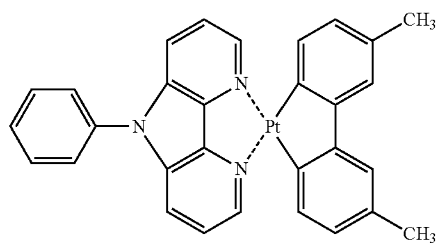

-continued
P-50
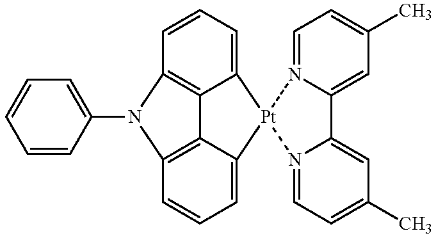
P-51
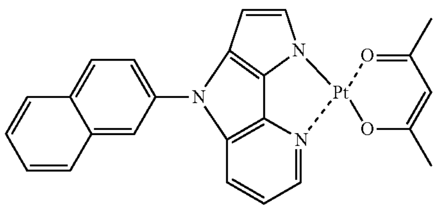
P-52
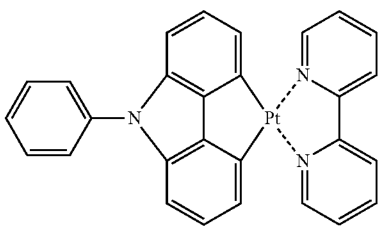
P-53
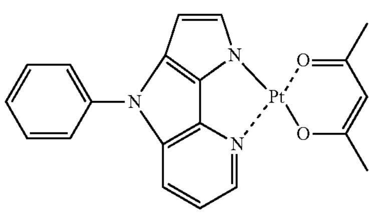
P-54
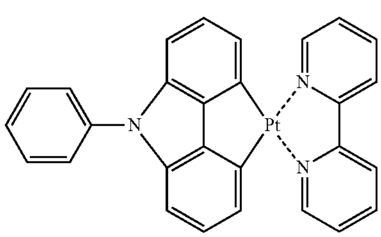
P-55
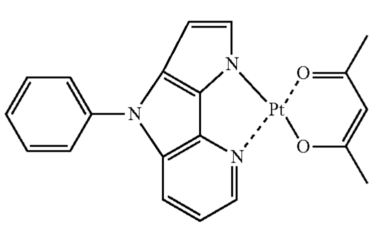
-continued
P-56
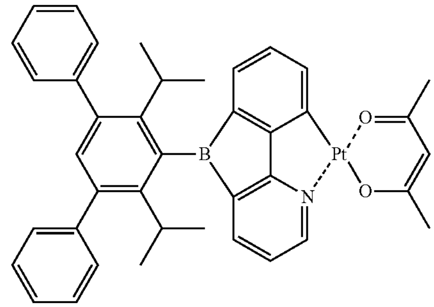
P-57
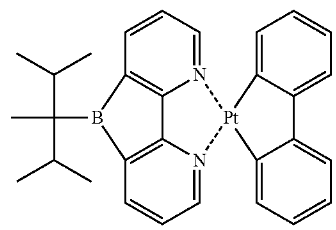
P-58
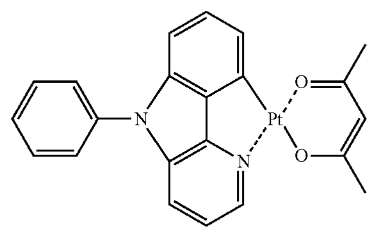
P-59
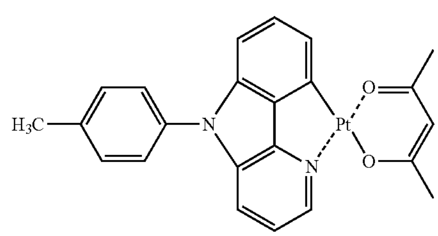
P-60
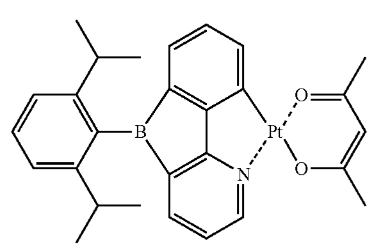

-continued
P-61
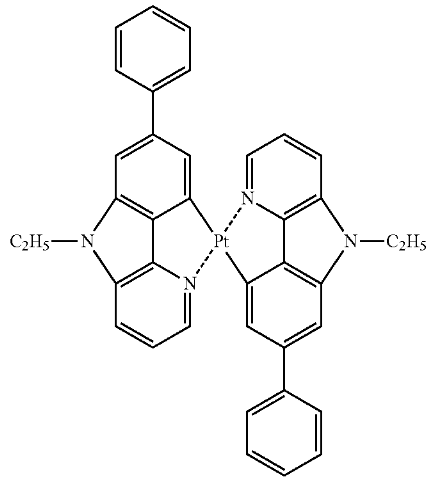
P-62
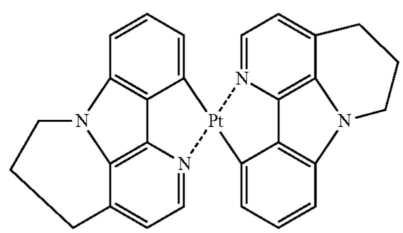
P-63
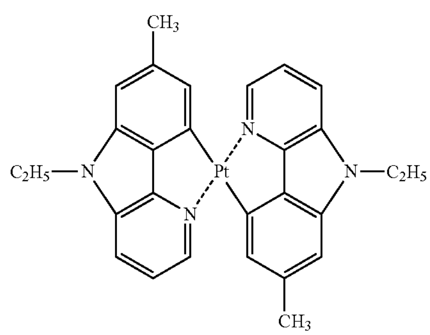
P-64
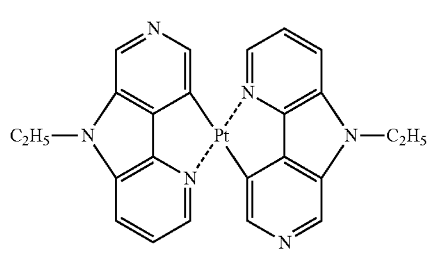
-continued
P-65
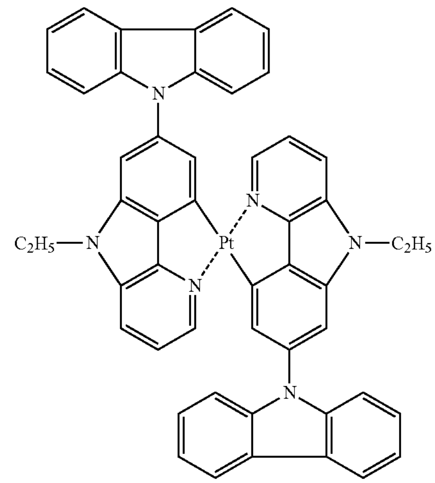
P-66
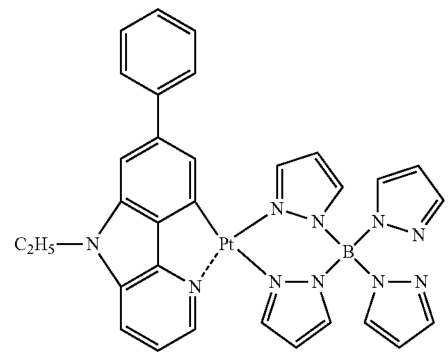
I-1
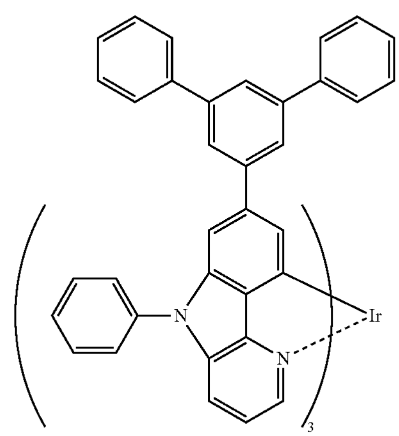
I-2
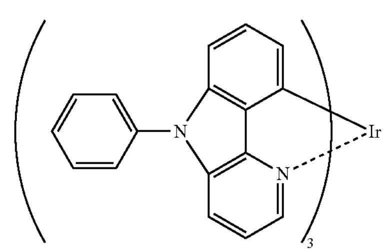

-continued
I-3
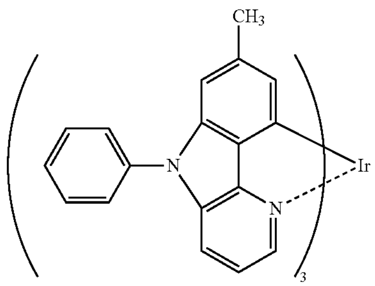
I-4
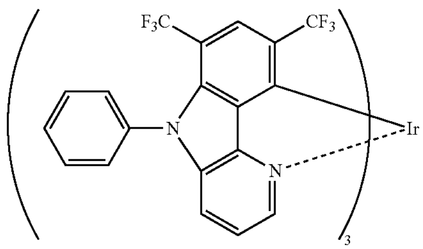
I-5
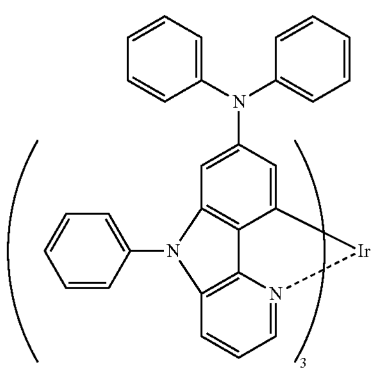
I-6
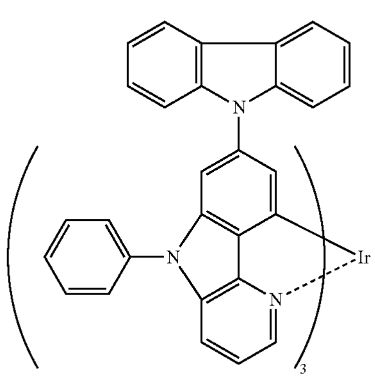
-continued
I-7
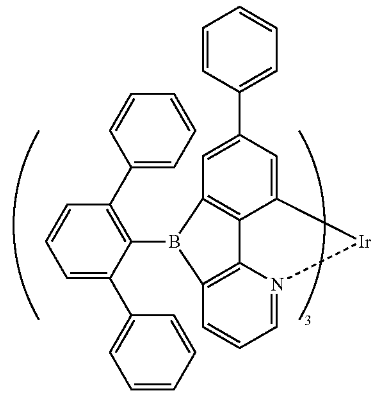
I-8
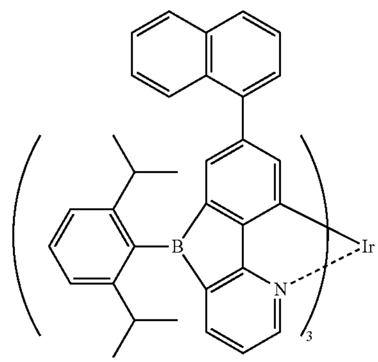
I-9
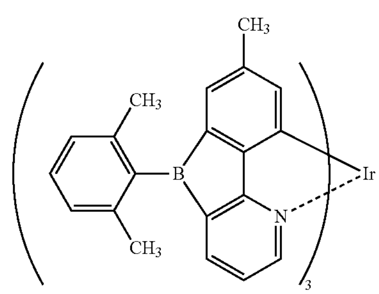
I-10
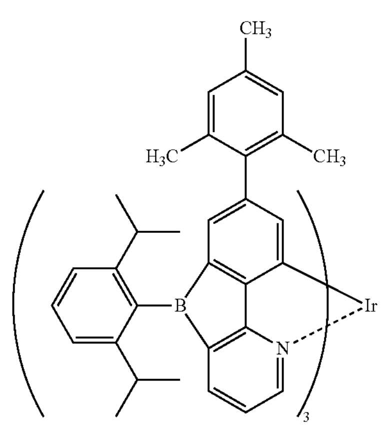

I-11
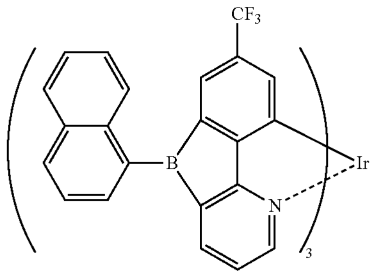
I-12
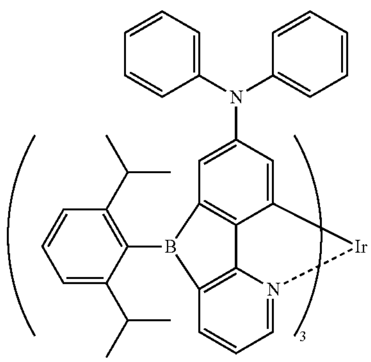
I-13
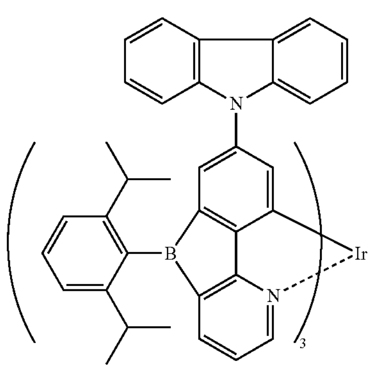
I-14
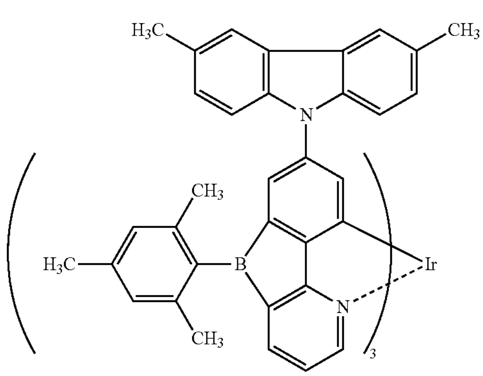
I-15
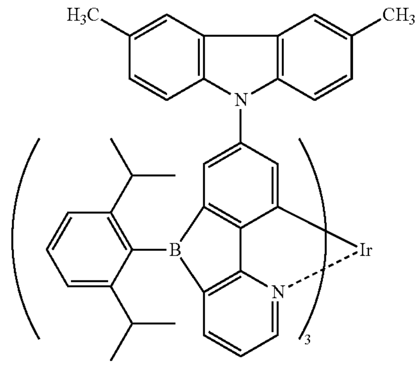
I-16
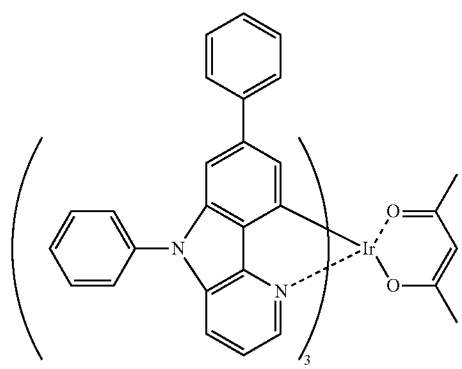
I-17
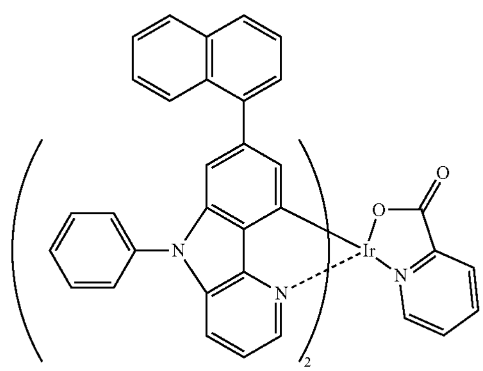
I-18
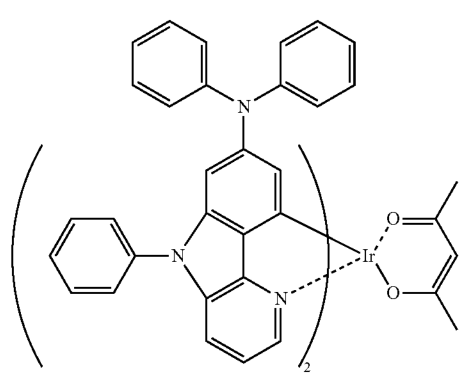

-continued
I-19
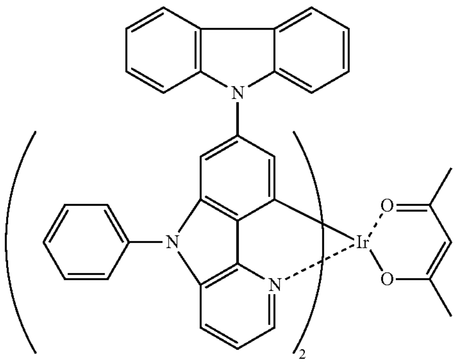
I-20
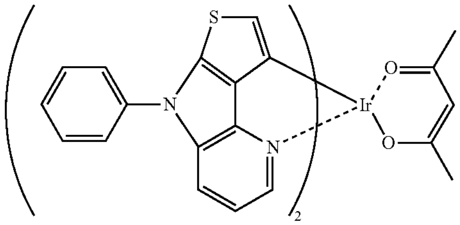
I-21
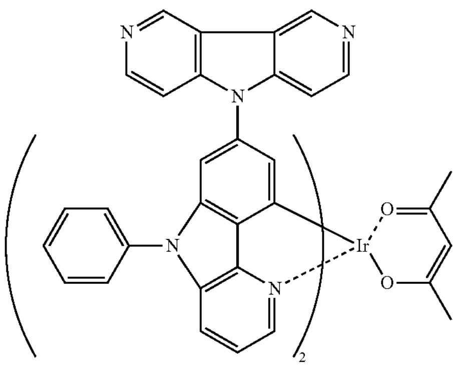
I-22
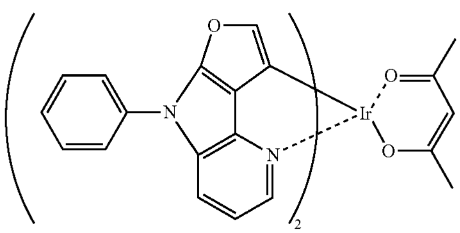
I-23
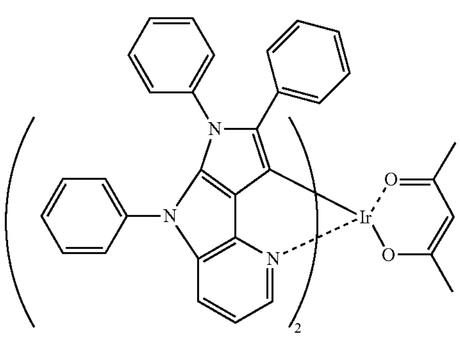
-continued
I-24
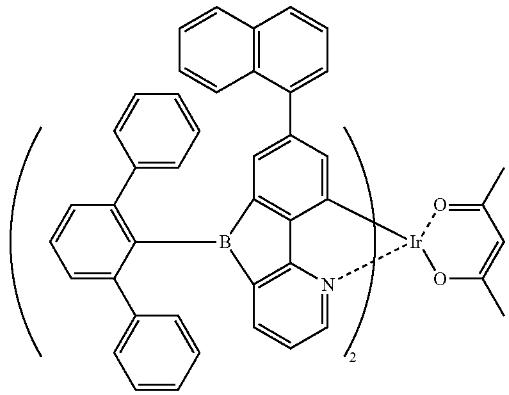
I-25
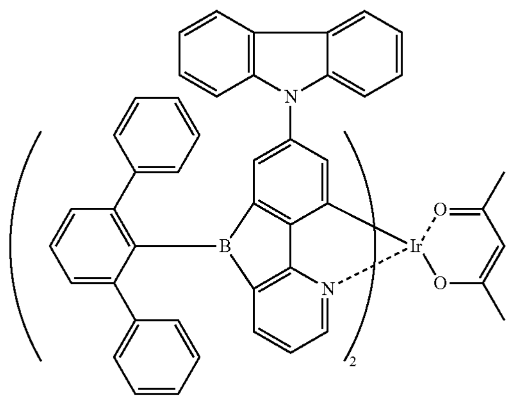
I-27
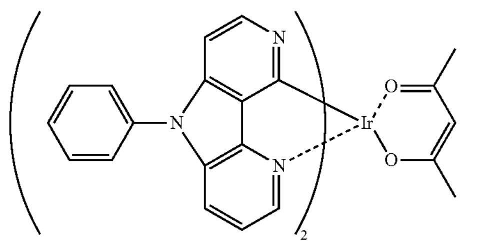
I-28
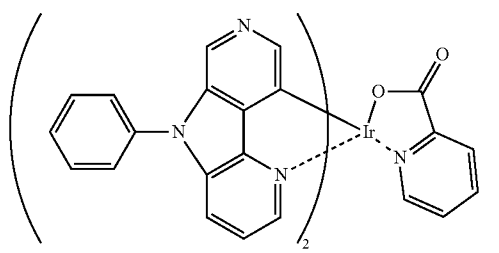
I-29
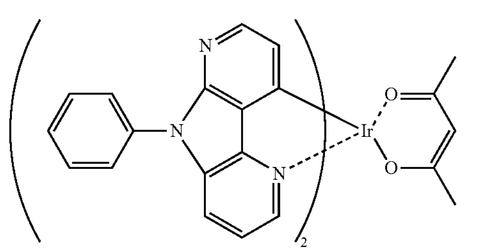

-continued
I-30
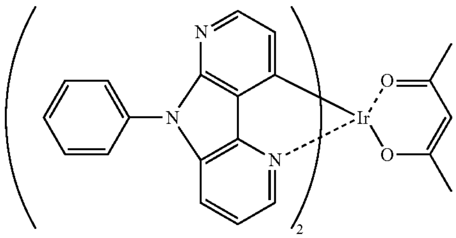
I-31
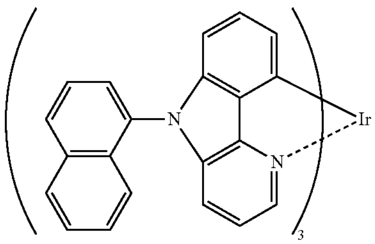
I-32
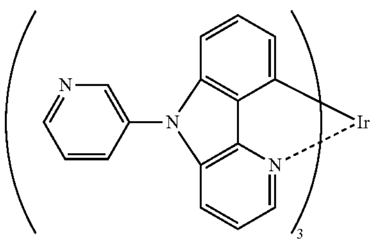
I-33
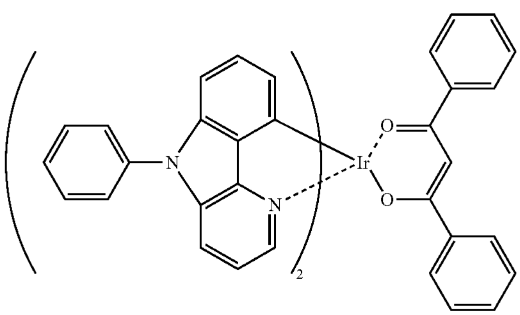
I-34
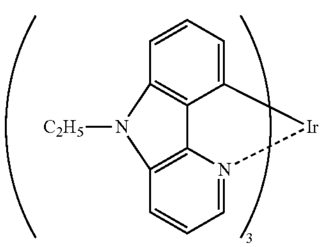
I-35
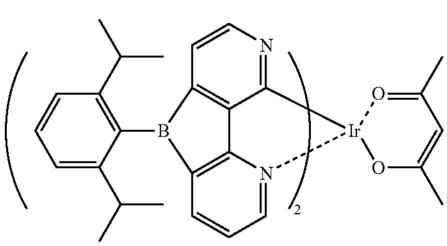
-continued
I-36
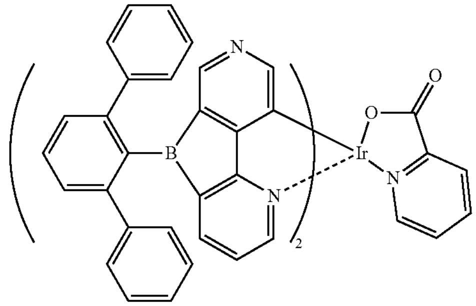
I-37
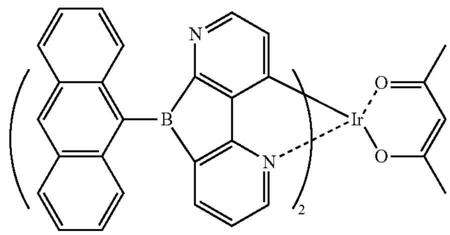
I-38
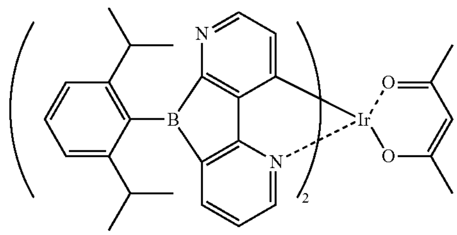
I-39
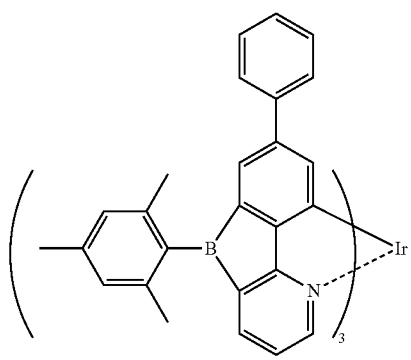
I-40
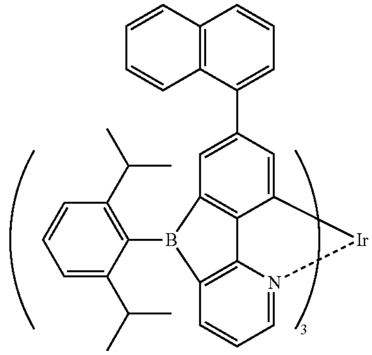

-continued
I-41
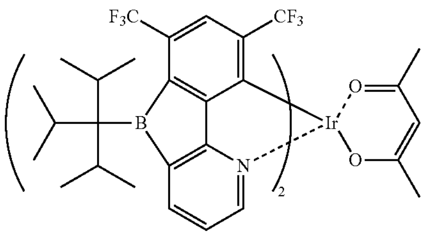
I-42
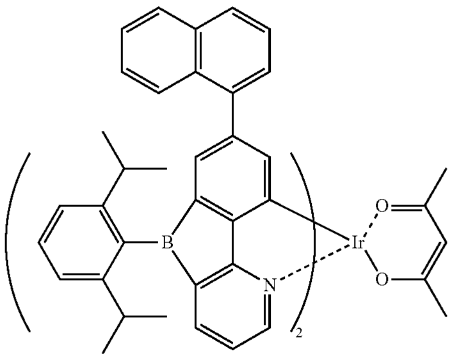
I-43
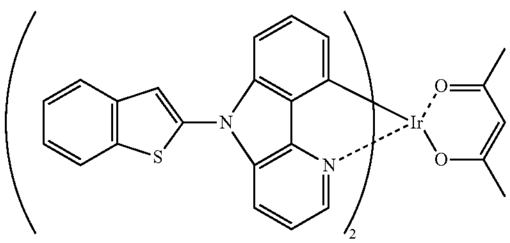
I-44
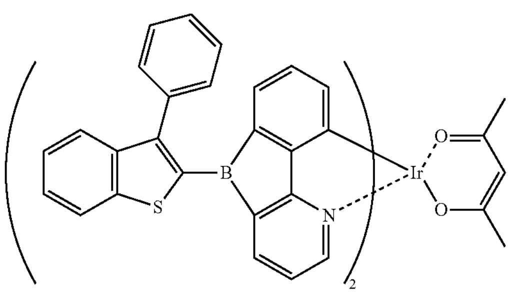
I-45
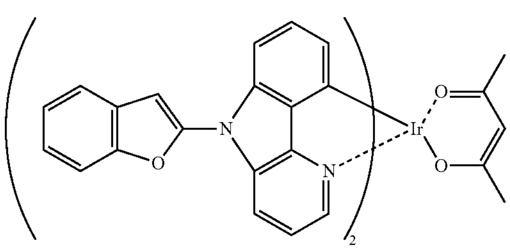
-continued
I-46
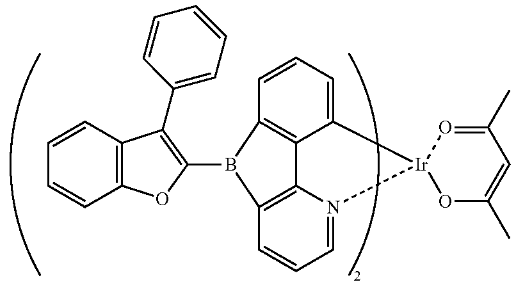
I-47
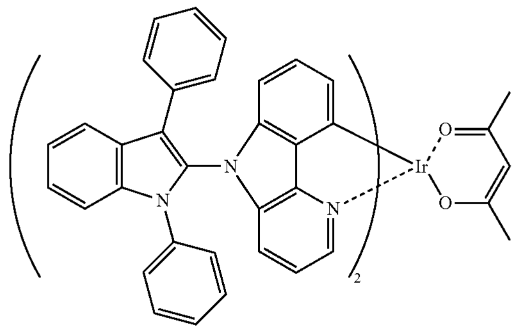
I-48
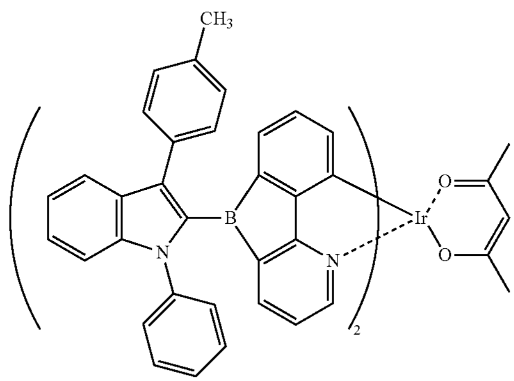
I-49
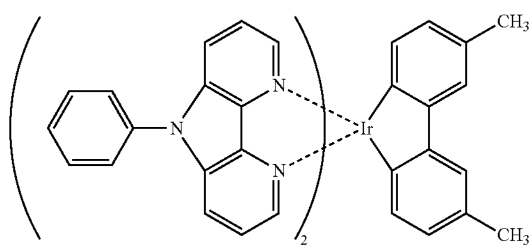
I-50
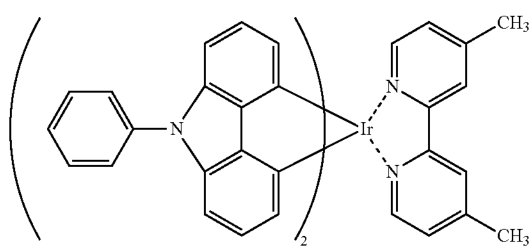

-continued
I-51
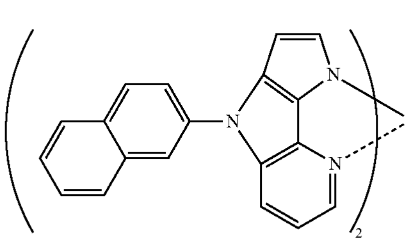
I-52
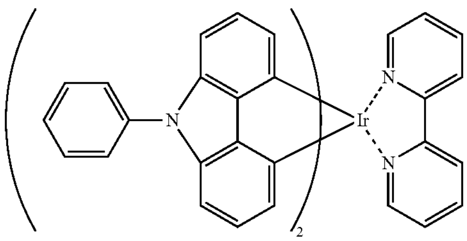
I-53
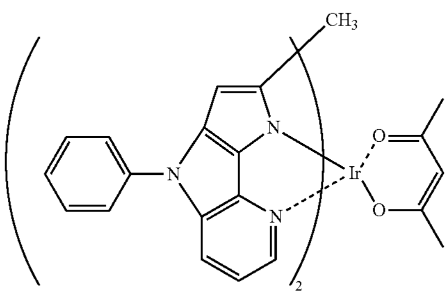
I-54
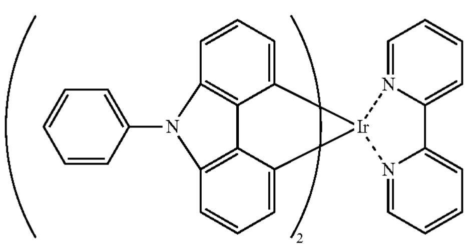
I-55
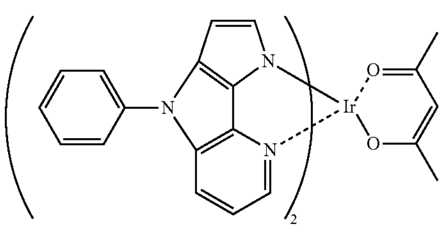
I-56
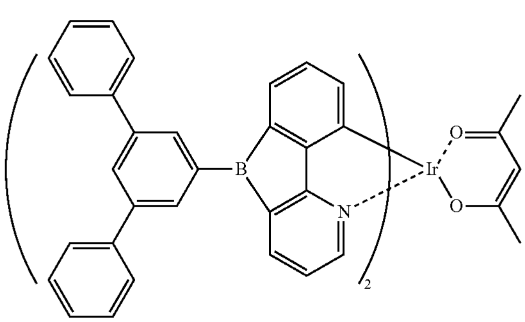
-continued
I-57
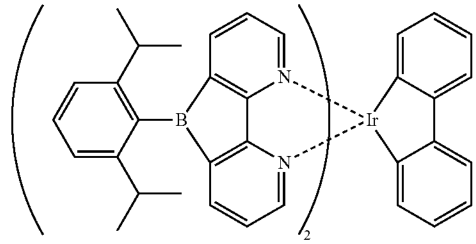
I-58
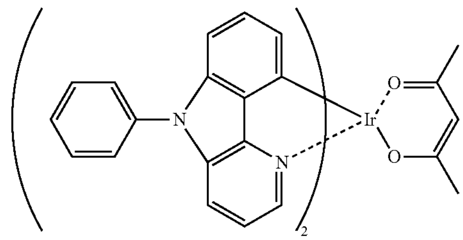
I-59
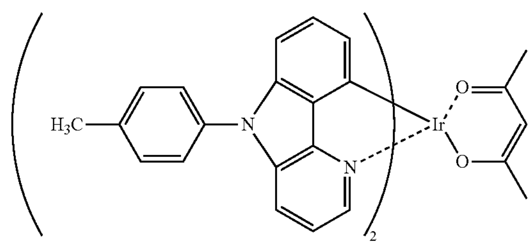
I-60
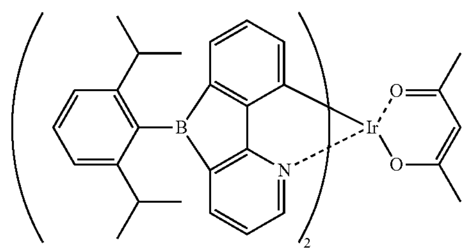
I-61
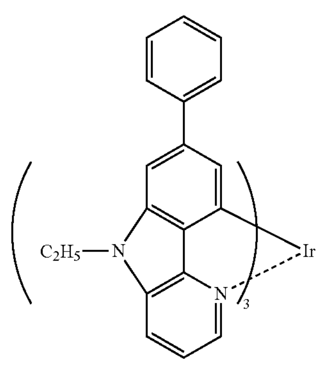
I-62
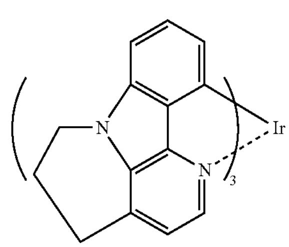

-continued

I-63

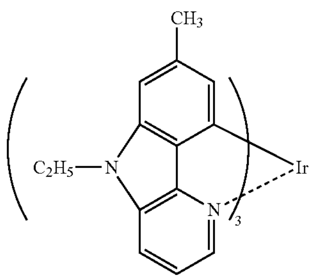

I-64

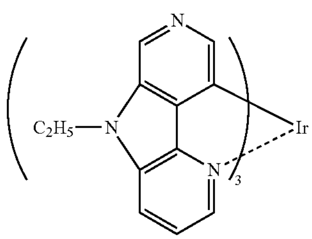

I-65

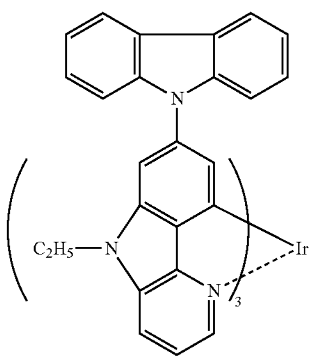

I-66

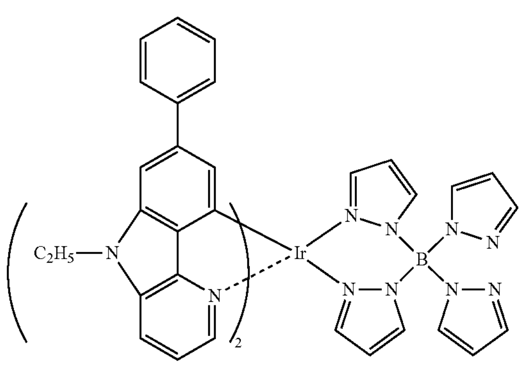

I-67

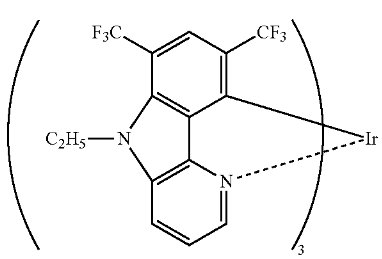

-continued

I-68

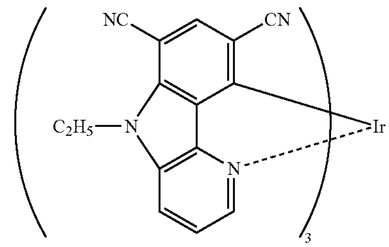

I-69

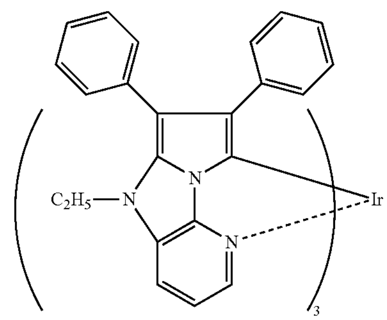

I-70

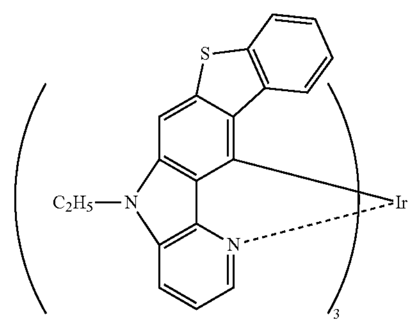

I-71

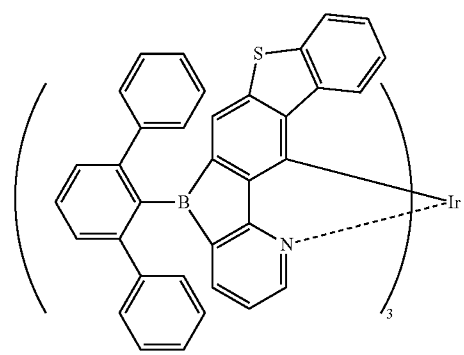

Embodiment (e)

The case in which a metal complex having a ligand represented by following Formula (13), a metal complex having a partial structure represented by following Formula (14), a metal complex having a partial structure represented by following Formula (15) or a tautomer thereof as a partial structure, a metal complex having a ligand represented by following Formula (16), a metal complex having a partial structure represented by following Formula (17), or a metal complex having a partial structure represented by following Formula (18) is utilized as a blue light emitting ortho metalated complex.

<Metal Complex Having Ligand Represented by Formula (13)>

A metal complex having a ligand represented by Formula (13) will now be explained.

First, a ligand represented by Formula (13) will be explained.

In Formula (13), an aromatic hydrocarbon ring which is formed by $Z_1$ together with $C_1$, $X_1$ and $X_3$ includes such as a benzene ring, a biphenyl ring, a naphthalene ring, an azulene ring, an anthrathene ring, a phenanthrene ring, a pyrene ring, a chrisene ring, a naphthacene ring, a triphenylene ring, an o-terphenyl ring, a m-terphenyl ring, a p-terphenyl ring, an acenaphtene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthraathrene ring.

Preferably utilized among them is a benzene ring. Further, the aforesaid aromatic hydrocarbon ring may be provided with a substituent represented by each of $R_1$ and $R_2$ in aforesaid Formula (13), which will be described later.

In Formula (13), an aromatic heterocyclic ring, which is formed by $Z_1$ together with $C_1$, $X_1$ and $X_3$ includes such as a furan ring, a thiophene ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzothiazole ring, a benzooxazole ring, a quinoxaline ring, a quinazoline ring, a phthalazine ring, a carbazole ring, a carboline ring, a ring in which at least one of carbon atoms of a hydrocarbon ring, which constitutes a carboline ring, is substituted by a nitrogen atom.

Preferable among them is a pyridine ring. Further, the aforesaid aromatic heterocyclic ring may be provided with a substituent represented by each of $R_1$ and $R_2$ in aforesaid Formula (13), which will be described later.

In Formula (13), a substituent each independently represented by $R_1$ and $R_2$ includes, for example, an alkyl group (such as a methyl group, an ethyl group, an isopropyl group, a hydroxyethyl group, a methoxymethyl group, a trifluoromethyl group and a t-butyl group), a cycloalkyl group (such as a cyclopentyl group and a cyclohexyl group), an aralkyl group (such as a benzyl group and a 2-phenetyl group), an aromatic hydrocarbon group (such as a phenyl group, a p-chlorophenyl group, a mesityl group, a tolyl group, a xylyl group, a biphenylyl group, a naphtyl group, an anthoryl group and a phenanthryl group), an aromatic heterocyclic group (such as a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolynyl group, a carbazolyl group and a phthalazinyl), an alkoxyl group (such as a methoxy group, an ethoxy group, an isopropoxy group and a butoxy group), an aryloxy group (such as a phenoxy group and a naphthyloxy group), a cyano group, a hydroxyl group, an alkenyl group (such as a vinyl group), a styryl group, a halogen atom (such as a chlorine atom, a bromine atom, an iodine atom and a fluorine atom). These groups may be further substituted.

Among them, in the present invention, at least one of groups represented by aforesaid $R_1$ and $R_2$ is preferably the above-described aromatic hydrocarbon group or aromatic heterocyclic group.

A coordination bond is formed (also referred to as complex formation) between a ligand represented by Formula (13) and a central metal (may be either a metal or an ion) resulting in formation of a metal complex.

Herein, when a coordination bond is formed between the aforesaid ligand and a central metal (which will be described later), a coordination bond or a covalent bond is preferably formed with $X_3$ and/or $X_4$ among atoms which constitute a ligand represented by aforesaid Formula (13).

<Metal Complex Having Partial Structure Represented by Formula (14)>

A metal complex provided with a partial structure represented by Formula (14) according to the present invention will now be explained.

In Formula (14), an aromatic hydrocarbon ring formed by $Z_3$ together with $C_5$, $C_3$ and $C_7$ is identical with an aromatic hydrocarbon ring formed by $Z_1$ together with $C_1$, $X_1$ and $X_3$ in Formula (13).

In Formula (14), an aromatic heterocyclic ring formed by $Z_3$ together with $C_5$, $C_3$ and $C_7$ is identical with an aromatic hydrocarbon ring formed by $Z_1$ together with $C_1$, $X_1$ and $X_3$ in Formula (13).

In Formula (14), an aromatic heterocyclic ring, which is formed by $Z_4$ together with $C_6$, $C_4$ and N includes such as a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzothiazole ring, a benzooxazole ring, a quinoxaline ring, a quinazoline ring, a phthalazine ring, a carbazole ring, a carboline ring and a rings in which at least one of carbon atoms of a hydrocarbon ring constituting a carboline ring is substituted by a nitrogen atom. Further, the aforesaid aromatic heterocyclic ring may be provided with a substituent represented by each of $R_1$ and $R_2$ in aforesaid Formula (13).

In Formula (14), a substituent each independently represented by $R_3$ and $R_4$ is identical with a substituent each independently represented by $R_1$ and $R_2$ in aforesaid Formula (13).

In Formula (14), $M_{11}$ is an element of the VIII group belonging to the 8th-10th groups of the periodic table, and preferably utilized are platinum (Pt) and iridium (Ir). Further, in Formula (14), $M_{11}$ may be either a metal or an ion.

<Metal Complex Having Formula (15) or Tautomer Thereof as Partial Structure>

A metal complex according to the present invention, which is provided with Formula (15) or a tautomer thereof as a partial structure, will now be explained.

In Formula (15), a substituent each independently represented by $R_5$ and $R_6$ is identical with a substituent each independently represented by $R_1$ and $R_2$ in aforesaid Formula (13).

In Formula (15), at least one of substituents represented by $R_5$ and $R_6$ is an aromatic hydrocarbon group or an aromatic heterocyclic group.

In Formula (15), an element represented by $M_{12}$ belonging to the 8th-10th groups of the periodic table is identical with an element represented by $M_{11}$ belonging to the 8th-10th groups of the periodic table in Formula (14).

<Metal Complex Having Ligand Represented by Formula (16)>

A metal complex having a ligand represented by Formula (16) will now be explained.

In Formula (16), an aromatic hydrocarbon ring each independently formed by $Z_5$ together with $C_8$, $X_3$ and $X_5$, $Z_6$ together with $C_9$, $X_4$ and $X_6$, $Z_7$ together with $C_{10}$ and $C_{11}$, and $Z_8$ together with $C_{12}$ and $C_{13}$, is identical with an aromatic hydrocarbon ring formed by $Z_1$ together with $C_1$, $X_1$ and $X_3$ in aforesaid Formula (13).

In Formula (16), an aromatic heterocyclic ring independently each formed by $Z_5$ together with $C_8$, $X_3$ and $X_5$, $Z_6$ together with $C_9$, $X_4$ and $X_6$, $Z_7$ together with $C_{10}$ and $C_{11}$, and $Z_8$ together with $C_{12}$ and $C_{13}$, is identical with an aromatic heterocyclic ring formed by $Z_1$ together with $C_1$, $X_1$ and $X_3$ in aforesaid Formula (13).

<Metal Complex Having Partial Structure Represented by Formula (17)>

A metal complex having a partial structure represented by Formula (17) will now be explained.

In Formula (17), an aromatic hydrocarbon ring each independently formed by $Z_9$ together with $C_{16}$, $C_{14}$ and $C_{18}$, $Z_{11}$ together with $C_{19}$ and $C_{20}$, and $Z_{12}$ together with $C_{21}$ and $C_{22}$, is identical with an aromatic hydrocarbon ring formed by $Z_1$ together with $C_1$, $X_1$ and $X_3$ in aforesaid Formula (13).

In Formula (17), an aromatic heterocyclic ring each independently formed by $Z_9$ together with $C_{16}$, $C_{14}$ and $C_{18}$, $Z_{11}$ together with $C_{19}$ and $C_{20}$, and $Z_{12}$ together with $C_{21}$ and $C_{22}$, is identical with an aromatic heterocyclic ring formed by $Z_1$ together with $C_1$, $X_1$ and $X_3$ in aforesaid Formula (13).

In Formula (17), an aromatic heterocyclic ring formed by $Z_{10}$ together with $C_{17}$, $C_{15}$ and N is identical with an aromatic heterocyclic ring formed by $Z_4$ together with $C_6$, $C_4$ and N in Formula (14).

In Formula (17), an element represented by $M_{21}$ belonging to the 8th-10th groups of the periodic table is identical with an element represented by $M_{11}$ belonging to the 8th-10th groups of the periodic table in Formula (14).

<Metal Complex Having Partial Structure Represented by Formula (18)>

A metal complex having a partial structure represented by Formula (18) will now be explained.

In Formula (18), an aromatic hydrocarbon ring each formed by $Z_{13}$ together with $C_{23}$ and $C_{24}$, and $Z_{14}$ together with $C_{25}$ and $C_{26}$, is identical with an aromatic hydrocarbon ring formed by $Z_1$ together with $C_1$, $X_1$ and $X_3$ in aforesaid Formula (13).

In Formula (18), an aromatic hydrocarbon ring each independently formed by $Z_{13}$ together with $C_{23}$ and $C_{24}$, and $Z_{14}$ together with $C_{25}$ and $C_{26}$, is identical with an aromatic hydrocarbon ring formed by $Z_1$ together with $C_1$, $X_1$ and $X_3$ in aforesaid Formula (13).

In Formula (18), a substituent each independently represented by $R_9$ and $R_{10}$ is identical with a substituent each independently represented by $R_1$ and $R_2$ in aforesaid Formula (13).

In Formula (18), an element represented by $M_{22}$ belonging to the 8th-10th groups of the periodic table is identical with an element represented by $M_{11}$ belonging to the 8th-10th groups of the periodic table in Formula (14).

In the following, specific examples of a metal complex having a ligand represented by Formula (13), a metal complex having a partial structure represented by Formula (14), a metal complex having a partial structure represented by Formula (15) or a tautomer thereof as a partial structure, a metal complex having a ligand represented by Formula (16), a metal complex having a partial structure represented by Formula (17), or a metal complex having a partial structure represented by Formula (18) will be listed, however, the present invention is not limited thereto.

P-1

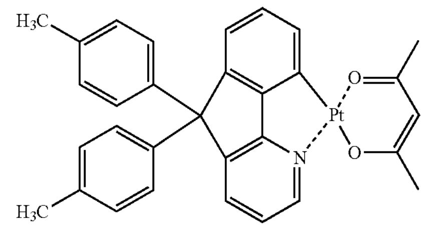

P-2

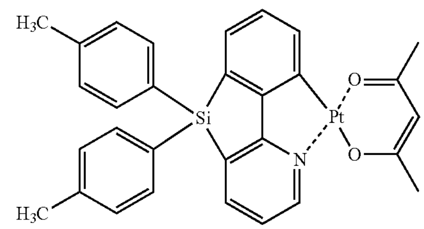

P-3

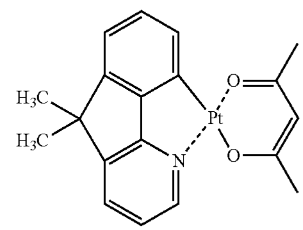

P-4

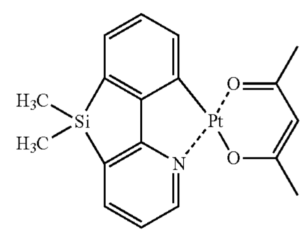

P-5

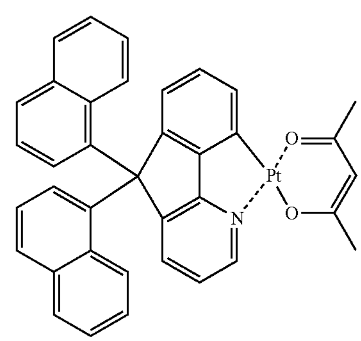

P-6

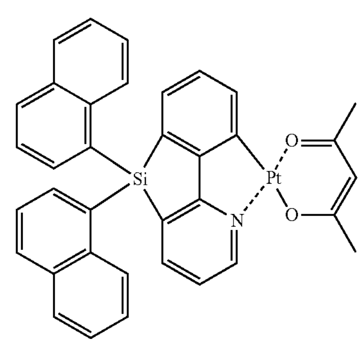

-continued
P-7
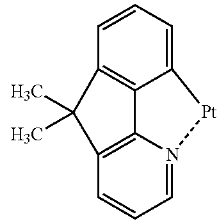
P-8
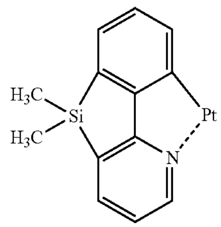
P-9
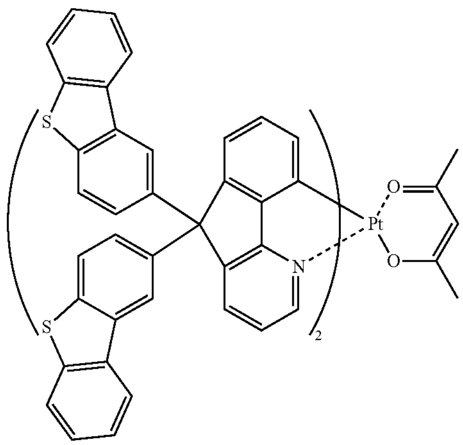
PP-1
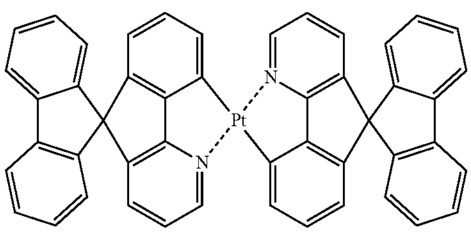
PP-2
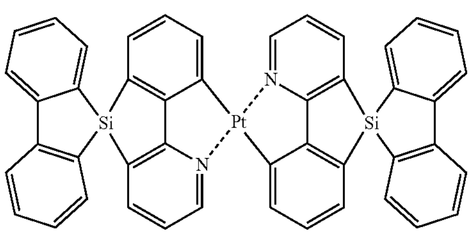
PP-3
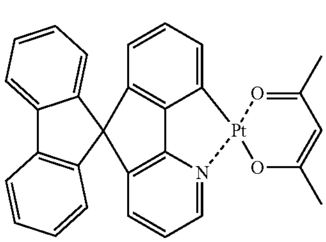
-continued
PP-4
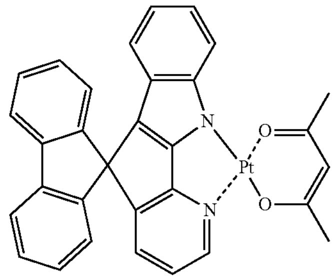
PP-5
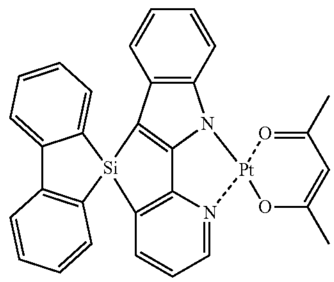
PP-6
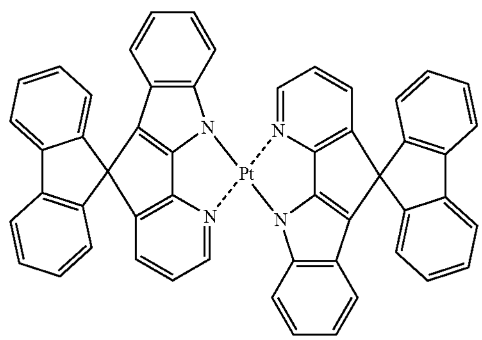
PP-7
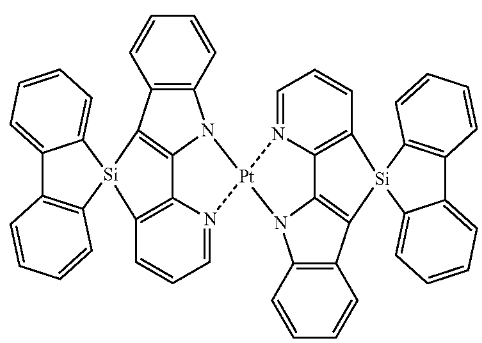
PP-8
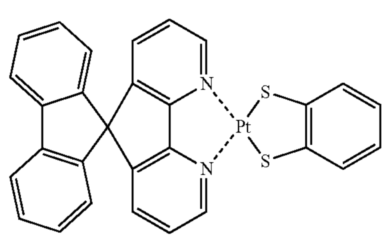

-continued
PP-9
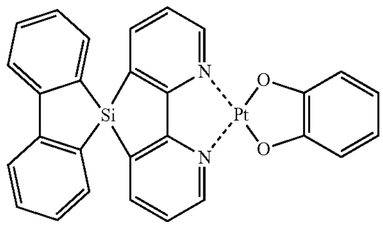
PP-10
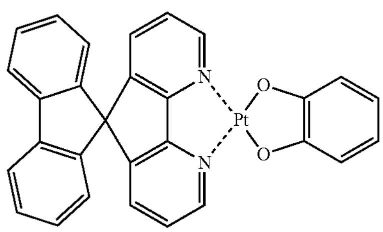
PP-11
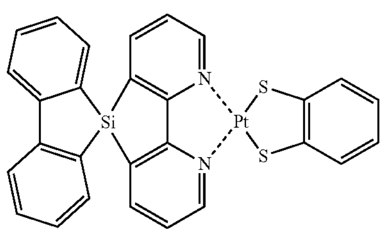
PP-12
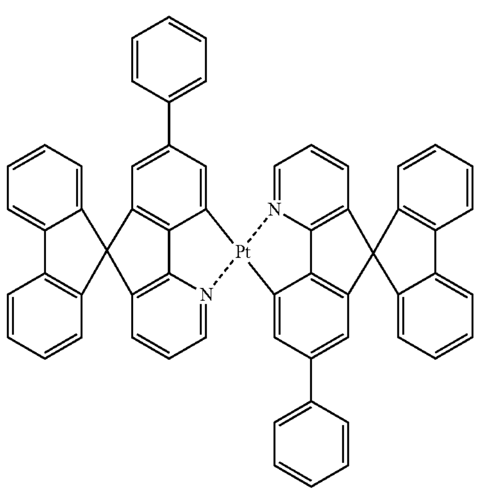
-continued
PP-13
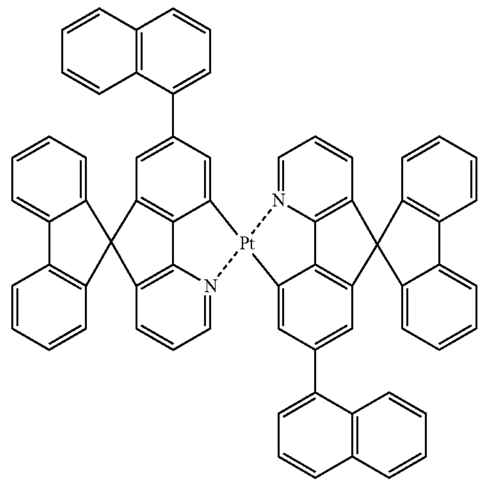
PP-14
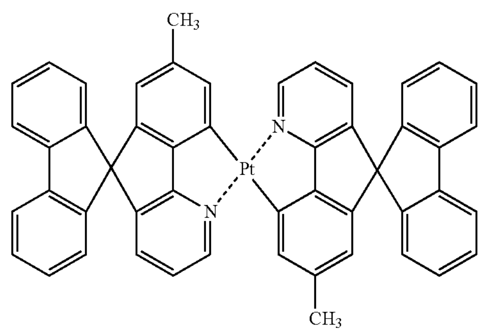
PP-15
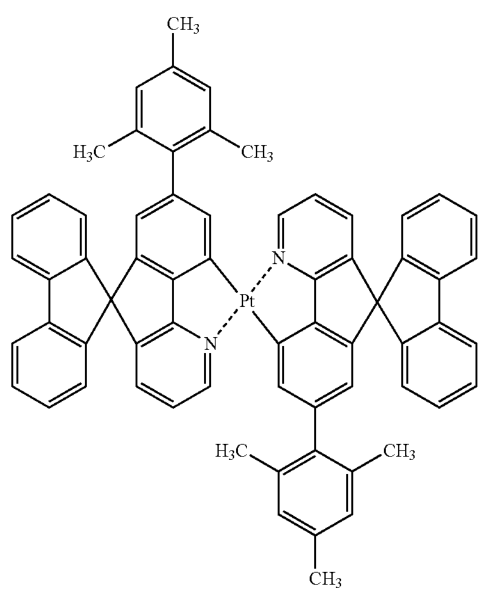

-continued
PP-16
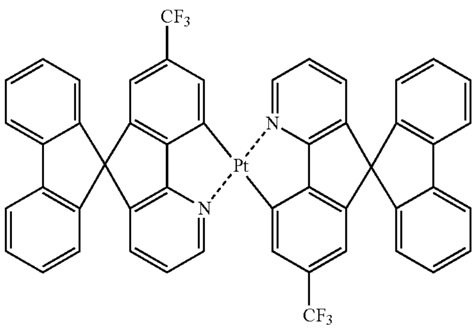
PP-17
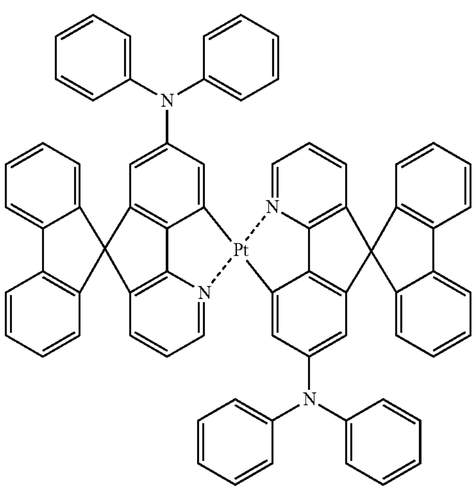
PP-18
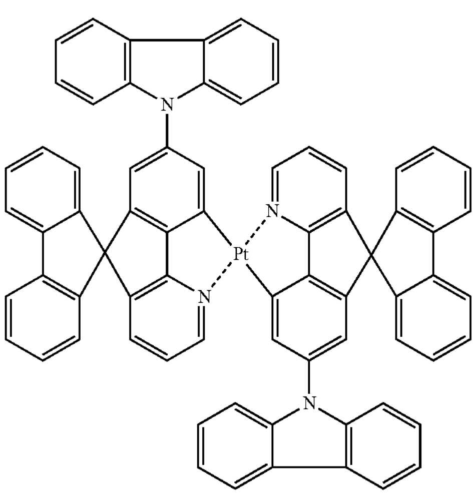
-continued
PP-19
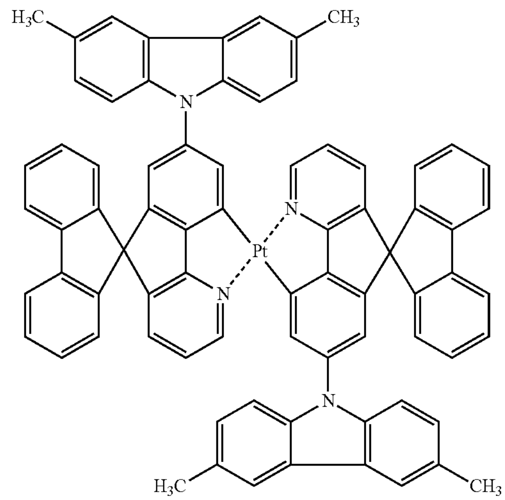
PP-20
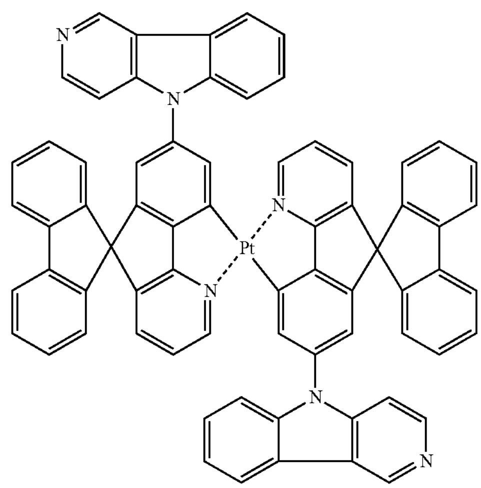
PP-21
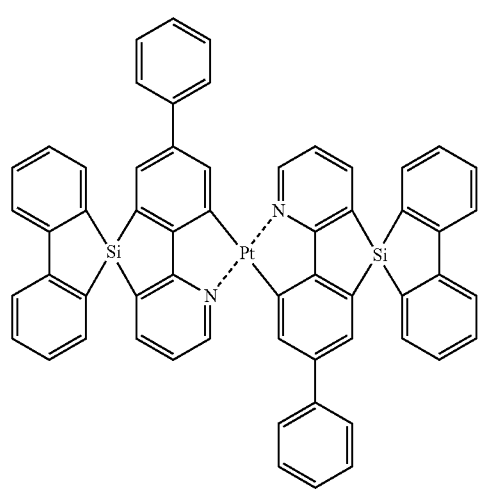

PP-22
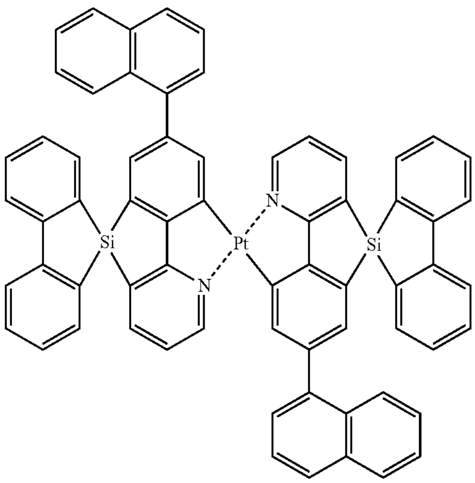
PP-23
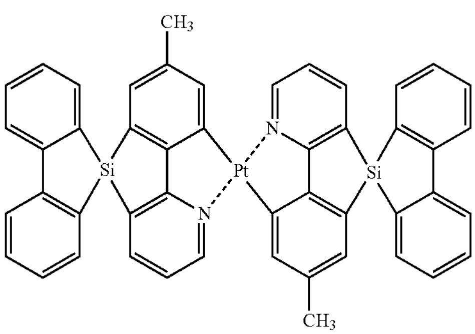
PP-24
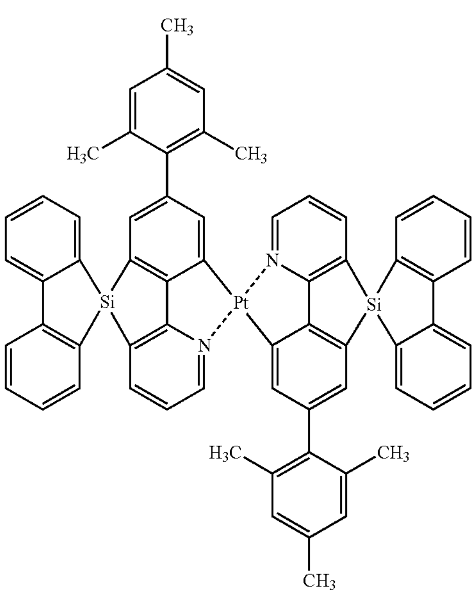
PP-25
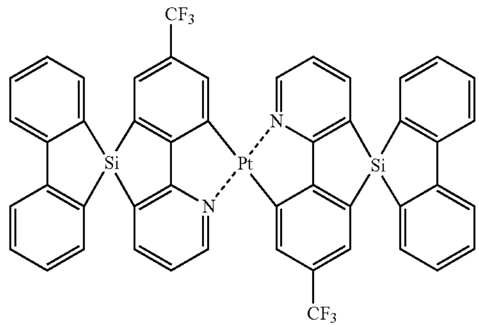
PP-26
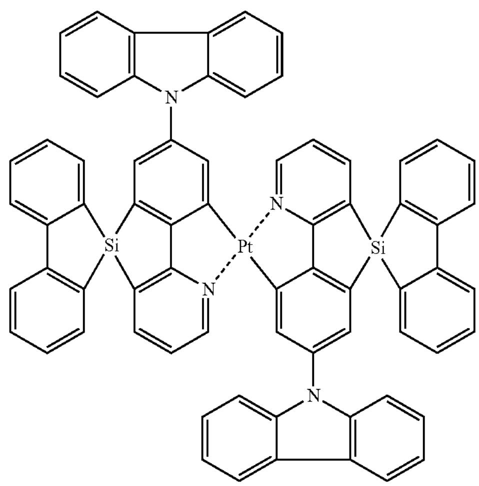
PP-27
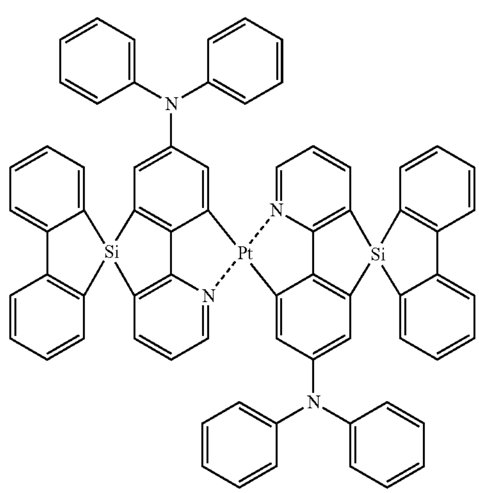

PP-28
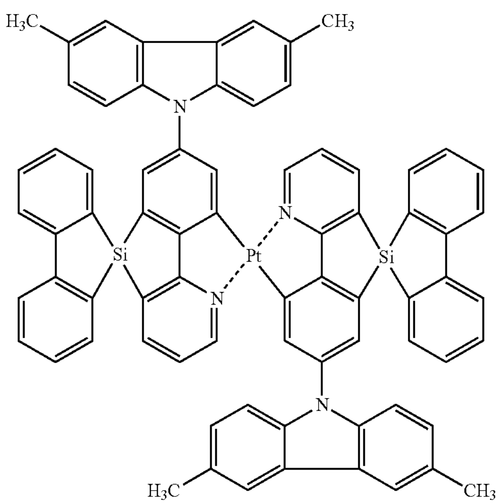
PP-29
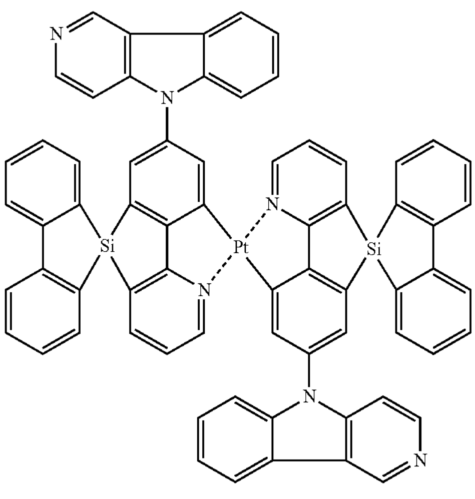
PP-30
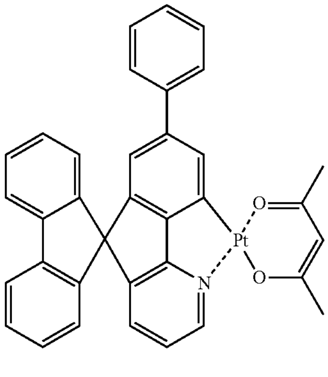
PP-31
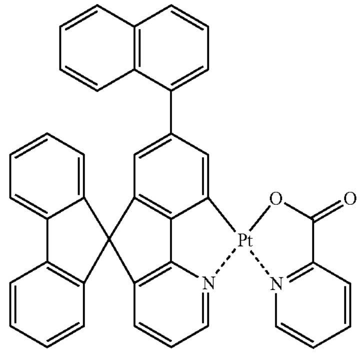
PP-32
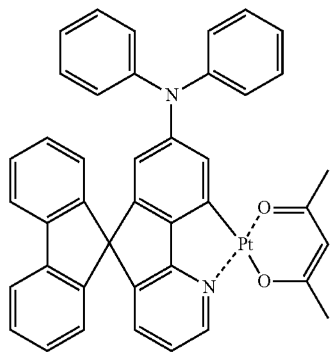
PP-33
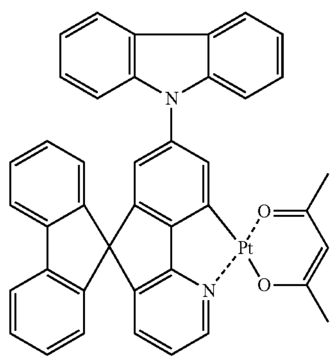
PP-34
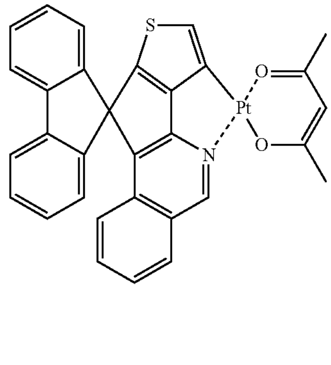

-continued
PP-35
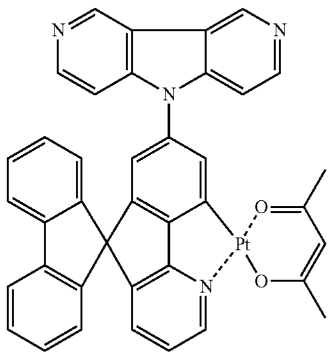
PP-36
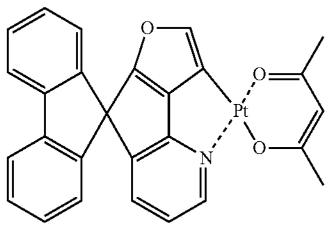
PP-37
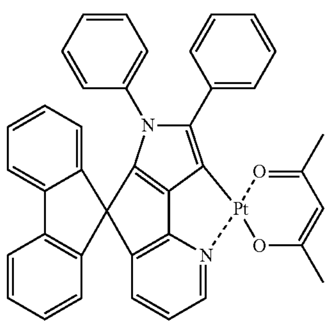
PP-38
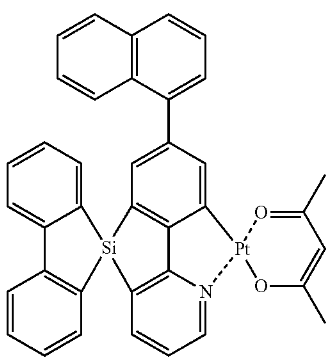
PP-39
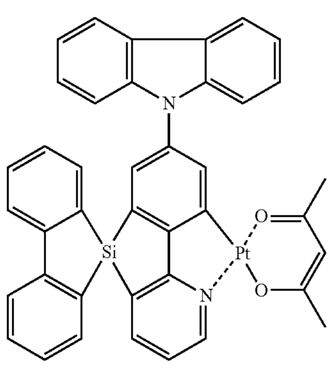
-continued
PP-40
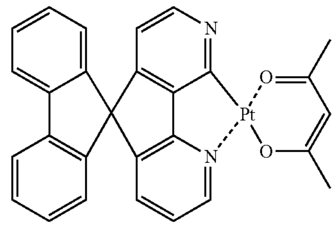
PP-41
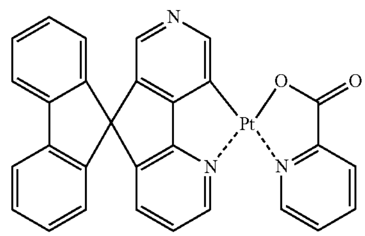
PP-42
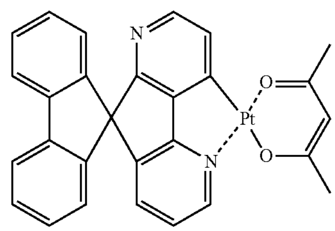
PP-43
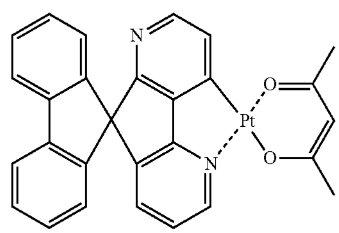
PP-44
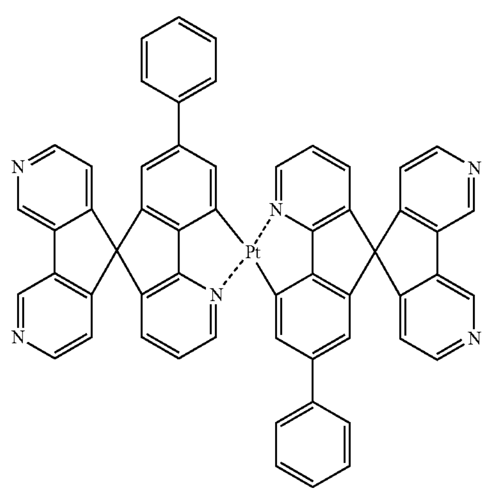

-continued
PP-45
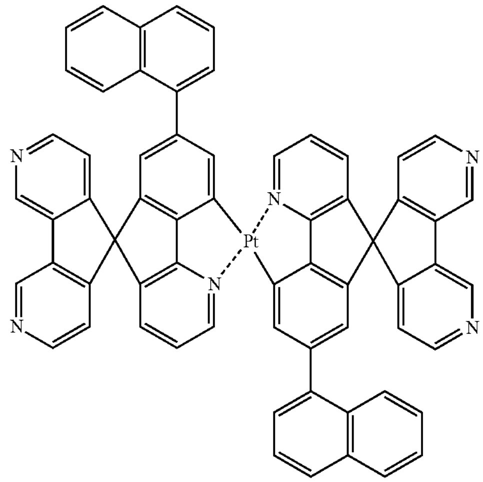
PP-46
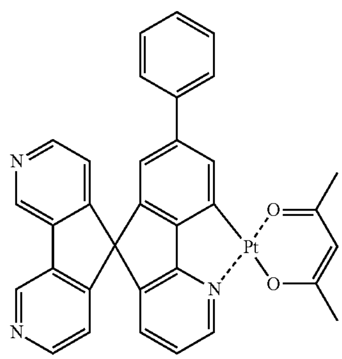
PP-47
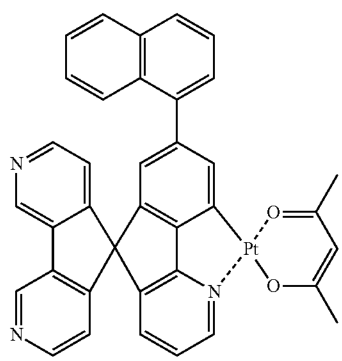
PP-48
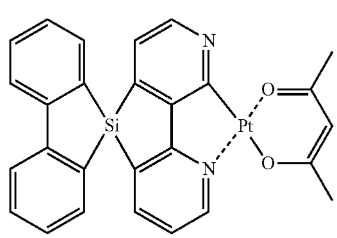
-continued
PP-49
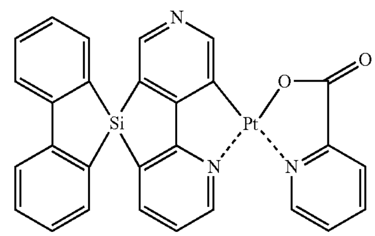
PP-50
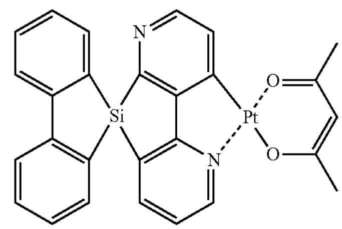
PP-51
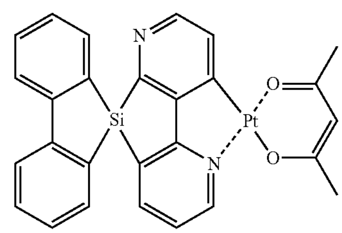
PP-52
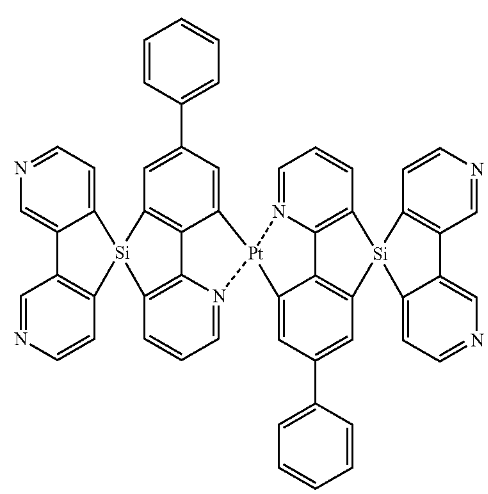

-continued
PP-53
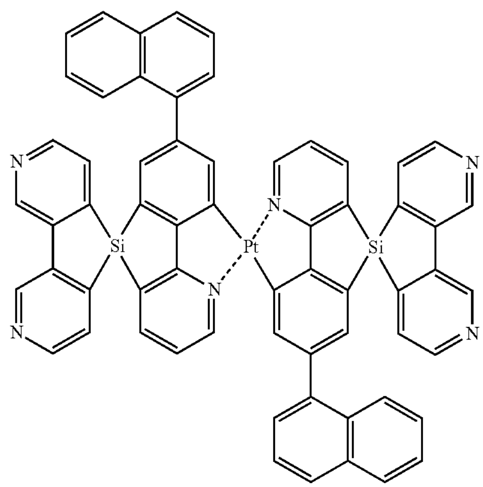
PP-54
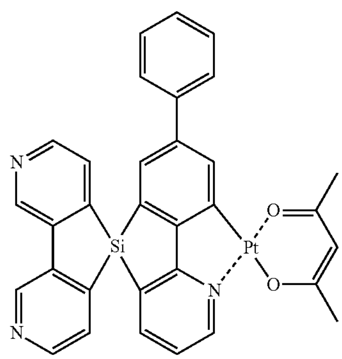
PP-55
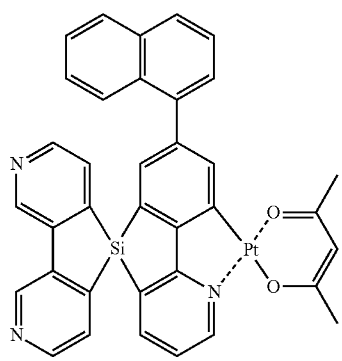
PP-56
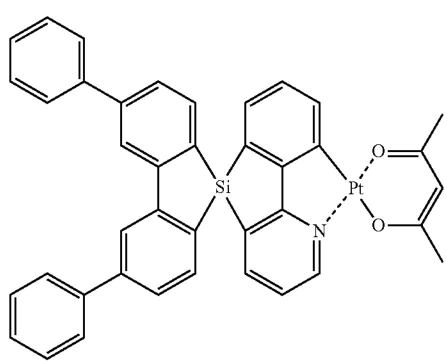
-continued
PP-57
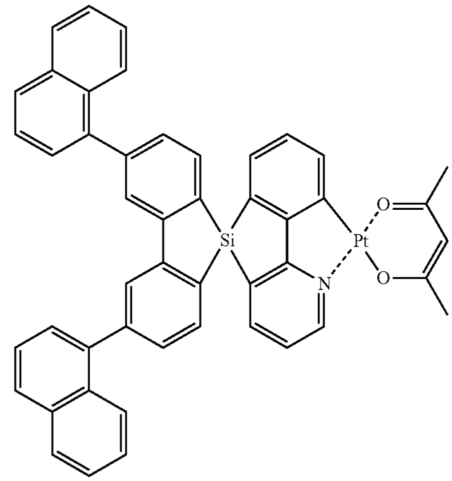
PP-58
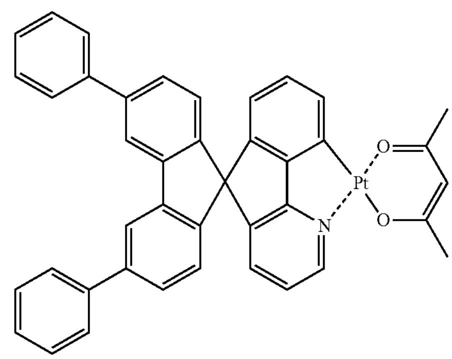
PP-59
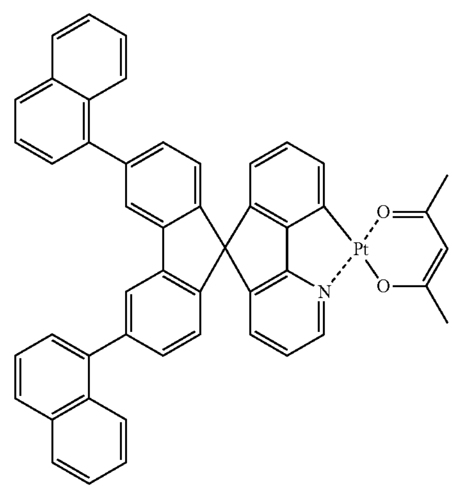
PP-60
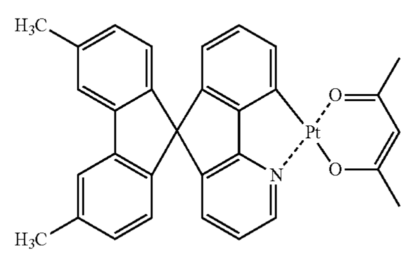

-continued
PP-61
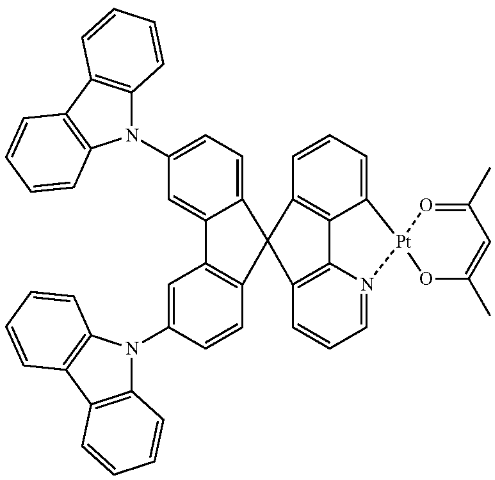
PP-62
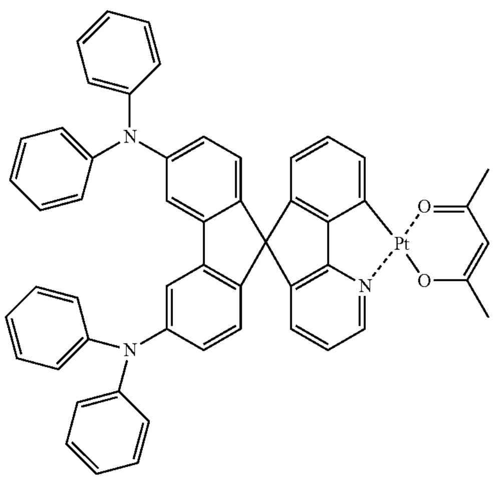
PP-63
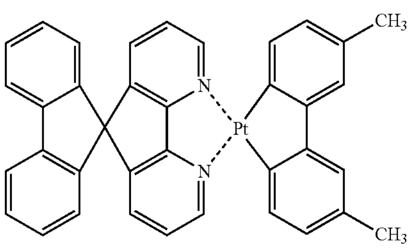
PP-64
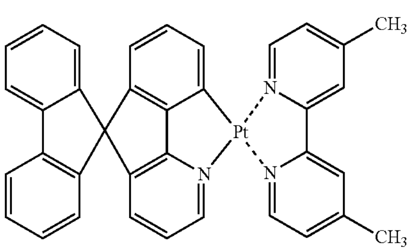
-continued
PP-65
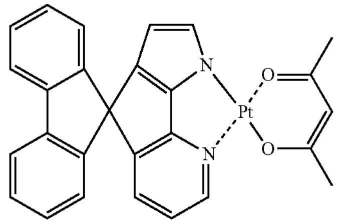
PP-66
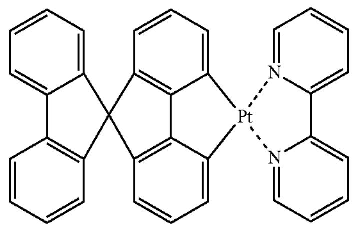
PP-67
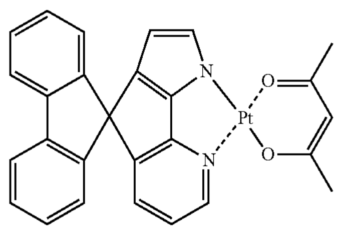
PP-68
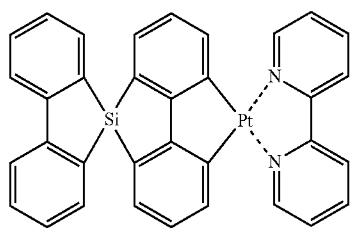
PP-69
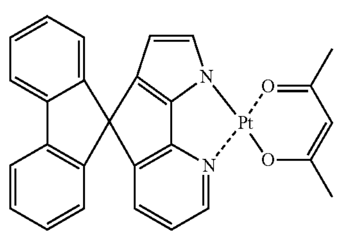
PP-70
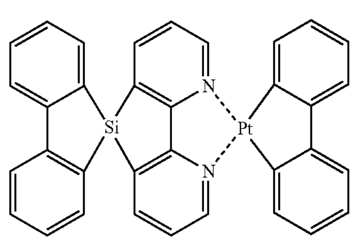

-continued
PP-71
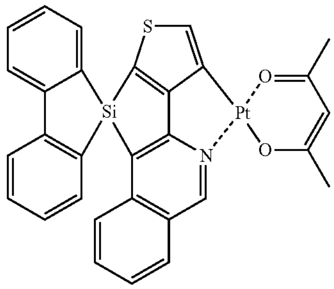
I-1
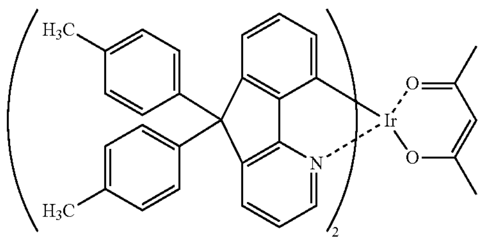
I-2
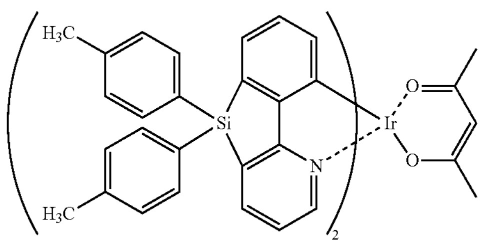
I-3
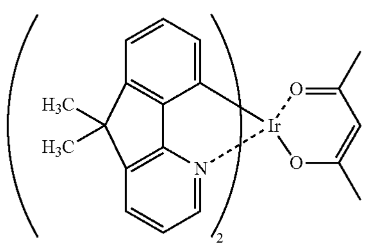
I-4
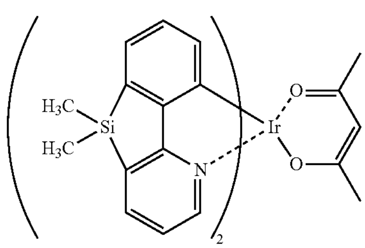
I-5
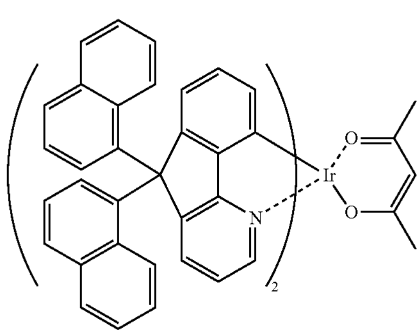
-continued
I-6
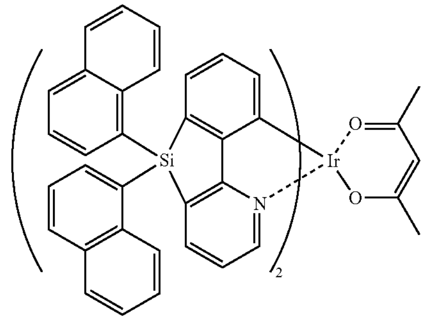
I-7
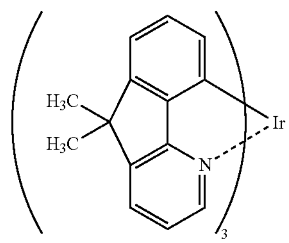
I-8
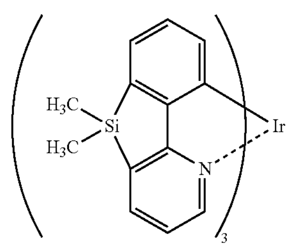
I-9
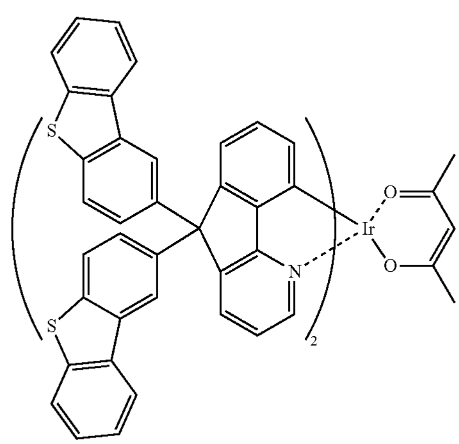

-continued
I-10
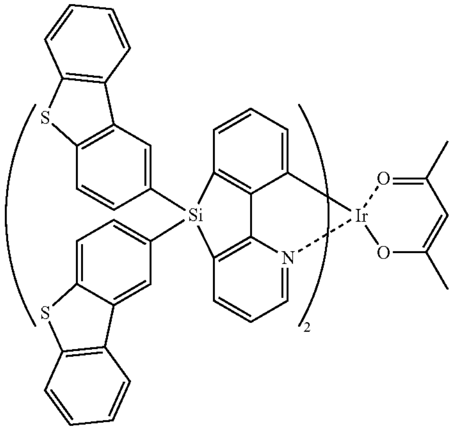
II-1
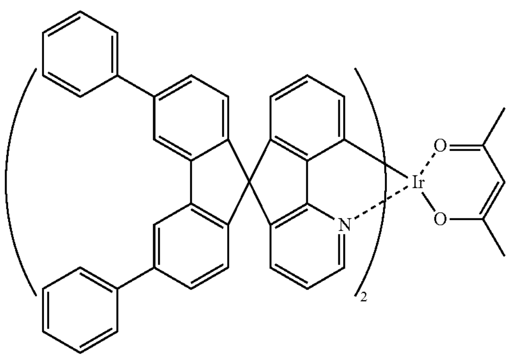
II-2
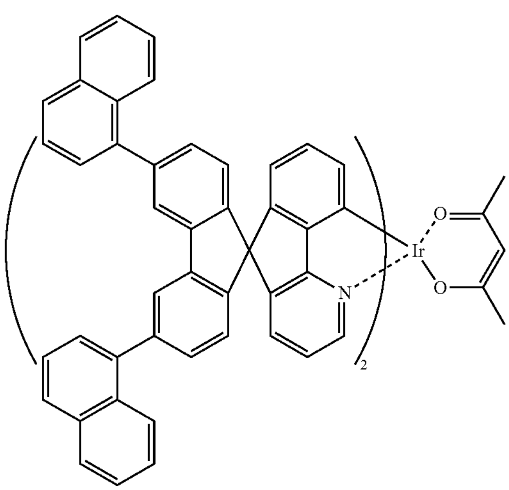
II-3
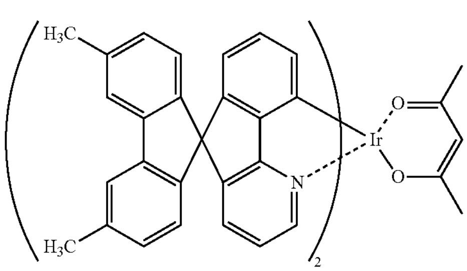
-continued
II-4
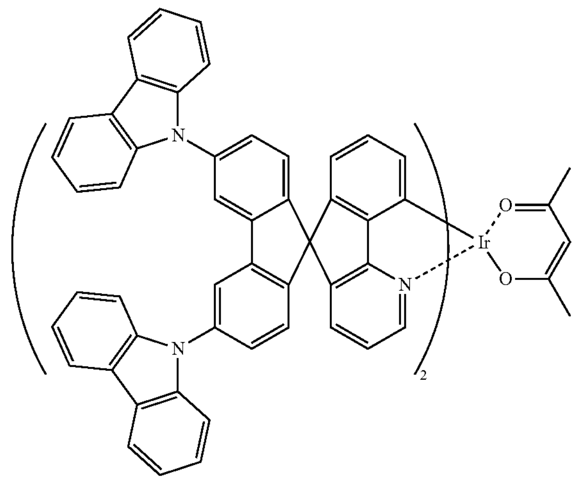
II-5
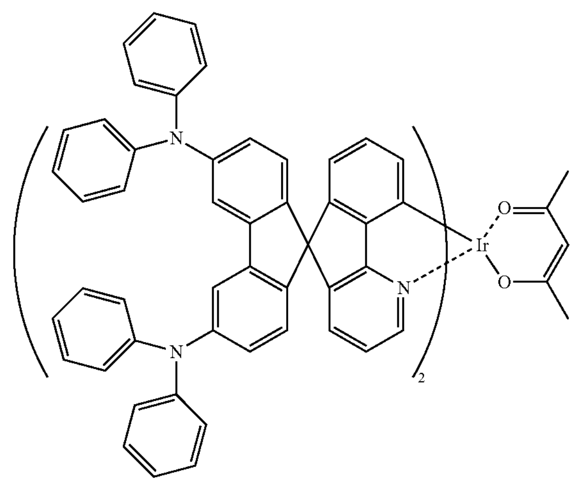
II-6
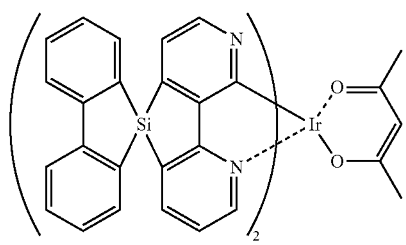
II-7
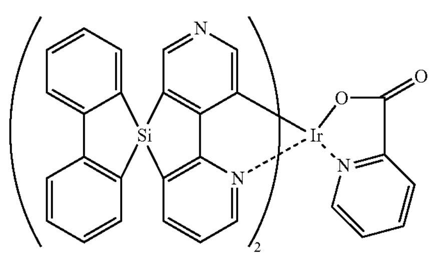

II-8
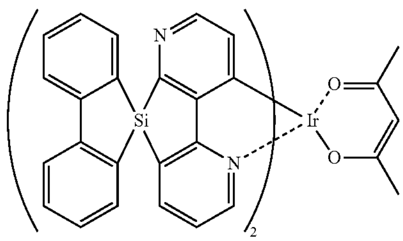
II-9
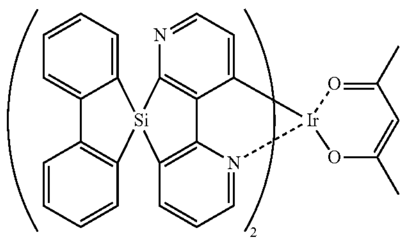
II-10
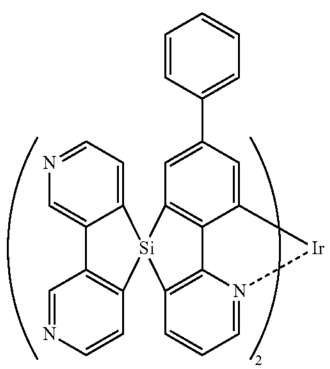
II-11
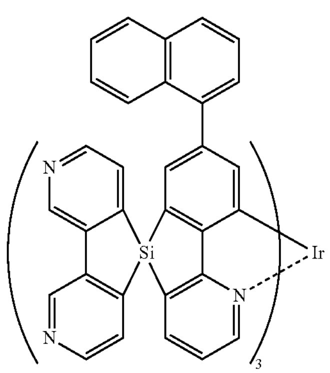
II-12
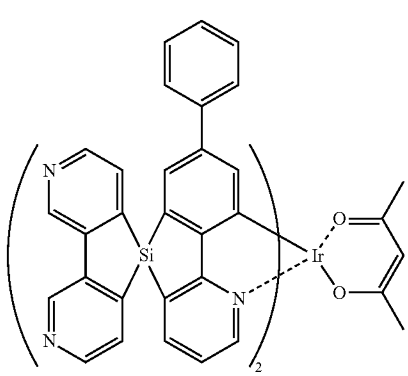
II-13
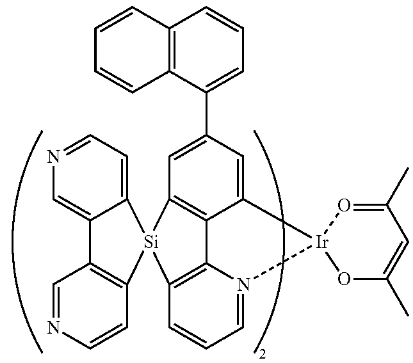
II-14
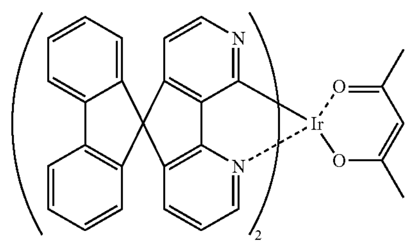
II-15
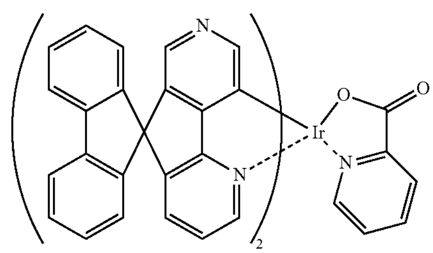
II-16
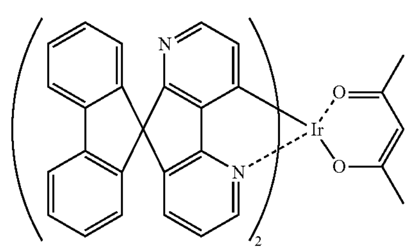
II-17
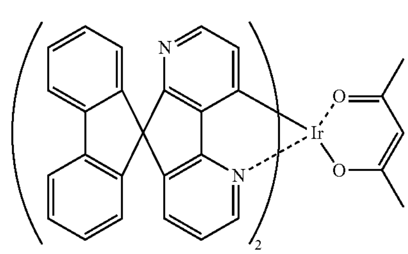

-continued
II-18
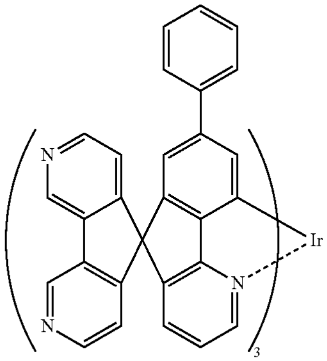
II-19
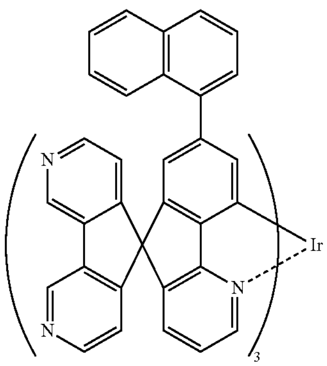
II-20
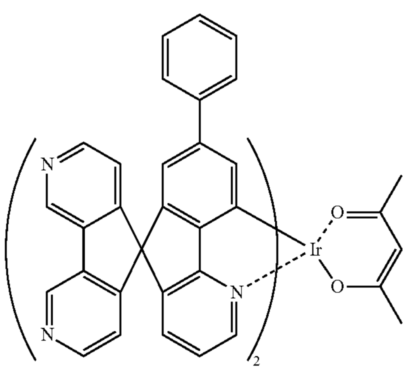
II-21
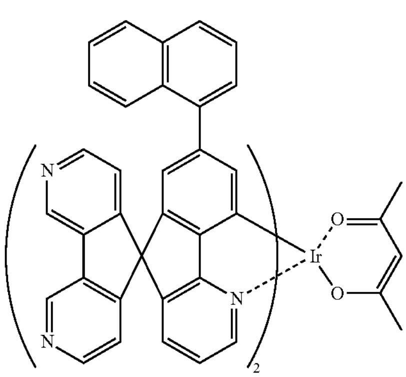
-continued
II-22
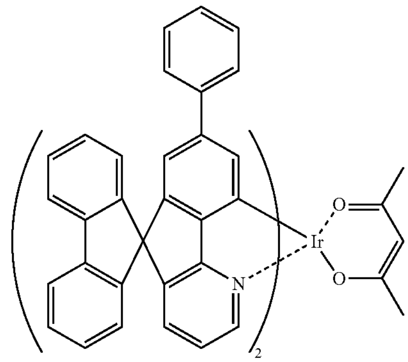
II-23
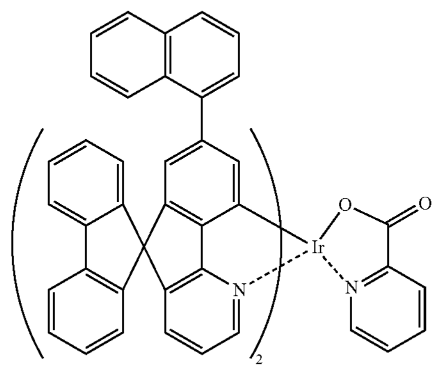
II-24
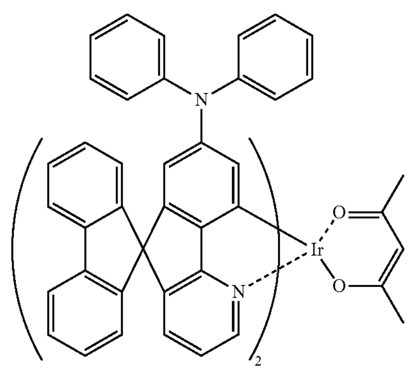
II-25
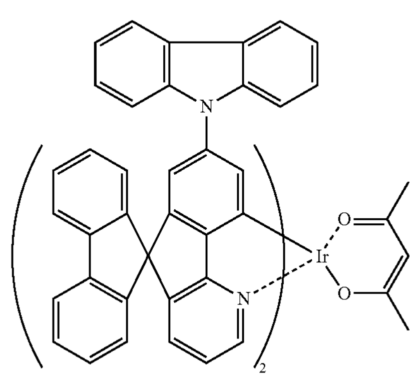

-continued
II-26
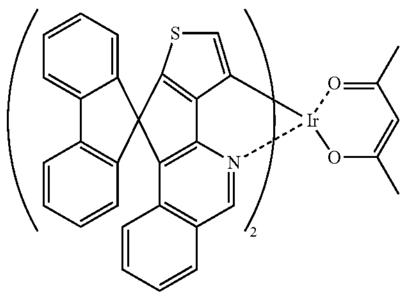
II-27
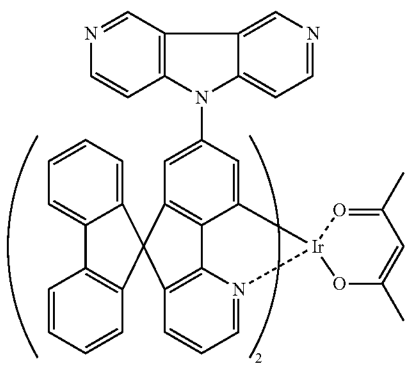
II-28
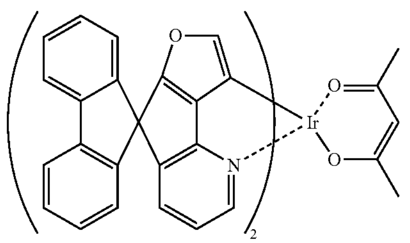
II-29
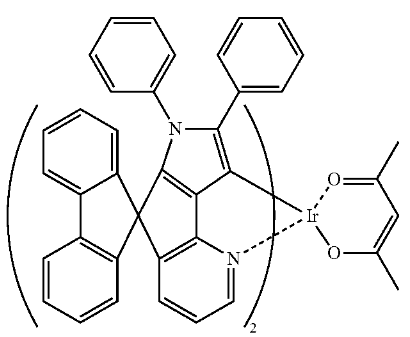
II-30
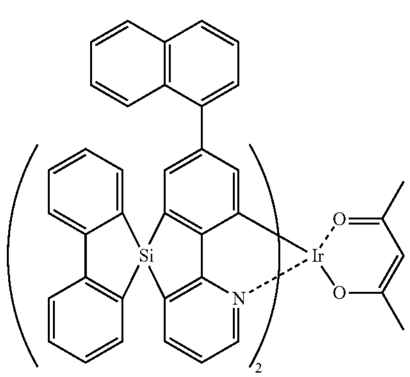
-continued
II-31
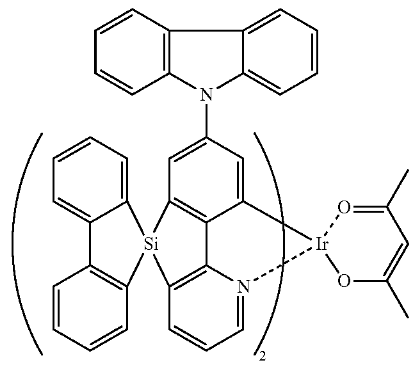
II-32
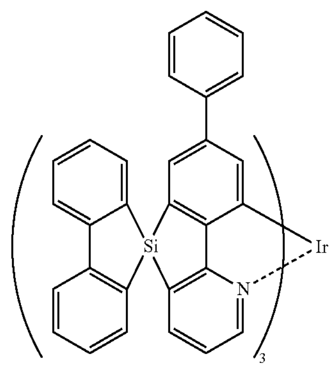
II-33
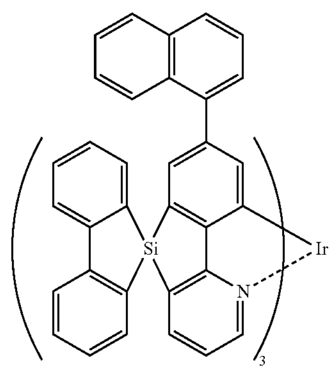
II-34
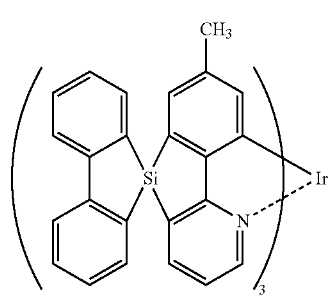

-continued
II-35
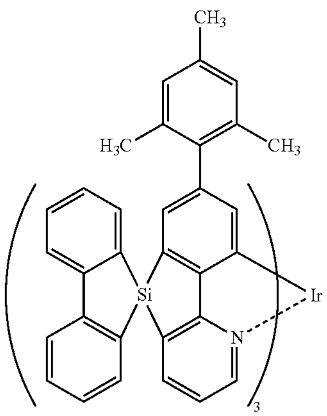
II-36
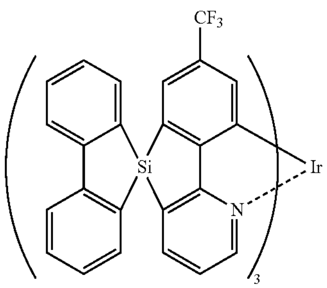
II-37
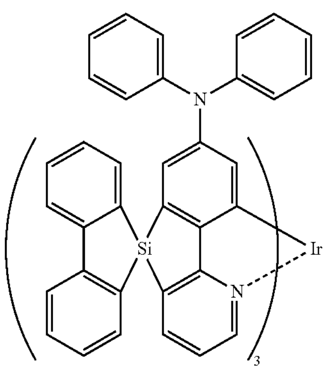
II-38
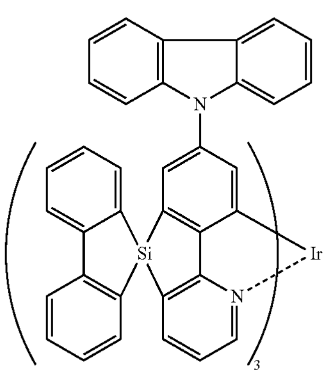
-continued
II-39
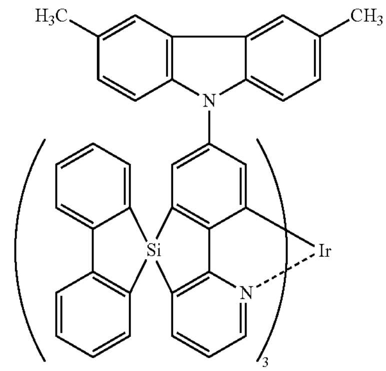
II-40
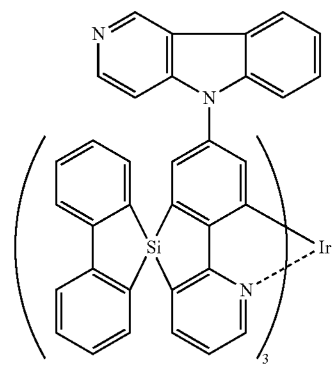
II-41
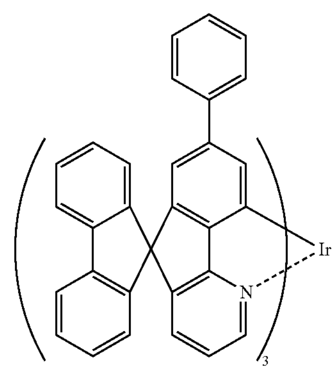
II-42
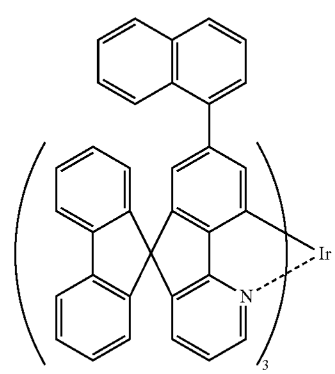

-continued
II-43
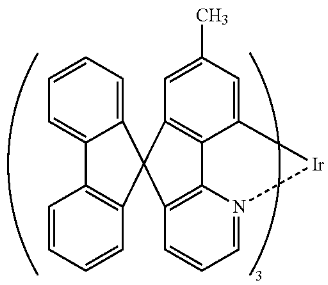
II-44
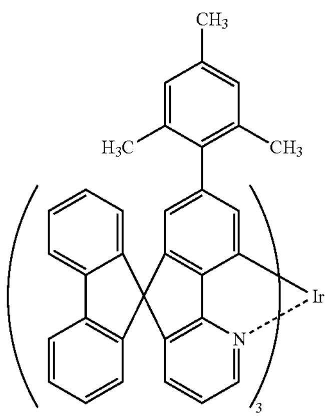
II-45
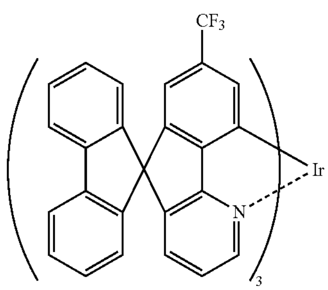
II-46
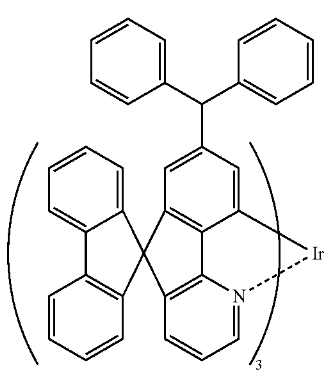
-continued
II-47
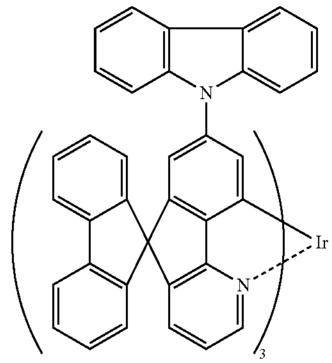
II-48
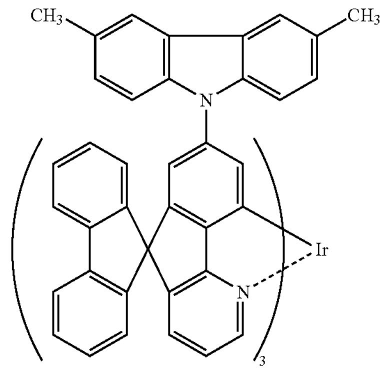
II-49
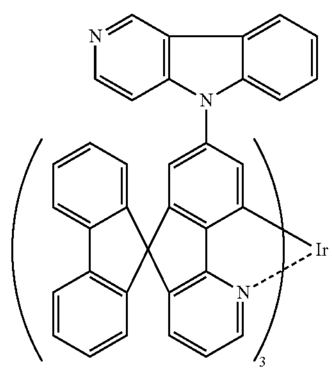
II-50
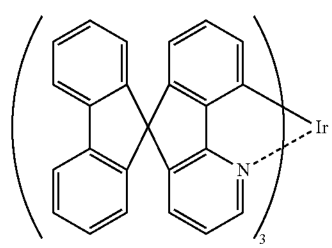
II-51
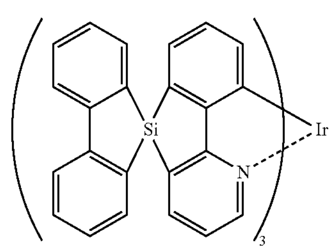

-continued
II-52
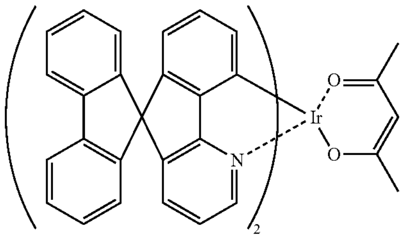
II-53
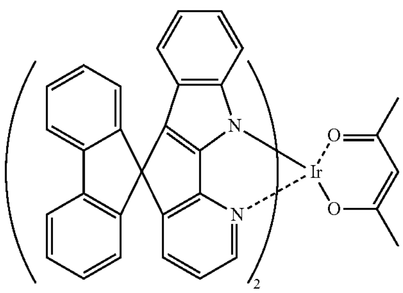
II-54
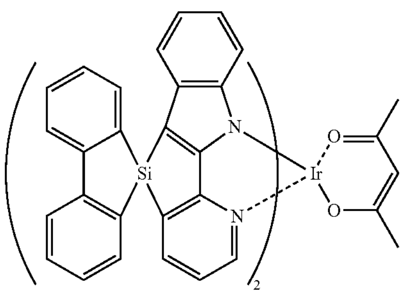
II-55
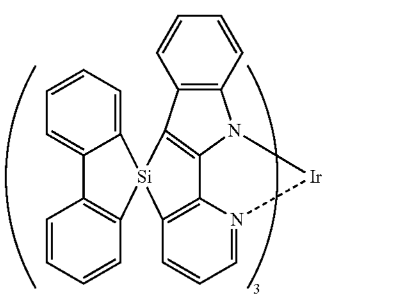
II-56
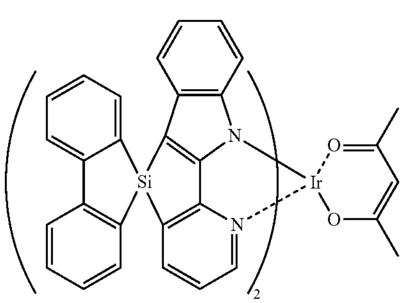
-continued
II-57
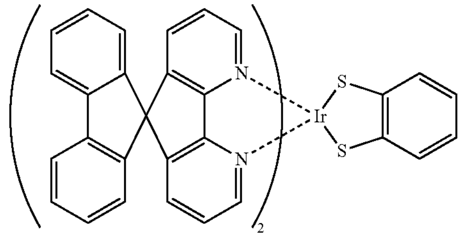
II-58
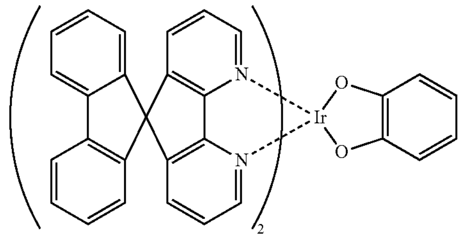
II-59
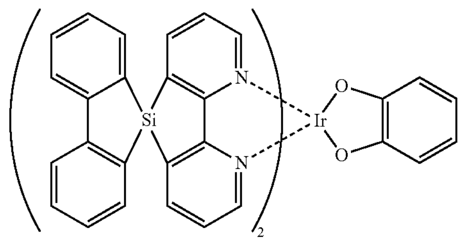
II-60
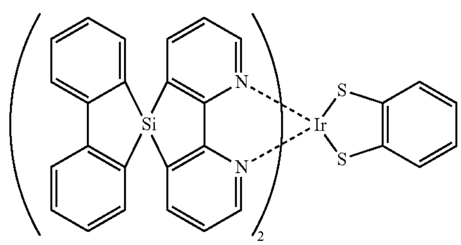
II-61
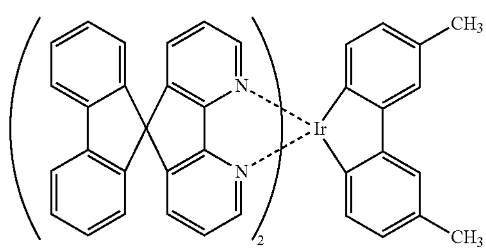
II-62
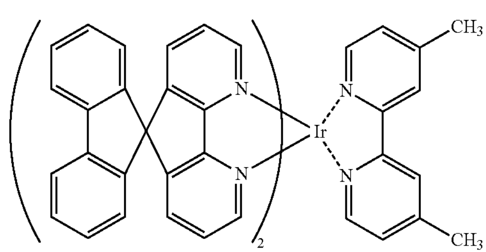

-continued
II-63
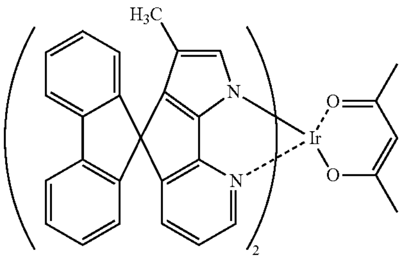
II-64
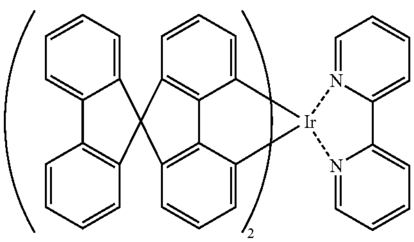
II-65
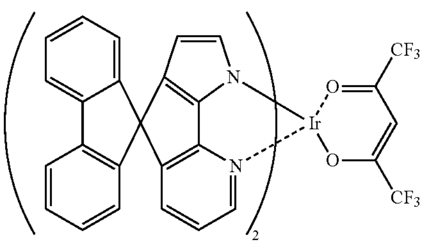
II-66
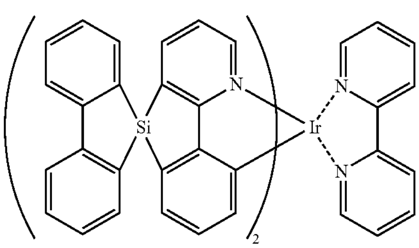
II-67
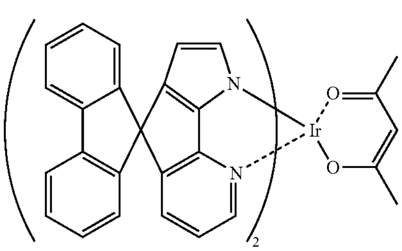
II-68
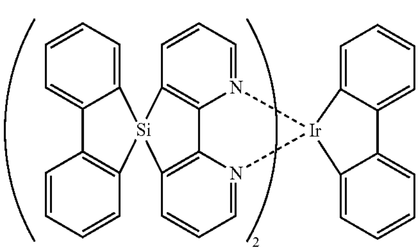
-continued
II-69
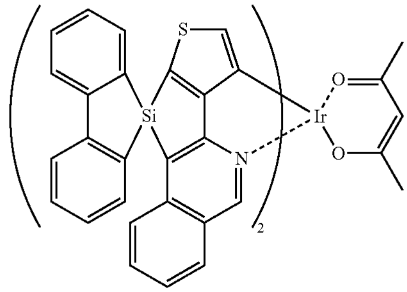
R-1
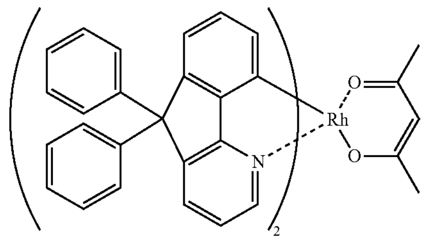
R-2
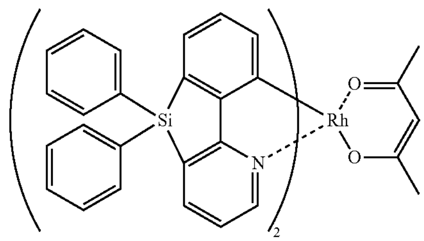
R-3
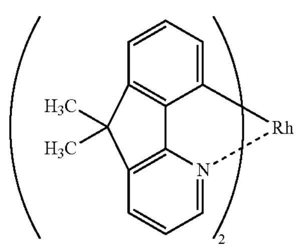
R-4
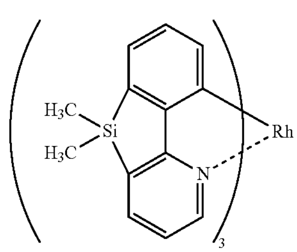
R-5
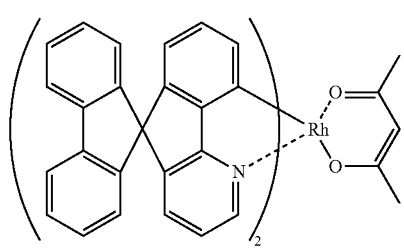

-continued

R-6

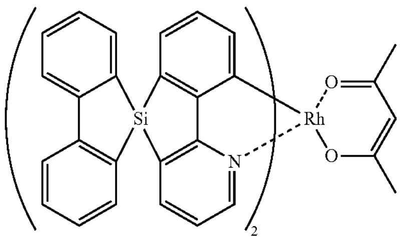

R-7

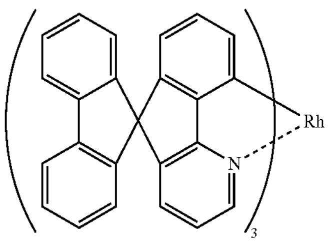

R-8

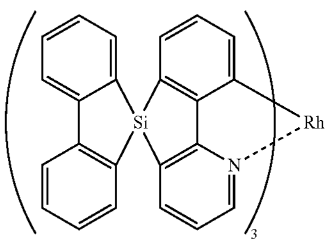

Embodiment (f)

The case in which at least one type of a platinum complex selected from a group comprised of following Formula (19)-(27) as the aforesaid blue light emitting ortho metalated complex.

<Platinum Complex Represented by Formula (19)>

A platinum complex represented by Formula (19) according to the present invention will now be explained. In the present invention, those represented by a tautomer of said Formula (19) are also included.

In Formula (19), a substituent each independently represented by $R_1$ and $R_2$ includes, for example, an alkyl group (such as a methyl group, an ethyl group, an isopropyl group, a hydroxyethyl group, a methoxymethyl group, a trifluoromethyl group and a t-butyl group), a cycloalkyl group (such as a cyclopentyl group and a cyclohexyl group), an aralkyl group (such as a benzyl group and a 2-phenetyl group), an aryl group (such as a phenyl group, a p-chlorophenyl group, a mesityl group, a tolyl group, a xylyl group, a biphenylyl group, a naphtyl group, an anthoryl group and a phenanthryl group), an aromatic heterocyclic group (such as a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolynyl group, a carbazolyl group and a phthalazinyl), an alkoxyl group (such as a methoxy group, an ethoxy group, an isopropoxy group and a butoxy group), an aryloxy group (such as a phenoxy group and a naphthyloxy group), a cyano group, a hydroxyl group, an alkenyl group (such as a vinyl group), a styryl group, a halogen atom (such as a chlorine atom, a bromine atom, an iodine atom and a fluorine atom). These groups may be further substituted.

In Formula (19), an aromatic hydrocarbon ring or an aromatic heterocyclic ring includes, for example, a benzene ring, a naphthalene ring, a pyridine ring, a pyridazine ring, a pyrimidine ring, a pyrazine ring, a triadine ring, a furan ring, a thiophen ring, a pyrol ring, an imidazole ring, a pyrazole ring, a triazole ring and a tetrazole ring. Preferable among them is a benzene ring.

In Formula (19), an aromatic hydrocarbon ring or an aromatic heterocyclic ring formed by $Z_4$ together with $C_6$, $C_4$ and N includes such as a pyridine ring, a pyridazine ring, a pyrimidine ring, a pyrazine ring, a triazine ring, a benzoimidazole ring, a benzothiazole ring, a benzooxazole ring, a quinazoline ring and a phthalazine ring. Preferable among them is a pyridine ring.

In Formula (19), n1 is an integer of 1 or 2, and L1 is a bidentate ligand when n1 is 1. A bidentate ligand represented by L1 includes such as oxycarboxylic acid, oxyaldehyde and derivatives thereof (such as salicic aldehyde and oxyacetophenonato), a dioxy compound (such as biphenolato), diketones (such as acetylacetonato, dibenzoylmethanate, diethylmalonato and ethylacetoacetato), oxyquinones (such as pyromeconato, oxynaphtoqunonato and oxyanthraquinonato), tropolones (such as troponato and hinokitiolato), an N-oxide compound, aminocarboxylic acid and the similar compounds (such as glycinato, alaninato, anthranilato and picolinato), hydroxylamines (such as aminophenolato, ethanolaminato and mercaptoethylaminato), oxines (such as 8-oxyquinolinato), aldimines (such as salicylaldiminato), oxyoximes (such as benzoinoximato and salicylaldoximato), an oxyazo compound (such as oxyazobenzonato and phenylazonaphtholato), nitrosonaphthols (such as β-nitroso-α-naphtholato), triazenes (such as diazoaminobenzenato), biurets (such as biuretato and a polypeptide group), formazenes and ditizones (such as diphenylcarbazonato and diphenylthiocarbazonato), biguanides (such as biguanidato) and glyoximes (such as dimethylglyoximato).

In the following, Formulas and specific examples of a bidentate ligand preferably utilized in the present invention will be listed; however, the present invention is not limited thereto.

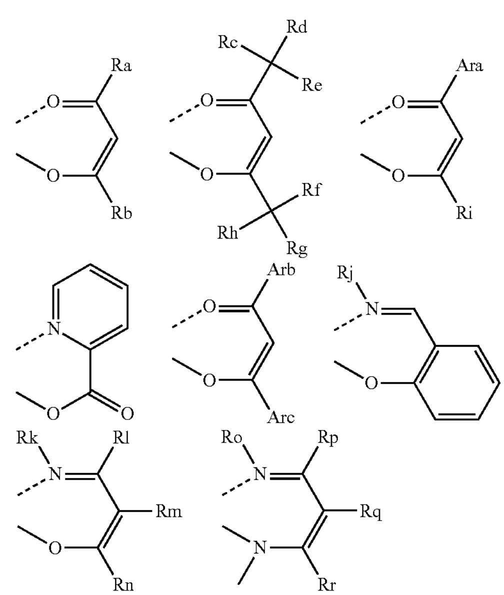

-continued

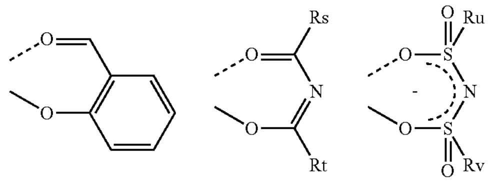

In the Formulas of bidentate ligands described above, Ra-Rv each are an alkyl group (for example, a methyl group, an ethyl group, an isopropyl group, a hydroxyethyl group, a methoxymethyl group, a trifluoromethyl group and a t-butyl group) or a alkyl halogenide group (for example, the aforesaid alkyl groups, at least one of hydrogen atoms of which is substituted by such as a fluorine atom, a chlorine atom, a bromine atom or a iodine atom).

In the Formulas of bidentate ligands described above, Ara-Arc are an aryl group (such as a phenyl group, a p-chlorophenyl group, a mesityl group, a tolyl group, a xylyl group, a biphenyl group, a naphthyl group, an anthoryl group and phenanthoryl group) or an aromatic heterocyclic group (such as a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolynyl group, a carbazolyl group, a carbolinyl group, a diazacarbazolyl group (a diazacarbazolyl group refers to the aforesaid carbolinyl group, any one of carbon atoms constituting a carboline ring of which is substituted by a nitrogen atom) and a phthalazinyl group).

<Platinum Complex Represented by Formula (20)>

A platinum complex represented by Formula (20) according to the present invention will now be explained.

In Formula (20), a substituent represented by each of $R_3$ and $R_4$ is identical with a substituent represented by each of $R_1$ and $R_2$ in aforesaid Formula (19).

In Formula (20), a bidentate ligand represented by L2 is identical with a bidentate ligand represented by L1 in aforesaid Formula (19).

<Platinum Complex Represented by Formula (21)>

A platinum complex represented by Formula (21) according to the present invention will now be explained.

In Formula (21), a substituent represented by each of $R_5$ and $R_6$ is identical with a substituent represented by each of $R_1$ and $R_2$ in aforesaid Formula (19).

In Formula (21), a bidentate ligand represented by L3 is identical with a bidentate ligand represented by L1 in aforesaid Formula (19).

In Formula (21), an aromatic hydrocarbon ring formed by $Z_3$ together with C (a carbon atom) includes such as a benzene ring, a biphenyl ring, a naphthalene ring, an azulene ring, an anthrathene ring, a phenanthrene ring, a pyrene ring, a chrisene ring, a naphthacene ring, a triphenylene ring, an o-terphenyl ring, a m-terphenyl ring, a p-terphenyl ring, an acenaphtene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthraathrene ring. Further, the aforesaid aromatic hydrocarbon ring may be provided with a substituent represented by each of $R_1$ and $R_2$ in aforesaid Formula (19).

In Formula (21), an aromatic heterocyclic ring formed by $Z_3$ together with C (a carbon atom) includes such as a furan ring, a thiophene ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole, a benzothiazole ring, a benzooxazole ring, a quinoxaline ring, a quinazoline ring, a phthalazine ring, a carbazole ring, a carboline ring and a ring in which at least one of carbon atoms of hydrocarbon ring constituting a carboline ring is substituted by a nitrogen atom. Further, the aforesaid aromatic heterocyclic ring may be provided with a substituent represented by each of $R_1$ and $R_2$ in aforesaid Formula (19).

<Platinum Complex Represented by Formula (22)>

A platinum complex represented by Formula (22) according to the present invention will now be explained.

In Formula (22), a substituent represented by each of $R_7$-$R_{13}$ is identical with a substituent represented by each of $R_1$ and $R_2$ in aforesaid Formula (19).

In Formula (22), a bidentate ligand represented by L4 is identical with a bidentate ligand represented by L1 in aforesaid Formula (19).

<Platinum Complex Represented by Formula (23)>

A platinum complex represented by Formula (23) according to the present invention will now be explained.

In Formula (23), a substituent represented by each of $R_{14}$ and $R_{15}$ is identical with a substituent represented by each of $R_1$ and $R_2$ in aforesaid Formula (19).

In Formula (23), a bidentate ligand represented by L5 is identical with a bidentate ligand represented by L1 in aforesaid Formula (19).

In Formula (23), an aromatic hydrocarbon ring formed by $Z_4$ together with C (a carbon atom) is identical with an aromatic hydrocarbon ring formed by $Z_3$ together with C (a carbon atom) in aforesaid Formula (21).

In Formula (23), an aromatic heterocyclic ring formed by $Z_4$ together with C (a carbon atom) is identical with an aromatic heterocyclic ring formed by $Z_3$ together with C (a carbon atom) in aforesaid Formula (21).

<Platinum Complex Represented by Formula (24)>

A platinum complex represented by Formula (24) according to the present invention will now be explained.

In Formula (24), a substituent represented by each of $R_{16}$-$R_{22}$ is identical with a substituent represented by each of $R_1$ and $R_2$ in aforesaid Formula (19).

In Formula (23), a bidentate ligand represented by L6 is identical with a bidentate ligand represented by L1 in aforesaid Formula (19).

<Platinum Complex Represented by Formula (25)>

A platinum complex represented by Formula (25) according to the present invention will now be explained.

In Formula (25), a substituent represented by each of $R_{23}$ and $R_{24}$ is identical with a substituent represented by each of $R_1$ and $R_2$ in aforesaid Formula (19).

In Formula (25), a bidentate ligand represented by L7 is identical with a bidentate ligand represented by L1 in aforesaid Formula (19).

In Formula (25), an aromatic heterocyclic ring, which is formed by each of $Z_5$ together with N includes such as a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole, a benzothiazole ring, a benzooxazole ring, a quinoxaline ring, a quinazoline ring, a phthalazine ring, a carbazole ring, a carboline ring and a ring in which at least one of carbon atoms of hydrocarbon ring constituting a carboline ring is substituted by a nitrogen atom. Further, the aforesaid aromatic heterocyclic ring may be provided with a substituent represented by each of $R_1$ and $R_2$ in aforesaid Formula (19).

<Platinum Complex Represented by Formula (26)>

A platinum complex represented by Formula (26) according to the present invention will now be explained.

In Formula (26), a substituent represented by each of $R_{25}$ and $R_{26}$ is identical with a substituent represented by each of $R_1$ and $R_2$ in aforesaid Formula (19).

In Formula (26), a bidentate ligand represented by L8 is identical with a bidentate ligand represented by L1 in aforesaid Formula (19).

In Formula (26), an aromatic heterocyclic ring, which is formed by each of $Z_6$ together with N includes such as a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole, a benzothiazole ring, a benzooxazole ring, a quinoxaline ring, a quinazoline ring, a phthalazine ring, a carbazole ring, a carboline ring and a ring in which at least one of carbon atoms of hydrocarbon ring constituting a carboline ring is substituted by a nitrogen atom. Further, the aforesaid aromatic heterocyclic ring may be provided with a substituent represented by each of $R_1$ and $R_2$ in aforesaid Formula (19).

<Platinum Complex Represented by Formula (27)>

A platinum complex represented by Formula (27) according to the present invention will now be explained.

In Formula (27), a substituent represented by each of $R_{27}$ and $R_{28}$ is identical with a substituent represented by each of $R_1$ and $R_2$ in aforesaid Formula (19).

In Formula (27), a bidentate ligand represented by L9 is identical with a bidentate ligand represented by L1 in aforesaid Formula (19).

In Formula (27), a 5-membered or 6-membered ring formed by $Z_7$ is identical with a 5-membered or 6-membered ring formed by $Z_1$ in Formula (19).

In Formula (27), a 5-membered or 6-membered ring formed by $Z_8$ is identical with a 5-membered or 6-membered ring formed by $Z_2$ in Formula (19).

In Formula (27), as a divalent connecting group represented by L0, utilized can be a group containing a hetero atom (for example, a divalent group containing a chalcogen atom such as —O— and —S—, and —N(R)— group, wherein R is a hydrogen atom or an alkyl group and said alkyl group is an alkyl group described as a substituent represented by each of $R_1$ and $R_2$ in aforesaid Formula (19)) in addition to a hydrocarbon group such as an alkylene group (such as an ethylene group, a trimethilene group, a tetramethylene group, a propylene group, an ethylethylene group, a pentaethylene group, a hexamethylene group, 2,2,4-trimethylhexamethylene group, a heptamethylene group, an octamethylene group, a nonamethylene group, a decamethylene group, an undecamethylene group, a dodecamethylene group, a cyclohexylene group (such as 1,6-cyclohexanediyl group), a cyclopentylene group (such as 1,5-cyclopentanediyl group)), an alkenylene group (such as a vinylene group and a propenylene group), an alkynylene group (such as an ethylenylene group and a 3-pentynylene group) and an arylene group.

In the following, specific examples of a platinum complex compound utilized as an organic EL element material of the present invention will be listed; however, the present invention is not limited thereto. Herein, in specific examples listed below, each surrounding of an aryl group incapable of free rotation or an aromatic heterocyclic group incapable of free rotation is indicated by a dotted line.

<Aryl Group Incapable of Free Rotation, Aromatic Heterocyclic Group Incapable of Free Rotation>

In the present invention, "an aryl group incapable of free rotation or an aromatic heterocyclic group incapable of free rotation" means a substituent in a bond of which is incapable of free rotation due to steric hindrance.

Herein, as the state of being incapable of free rotation, not only the case, in which free rotation is physically impossible due to the aforesaid aryl group or aromatic heterocyclic group being close to such as other substituents arranged in the surrounding, but also the case, in which a bond rotation barrier exists due to conformation energy with respect to a substituent bonded through a bonding axis of an aryl group or a bonding axis of an aromatic heterocyclic group, can be defined as an aryl group incapable of free rotation or an aromatic heterocyclic group incapable of free rotation.

Herein, conformation energy to produce a bond rotation barrier is preferably not less than 25 kcal/mol.

Further, in the present invention, an aryl group or an aromatic heterocyclic group each is preferably in the state of being physically incapable of free rotation.

An aryl group utilizable as an aryl group incapable of free rotation includes such as a phenyl group, a tolyl group, a xylyl group, a biphenyl group, a naphthyl group, an anthryl group and a phenanthryl group.

An aromatic heterocyclic group utilizable as an aromatic heterocyclic group incapable of free rotation includes such as a furyl group, a thienyl group, a pyridyl group, a pyridazynyl group, a pyrimizinyl group, a prazinyl group, a triazinyl group, an imidazolyl group, a pyrazolyl group, a thiazoliyl group, a quinazolinyl group and a phthalazinyl group.

1

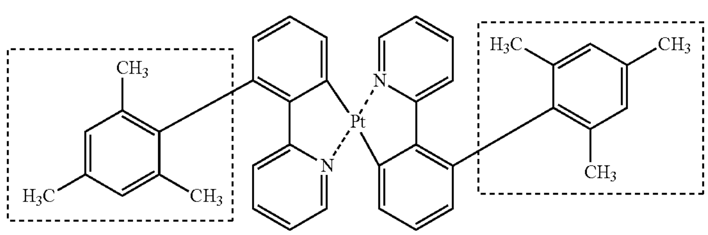

-continued
2
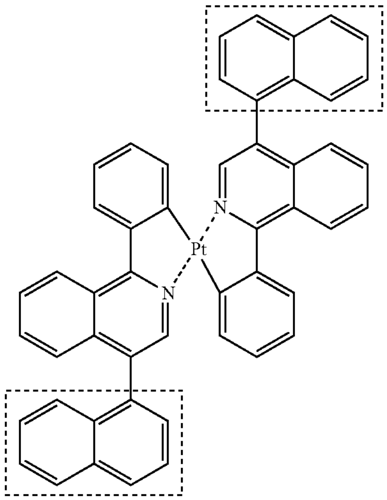
3
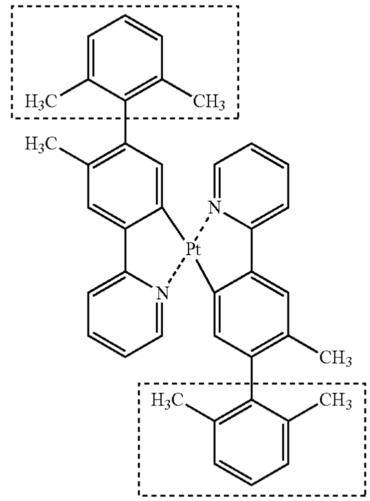
4
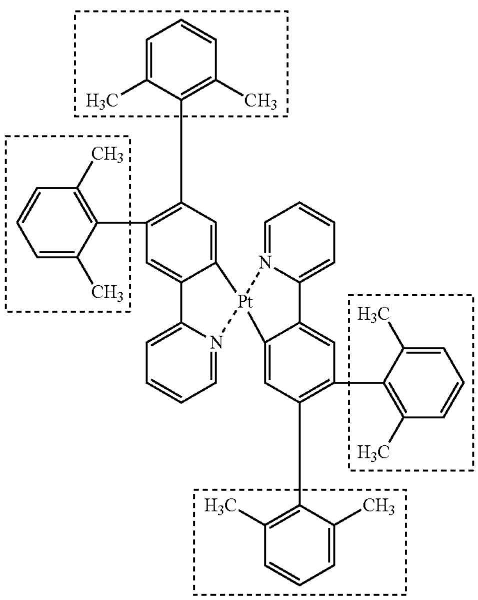
5
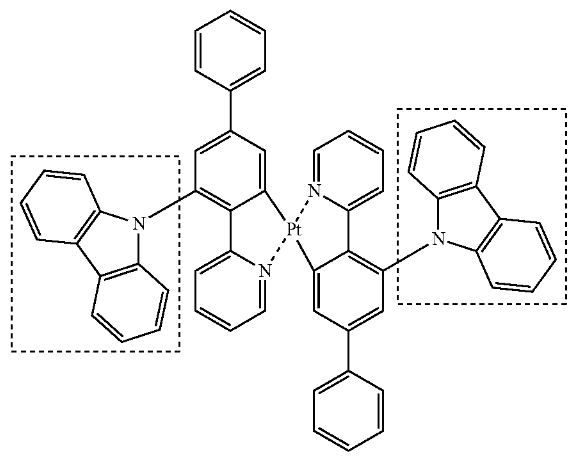
6
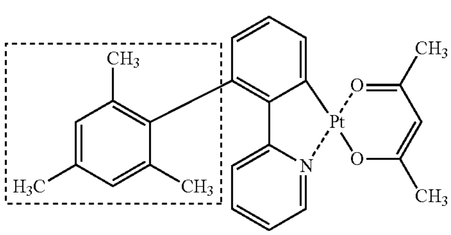
7
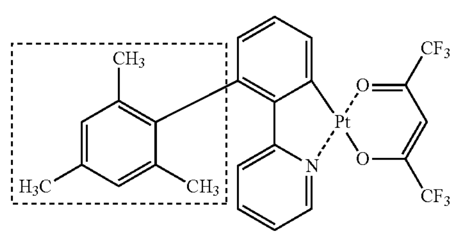
8
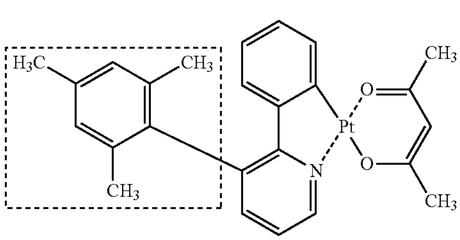

-continued
9
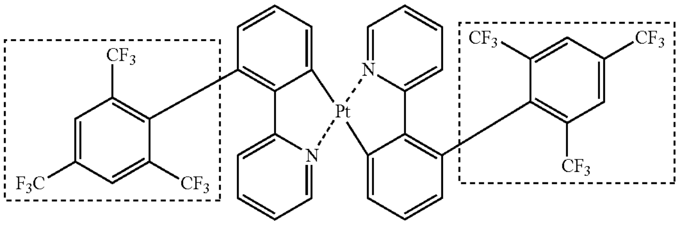
10
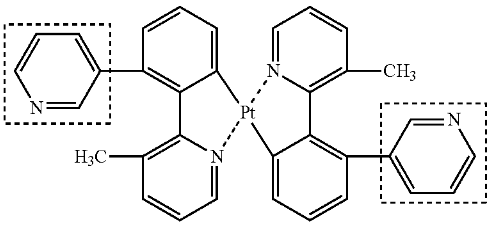
11
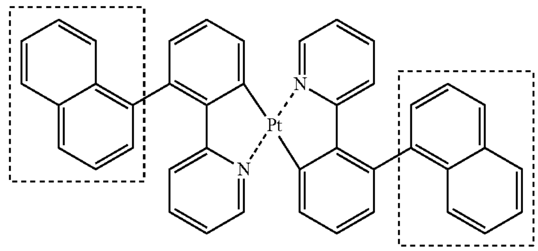
12
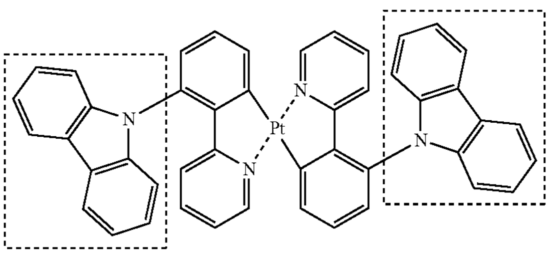
13
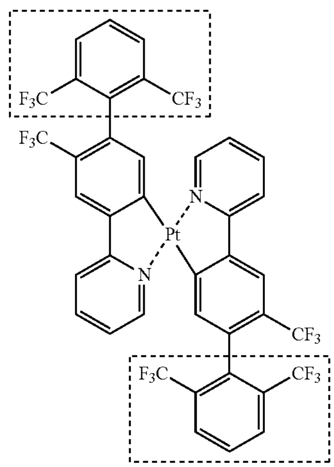
14
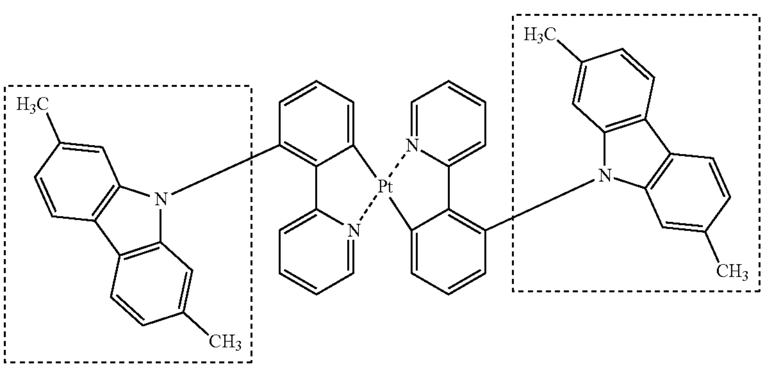

-continued
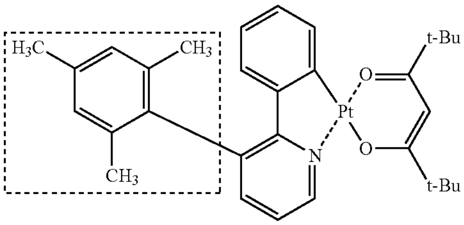
15
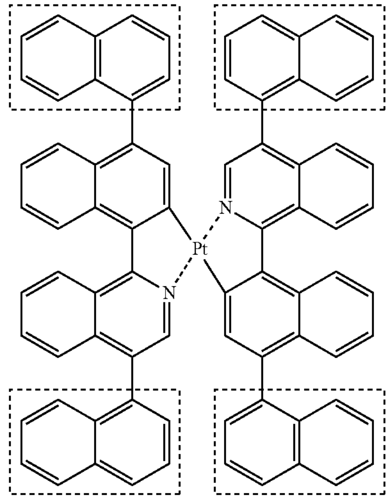
16
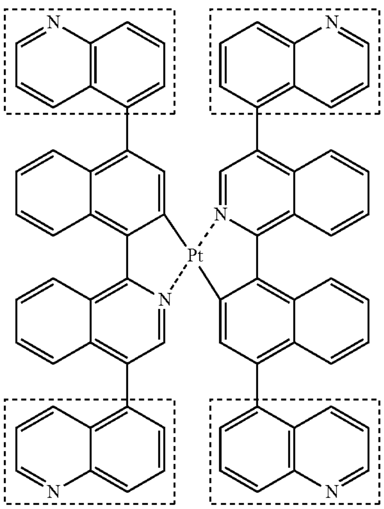
17
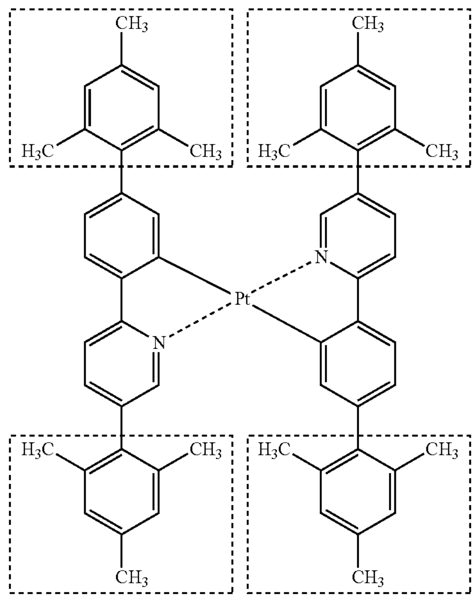
18
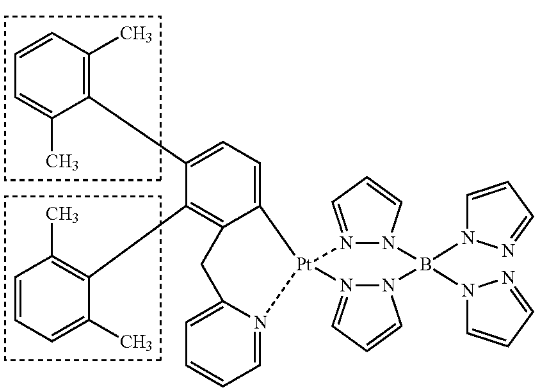
19
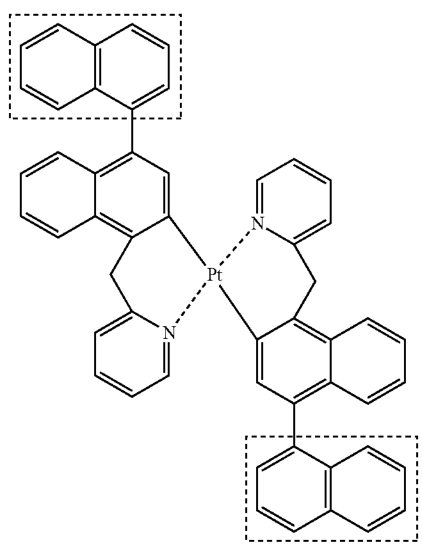
20

-continued
21
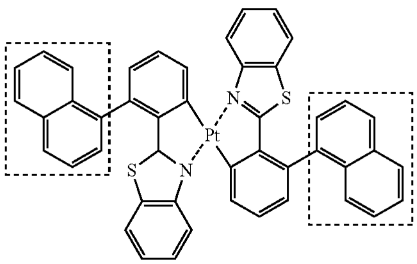
22
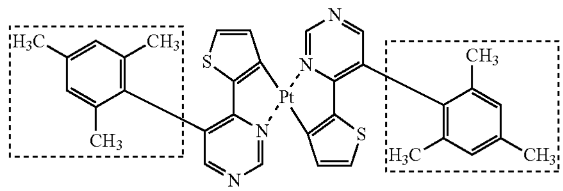
23
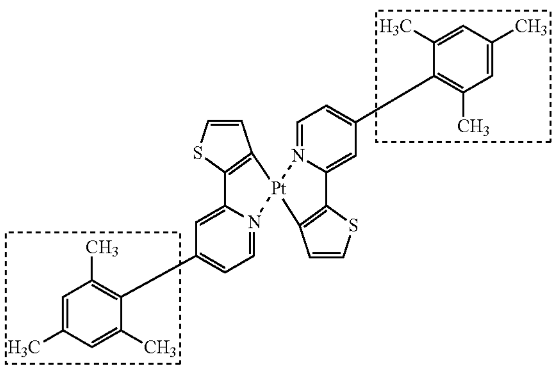
24
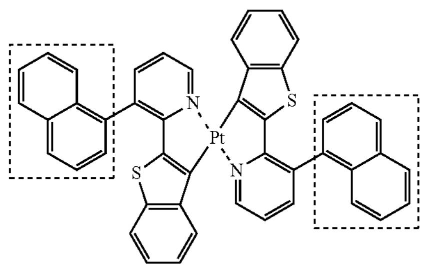
25
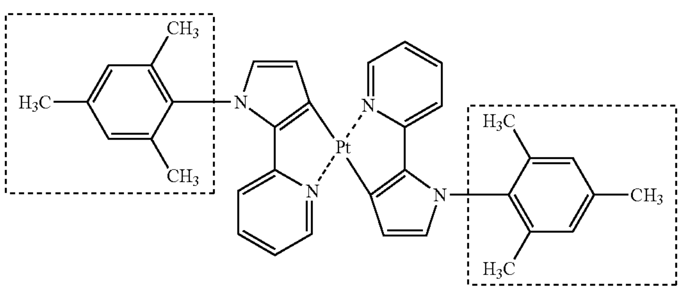
26
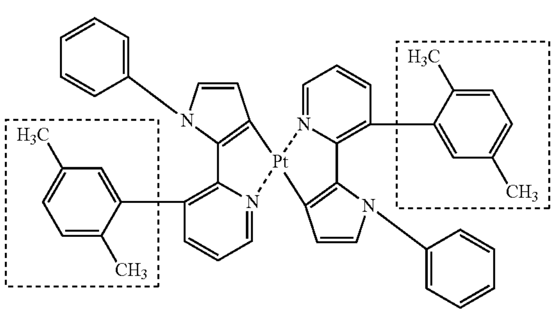
27
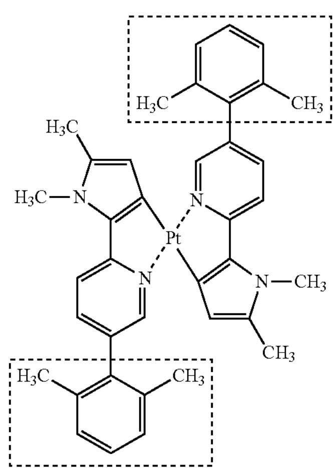

-continued
28
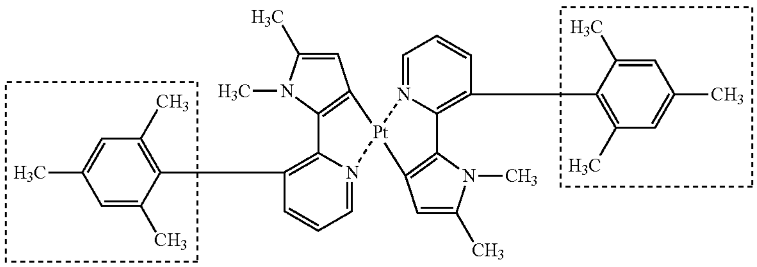
29
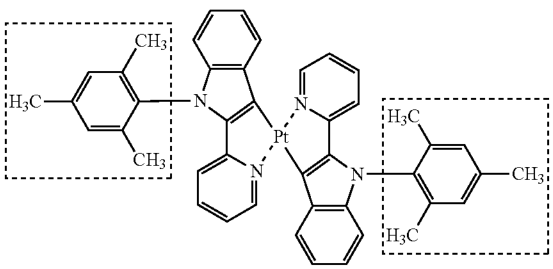
30
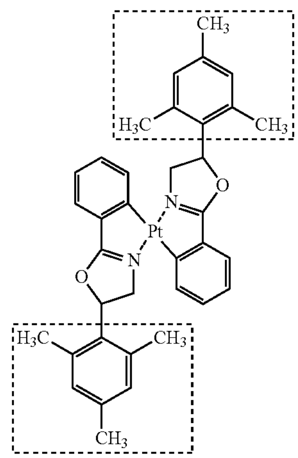
31
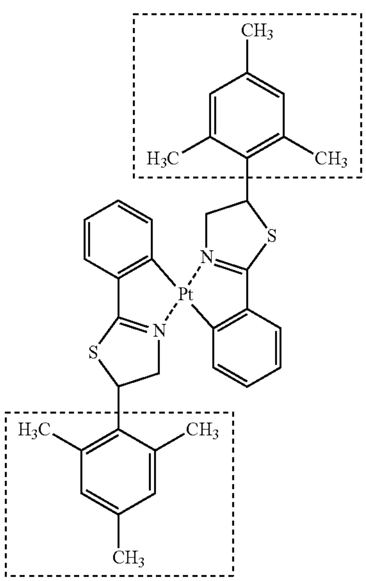
32
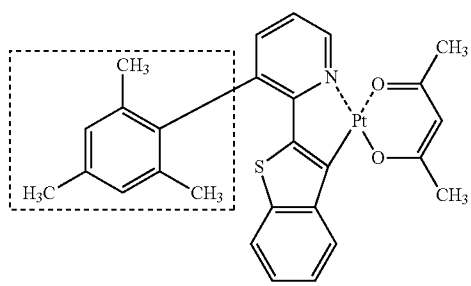
33
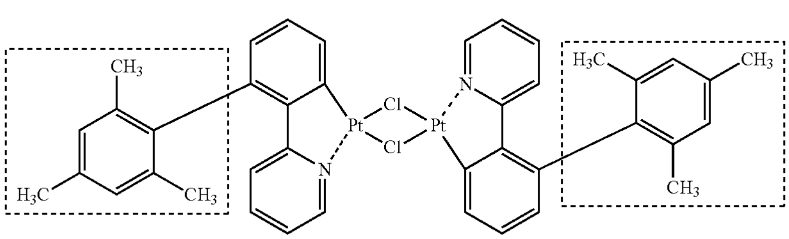

-continued
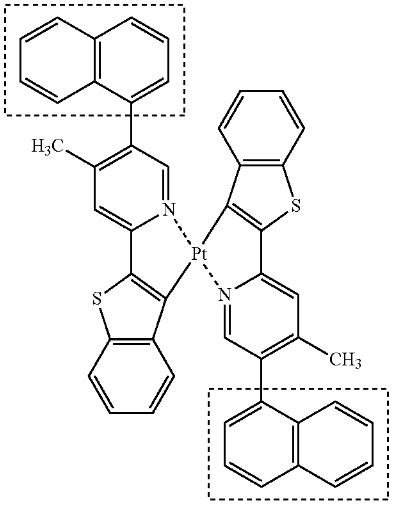
34
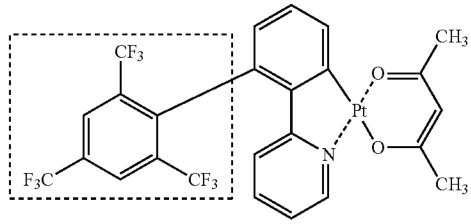
35
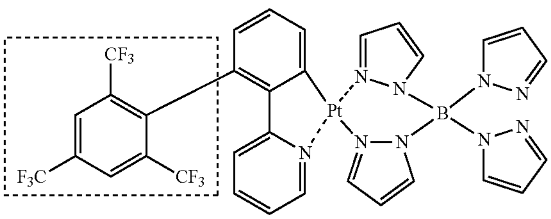
36
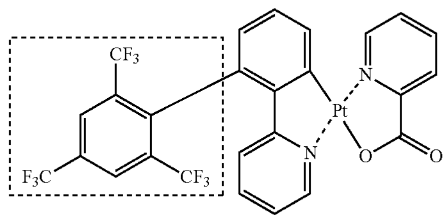
37
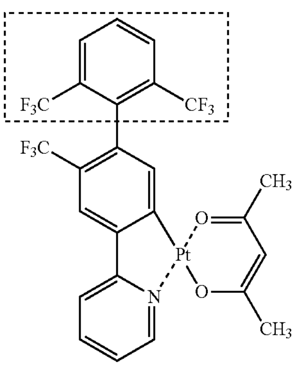
38
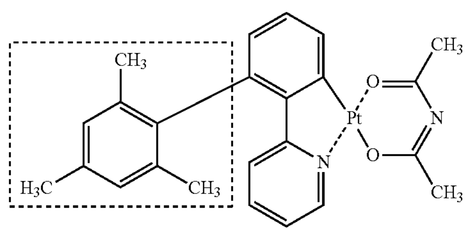
39
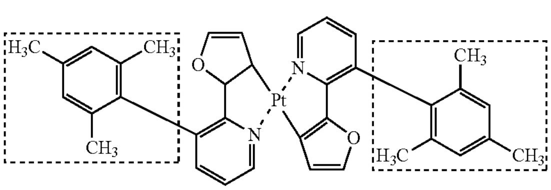
40
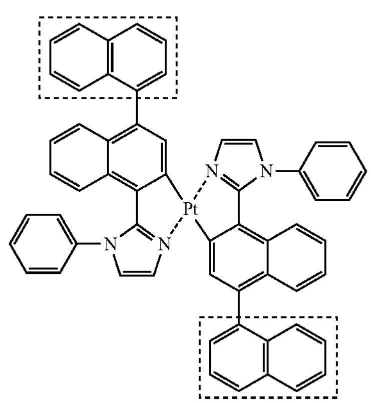
41

-continued
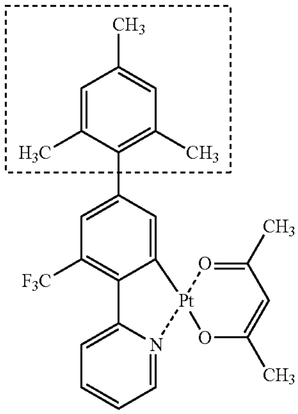
42
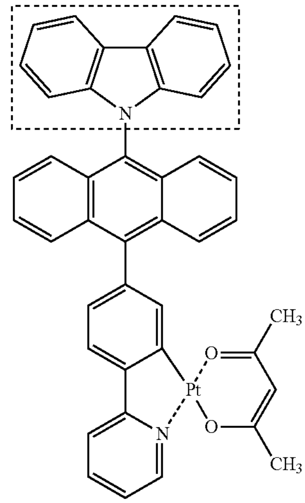
43
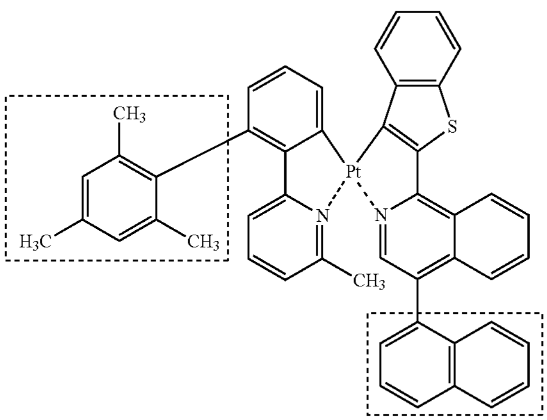
44
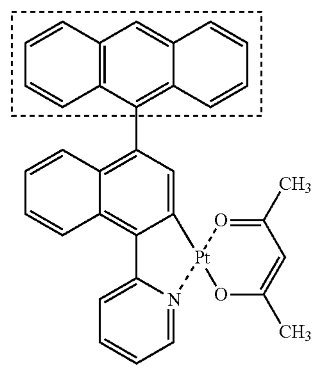
45
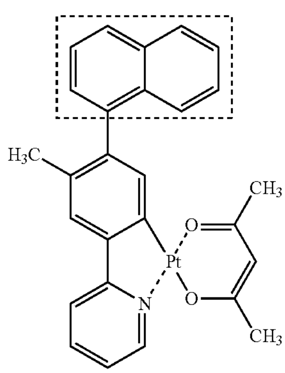
46
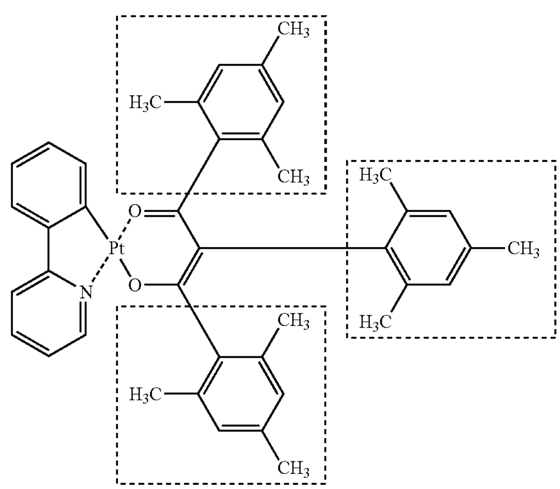
47

-continued
48
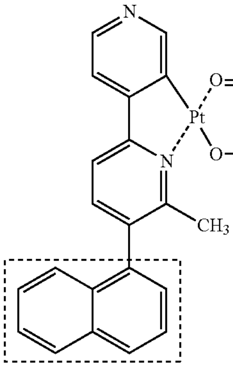
49
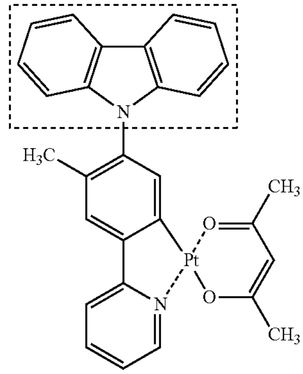
50
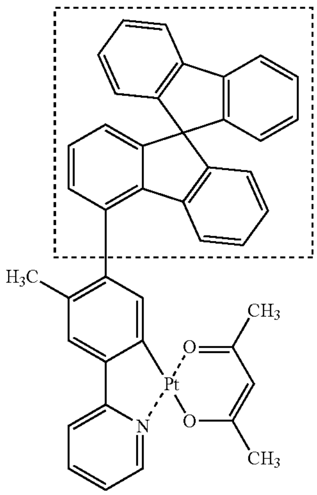
51
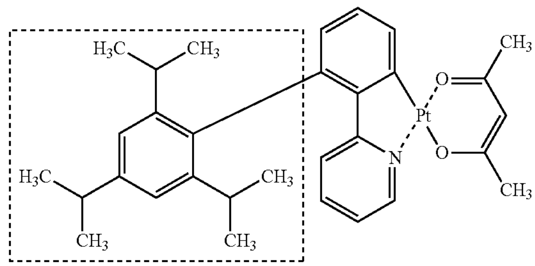
52
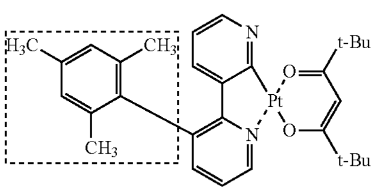
53
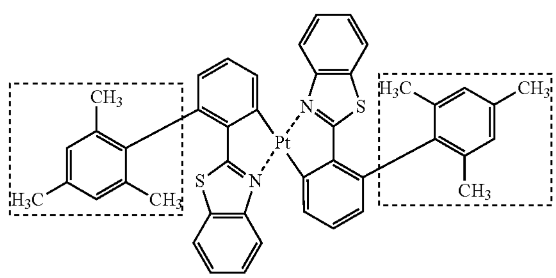
54
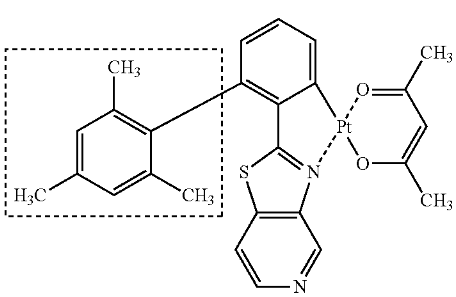
55
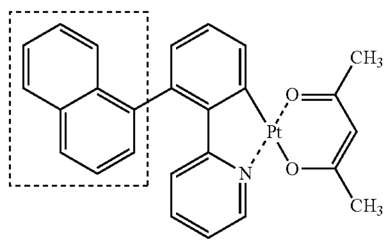

-continued
56
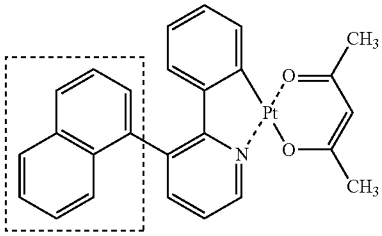
57
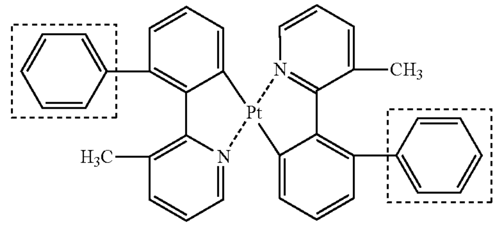
58
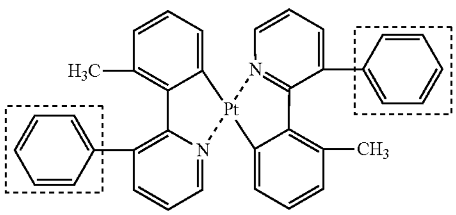
59
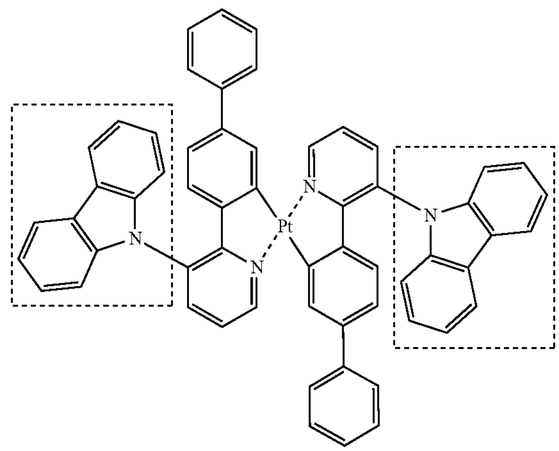
60
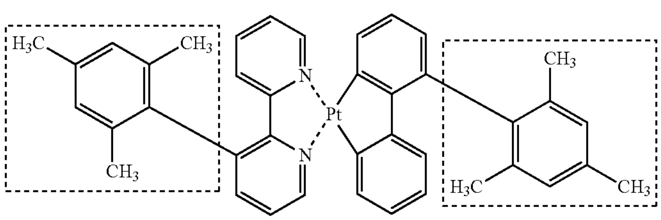
61
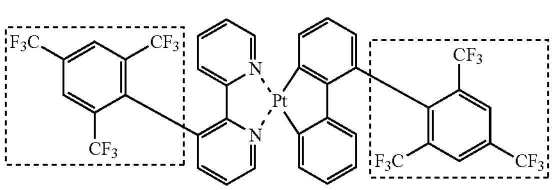
62
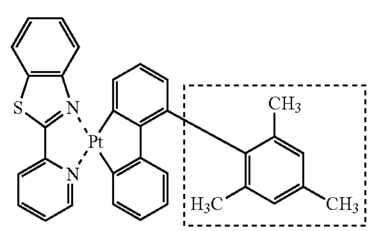
63
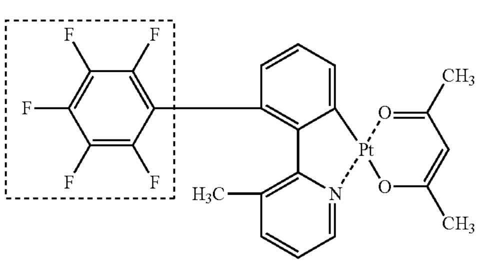
64
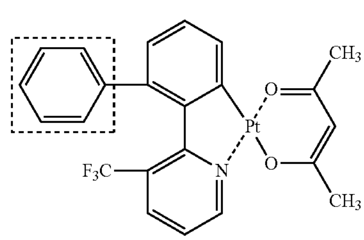

-continued
65
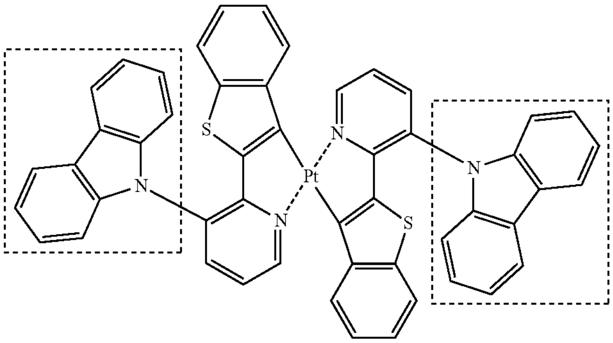
66
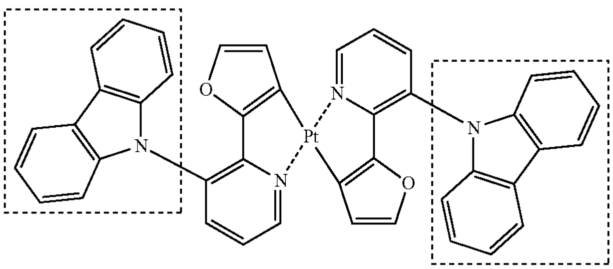
67
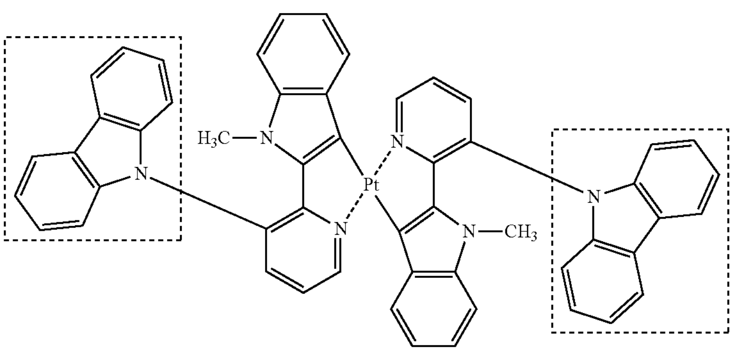
68
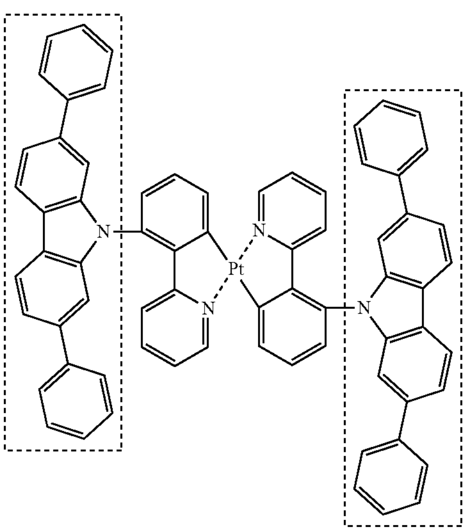
69
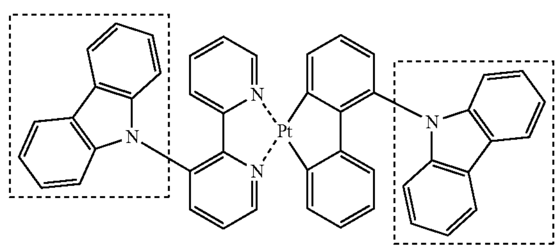

-continued
70
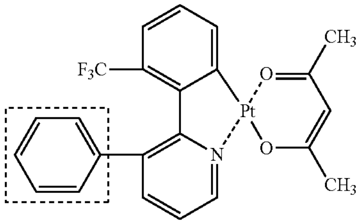
71
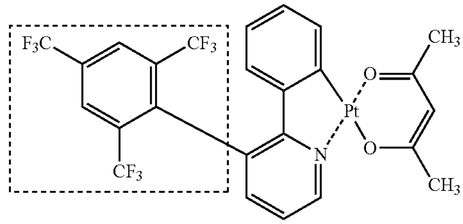
72
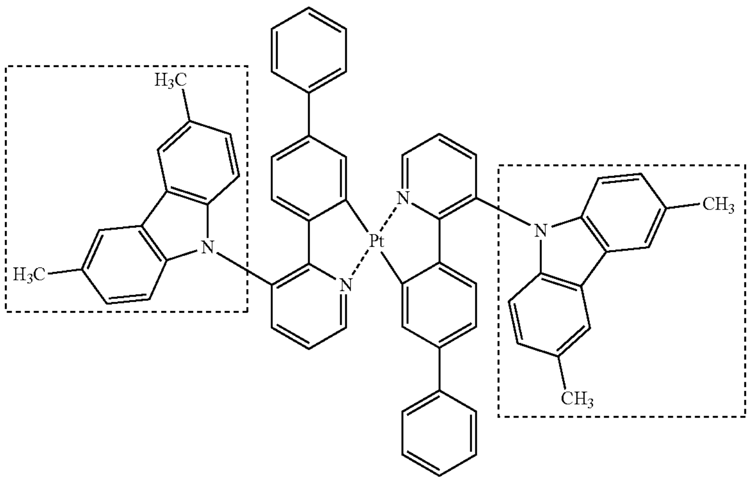
73
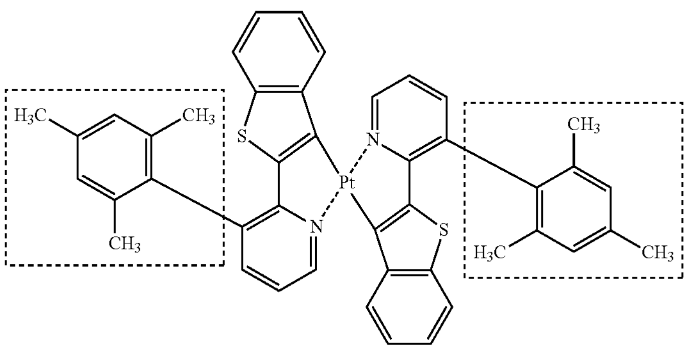
74
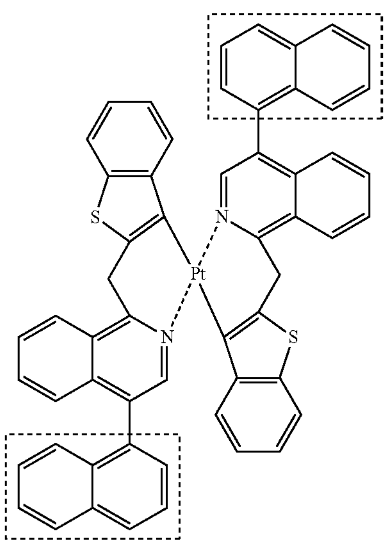

Embodiment g

The case in which at least one type of a platinum complex selected from a group comprising following Formulas (28)-(32) as the aforesaid blue light emitting ortho metalated complex.

A metal complex compound provided with a specific structure, which is represented by each of Formulas (28)-(32) according to the present invention, will now be explained.

In Formula (28) described above, $Z_{11}$ together with a carbon atom and a nitrogen atom is an atomic group necessary to form an aromatic heterocyclic ring; $Z_{12}$ together with a carbon atom is an atomic group necessary to form a non-aromatic ring; and M is a metal. An aromatic heterocyclic group formed by $Z_{11}$ includes such as a pyridine ring, a pyridazine ring, a pyrimidine ring, a pyrazine ring, a triazine ring, a benzoimidazole ring, a benzothiazole ring, a benzooxazole ring, a quinazoline ring and a phthalazine ring. A non-aromatic ring formed by $Z_{12}$ includes, for example, the rings described below.

R-1

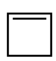

R-2

R-3

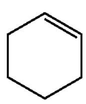

R-4

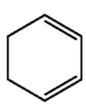

R-5

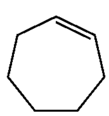

R-6

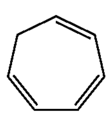

In Formula (28), a non-aromatic ring represented by $Z_{12}$ is preferably R-2 or R-6.

Next, Formula (29) will be explained.

In Formula (29), each of $Z_{21}$ and $Z_{22}$, together with a carbon atom and a nitrogen atom, is an atomic group necessary to form an aromatic heterocyclic ring and M is a metal. An aromatic ring formed by $Z_{21}$ includes aromatic heterocyclic rings similar to aforesaid $Z_{11}$, and an aromatic heterocyclic ring formed by $Z_{22}$ includes such as a pyrrole ring, a pyrazole ring, an imidazole ring, a triazole ring, an indole ring and a benzoimidazole ring. Preferable are the case of a pyrrole ring or a triazole ring.

Next, Formula (30) will be explained.

In Formula (30), $Z_{31}$, together with a carbon atom and a nitrogen atom, is an atomic group necessary to form an aromatic heterocyclic ring; $Z_{32}$, together with a carbon atom, is an atomic group comprising a carbon, nitrogen or oxygen atom necessary to form a 5-membered aromatic ring; and M is a metal. An aromatic heterocyclic ring formed by $Z_{31}$ includes aromatic heterocyclic rings similar to aforesaid $Z_{11}$, and a 5-membered aromatic ring formed by $Z_{32}$ includes such as a pyrrole ring, a furan ring, an imidazole ring, a pyrazole ring, an oxazole ring and an oxadizole ring. Preferable is a nitrogen-containing aromatic heterocyclic ring and more preferably is a nitrogen-containing aromatic heterocyclic ring having a plural number of nitrogen atoms or an oxygen atoms.

Next, Formula (31) will be explained.

In Formula (31), $Z_{41}$, together with a carbon atom and a nitrogen atom, is an atomic group necessary to form an aromatic heterocyclic ring; $Z_{42}$, together with a carbon atom, is an atomic group necessary to form a ring; and M is a metal. An aromatic heterocyclic ring formed by $Z_{31}$ includes aromatic heterocyclic rings similar to an aromatic heterocyclic group similar to aforesaid $Z_{11}$; and a ring formed by $Z_{42}$ may be either an aromatic ring or a non-aromatic ring, however, is preferably a non-aromatic ring.

Next, Formula (32) will be explained.

In Formula (32), $Z_{51}$, together with a carbon atom and a nitrogen atom, is an atomic group necessary to form an aromatic heterocyclic ring; $Z_{52}$, together with a carbon atom, is an atomic group necessary to form an azulene ring; and M is a metal. An aromatic heterocyclic ring formed by $Z_{51}$ includes aromatic heterocyclic rings similar to aforesaid $Z_{11}$.

In Formulas (28)-(32) explained above, a ring formed by $Z_{11}$, $Z_{12}$, $Z_{21}$, $Z_{22}$, $Z_{31}$, $Z_{32}$, $Z_{41}$, $Z_{42}$, $Z_{51}$ and $Z_{52}$ may be further provided with a substituent, and the substituents may bond to each other to further form a ring. Further, in Formulas (28)-(32), M is preferably a metal belonging to the 8th-10th groups of the periodic table, more preferably iridium, osmium or platinum, and most preferably iridium.

In the following, specific examples represented any one of Formulas (28)-(32) will be listed, however, the present invention is not limited thereto.

1-1

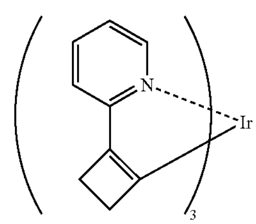

1-2

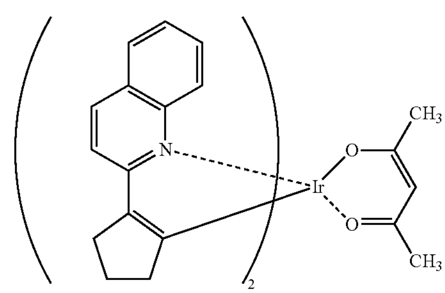

1-3

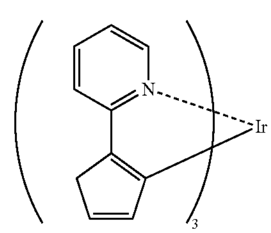

-continued
1-4
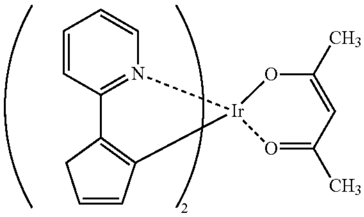
1-5
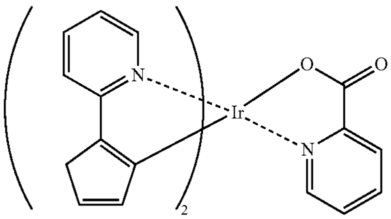
1-6
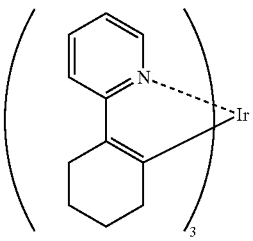
1-7
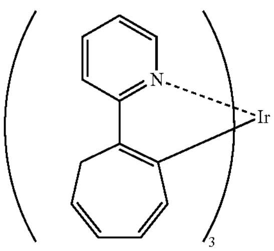
1-8
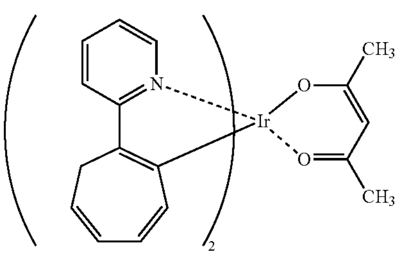
1-9
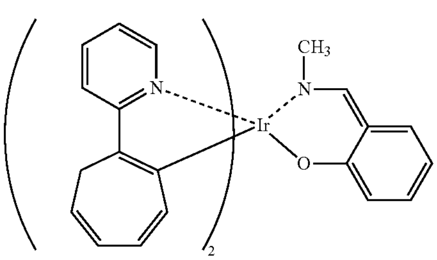
-continued
1-10
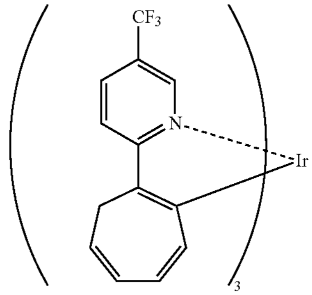
1-11
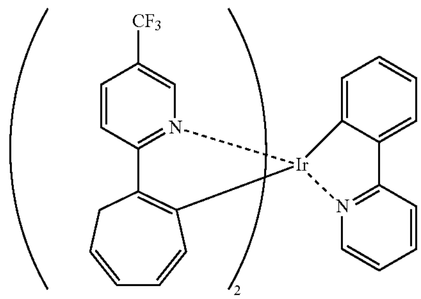
1-12
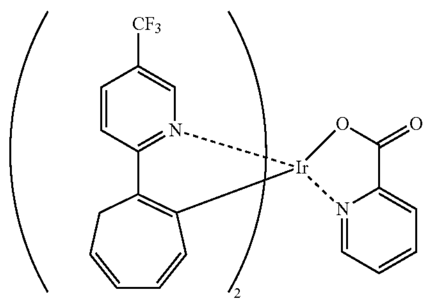
1-13
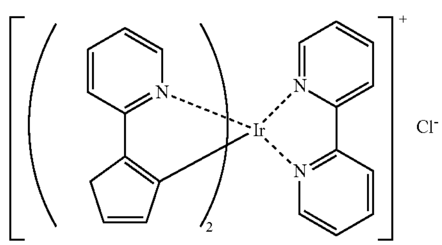
1-14
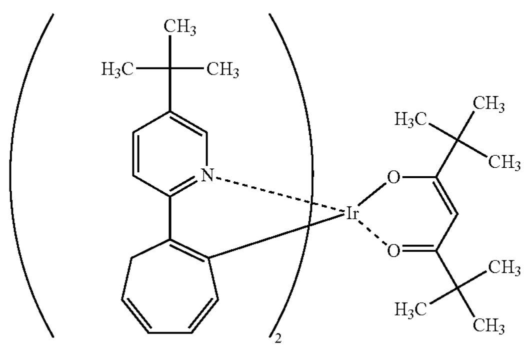

-continued
1-15
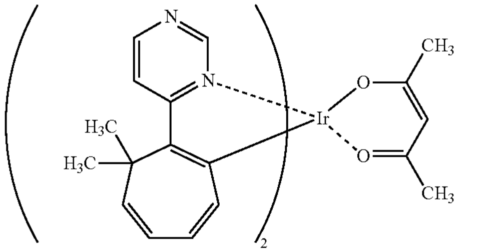
1-16
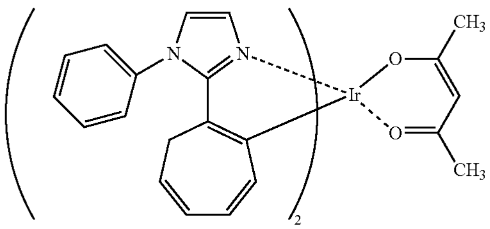
1-17
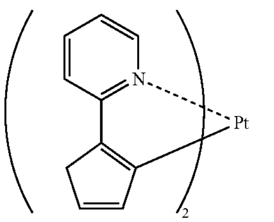
1-18
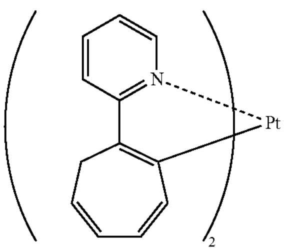
1-19
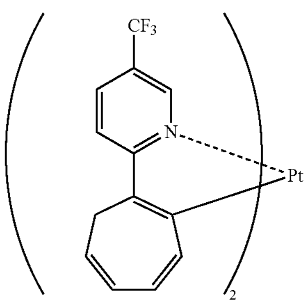
1-20
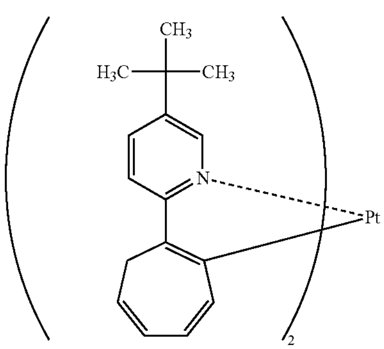
-continued
1-21
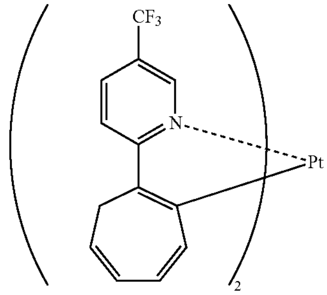
1-22
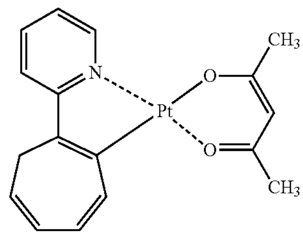
1-23
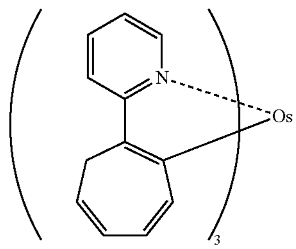
1-24
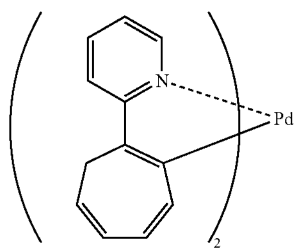
1-25
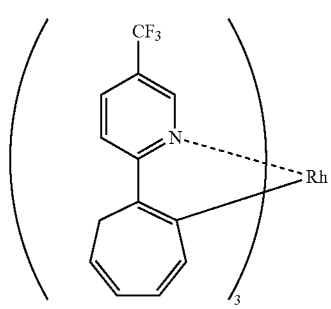
2-1
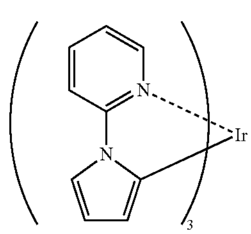

-continued
2-2
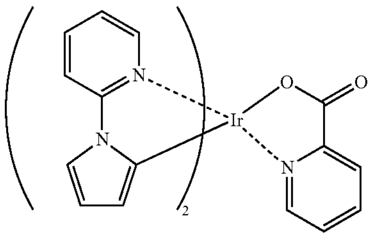
2-3
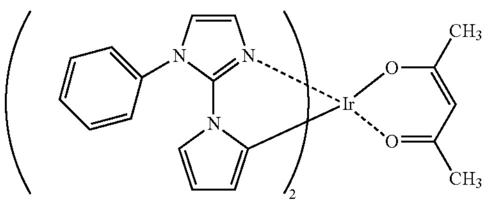
2-4
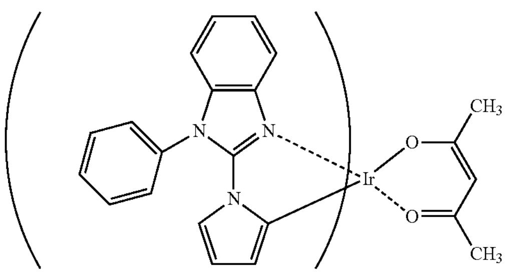
2-5
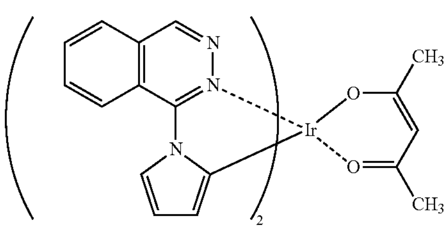
2-6
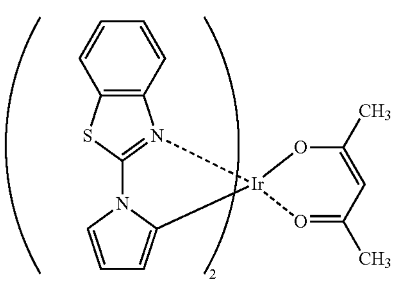
2-7
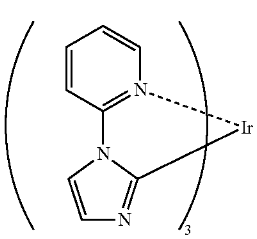
-continued
2-8
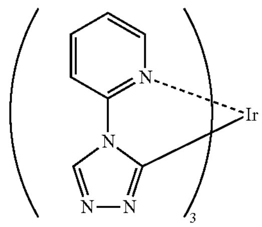
2-9
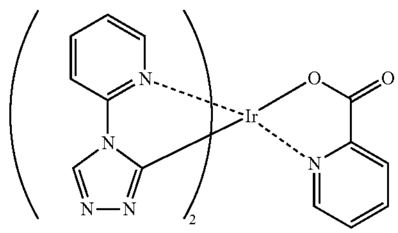
2-10
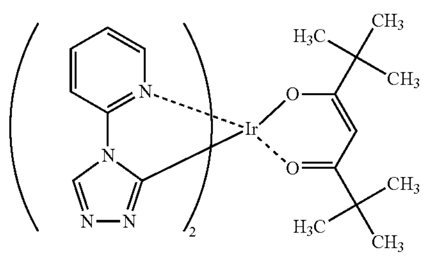
2-11
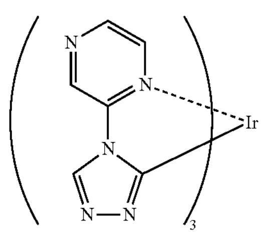
2-12
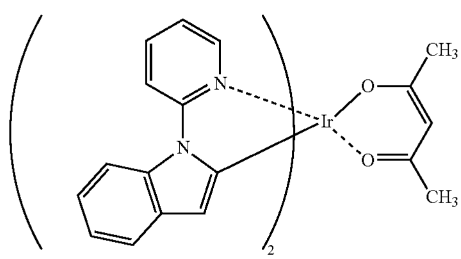
2-13
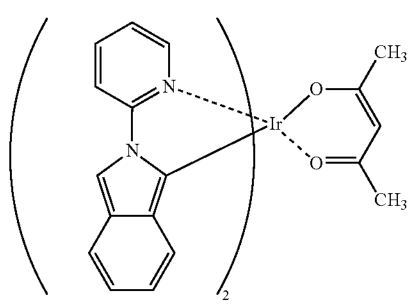

-continued
2-14
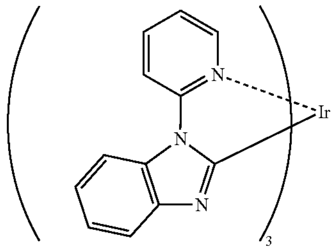
2-15
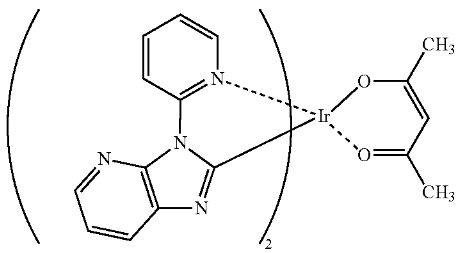
2-16
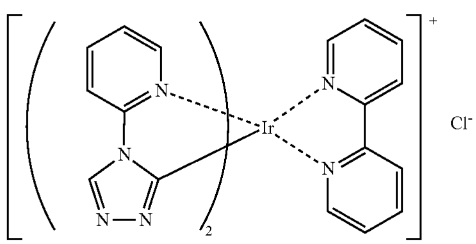
2-17
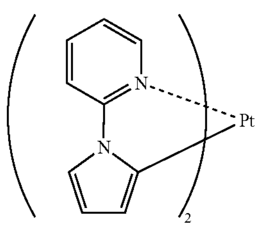
2-18
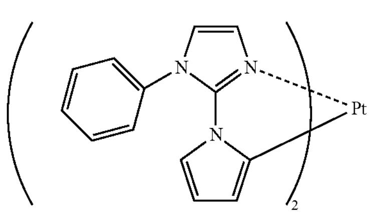
2-19
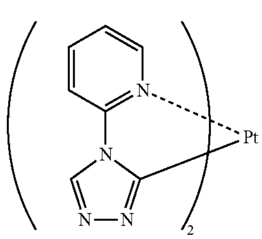
-continued
2-20
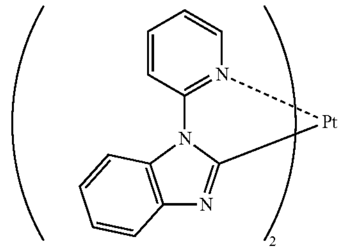
2-21
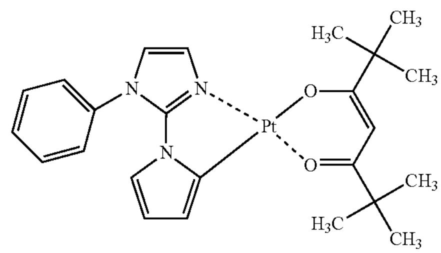
2-22
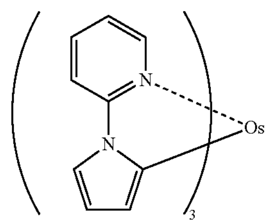
2-23
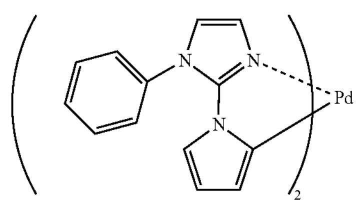
2-24
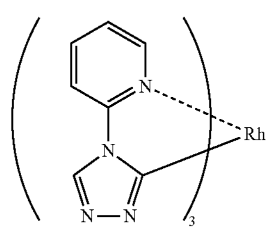
3-1
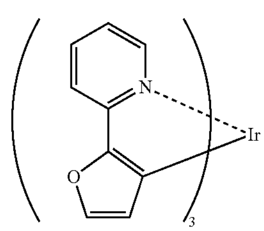
3-2
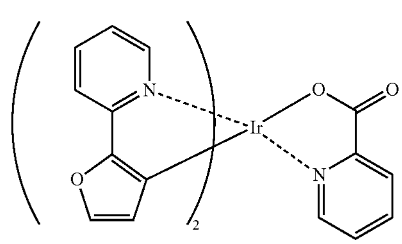

-continued
3-3
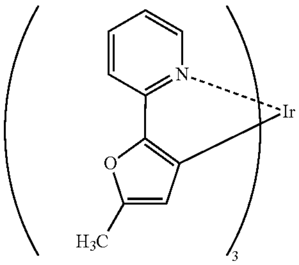
3-4
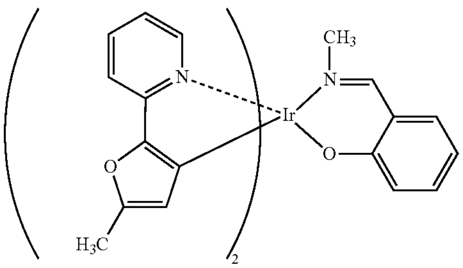
3-5
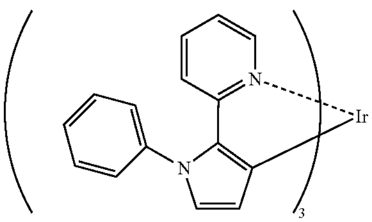
3-6
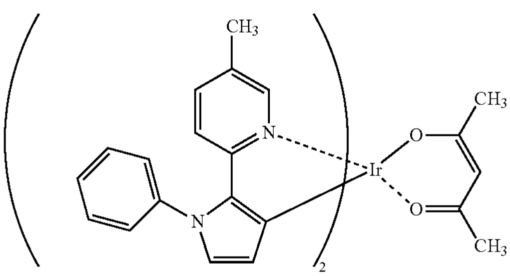
3-7
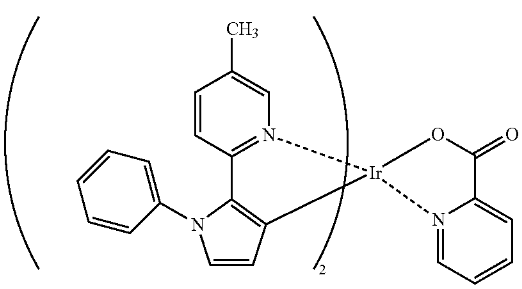
3-8
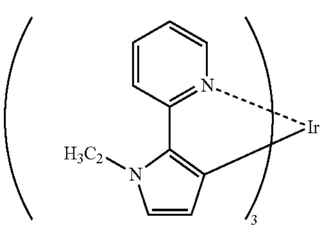
-continued
3-9
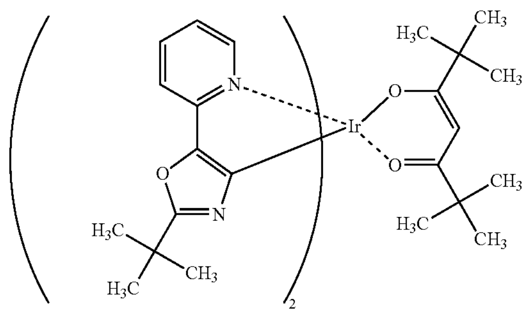
3-10
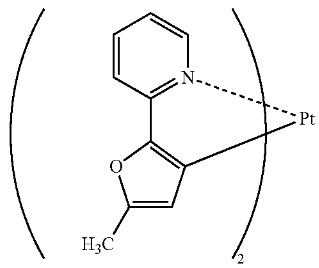
3-11
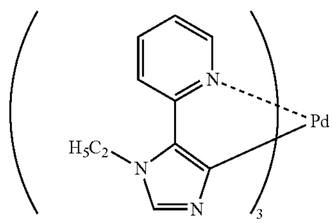
3-12
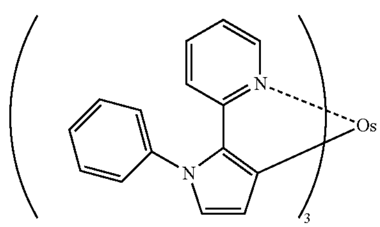
4-1
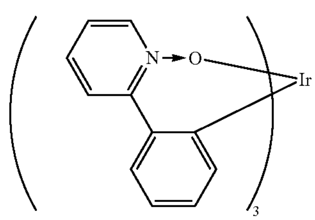
4-2
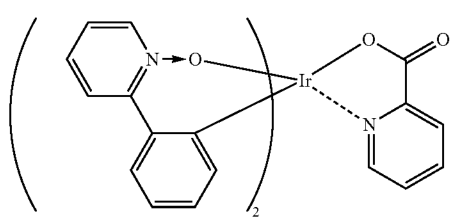

-continued
4-3
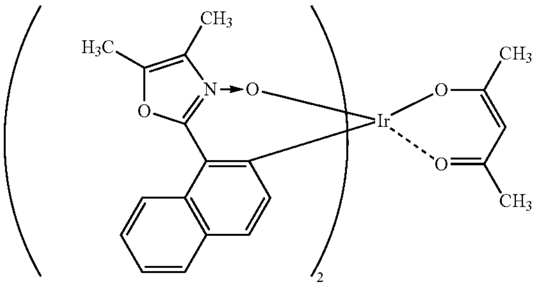
4-4
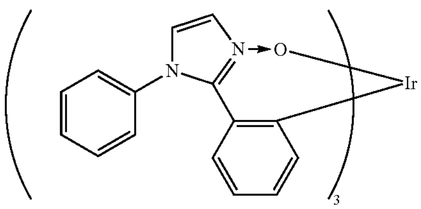
4-5
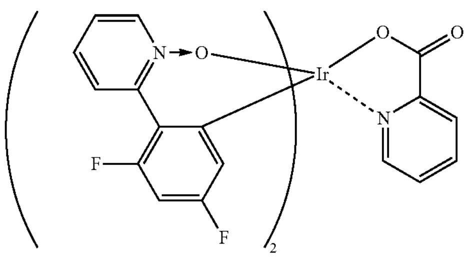
4-6
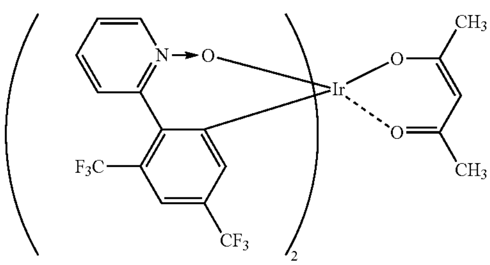
4-7
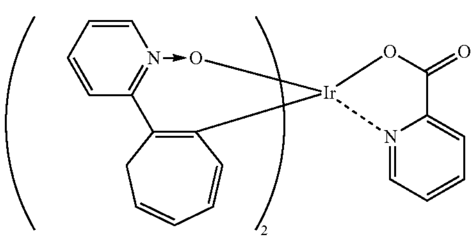
4-8
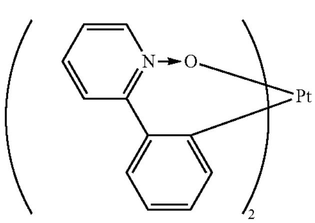
-continued
4-9
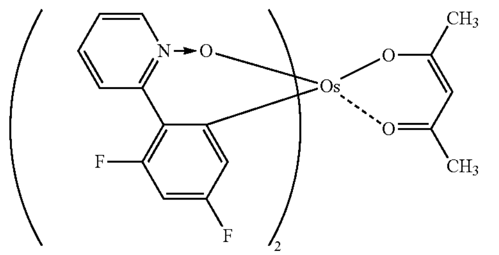
5-1
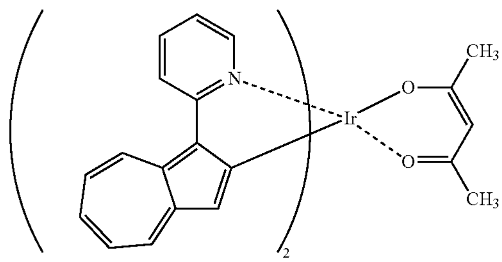
5-2
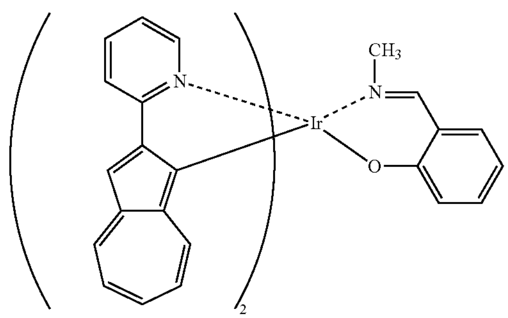
5-3
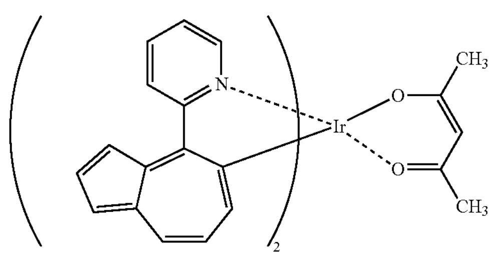
5-4
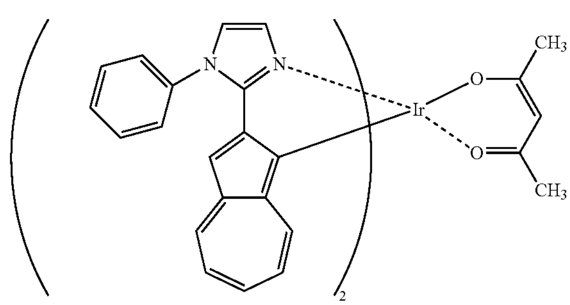

-continued 5-5

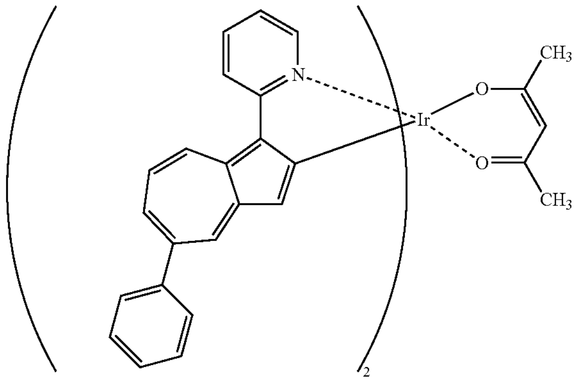

5-6

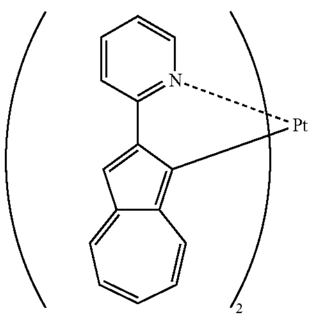

Embodiment h

The case in which at least one type of a platinum complex represented by following Formula (A) or (B) as the aforesaid blue light emitting ortho metalated complex.

At least one type of a platinum complex represented by following Formula (A) or (B) according to the present invention will now be explained.

<Platinum Complex Having Ligand Represented by Formula (A)>

A platinum complex having a partial structure represented by Formula (A) according to the present invention will be explained.

A platinum complex represented by Formula (A) according to the present invention will be explained.

In Formula (A), a substituent represented by each of $R_1$, $R_2$, $R_3$, $R_4$, $R_5$, $R_2$ and $R_7$ includes, for example, an alkyl group (such as a methyl group, an ethyl group, a propyl group, an isopropyl group, t-butyl group, a pentyl group, a hexyl group, an octyl group, a dodecyl group, a tridecyl group, a tetradecyl group and a pentadecyl group), a cycloalkyl group (such as a cyclopentyl group and a cyclohexyl group), an alkenyl group (such as a vinyl group and an allyl group), an alkynyl group (such as a propargyl group), an aryl group (such as a phenyl group, a tolyl group, a xylyl group, a naphthyl group, a biphenylyl group, an anthoryl group, a phnathryl group, a mesityl group and a fluorenyl group), a heterocyclic group (such as a pyridyl group, a thiazolyl group, a oxazolyl group, an imidazolyl group, a furyl group, a pyrrolyl group, a pyradinyl group, a pyrimidinyl group, a pyridazinyl group, a selenazolyl group, a sulforanyl group, a piperidinyl group, a pyrazolyl group, tetrazolyl group and a carbazolyl group), an alkoxyl group (such as a methoxy group, an ethoxy group, a propyloxy group, a pentyloxy group, a hexyloxy group, an octyloxy group and a dodecyloxy group), a cycloalkoxy group (such as cyclopentyloxy group and a cyclohexyloxy group), an aryloxy group (such as a phenoxy group and a naphthyloxy group), an alkylthio group (such as a methylthio group, an ethylthio group, a propylthio group, a pentylthio group, a hexylthio group, an octylthio group and a dodecylthio group), a cycloalkylthio group (such as cyclopentylthio group and a cyclohecylthio group), an arylthio group (such as a phenylthio group and a naphthylthio group), alkoxycarbonyl group (such as a methyloxycarbonyl group, an ethyloxycarbonyl group, a butyloxycarbonyl group, an octyloxycarbonyl group and a dodecyloxycarbonyl group), an aryloxycarbonyl group (such as a phenyloxycarbonyl group and a naphthyloxycarbonyl group), a sulfamoyl group (such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group), an ureido group (such as a methylureido, an ethylureido group, a pentylureido group, a cyclohexylureido group, an octylureido group, a dodecylureido group, a phenylureido group, a naphthylureido group and a 2-pyridylaminoureido group), an acyl group (such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group), an acyloxy group (such as an acetyloxy group, an ethylcarbonyloxy group, a butylcarbonyloxy group, an octylcarbonyloxy group, a dodecylcarbonyloxy group and a phenylcarbonyloxy group), an amido group (such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group), a carbamoyl group (such as an aminocarbonyl group, a methyaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group), a sulfinyl group (such as a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group or an arylsulfonyl group (such as a methylsulfonyl group, an ethylsulfonyl group, a butylsulfonyl group, an cyclohexylsulfonyl group, a 2-ethylhexylsulfonyl group, a dodecylsulfonyl group, a phenylsulfonyl group, a naphthylsulfonyl group and a 2-pyridylsulfonyl group), an amido group (an amino group, an ethylamino group, a dimethylamino group, a butylamino group, a cyclopentylamino group, a 2-ethylhexylamino group, a dodcylamino group, an anilino group, a naphthylamino group and a 2-pyridyl amino group), a nitro group, a cyano group, a silyl group (such as a trimethylsilyl group, a t-butylmethylsilyl group, a dimethylphenylsilyl group and a triphenylsilyl group).

In the present invention, at least one of groups represented by $R_1$, $R_2$, $R_3$ and $R_4$ is preferably an electron donating group;

it is more preferable that at least two of aforesaid groups represented by $R_1$, $R_2$, $R_3$ and $R_4$ are electron donating groups and σp of at least one of said electron donating groups is not more than −0.20; and it is most preferable that the aforesaid electron donating group is introduced to $R_2$ or $R_4$ of Formula (A).

<Electron Donating Group Having Up of not More than −0.20>

Herein, an electron donating group having σp of not more than −0.20 includes such as a cyclopropyl group (−0.21), a cyclohexyl group (−0.22), a tert-butyl group (−0.20), —$CH_2Si(CH_3)_3$ (−0.21), an amino group (−0.66), a hydroxylamino group (−0.34), —$NHNH_2$ (−0.55), —$NHCONH_2$ (−0.24), —$NHCH_3$ (−0.84), —$NHC_2H_5$ (−0.61), —$NHCONHC_2H_5$ (−0.26), —$NHC_4H_9$ (−0.51), —$NHC_6H_5$ (−0.40), —N═$CHC_6H_5$ (−0.55), —OH (−0.37), —$OCH_3$ (−0.27), —$OCH_2COOH$ (−0.33), —$OC_2H_5$ (−0.24), —$OC_3H_7$ (−0.25), —$OCH(CH_3)_2$ (−0.45), —$OC_5H_{11}$ (−0.34) and —$OCH_2C_6H_5$ (−0.42), however, the present invention is not limited thereto.

In Formula (A), a substituent represented by each of Ra and Rb is identical with a substituent represented by each of $R_1$, $R_2$, $R_3$, $R_4$, $R_5$, $R_6$ and $R_7$ in Formula (A), however, preferable is the case in which both Ra and Rb are alkyl groups.

<Platinum Complex Having Ligand Represented by Formula (B)>

A platinum complex having a partial structure represented by Formula (B) will now be explained.

A platinum complex represented by Formula (B) will now be explained.

In Formula (B), a substituent represented by each of $R_{11}$, $R_{12}$, $R_{13}$, $R_{14}$, $R_{15}$, $R_{16}$ and $R_{17}$ is identical with a substituent represented by each of $R_1$, $R_2$, $R_3$, $R_4$, $R_5$, $R_6$ and $R_7$ in Formula (1). Herein, at least one of $R_{11}$ and $R_{12}$ is an electron attracting group; the both of $R_{11}$ and $R_{12}$ are preferably electron attracting groups, and it is furthermore preferable that σp of the aforesaid electron attracting group is not less than 0.10.

<Electron Attracting Group Having σp of not Less than 0.10>

An electron attracting group having σp of not less than 0.10 includes such as —$B(OH)_2$ (0.12), bromine atom (0.23), chlorine atom (0.23), iodine atom (0.18), —$CBr_3$ (0.29), —$CCl_3$ (0.33), —$CCF_3$ (0.54), —CN (0.66), —CHO (0.42), —COOH (0.45), —$CONH_2$ (0.36), —$CH_2SO_2CF_3$ (0.31), —$COCH_3$ (0.45), 3-varenyl group (0.19), —$CF(CF_3)_2$ (0.53), —$CO_2C_2H_5$ (0.45), —$CF_2CF_2CF_2CF_3$ (0.52), —$C_6F_5$ (0.41), 2-benzooxazolyl group (0.33), 2-benzothiazolyl group (0.29), —C═$O(C_6H_5)$ (0.43), —$OCF_3$ (0.35), —$CSO_2CH_3$ (0.36), —$SO_2(CH_2)$ (0.57), —$SO_2CH_3$ (0.72), —$COCH_2CH_3$ (0.48), —$COCH(CH_3)_2$ (0.47) and —$COC(CH_3)_3$ (0.32), however, the present invention is not limited thereto.

In Formula (B), a substituent represented by each of Rc and Rd is identical with a substituent represented by each of $R_1$, $R_2$, $R_3$, $R_4$, $R_5$, $R_6$ and $R_7$ in Formula (1), however, the both of Rc and Rd are preferably alkyl groups.

In the following, specific examples of a platinum complex having a partial structure represented by Formula (A) or (B) according to the present invention will be listed; however, the present invention is not limited thereto.

1

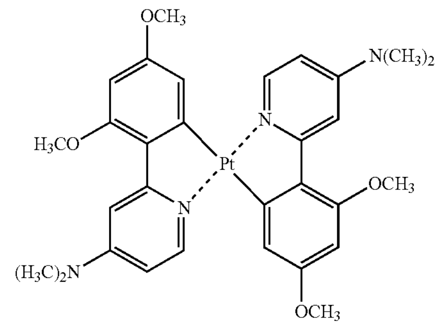

2

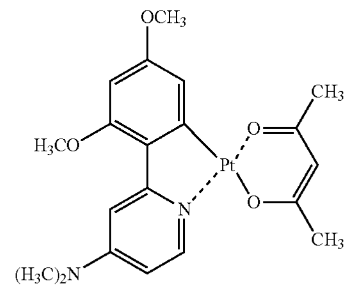

3

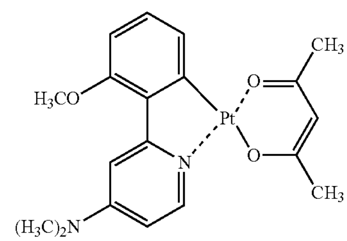

4

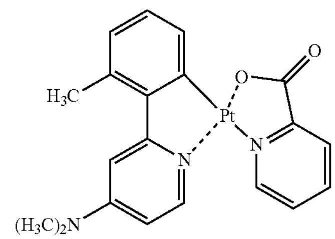

5

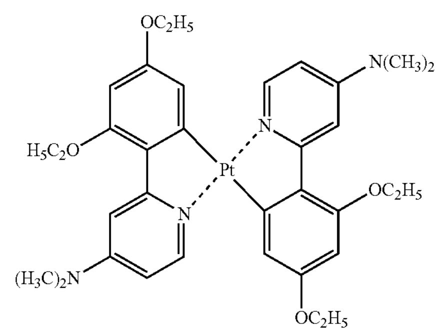

-continued
6
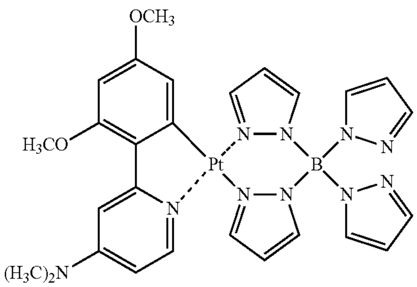
7
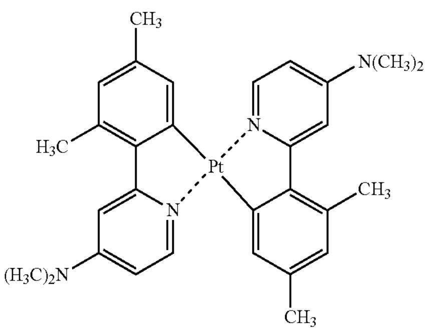
8
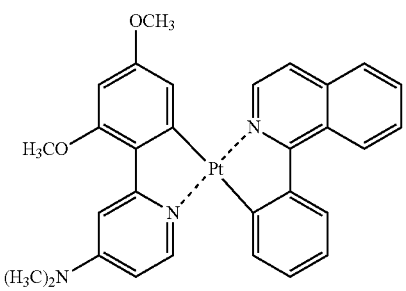
9
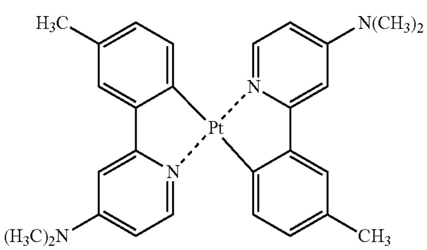
10
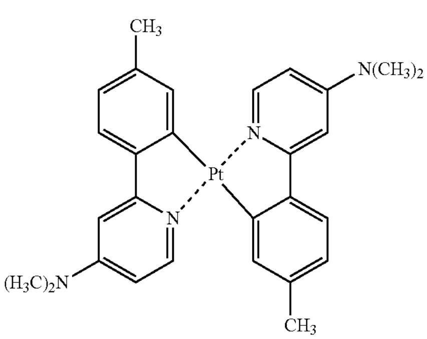
-continued
11
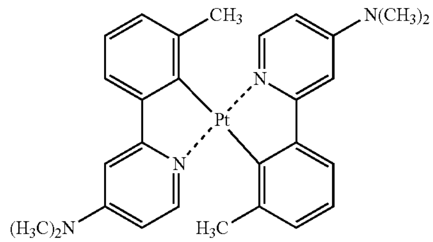
12
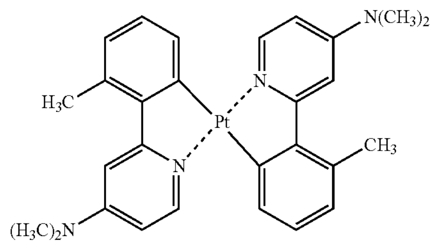
13
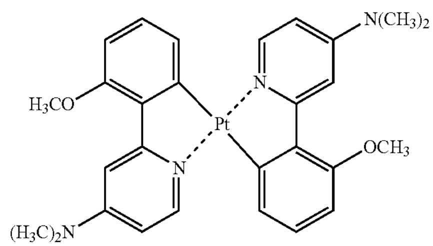
14
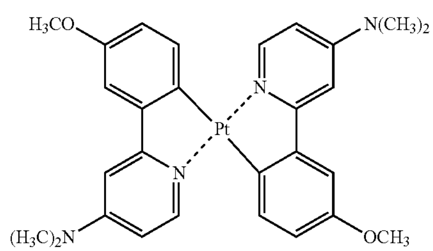
15
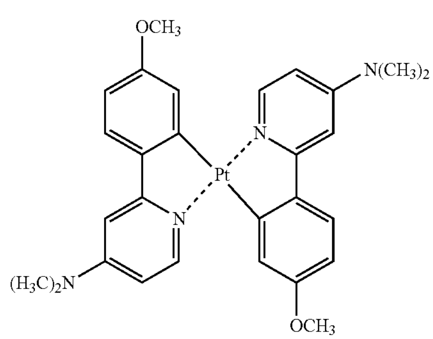
16
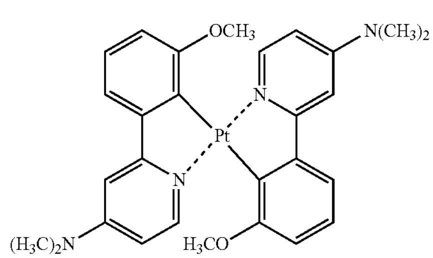

-continued
17
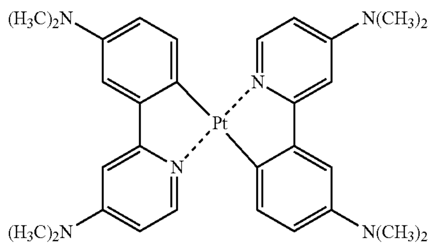
18
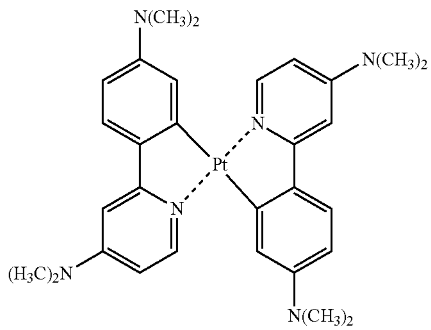
19
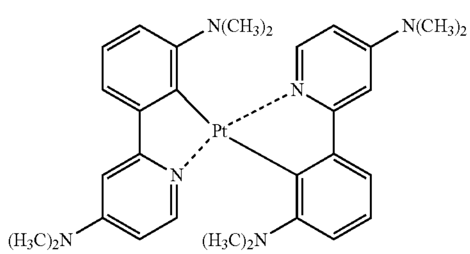
20
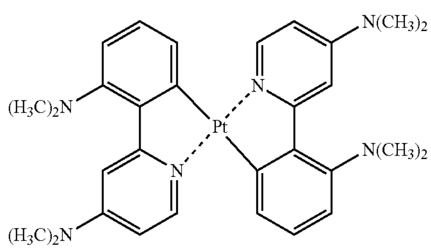
21
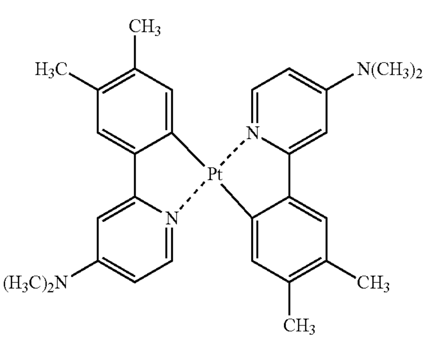
-continued
22
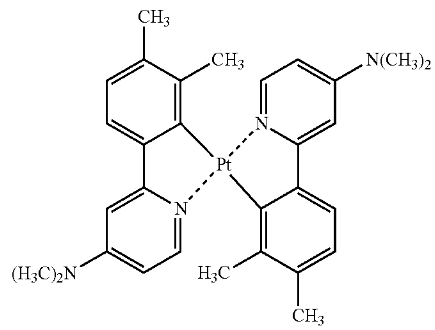
23
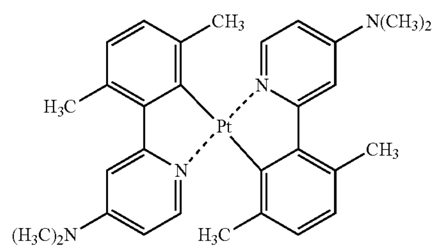
24
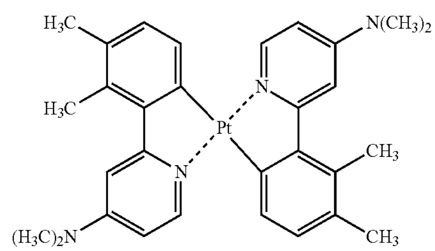
25
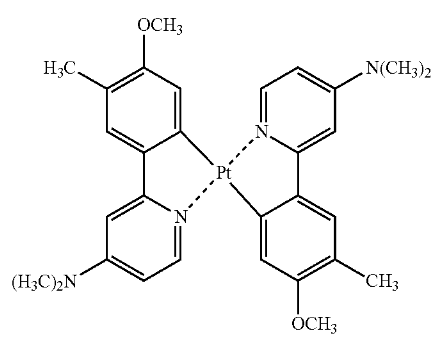
26
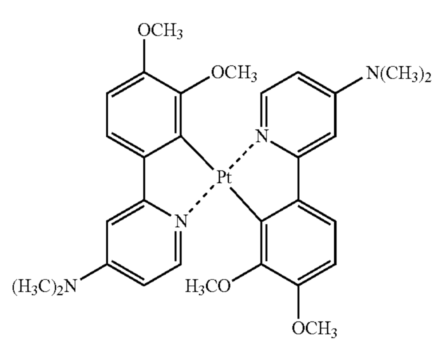

-continued
27
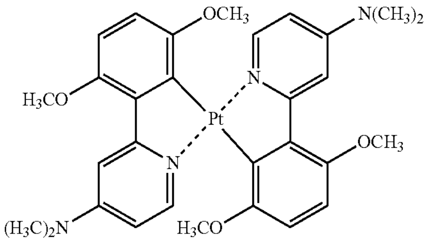
28
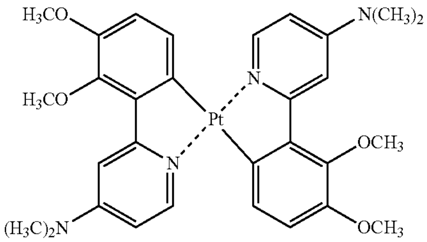
29
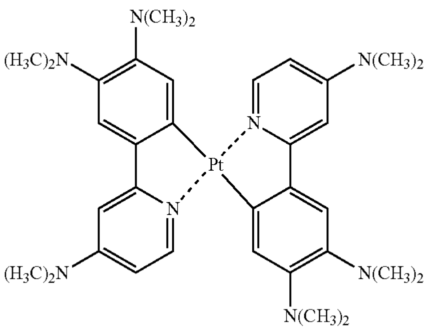
30
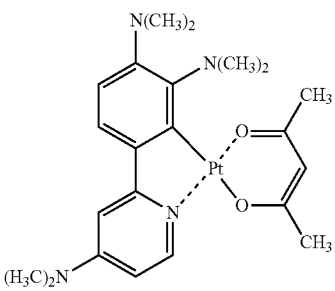
31
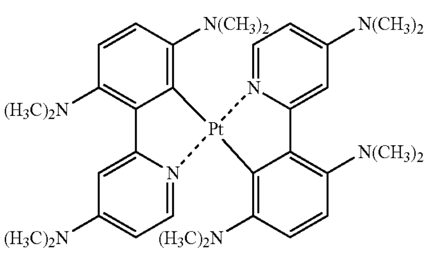
32
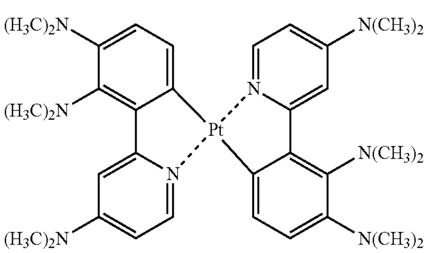
-continued
33
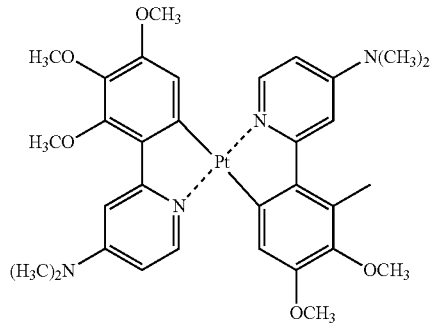
34
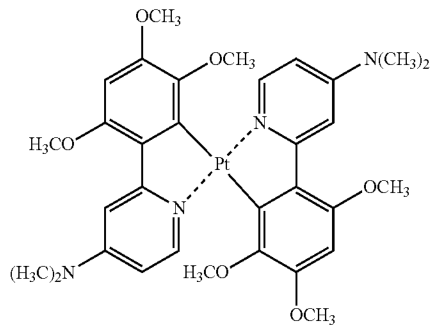
35
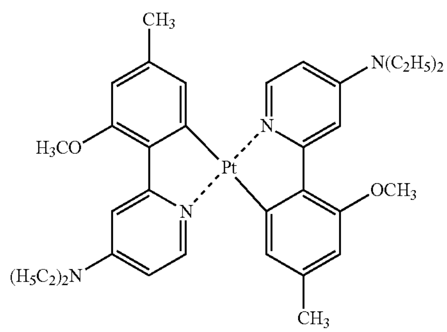
36
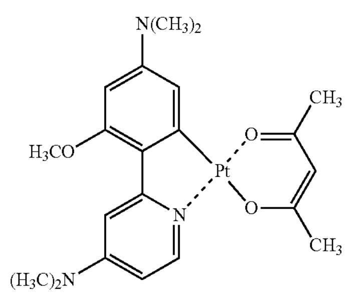
37
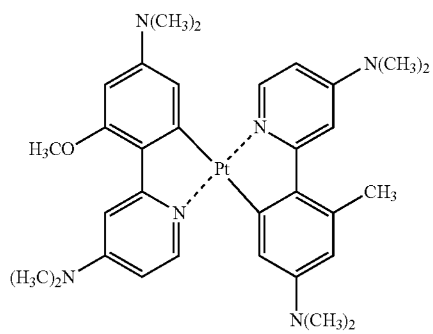

-continued
38
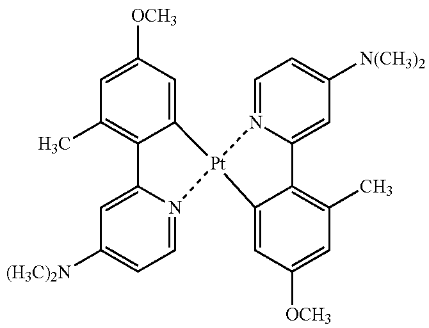
39
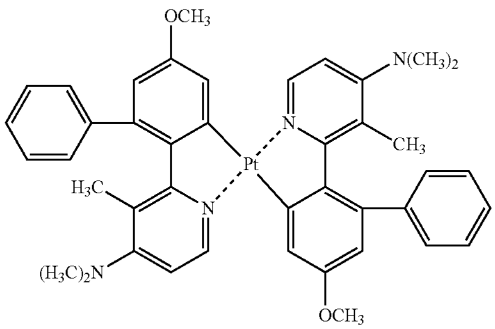
40
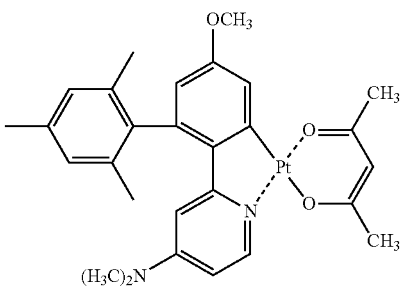
41
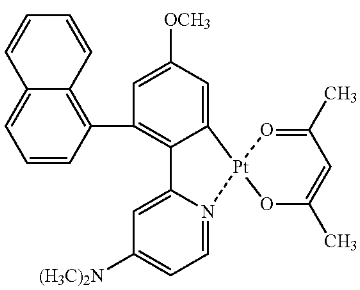
42
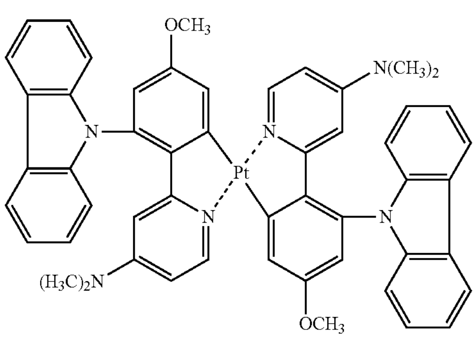
-continued
43
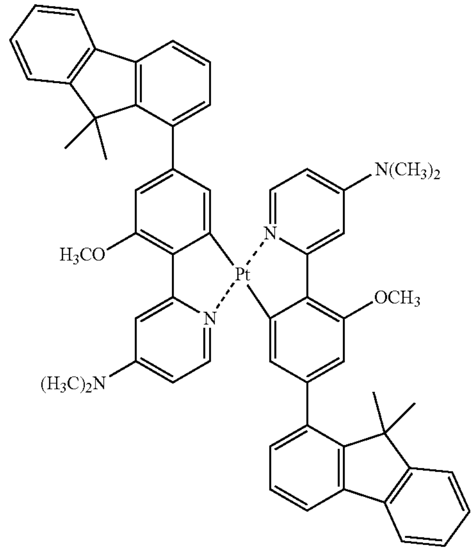
44
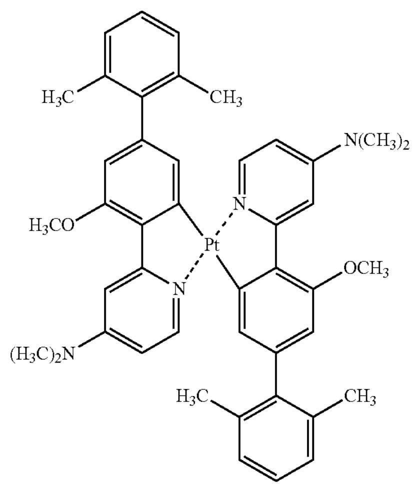
45
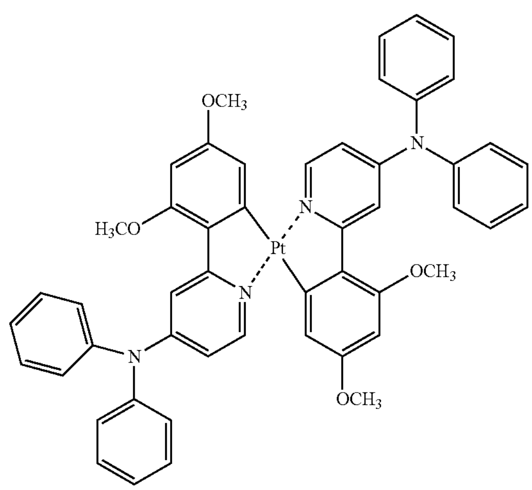

-continued
46
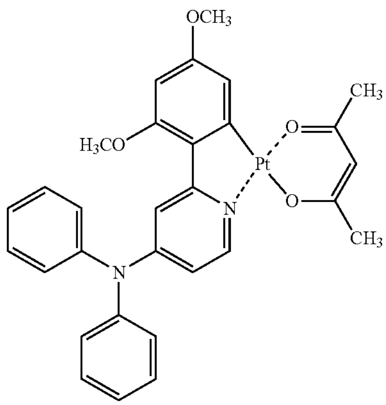
47
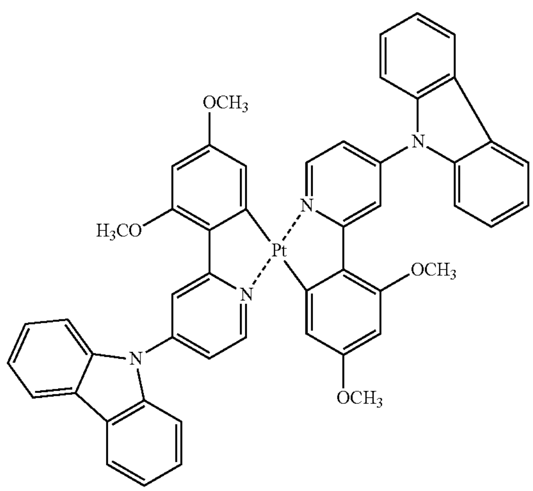
48
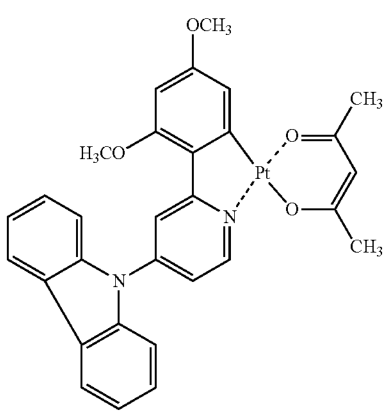
-continued
49
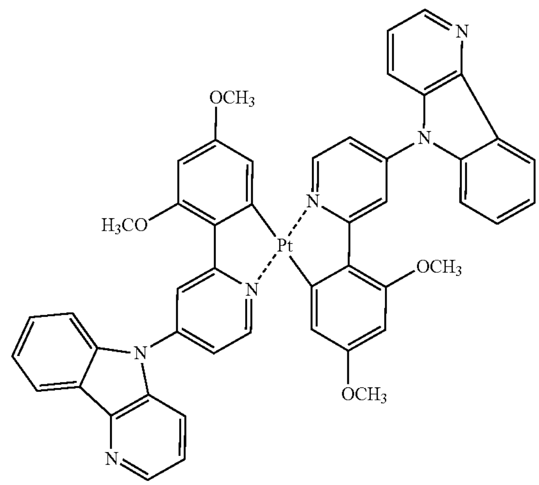
50
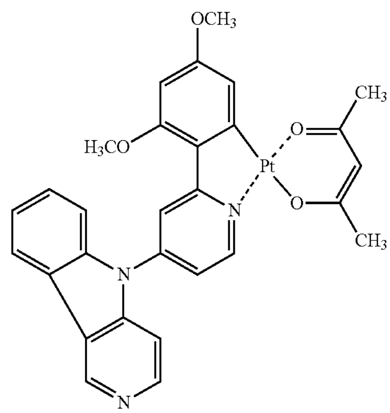
51
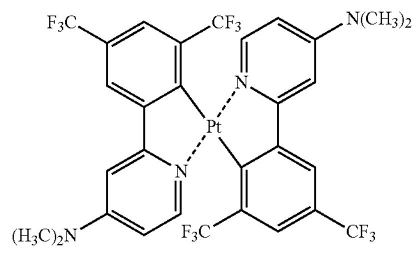
52
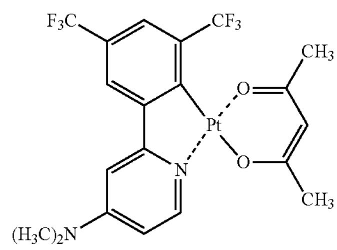
53
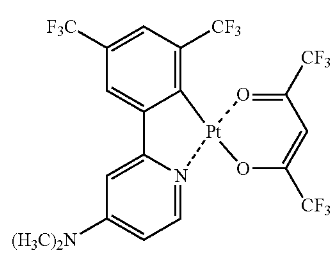

-continued
54
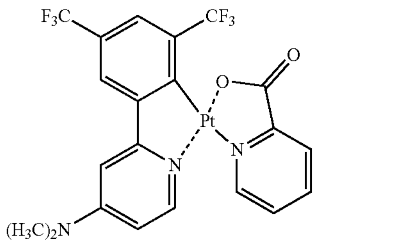
55
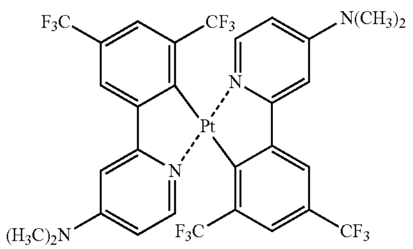
56
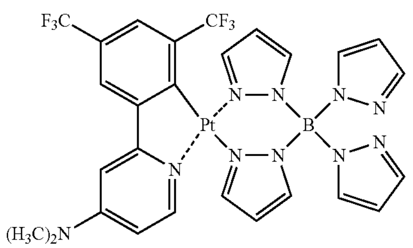
57
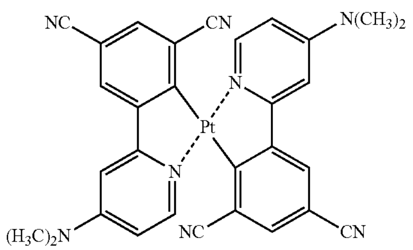
58
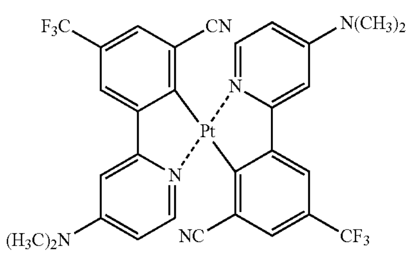
59
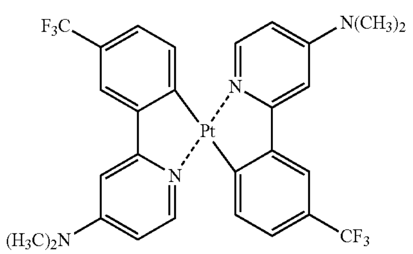
60
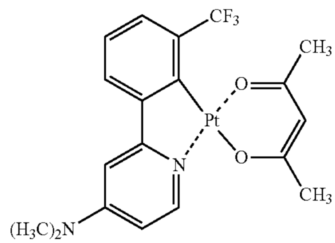
61
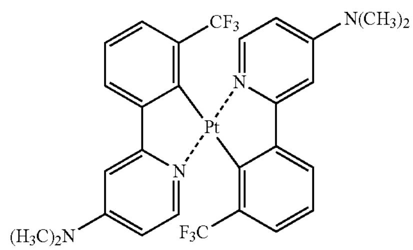
62
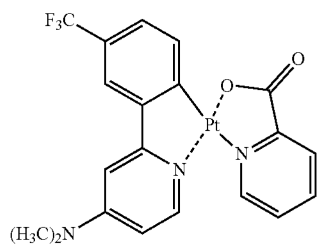
63
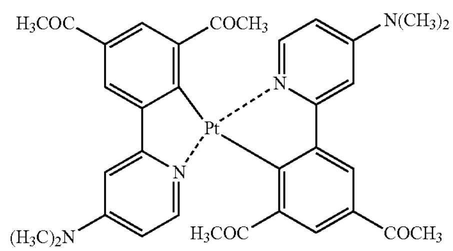
64
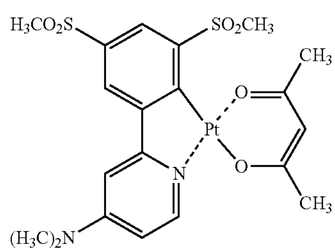
65
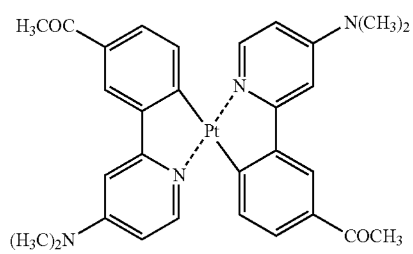

-continued
66
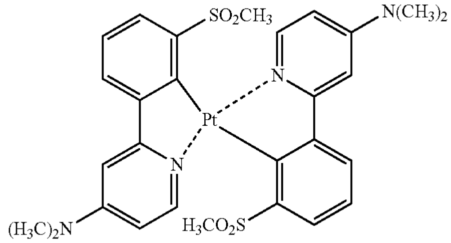
67
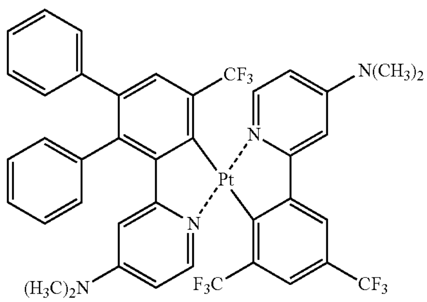
68
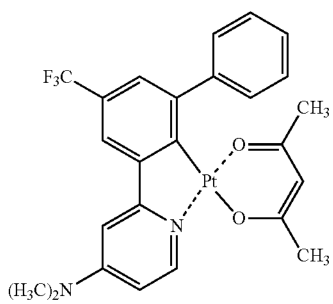
69
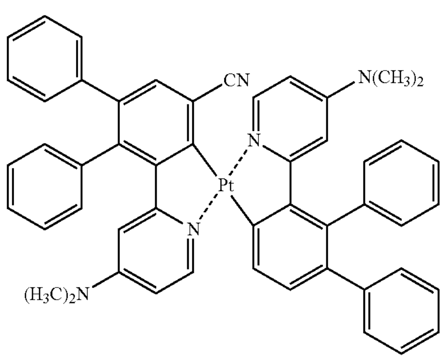
70
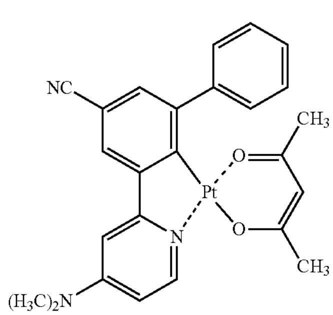
-continued
71
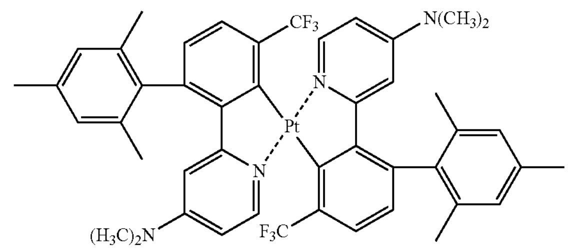
72
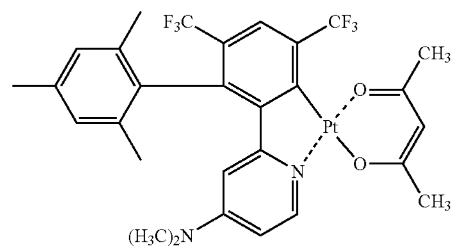
73
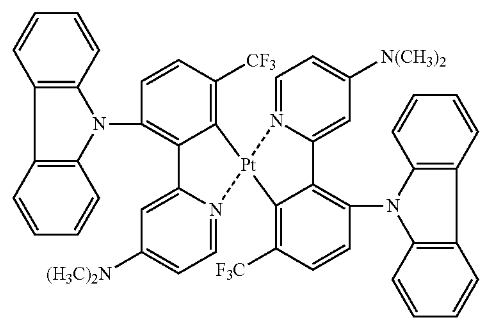
74
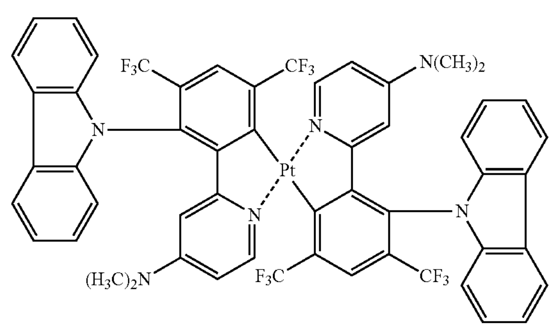
75
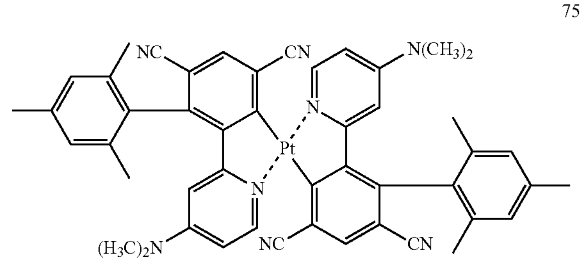

-continued
76
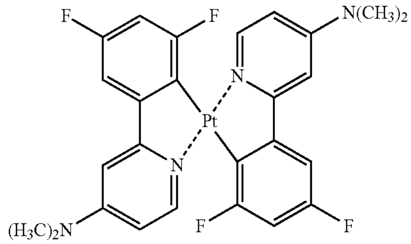
77
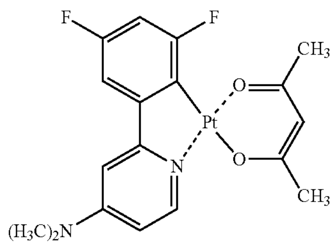
78
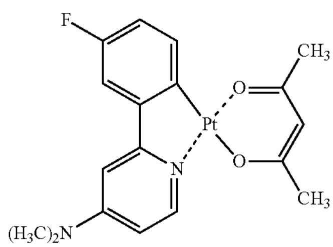
79
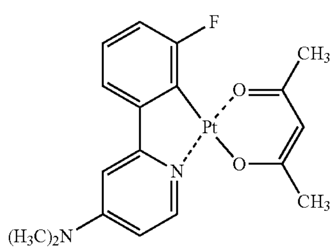
80
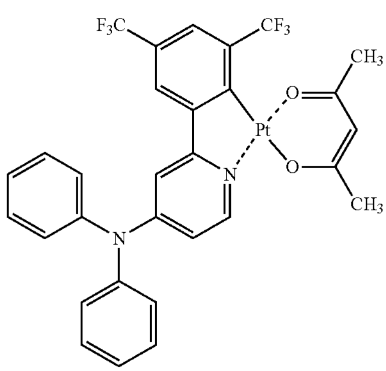
81
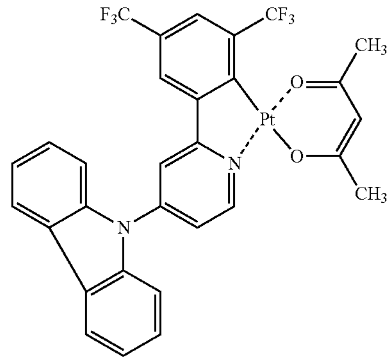
82
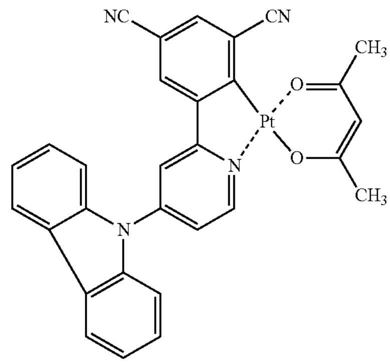
83
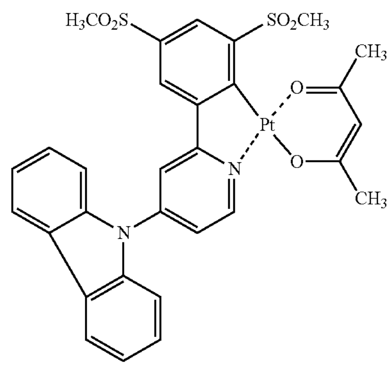
84
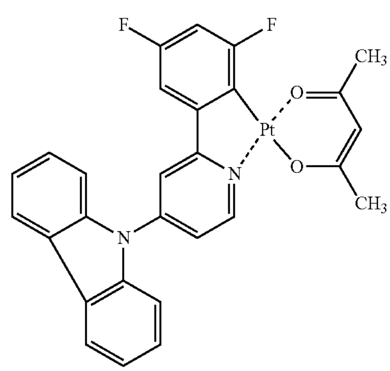
Metal complexes according to an organic EL element of the present invention (specifically, ortho metalated complexes of each of green, blue and red) can be synthesized by applying a method described, for example, in Organic Letter, vol. 13, No. 16, pp. 2579-2581 (2001), Inorganic Chemistry, vol. 30, No. 8, pp. 1685-1687 (1991), J. Am. Chem. Soc., vol. 123, p. 4304 (2001), Inorganic Chemistry, vol. 40, No. 7, pp. 1704-1711 (2001), Inorganic Chemistry, vol. 41, No. 12, pp.

3055-3066 (2002), and New Journal of Chemistry, vol. 26, p. 1171 (2002); and further in references described in these literatures.

<Application of Organic EL Element Material Containing Metal Complex to Organic EL Element>

In the case of preparing an organic EL element by utilizing a phosphorescent compound according to the present invention, said phosphorescent compound is preferably utilized in an emission layer or a positive hole blocking layer among the constituent layers of an organic EL element (details of which will be described later). Further, in an emission layer, said phosphorescent compound is preferably utilized as an emission dopant.

(Emission Host and Emission Dopant)

The mixing ratio of an emission dopant against an emission host, which is a host compound as a primary component in an emission layer, is preferably adjusted in a range of not less than 0.1 weight % and less than 30 weight %.

Herein, plural types of compounds may be mixed to be utilized as an emission dopant, and the partner to be mixed may be another metal complex having a different structure, a phosphorescent dopant or a fluorescent dopant having another structure.

An embodiment wherein a phosphorescence emitting compound according to the present invention is preferably utilized includes the following embodiments.

(a) The case in which at least two types of phosphorescence emitting compounds different from each other are contained in the same emission layer.

(b) The case in which at least two types of phosphorescence emitting compounds different from each other are contained in different emission layers, respectively.

(b) The case in which two types out of three types of phosphorescence emitting compounds different from each other are contained in the same emission layer and the remaining one type is contained in an emission layer different from the emission layer in which aforesaid two types are contained.

Further, a dopant (such as a phosphorescent dopant and a fluorescent dopant) utilizable in combination with a phosphorescence emitting compound according to the present invention, which is utilized as an emission dopant, will be explained.

An emission dopant is roughly classified into two types, a fluorescent dopant which emits fluorescence and a phosphorescent dopant which emits phosphorescence.

A typical example of the former (a fluorescent dopant) includes such as cumarin type dye, pyran type dye, cyanine type dye, croconium type dye, squalium type dye, oxobenzanthrathene type dye, fluoresceine type dye, Rhodamine type dye, pyrylium type dye, perillene type dye, stylben type dye, polythiophene type dye or a rare earth complex type fluorescent substance.

A typical example of the latter (a phosphorescent dopant) is preferably a complex type compound containing a metal belonging to the 8th, 9th or 10th group of the periodic table, more preferably an iridium compound and an osmium compound and most preferably an iridium compound.

Specifically, these are compounds described in the following patent publications:

Such as WO 00/70655 pamphlet; JP-A Nos. 2002-280178, 2001-181616, 2002-280179, 2001-181617, 2002-280180, 2001-247859, 2002-299060, 2001-313178, 2002-302671, 2001-345183 and 2002-324679; WO 02/15645 pamphlet; JP-A Nos. 2002-332291, 2002-50484, 2002-332292, 2002-83684, 2002-540572, 2002-117978, 2002-338588, 2002-170684 and 2002-352960; WO 01/93642 pamphlet, JP-A Nos. 2002-50483, 2002-100476, 2002-173674, 2002-359082, 2002-175884, 2002-363552, 2002-184582 and 2003-7469; Japanese Translation of PCT International Application Publication No. 2002-525808; JP-A 2003-7471; Japanese Translation of PCT International Application Publication No. 2002-525833; JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

Compounds which can be utilized in combination with a phosphorescence emitting compound according to the present invention will be partly listed below.

Ir-1

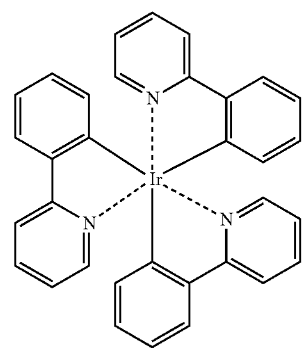

Ir-2

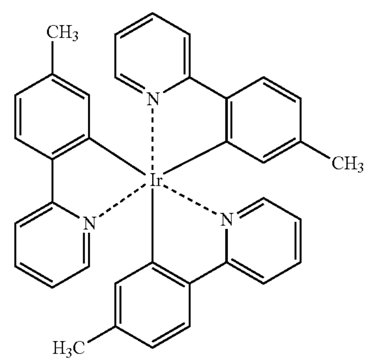

Ir-3

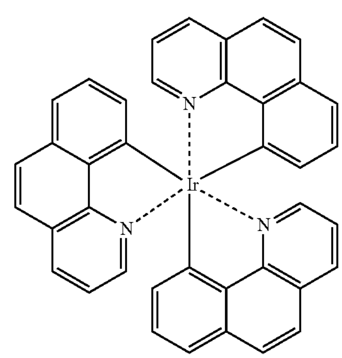

-continued
Ir-4
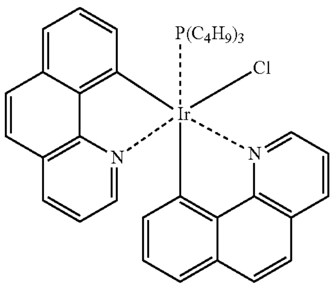
Ir-5
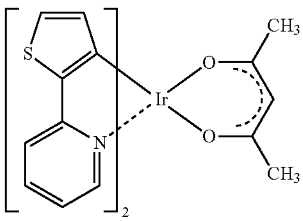
Ir-6
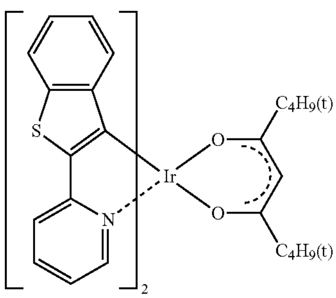
Ir-7
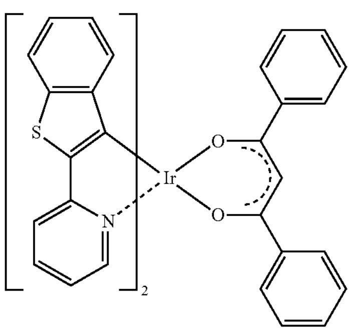
Ir-8
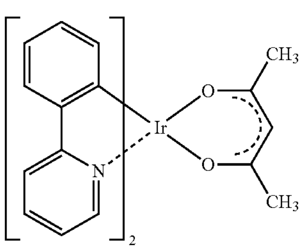
-continued
Ir-9
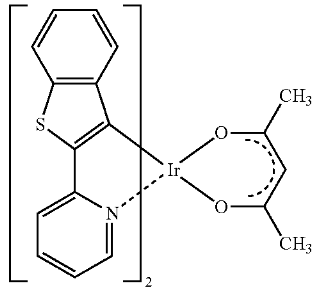
Ir-10
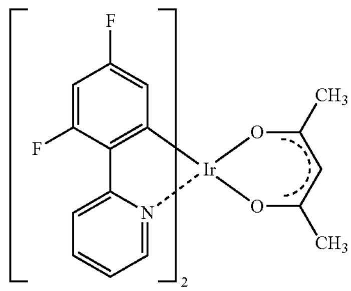
Ir-11
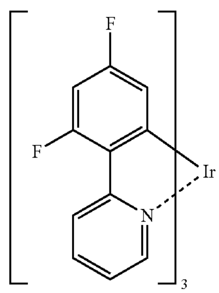
Ir-12
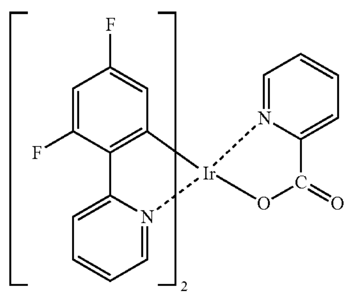
Ir-13
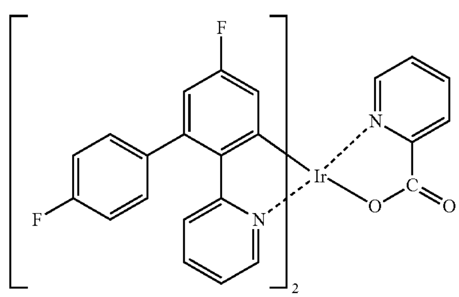

-continued

Pt-1

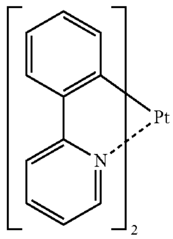

Pt-2

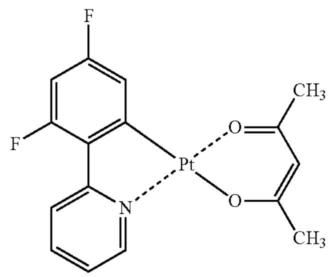

Pt-3

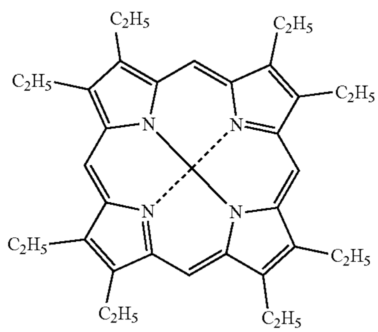

A-1

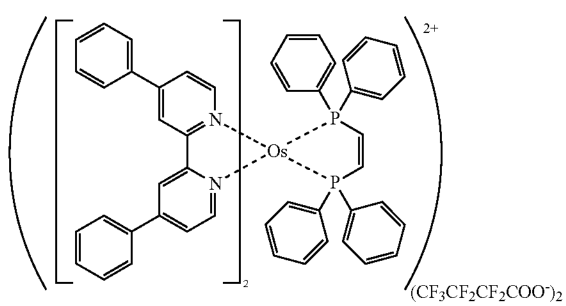

(Emission Host)

An emission host means a compound a mixing ratio (weight) of which is largest in an emission layer comprising at least two types of compounds, and other compounds are called as dopant compounds (or simply as dopants). For example, when an emission layer is comprised of two types, compound A and compound B, and the mixing ratio A/B=10/90, compound A is a dopant compound and compound B is a host compound. Further, when an emission layer is comprised of three types, compound A, compound B and compound C, and the mixing ratio A/B/C=5/10/85, compound A and compound B are dopant compounds and compound C is a host compound.

An emission host utilized in the present invention is not specifically limited with respect to the structure, however, typically includes those having a basic skeleton of such as a carbazole derivative, a triarylamine derivative, an aromatic borane derivative, a nitrogen-containing heterocyclic compound, a thiophene derivative, a furan derivative and oligoarylene compound, or such as a carboline derivative and a diazacarbazole derivative (wherein, a diazacarbazole derivative is those at least one carbon atom of a hydrocarbon ring, which constitutes a carboline ring of a carboline derivative, is substituted by a nitrogen atom).

Among them, preferably utilized are such as a carboline derivative, a diazacarbazole derivative and a compound represented by above-described Formula (33).

<Compound Represented by Formula (33)>

A compound represented by Formula (33) according to the present invention will now be explained.

The inventors of the present invention, as a result of extensive study, have found that an organic EL element, which is prepared by containing a compound represented by aforesaid Formula (33) in an emission layer or in an adjacent layer to said emission layer and utilizing a phosphorescence emitting compound described later in an emission layer, exhibits increased emission efficiency and prolonged life.

In aforesaid Formula (33), $Z_1$ is an aromatic heterocyclic ring which may be provided with a substituent; $Z_2$ is an aromatic heterocyclic ring or an aromatic hydrocarbon ring which may be provided with a substituent; and $Z_3$ is a divalent connecting group or a simple bonding hand. $R_{101}$ is a hydrogen atom or a substituent.

In aforesaid Formula (33), an aromatic heterocyclic ring represented by $Z_1$ and $Z_2$ includes such as a furan ring, a thiophene ring, a pyridine ring, a pyridazine ring, a pyrimidine ring, a pyradine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring and a ring in which a carbon atom of a hydrocarbon ring constituting a carboline ring is further substituted by a nitrogen atom. Further, the aforesaid aromatic heterocyclic ring may be provided with a substituent represented by $R_{101}$, which will be described later.

In aforesaid Formula (33), an aromatic hydrocarbon ring represented by $Z_2$ includes such as a benzene ring, a biphenyl ring, a naphthalene ring, an azulene ring, an anthrathene ring, a phenanthrene ring, a pyrene ring, a chrisene ring, a naphthacene ring, a triphenylene ring, an o-terphenyl ring, a m-terphenyl ring, a p-terphenyl ring, an acenaphtene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthraathrene ring. Further, the aforesaid aromatic hydrocarbon ring may be provided with a substituent represented by $R_{101}$ which will be described later.

In Formula (33), a substituent represented by $R_{101}$ includes such as an alkyl group (such as a methyl group, an ethyl group, a propyl group, an isopropyl group, t-butyl group, a pentyl group, a hexyl group, an octyl group, a dodecyl group, a tridecyl group, a tetradecyl group and a pentadecyl group), a cycloalkyl group (such as a cyclopentyl group and a cyclohexyl group), an alkenyl group (such as a vinyl group and an allyl group), an alkynyl group (such as a ethynyl group and a propargyl group), an aryl group (such as a phenyl group and a naphthyl group), an aromatic heterocyclic group (such as a furyl group, a thienyl group, a pyridyl group, a pyridazinyl group, a pyrimidinyl group, a pyradinyl group, a triazinyl group, an imidazolyl group, a pyrazolyl group, a thiazolyl group, a quinazolyl group and a phthalazinyl group), a heterocyclic group (such as a pyrrolidyl group, an imidazolidyl group, a morpholyl group and a oxazolidyl group), an alkoxyl group (such as a methoxy group, an ethoxy group, a propyloxy group, a pentyloxy group, a hexyloxy group, an octyloxy group and a dodecyloxy group), a cycloalkoxy group (such as cyclopentyloxy group and a cyclohexyloxy group), an aryloxy group (such as a phenoxy group and a naphthyloxy group), an alkylthio group (such as a methylthio group, an ethylthio group, a propylthio group, a pentylthio group, a hexylthio group, an octylthio group and a dodecylthio group), a cycloalkylthio group (such as cyclopentylthio group and a cyclohecylthio group), an arylthio group (such as a phenylthio group and a naphthylthio group), alkoxycarbonyl group (such as a methyloxycarbonyl group, an ethyloxycarbonyl group, a butyloxycarbonyl group, an octyloxycarbonyl group and a dodecyloxycarbonyl group), an aryloxycarbonyl group (such as a phenyloxycarbonyl group and a naphthyloxycarbonyl group), a sulfamoyl group (such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group), an acyl group (such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group), an acyloxy group (such as an acetyloxy group, an ethylcarbonyloxy group, a butylcarbonyloxy group, an octylcarbonyloxy group, a dodecylcarbonyloxy group and a phenylcarbonyloxy group), an amido group (such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group), a carbamoyl group (such as an aminocarbonyl group, a methyaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group), an ureido group (such as a methylureido group, an ethylureido group, a pentyl ureido group, a cyclohexylureido group, an octylureido group, a dodecylureido group, a phenylureido group, a naphthylureido group and a 2-pyridylureido group), a sulfinyl group (such as a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group (such as a methylsulfonyl group, an ethylsulfonyl group, a butylsulfonyl group, an cyclohexylsulfonyl group, a 2-ethylhexylsulfonyl group and a dodecylsulfonyl group), an arylsulfonyl group (such as a phenylsulfinyl group, a naphthylsulfonyl group and a 2-pyridylsulfonyl group), an amino group (an amino group, an ethylamino group, a dimethylamino group, a butylamino group, a cyclopentylamino group, a 2-ethylhexylamino group, a dodcylamino group, an anilino group, a naphthylamino group and a 2-pyuridyl amino group), a halogen atom (such as a fluorine atom, a chlorine atom and a bromine atom), a fluorohydrocarbon group (such as a fluoromethyl group, trifluoromethyl group, pentafluoroethyl group and pentafluorophenyl group), a cyano group, a nitro group, a hydroxyl group, a mercapto group, a silyl group (such as trimethylsilyl group, t-isopropylsilyl group and a triphenylsilyl group).

These substituents may be further substituted by the above-described substituents. Further, a plural number of these substituents may bond to each other to form a ring.

Preferable substituents are an alkyl group, a cycloalkyl group, a fluorohydrocarbon group, an aryl group and an aromatic heterocyclic group.

A divalent connecting group may be those containing a hetero atom in addition to a hydrocarbon group such as alkylene, alkenylene, alkynylene and arylene; also may be those arising from a compound having an aromatic heterocyclic ring (also referred to as a hetero aromatic compound) such as a thiophene-2,5-diyl group and a pyridine-2,3-diyl group; and may be a chalcogen atom such as oxygen and sulfur. Further, a divalent connecting group may be a group, which bonds via a hetero atom, such as an alkylimino group, a dialkylsilanediyl group and a diarylgermandiyl.

A simple bonding hand is a bonding hand to directly connect substituents to be combined with each other.

In the present invention, $Z_1$ of aforesaid Formula (33) is preferably a 6-membered ring. Thereby, higher emission efficiency can be obtained and the life is further prolonged.

Further, in the present invention, $Z_2$ of aforesaid Formula (33) is preferably a 6-membered ring. Thereby, higher emission efficiency can be obtained and the life is further prolonged.

Further, it is preferable to make the both $Z_1$ and $Z_2$ of aforesaid Formula (33) be a 6-membered ring, because furthermore high emission efficiency can be obtained. Further, it is preferable because the life is furthermore prolonged.

A compound represented by aforesaid Formula (33) is preferably a compound represented by each of aforesaid Formula (33-1)-(33-13).

In aforesaid Formula (33-1), $R_{501}$-$R_{507}$ each independently are a hydrogen atom or a substituent.

By utilizing a compound represented by aforesaid Formula (33-1), an organic EL element having higher emission efficiency can be prepared. Further, the life of the organic EL element can be prolonged.

In aforesaid Formula (33-2), $R_{511}$-$R_{517}$ each independently are a hydrogen atom or a substituent.

By utilizing a compound represented by aforesaid Formula (33-2), an organic EL element having higher emission efficiency can be prepared. Further, the life of the organic EL element can be prolonged.

In aforesaid Formula (33-3), $R_{521}$-$R_{527}$ each independently are a hydrogen atom or a substituent.

By utilizing a compound represented by aforesaid Formula (33-3), an organic EL element having higher emission efficiency can be prepared. Further, the life of the organic EL element can be prolonged.

In aforesaid Formula (33-4), $R_{531}$-$R_{537}$ each independently are a hydrogen atom or a substituent.

By utilizing a compound represented by aforesaid Formula (33-4), an organic EL element having higher emission efficiency can be prepared. Further, the life of the organic EL element can be prolonged.

In aforesaid Formula (33-5), $R_{541}$-$R_{548}$ each independently are a hydrogen atom or a substituent.

By utilizing a compound represented by aforesaid Formula (33-5), an organic EL element having higher emission efficiency can be prepared. Further, the life of the organic EL element can be prolonged.

In aforesaid Formula (33-6), $R_{551}$-$R_{558}$ each independently are a hydrogen atom or a substituent.

By utilizing a compound represented by aforesaid Formula (33-6), an organic EL element having higher emission efficiency can be prepared. Further, the life of the organic EL element can be prolonged.

In aforesaid Formula (33-7), $R_{561}$-$R_{567}$ each independently are a hydrogen atom or a substituent.

By utilizing a compound represented by aforesaid Formula (33-7), an organic EL element having higher emission efficiency can be prepared. Further, the life of the organic EL element can be prolonged.

In aforesaid Formula (33-8), $R_{571}$-$R_{577}$ each independently are a hydrogen atom or a substituent.

By utilizing a compound represented by aforesaid Formula (33-8), an organic EL element having higher emission efficiency can be prepared. Further, the life of the organic EL element can be prolonged.

In aforesaid Formula (33-9), $R_{591}$-$R_{588}$ each independently are a hydrogen atom or a substituent.

By utilizing a compound represented by aforesaid Formula (33-9), an organic EL element having higher emission efficiency can be prepared. Further, the life of the organic EL element can be prolonged.

In aforesaid Formula (33-10), $R_{591}$-$R_{598}$ each independently are a hydrogen atom or a substituent.

By utilizing a compound represented by aforesaid Formula (33-10), an organic EL element having higher emission efficiency can be prepared. Further, the life of the organic EL element can be prolonged.

Further, a compound represented by aforesaid Formula (33) is preferably a compound having at least one group represented by any one of aforesaid Formulas (3-1)-(3-10). In particular, it is preferable that 2-4 of groups represented by any one of aforesaid Formulas (34-1)-(34-10) are provided in a molecule. Herein, included is the case wherein, in a structure represented by aforesaid Formula (33), the part except $R_{101}$ is substituted by any one of aforesaid Formulas (34-1)-(34-10).

Herein, a compound represented by aforesaid Formula (35)-(49) is specifically preferable with respect to obtaining an effect of the present invention.

In aforesaid Formula (35), $R_{601}$-$R_{606}$ are a hydrogen atom or a substituent, however, at least one of $R_{601}$-$R_{606}$ is a group represented by any one of aforesaid Formula (34-1)-(34-10).

By utilizing a compound represented by aforesaid Formula (35), an organic EL element having higher emission efficiency can be prepared. Further, the life of the organic EL element can be prolonged.

In aforesaid Formula (36), $R_{611}$-$R_{620}$ are a hydrogen atom or a substituent, however, at least one of $R_{611}$-$R_{620}$ is a group represented by any one of aforesaid Formula (34-1)-(34-10).

By utilizing a compound represented by aforesaid Formula (36), an organic EL element having higher emission efficiency can be prepared. Further, the life of the organic EL element can be prolonged.

In aforesaid Formula (37), $R_{621}$-$R_{623}$ are a hydrogen atom or a substituent, however, at least one of $R_{621}$-$R_{623}$ is a group represented by any one of aforesaid Formula (34-1)-(34-10).

By utilizing a compound represented by aforesaid Formula (37), an organic EL element having higher emission efficiency can be prepared. Further, the life of the organic EL element can be prolonged.

In aforesaid Formula (38), $R_{631}$-$R_{645}$ are a hydrogen atom or a substituent, however, at least one of $R_{631}$-$R_{645}$ is a group represented by any one of aforesaid Formula (34-1)-(34-10).

By utilizing a compound represented by aforesaid Formula (38), an organic EL element having higher emission efficiency can be prepared. Further, the life of the organic EL element can be prolonged.

In aforesaid Formula (39), $R_{651}$-$R_{656}$ are a hydrogen atom or a substituent, however at least one of $R_{651}$-$R_{656}$ is a group represented by any one of aforesaid Formula (34-1)-(34-10). na is an integer of 0-5 and nb is an integer of 1-6, however, the sum of na and nb is 6.

By utilizing a compound represented by aforesaid Formula (39), an organic EL element having higher emission efficiency can be prepared. Further, the life of the organic EL element can be prolonged.

In aforesaid Formula (40), $R_{661}$-$R_{672}$ are a hydrogen atom or a substituent, however, at least one of $R_{661}$-$R_{672}$ is a group represented by any one of aforesaid Formula (34-1)-(34-10).

By utilizing a compound represented by aforesaid Formula (40), an organic EL element having higher emission efficiency can be prepared. Further, the life of the organic EL element can be prolonged.

In aforesaid Formula (41), $R_{681}$-$R_{688}$ are a hydrogen atom or a substituent, however, at least one of $R_{881}$-$R_{688}$ is a group represented by any one of aforesaid Formula (34-1)-(34-10).

By utilizing a compound represented by aforesaid Formula (41), an organic EL element having higher emission efficiency can be prepared. Further, the life of the organic EL element can be prolonged.

In aforesaid Formula (42), $R_{691}$-$R_{700}$ are a hydrogen atom or a substituent, however, at least one of $R_{691}$-$R_{700}$ is a group represented by any one of aforesaid Formula (34-1)-(34-10).

In Formula (42), as a divalent connecting group represented by $L_1$, utilized can be a group containing a hetero atom (for example, a divalent group containing a chalcogen atom such as —O— and —S—, and —N(R)— group, wherein R is a hydrogen atom or an alkyl group and said alkyl group is identical with an alkyl group represented by $R_{101}$ in aforesaid Formula (33)) in addition to a hydrocarbon group such as an alkylene group (such as an ethylene group, a trimethilene group, a tetramethylene group, a propylene group, an ethylethylene group, a pentamethylene group, a hexamethylene group, 2,2,4-trimethylhexamethylene group, a heptamethylene group, an octamethylene group, a nonamethylene group, a decamethylene group, an undecamethylene group, a dodecamethylene group, a cyclohexylene group (such as 1,6-cyclohexanediyl group), a cyclopentylene group (such as 1,5-cyclopentanediyl group)), an alkenylene group (such as a vinylene group and a propenylene group), an alkynylene group (such as an ethylenylene group and a 3-pentynylene group) and an arylene group.

Further, in each of the above-described alkenylene group, alkynylene group and arylene group, at least one of carbon atoms, which constitute a divalent connecting group, may be substituted by a charcogen atom (such as oxygen and sulfur) or aforesaid —N(R)— group.

Further, as a divalent group represented by $L_1$, for example, a group having a divalent heterocyclic group is utilized and listed are such as a oxazolediyl group, a pyrimidinediyl group, a pyridazinediyl group, a pyradinediyl group, a pyrrolinediyl group, an imidazolinediyl group, an imidazolidinediyl group, a pyrazolidinediyl group, a pyrazolinediyl group, a piperidinediyl group, a piperadinediyl group, a morpholinediyl group and a quinuclidinediyl group; and also listed may be a divalent connecting group arising from a compound having an aromatic heterocyclic ring (also referred to as a hetero aromatic compound) such as a thiophene-2,5-diyl group and a pyridine-2,3-diyl group.

Further, also listed may be a group which bonds via a hetero atom such as an alkylimino group, a dialkylsilanediyl group and an allylgermanediyl group.

By utilizing a compound represented by aforesaid Formula (42), an organic EL element having higher emission efficiency can be prepared. Further, the life of the organic EL element can be prolonged.

In a compound represented by each of aforesaid Formulas (43)-(47), a substituent represented by each of $R_1$ and $R_2$ is identical with a substituent represented by $R_{101}$ in aforesaid Formula (33).

In aforesaid Formula (47), a 6-membered aromatic heterocyclic ring containing at least one nitrogen atom represented by each of $Z_1$, $Z_2$, $Z_3$ and $Z_4$ includes such as a pyridine ring, a pyridazine ring, a pyrimidine ring and a pyradine ring.

In aforesaid Formula (48), a 6-membered aromatic heterocyclic ring containing at least one nitrogen atom represented by each of $Z_1$ and $Z_2$ includes such as a pyridine ring, a pyridazine ring, a pyrimidine ring and a pyradine ring.

In aforesaid Formula (48), an arylen group represented by each of $Ar_1$ and $Ar_2$ includes o-phenylene group, a m-phenylene group, a p-phenylene group, a naphthalenediyl group, an anthracenediyl group, a naphthacenediyl group, a pyrenediyl group, a naphthylnaphthalenediyl group, a biphenyldiyl group (such as 3,3'-biphenyldiyl group and a 3,6-biphenyldiyl group), a terphenyldiyl group, a quaterphenyldiyl group, a quinquiphenyldiyl group, a sexiphenyldiyl group, a septiphenyldiyl group, an octiphenyldiyl group, a nobiphenyldiyl group and a deciphenyldiyl group. Further, the aforesaid arylene group may be provided with a substituent which will be described later.

In aforesaid Formula (48), a divalent aromatic heterocyclic group represented by each of $Ar_1$ and $Ar_2$ includes a divalent group derived from such as a furan ring, a thiophene ring, a pyridine ring, a pyridazine ring, a pyrimidine ring, a pyradine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring and a ring in which at least one of carbon atoms of a hydrocarbon ring constituting a carboline ring is further substituted by a nitrogen atom. Further, the aforesaid aromatic heterocyclic group may be provided with a substituent represented by aforesaid $R_{101}$.

In aforesaid Formula (48), a divalent connecting group represented by L is identical with a divalent connecting group represented by $L_1$ in aforesaid Formula (42), however, preferable are an alkylene group and a divalent group containing a charcogen atom such as —O— and —S—, and most preferable is an alkylene group.

In aforesaid Formula (49), an arylen group represented by each of $Ar_1$ and $Ar_2$ is identical with an arylen group represented by each of $Ar_1$ and $Ar_2$ in aforesaid Formula (48).

In aforesaid Formula (49), an aromatic heterocyclic group represented by each of $Ar_1$ and $Ar_2$ is identical with an aromatic heterocyclic group represented by each of $Ar_1$ and $Ar_2$ in aforesaid Formula (48).

In aforesaid Formula (49), a 6-membered aromatic heterocyclic ring containing at least one nitrogen atom represented by each of $Z_1$, $Z_2$, $Z_3$ and $Z_4$ includes such as a pyridine ring, a pyridazine ring, a pyrimidine ring and a pyradine ring.

In aforesaid Formula (49), a divalent connecting group represented by L is identical with a divalent connecting group represented by $L_1$ in aforesaid Formula (42), however, preferable are an alkylene group and a divalent group containing a charcogen atom such as —O— and —S—, and most preferable is an alkylene group.

In the following, specific examples represented by Formula (33) according to the present invention will be shown; however, the present invention is not limited thereto.

| COMPOUND | CENTRAL MOIETY | A |
|---|---|---|
| 1 | 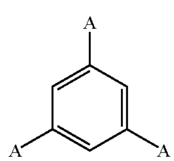 | 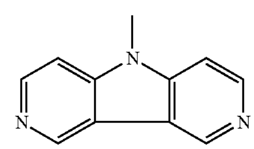 |
| 2 | 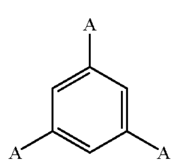 | 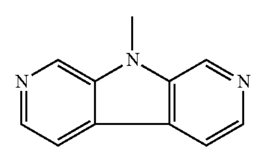 |
| 3 | 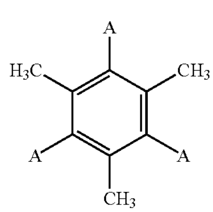 | 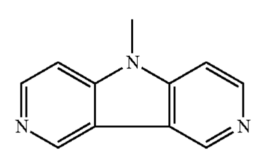 |

-continued
| | | |
|---|---|---|
| 4 | 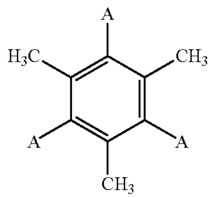 | 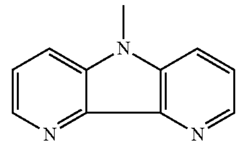 |
| 5 | 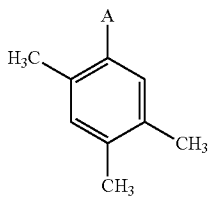 | 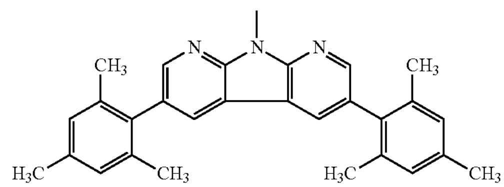 |
| 6 | 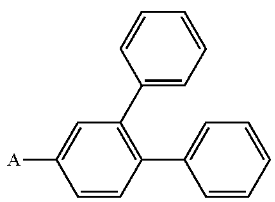 | 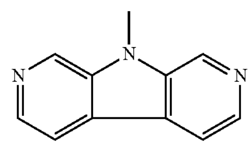 |
| 7 | 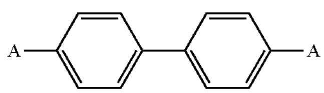 | 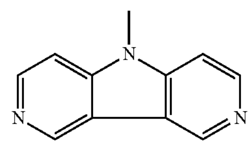 |
| 8 | 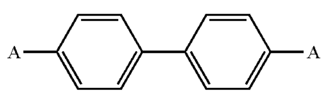 | 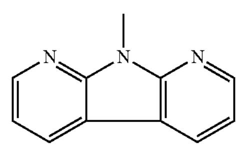 |
| 9 | 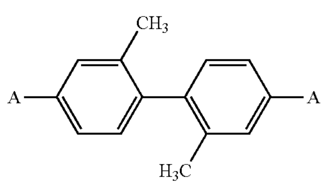 | 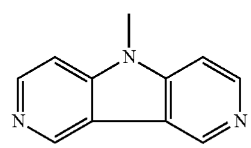 |
| 10 | 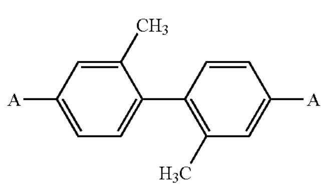 | 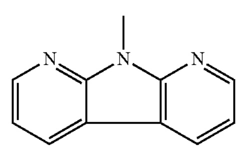 |
| 11 | 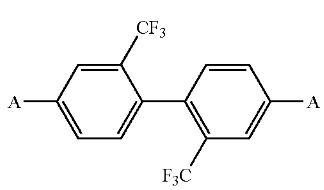 | 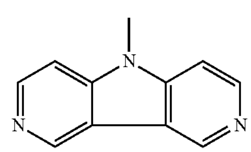 |

-continued
| | | |
|---|---|---|
| 12 | 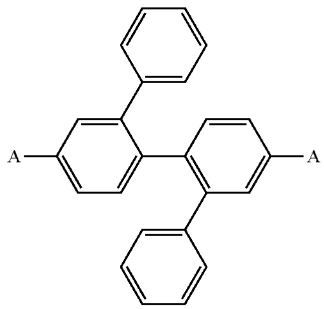 | 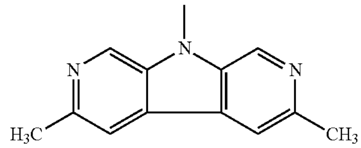 |
| 13 | 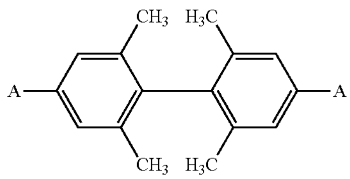 | 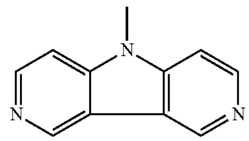 |
| 14 | 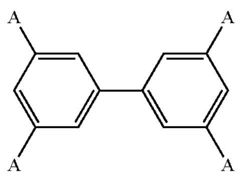 | 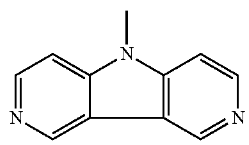 |
| 15 | 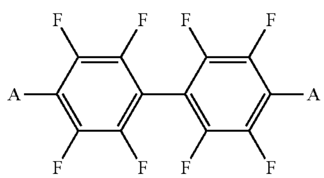 | 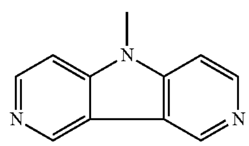 |
| 16 | 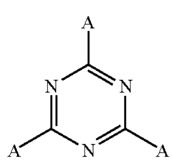 | 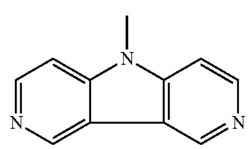 |
| 17 | 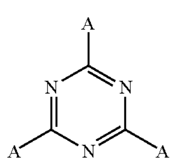 | 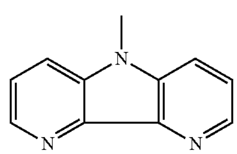 |
| 18 | 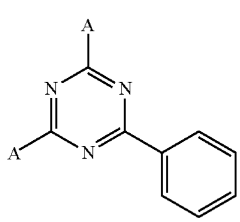 | 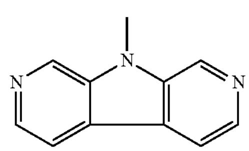 |

-continued
19
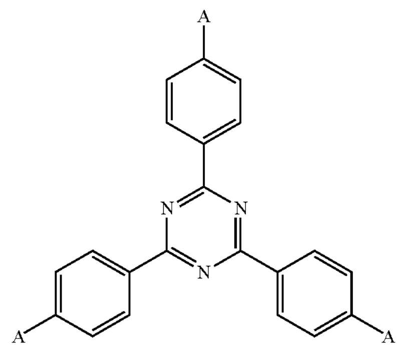
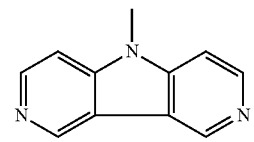
20
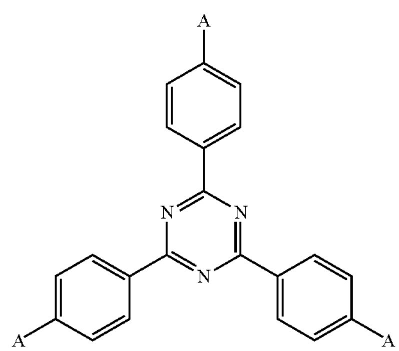
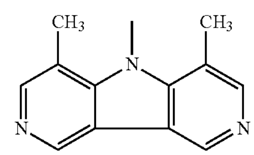
21
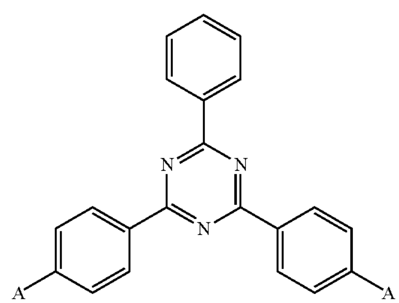
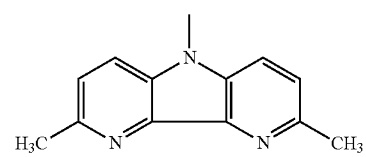
22
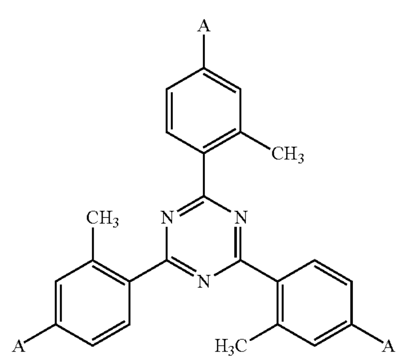
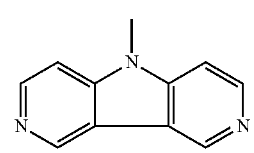

-continued
| | | |
|---|---|---|
| 23 | 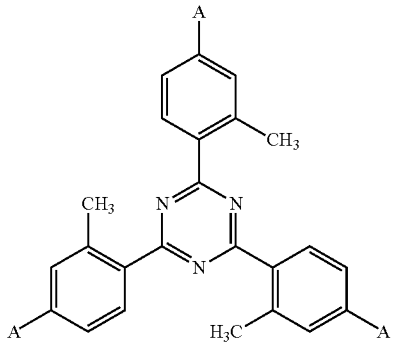 | 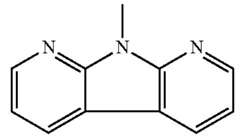 |
| 24 | 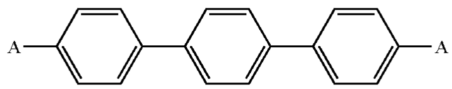 | 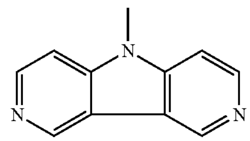 |
| 25 | 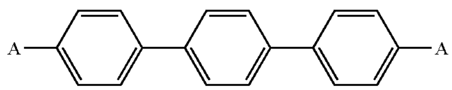 | 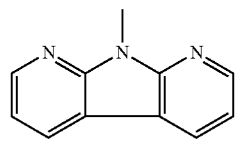 |
| 26 | 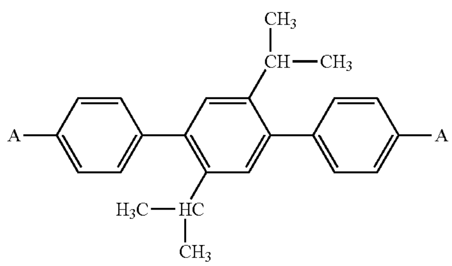 | 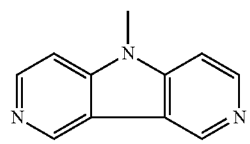 |
| 27 | 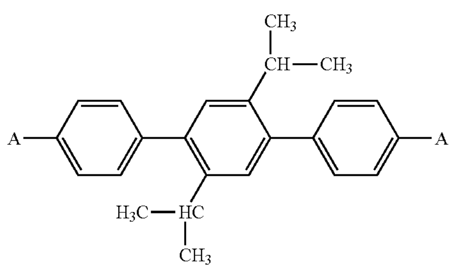 | 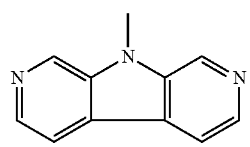 |
| 28 | 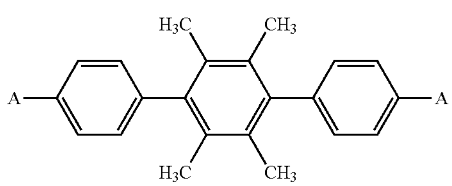 | 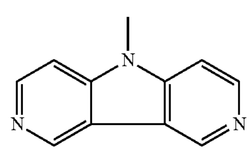 |
| 29 | 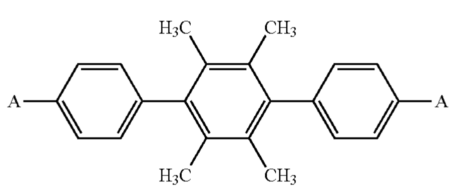 | 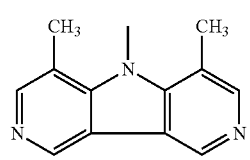 |

-continued
| | | |
|---|---|---|
| 30 | 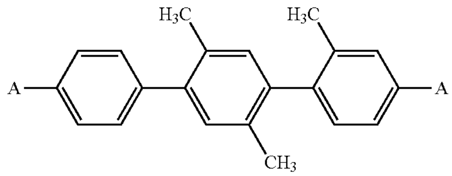 | 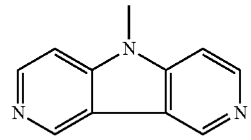 |
| 31 | 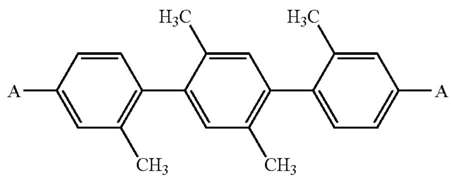 | 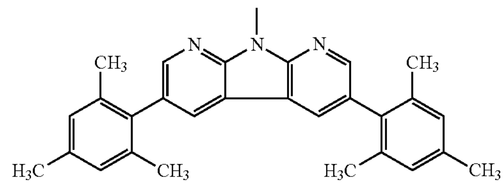 |
| 32 | 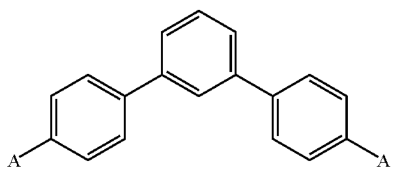 | 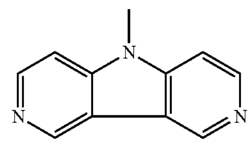 |
| 33 | 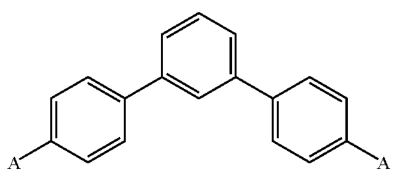 | 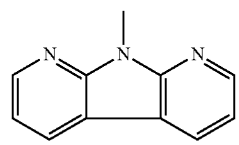 |
| 34 | 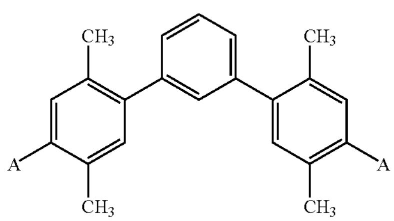 | 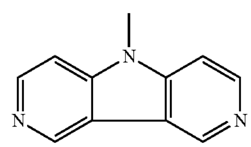 |
| 35 | 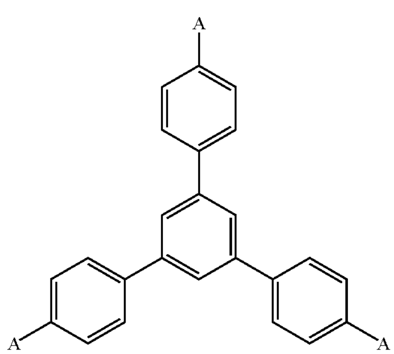 | 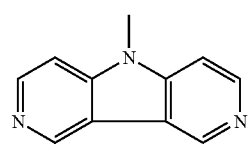 |
| 36 | 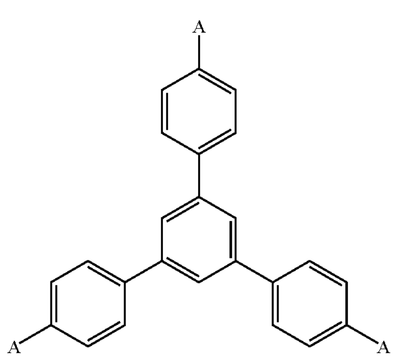 | 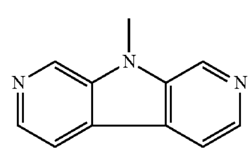 |

-continued
37 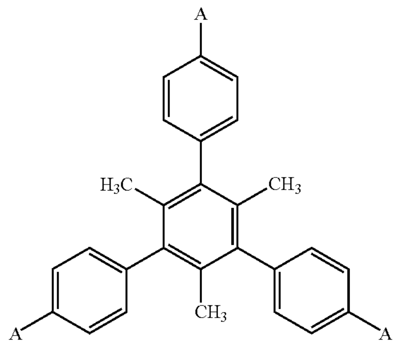 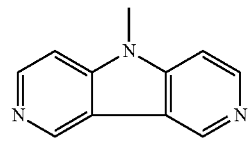
38 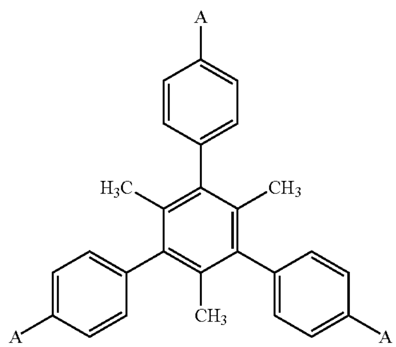 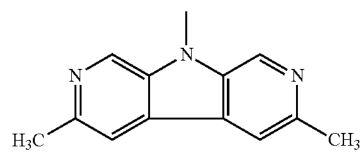
39 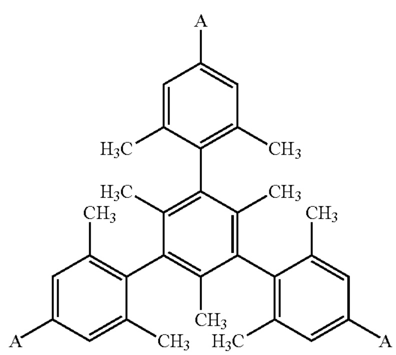 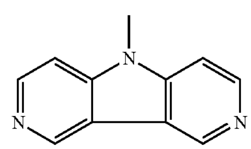
40 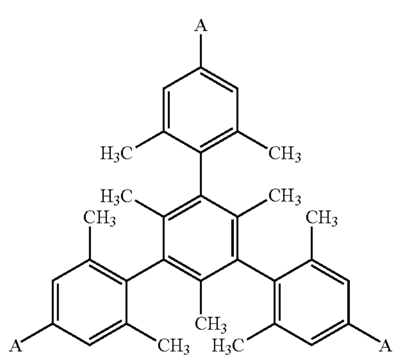 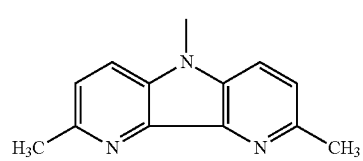

-continued
| | | |
|---|---|---|
| 41 | 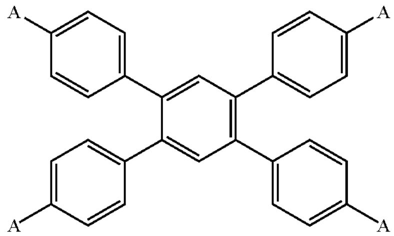 | 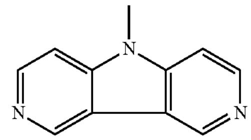 |
| 42 | 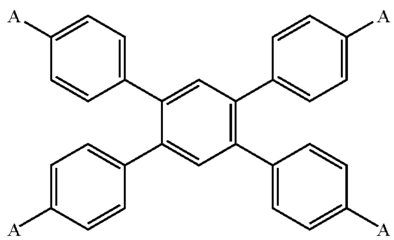 | 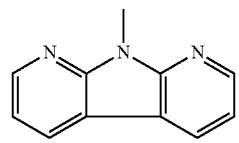 |
| 43 | 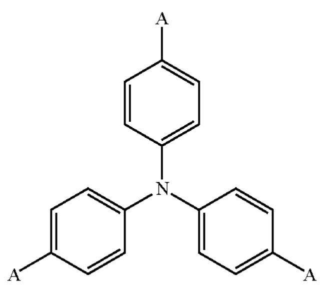 | 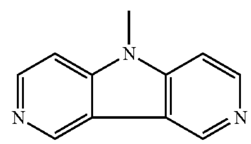 |
| 44 | 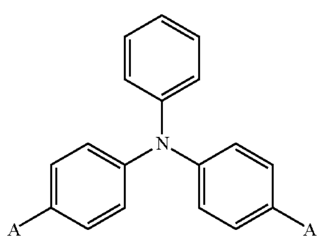 | 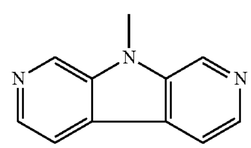 |
| 45 | 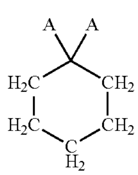 | 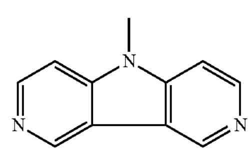 |
| 46 | 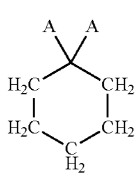 | 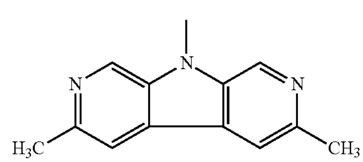 |

-continued
| | | |
|---|---|---|
| 47 | 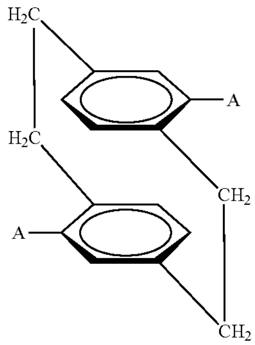 | 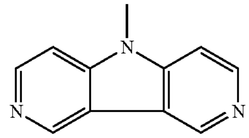 |
| 48 | 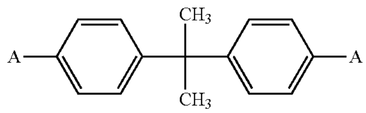 | 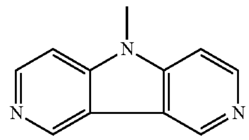 |
| 49 | 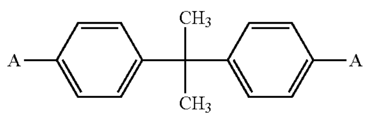 | 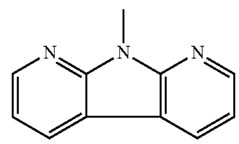 |
| 50 | 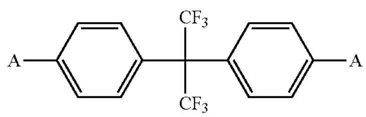 | 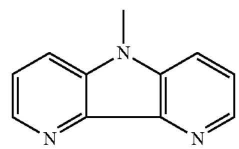 |
| 51 | 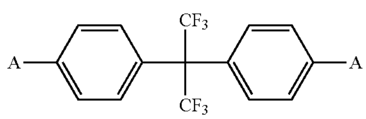 | 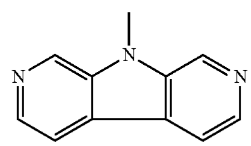 |
| 52 | 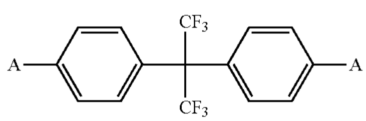 | 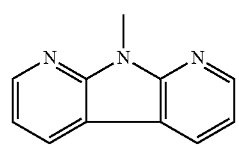 |
| 53 | 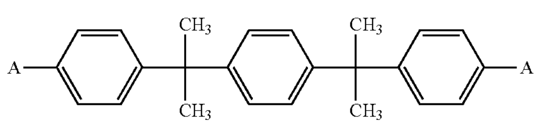 | 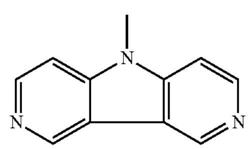 |
| 54 | 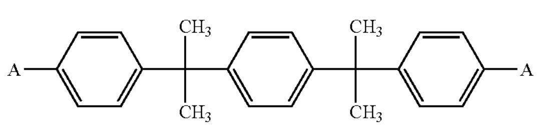 | 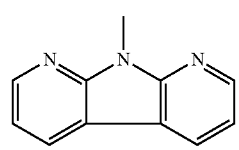 |
| 55 | 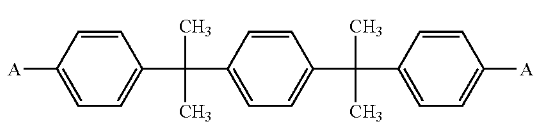 | 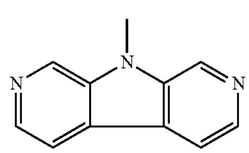 |

-continued
56
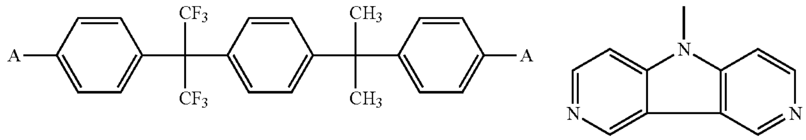
57
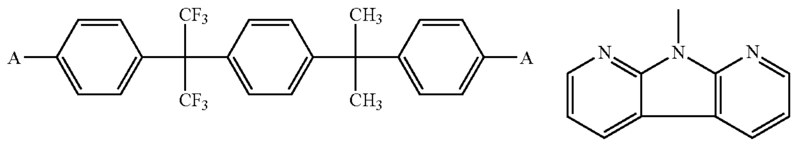
58
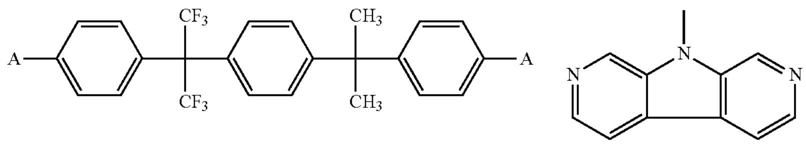
59
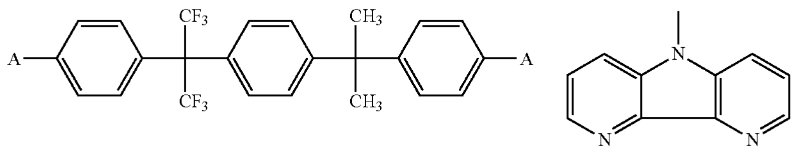
60
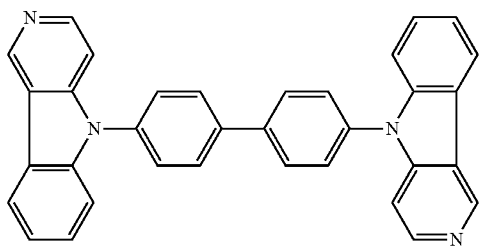
61
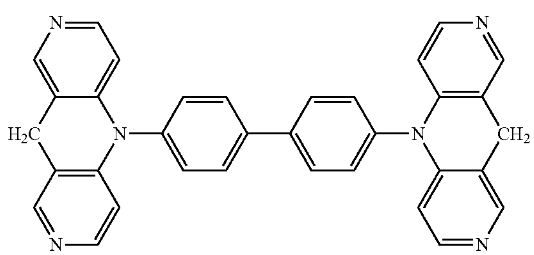
62
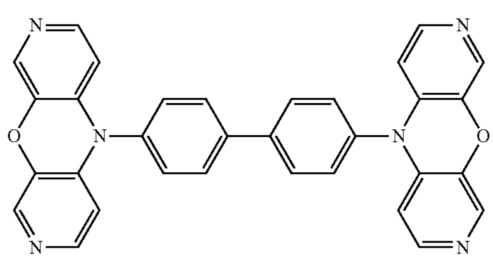
63
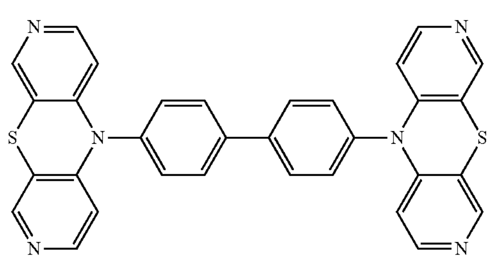

-continued
64
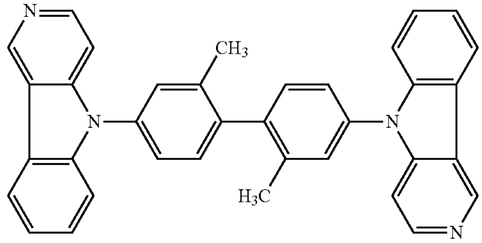
65
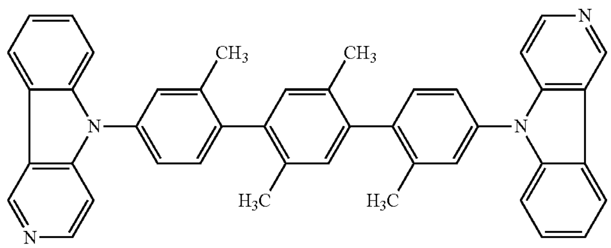
66
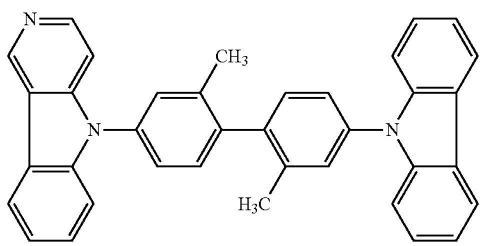
67
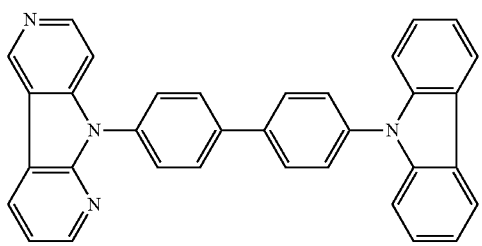
68
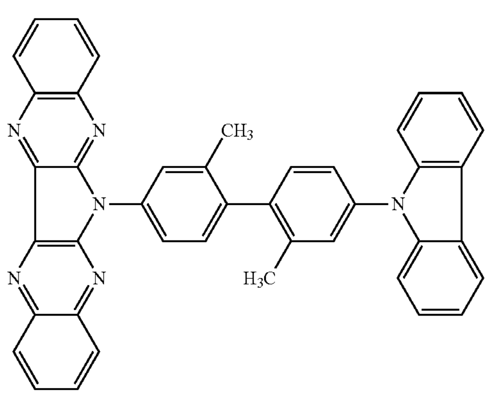

-continued
69
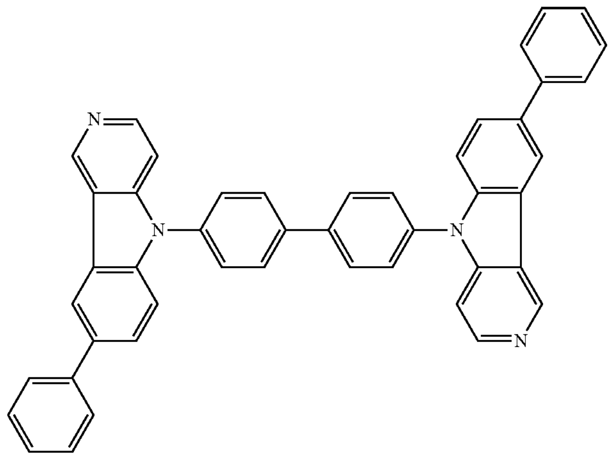
70
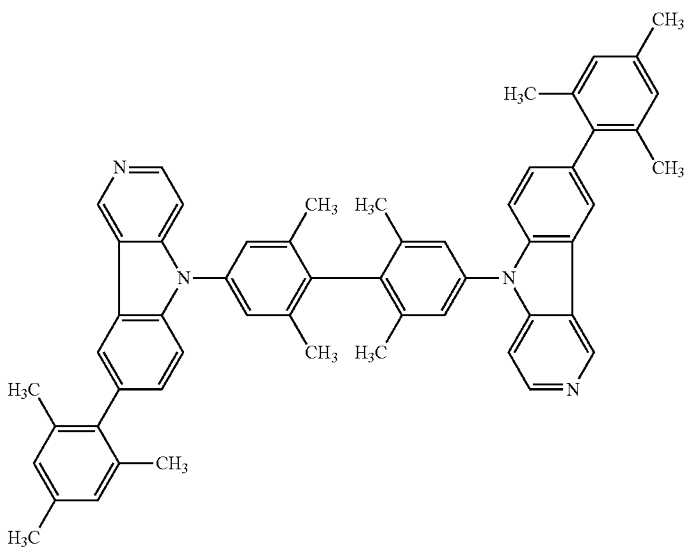
71
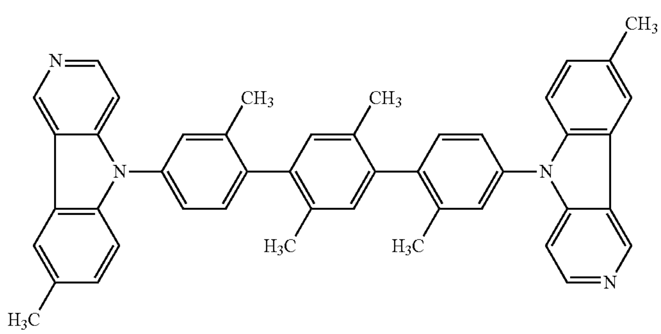
72
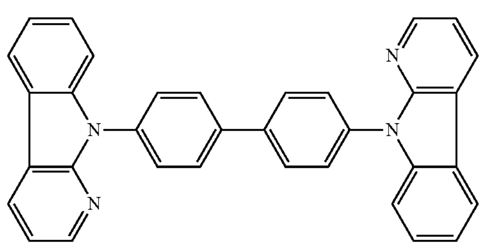

-continued
73
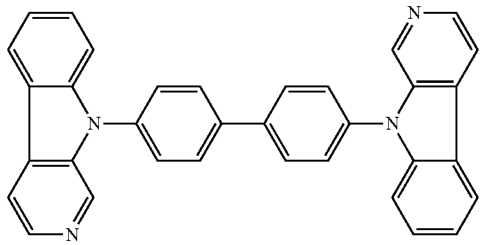
74
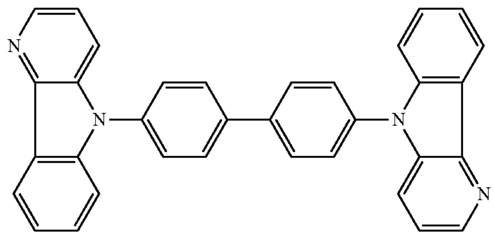
75
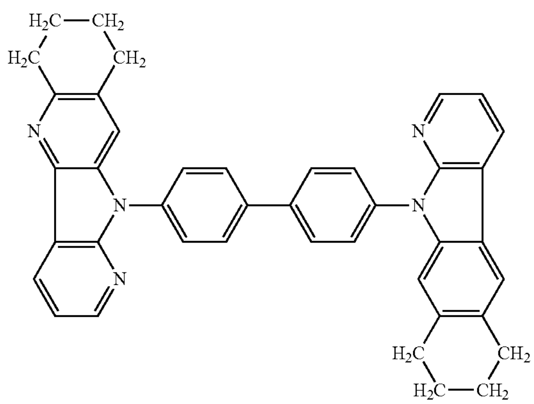
76
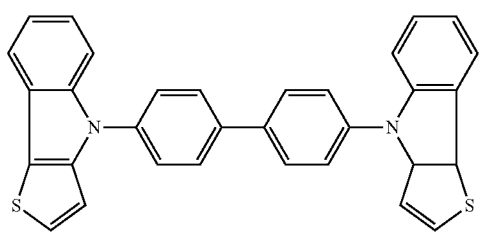
77
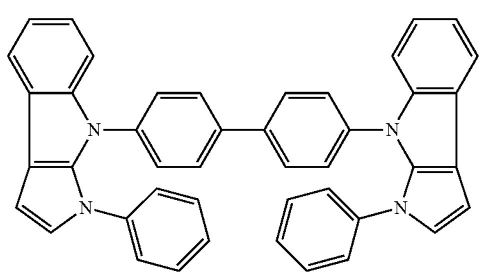

-continued
78
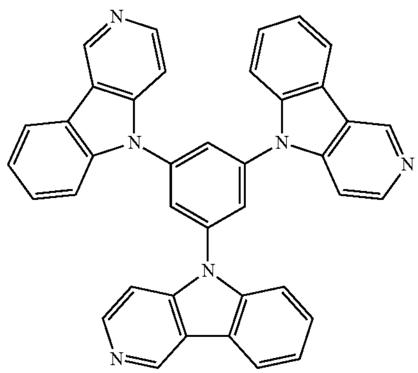
79
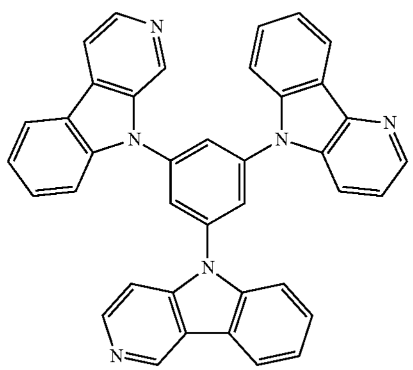
80
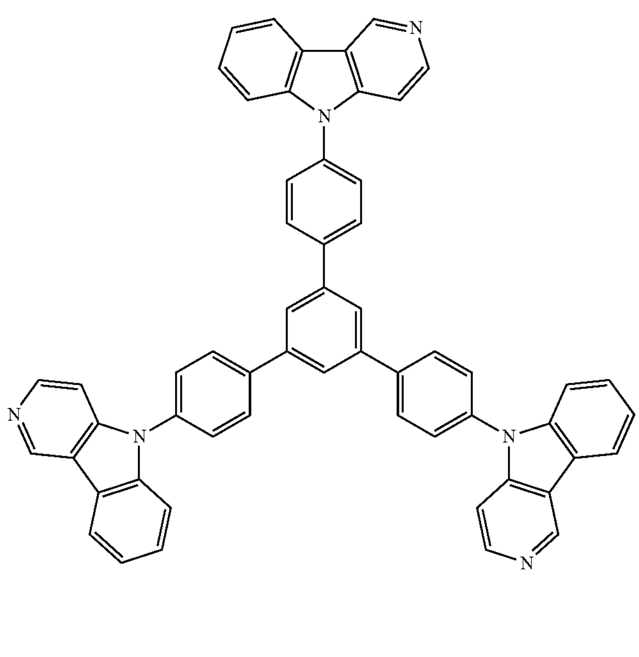

-continued
81
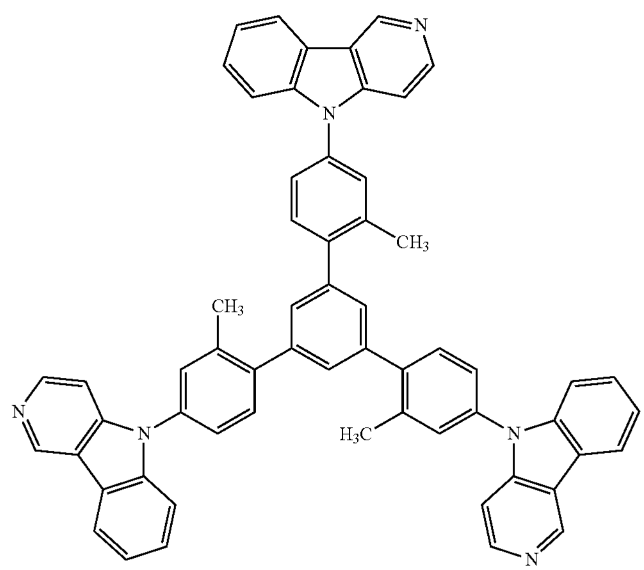
82
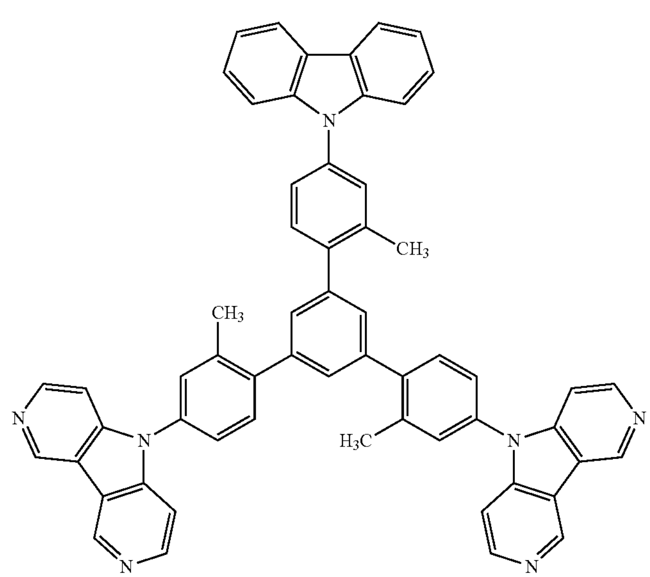

-continued
83
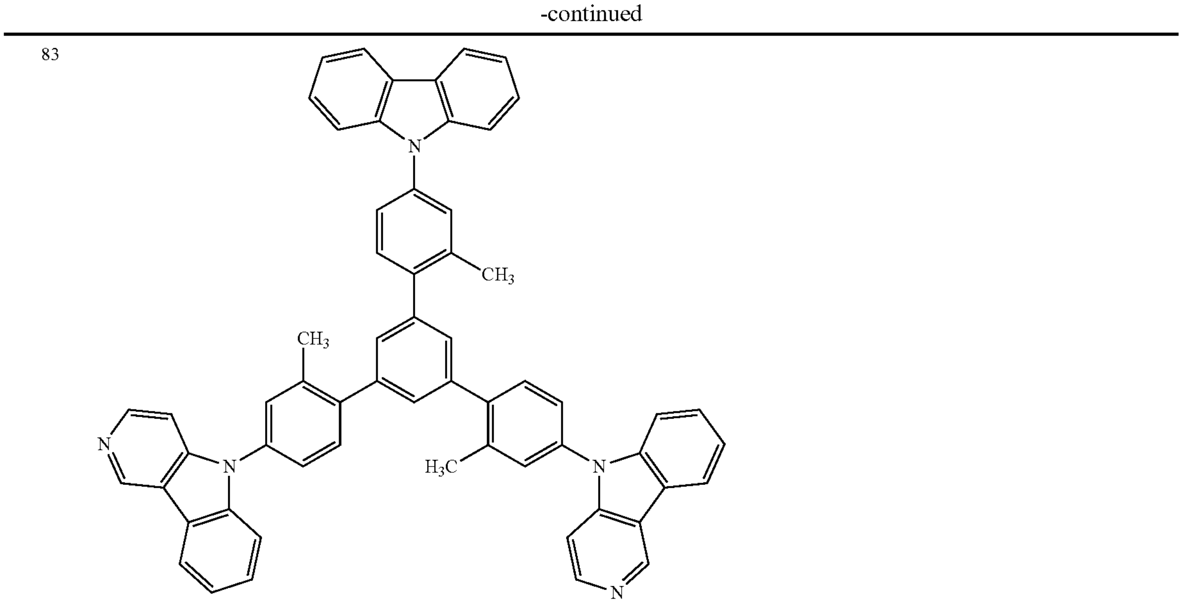
84
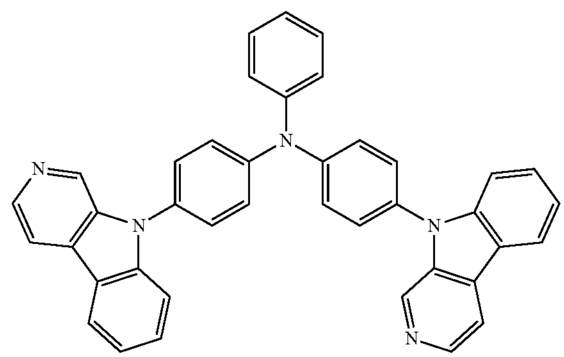
85
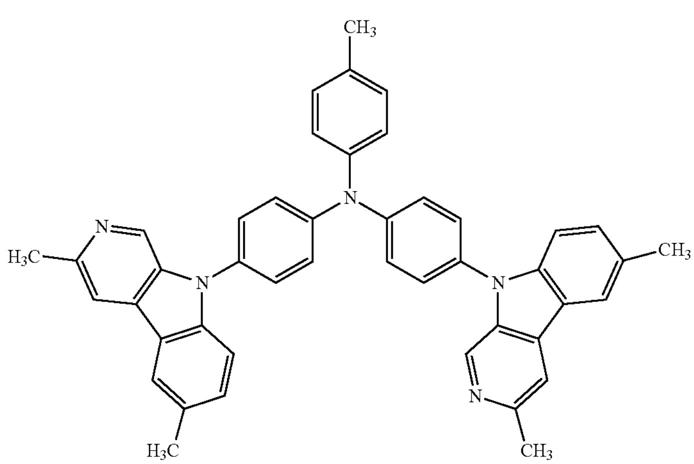

-continued
86
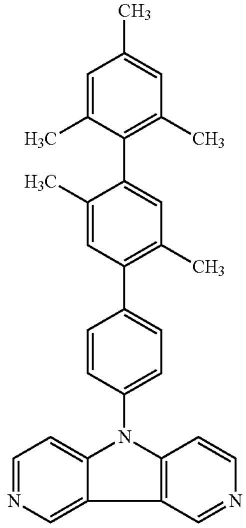
87
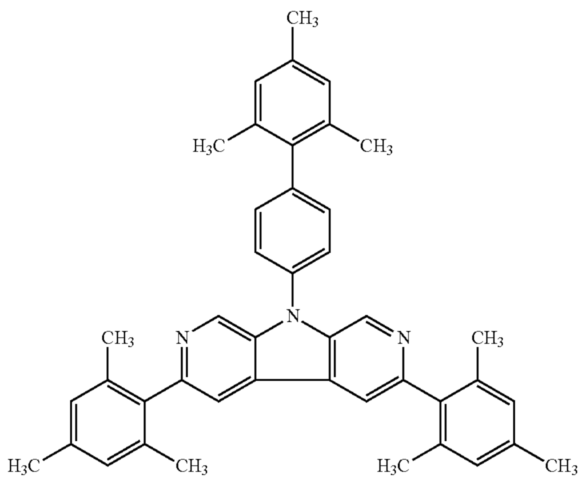
88
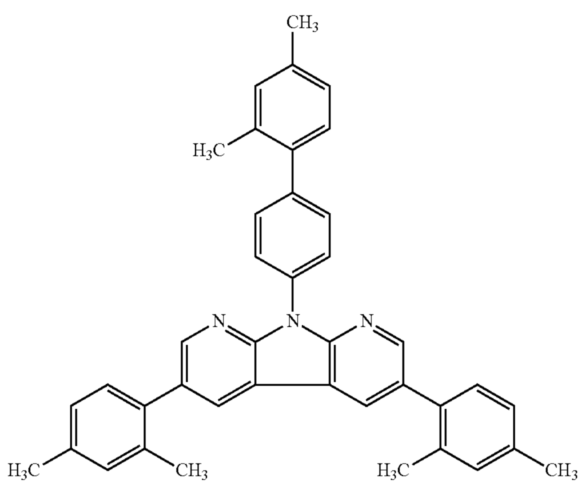

89
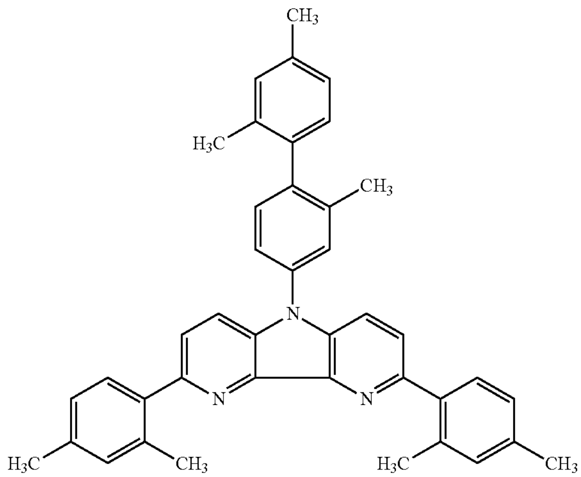
90
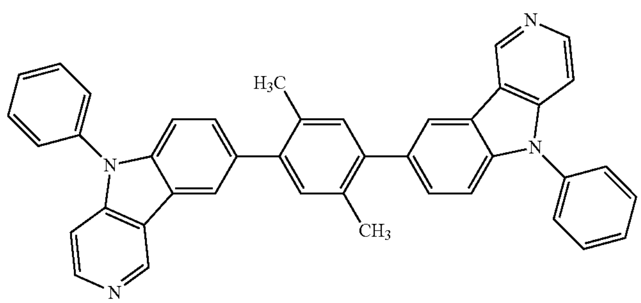
91
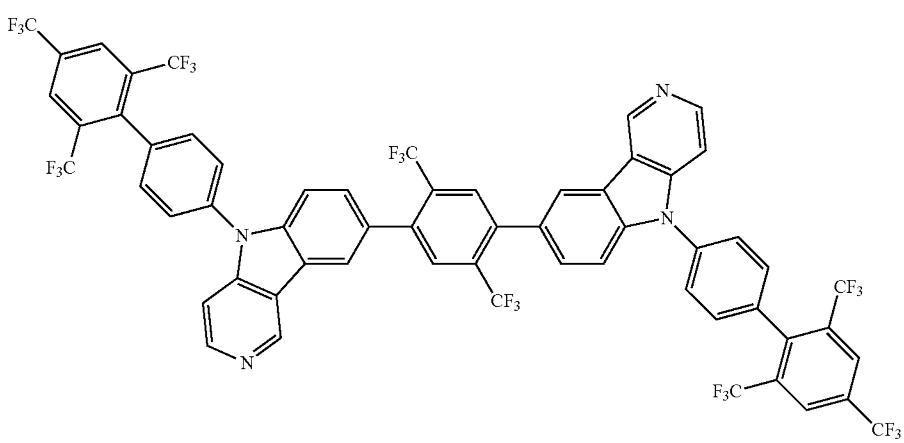
92
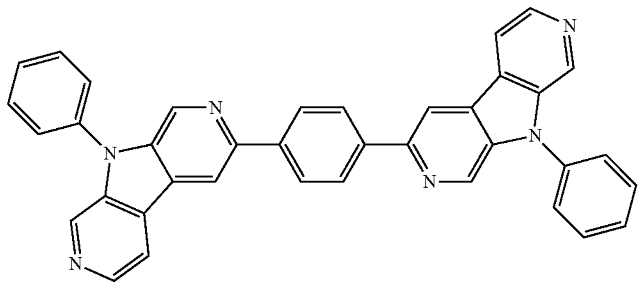

-continued
93
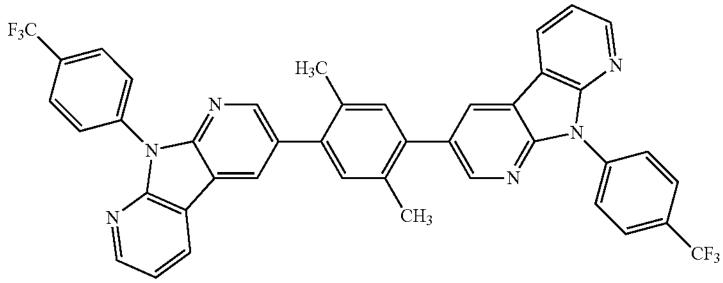
94
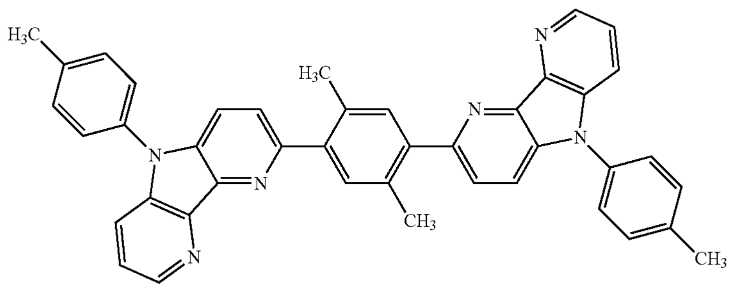
95
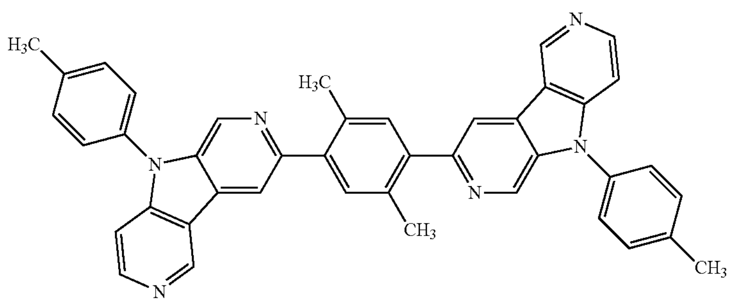
96
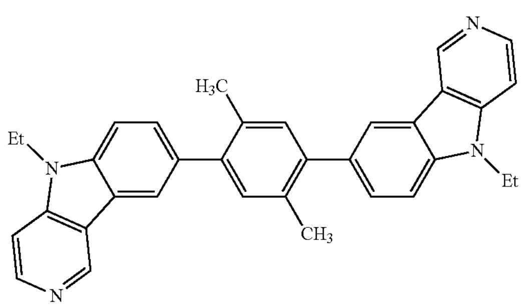
97
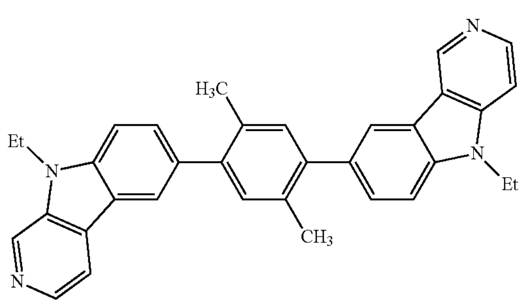

-continued
98
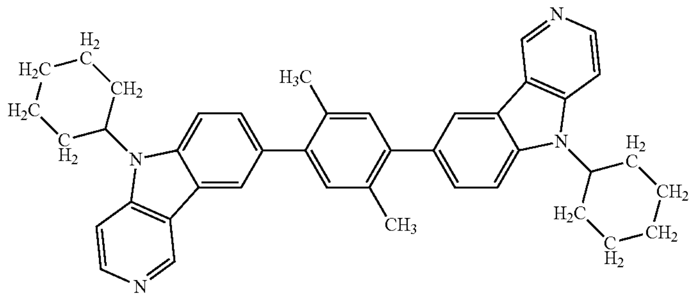
99
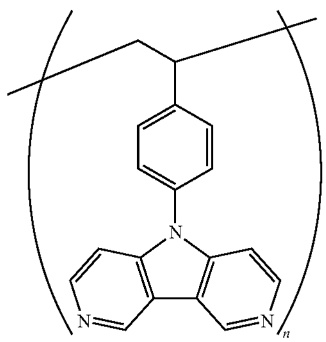
100
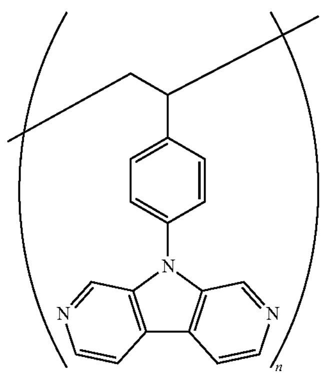
101
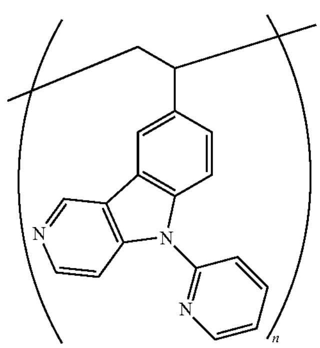
102
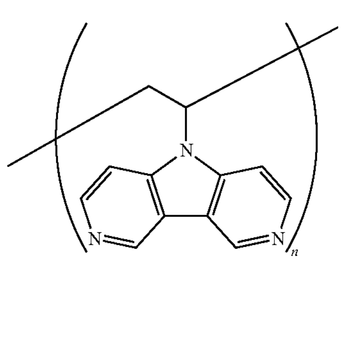

-continued
103
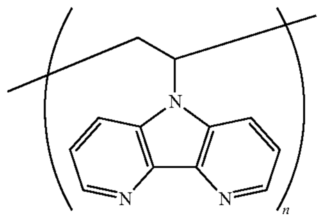
104
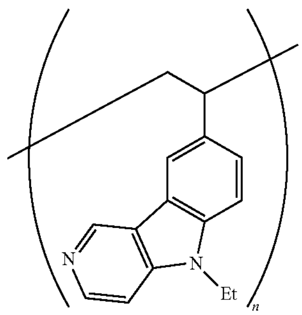
105
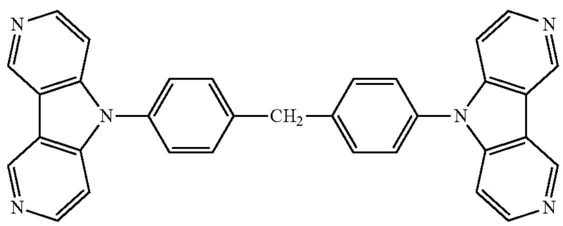
106
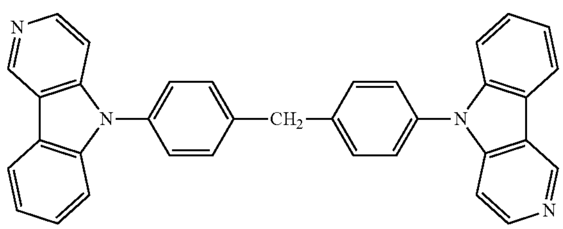
107
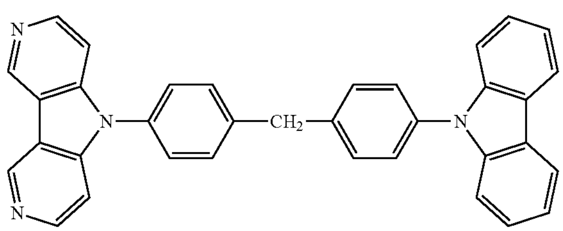
108
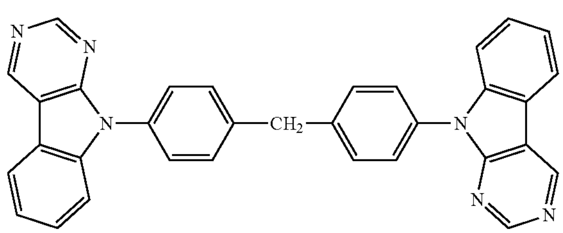

-continued
109
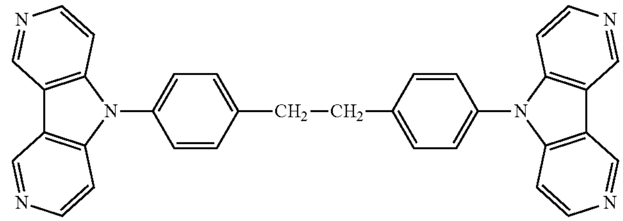
110
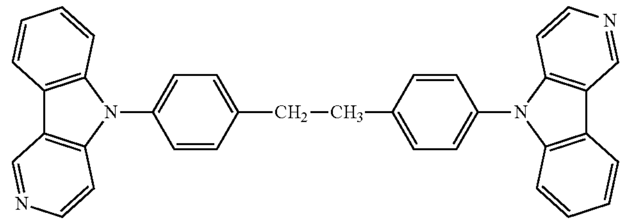
111
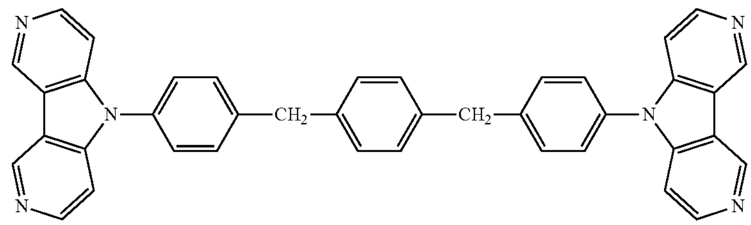
112
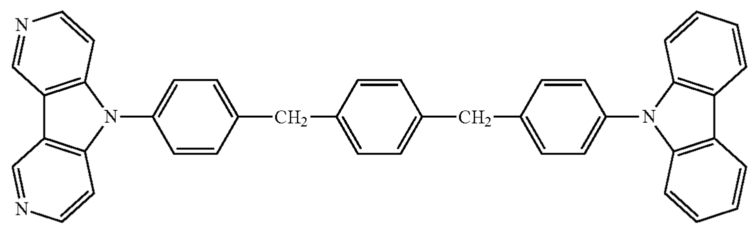
113
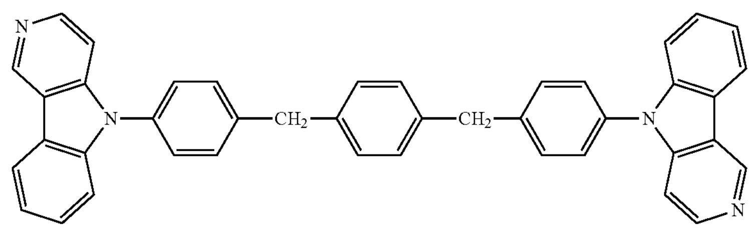
114
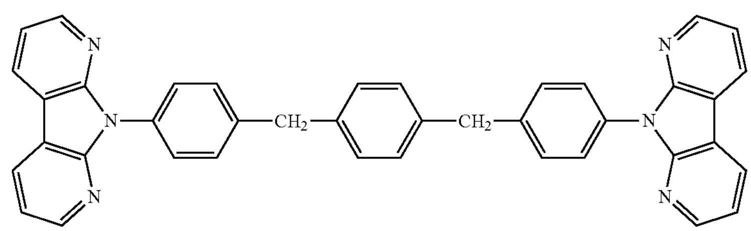
115
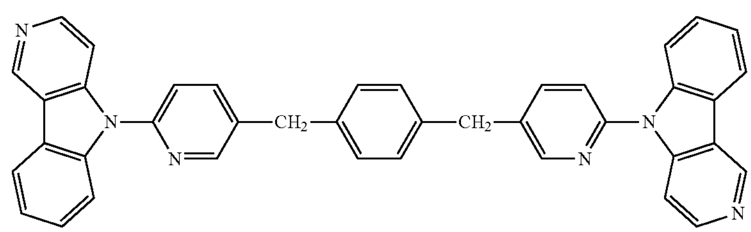

-continued
116
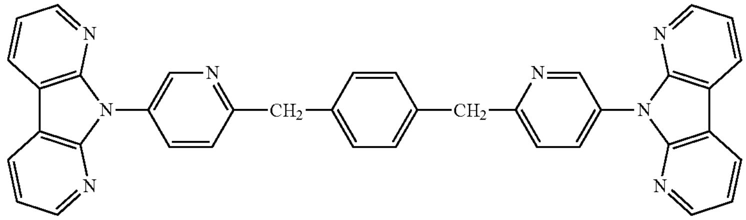
117
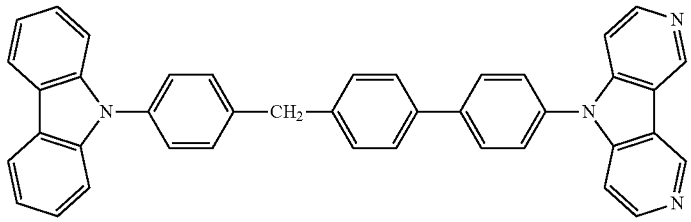
118
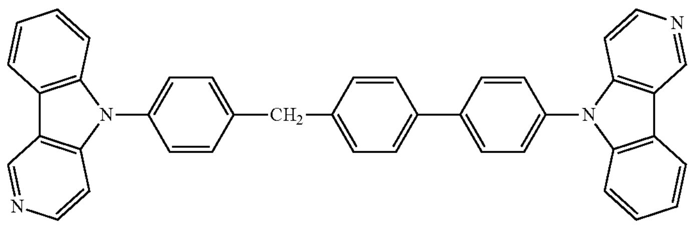
119
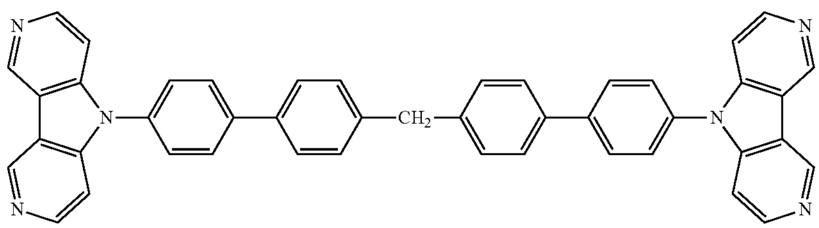
120
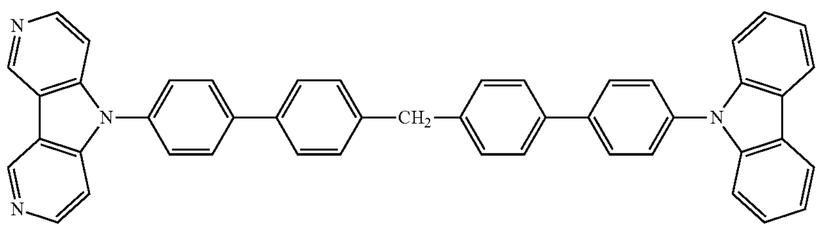
121
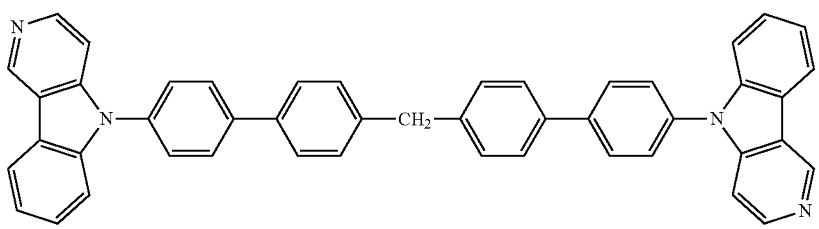
122
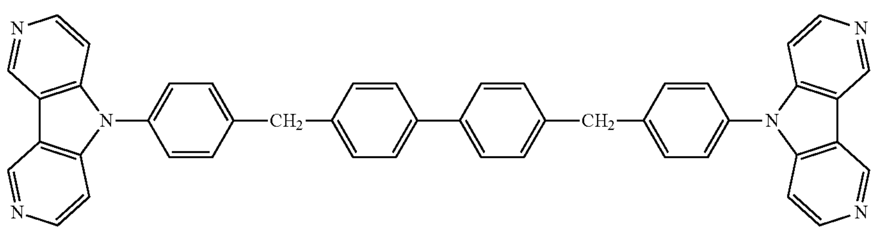

-continued
123
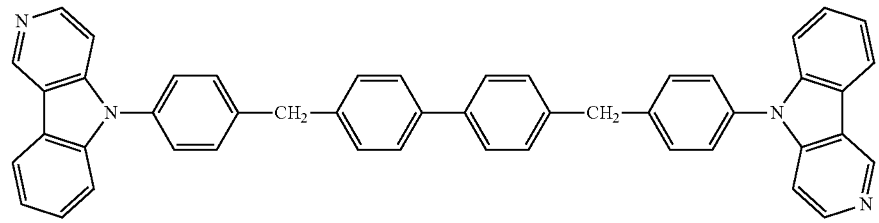
124
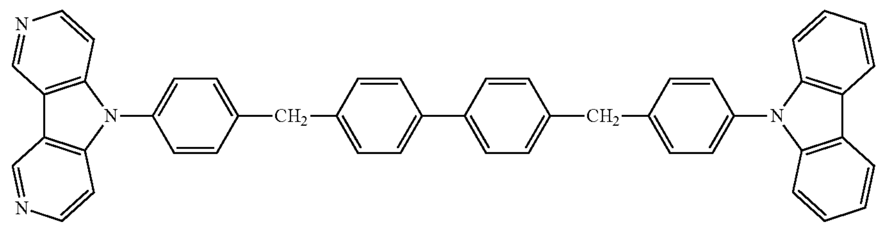
125
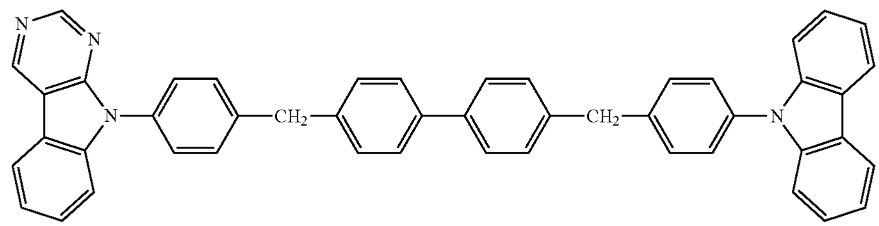
126
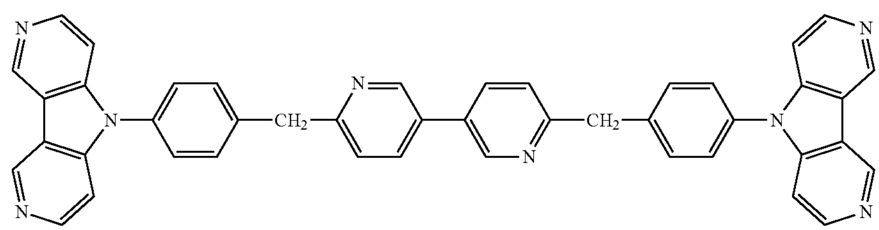
127
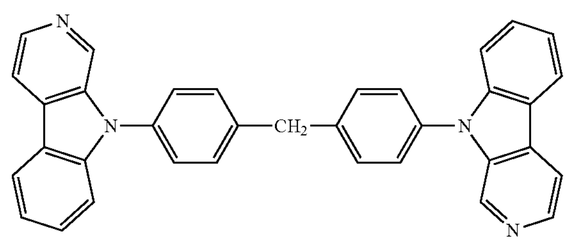
128
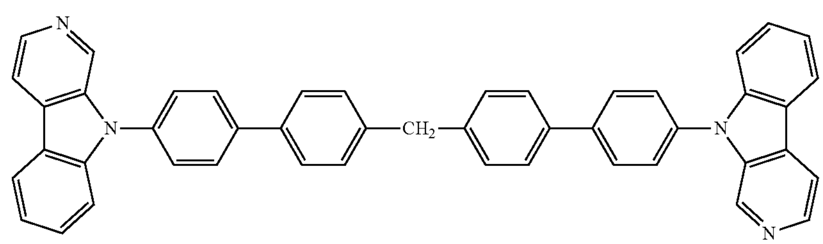
129
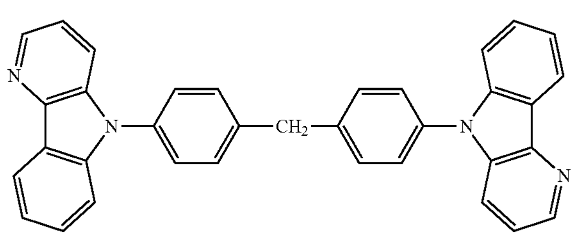

-continued
130
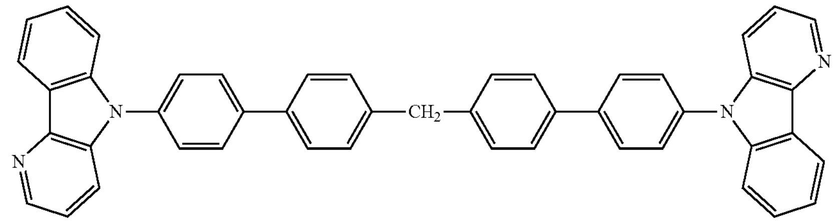
131
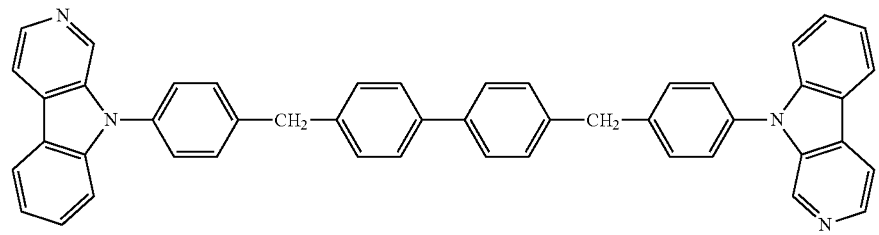
132
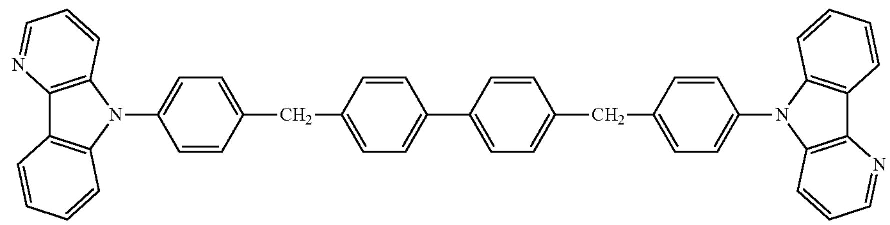
133
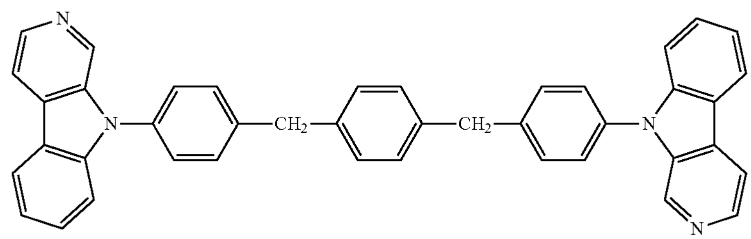
134
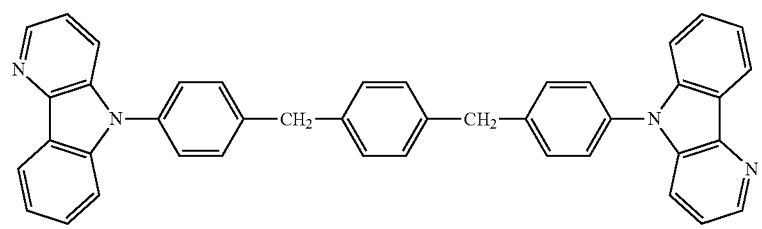
135
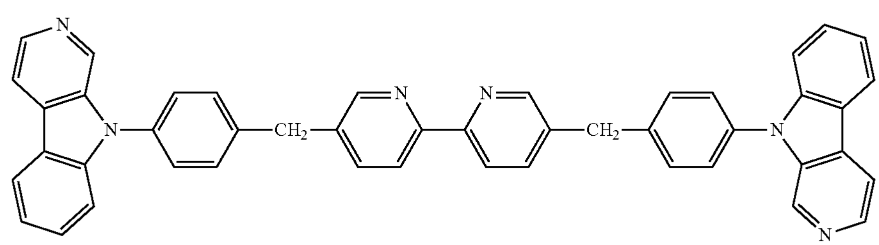
136
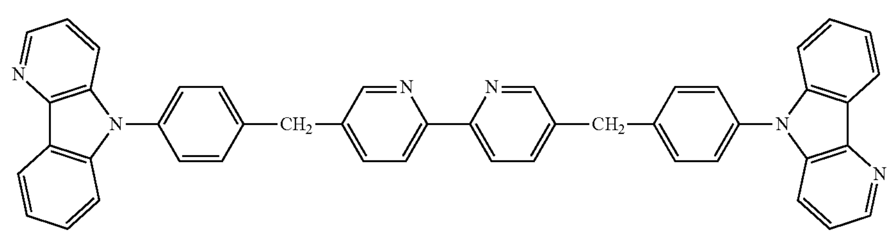

-continued
137
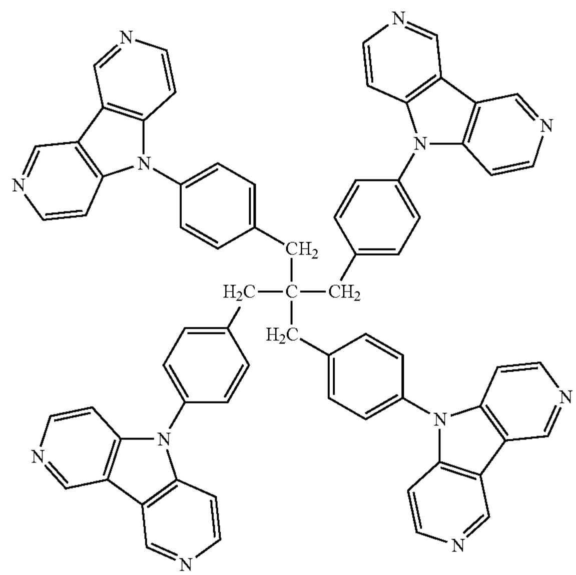
138
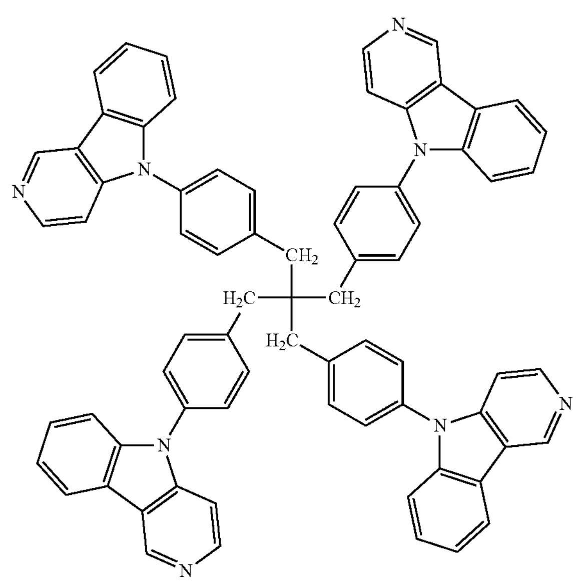

-continued
139
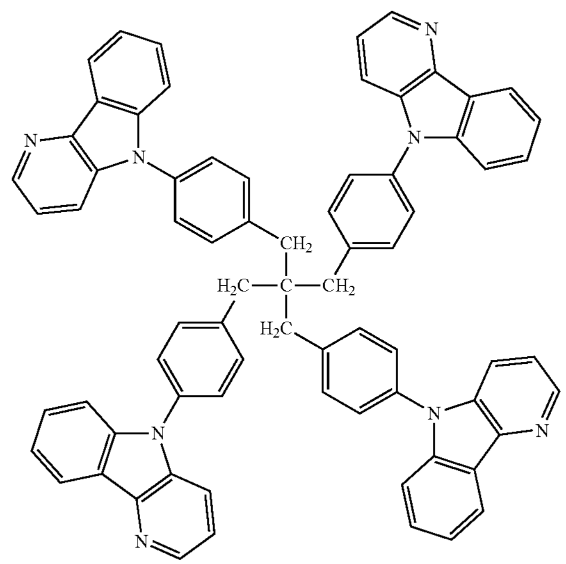
140
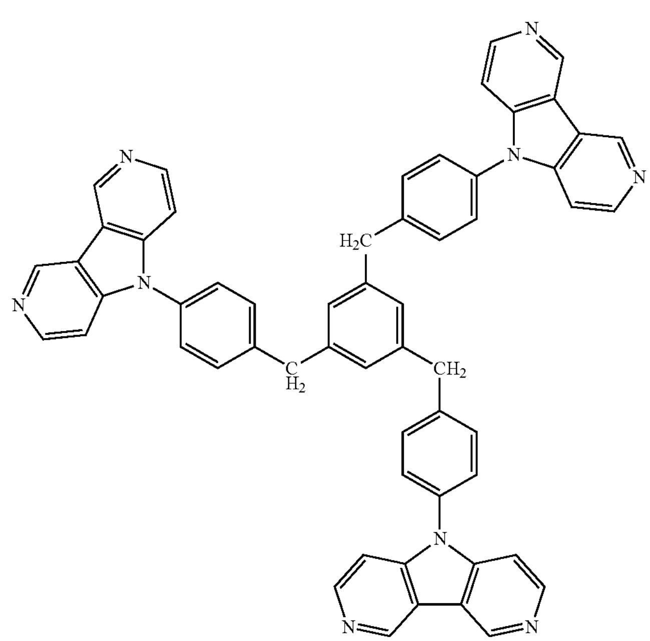

-continued
141
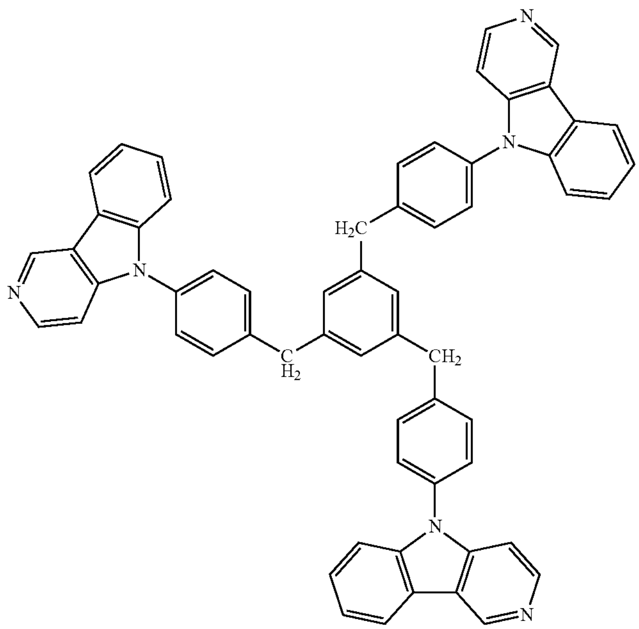
142
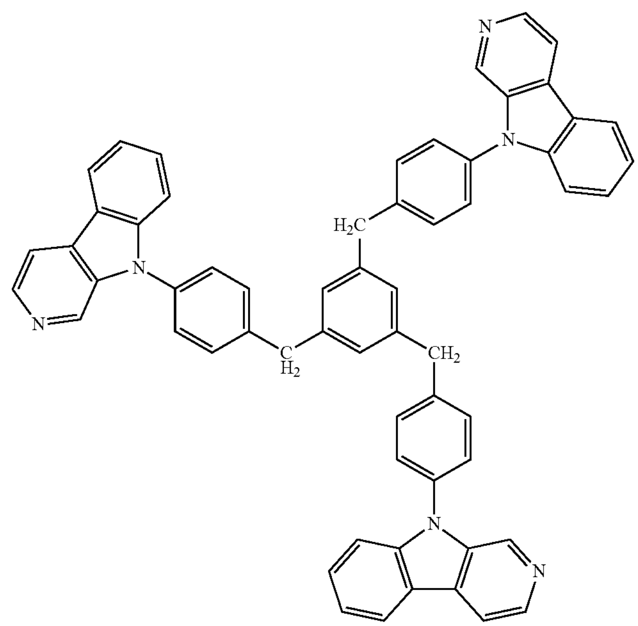
143
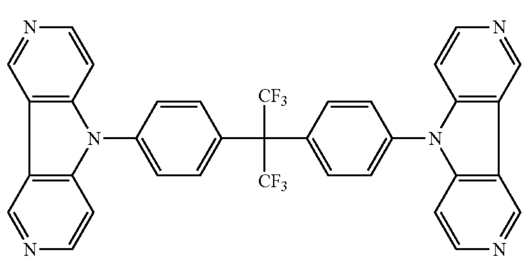

-continued
144
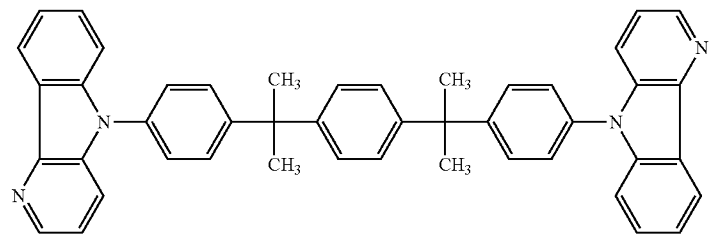
145
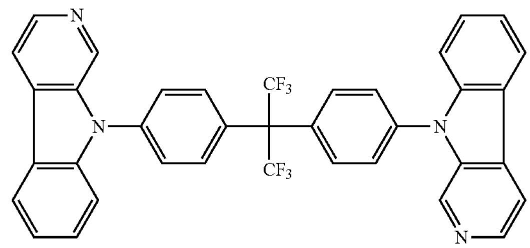
146
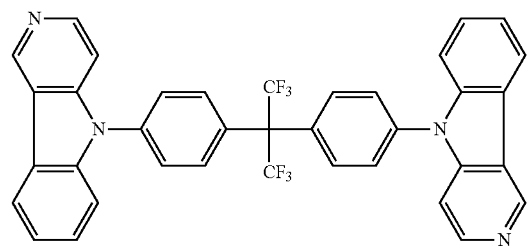
147
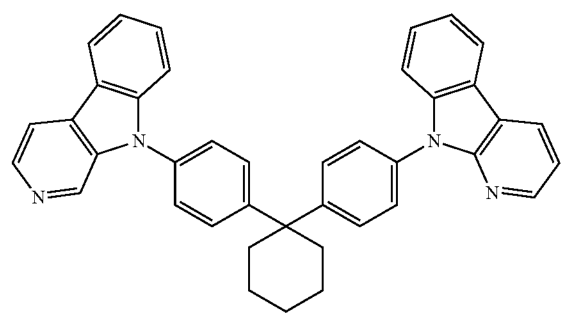
148
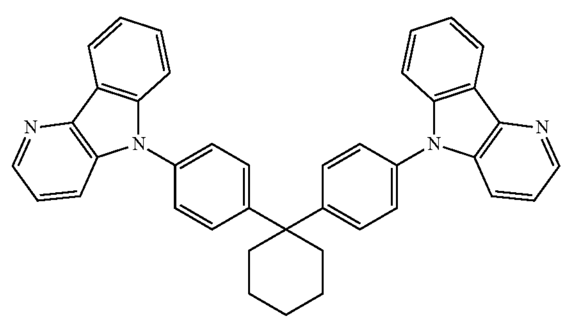

-continued
149
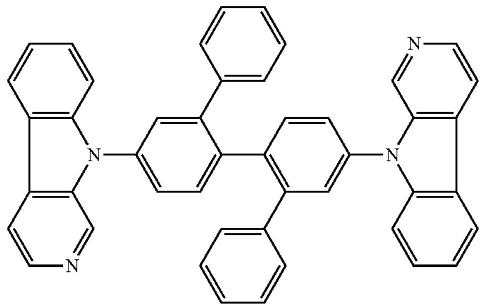
150
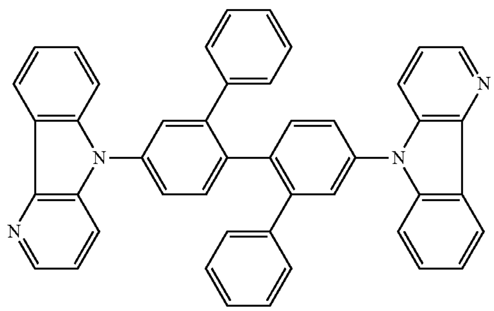
151
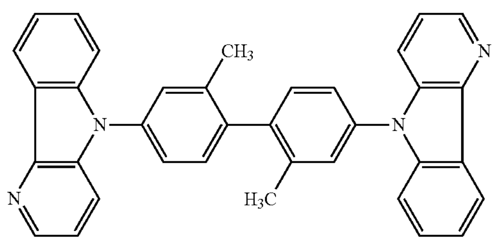
152
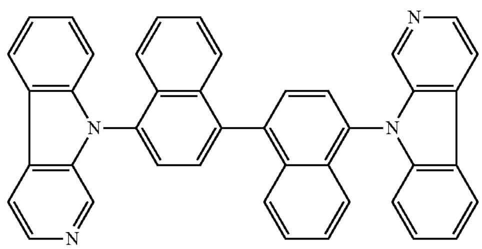
153
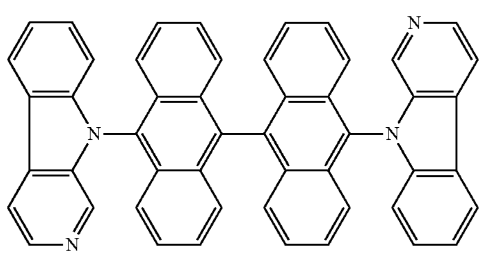

-continued
154
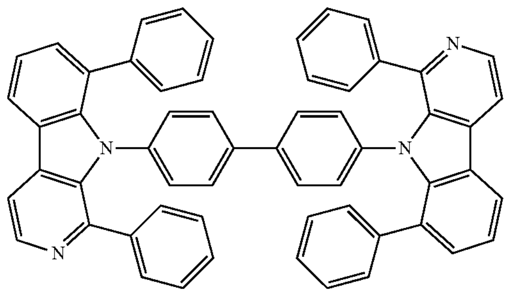
155
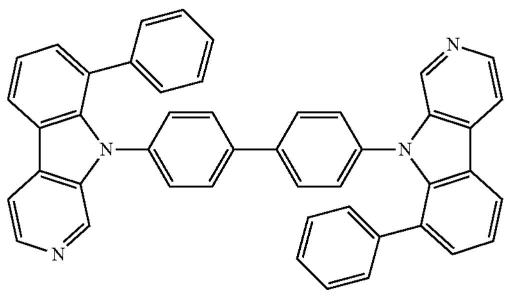
156
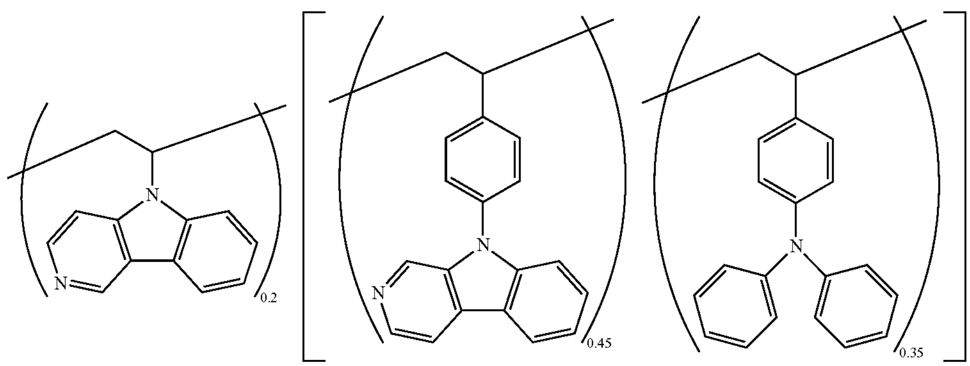
157
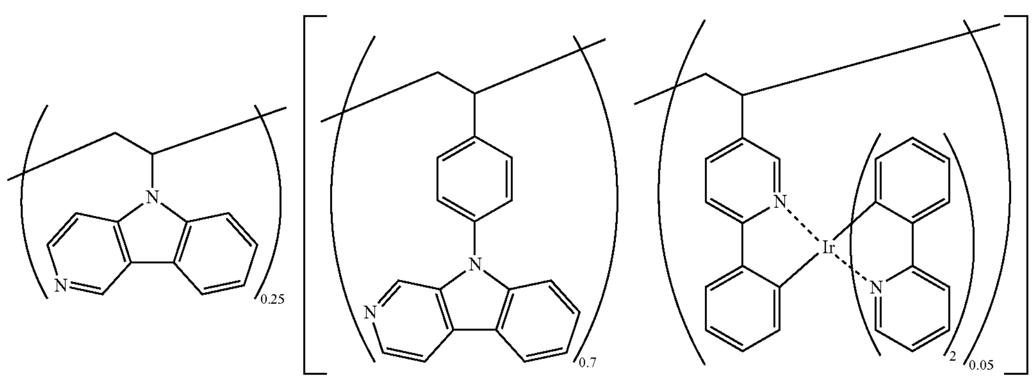
158
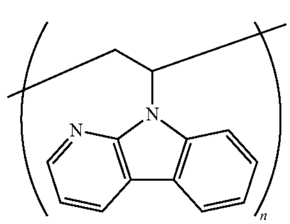

159
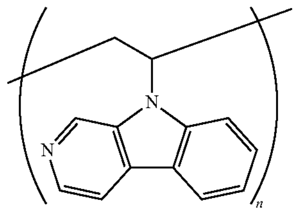
160
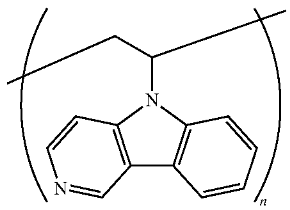
161
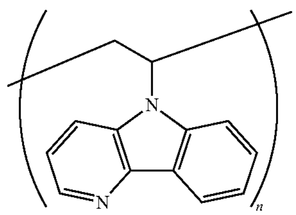
162
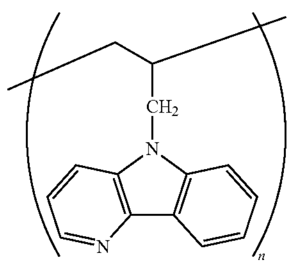
163
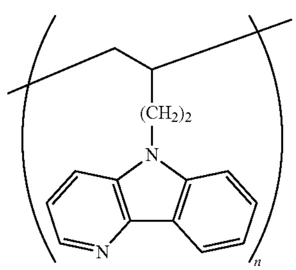
164
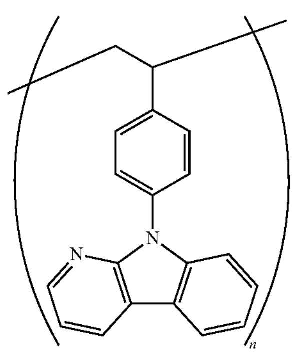

-continued
165
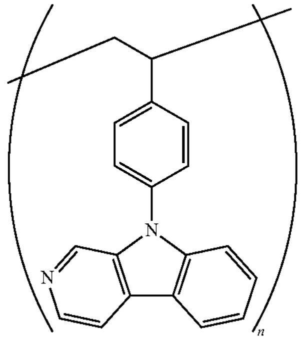
166
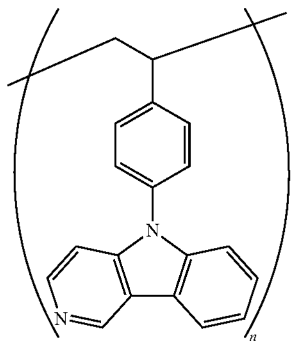
167
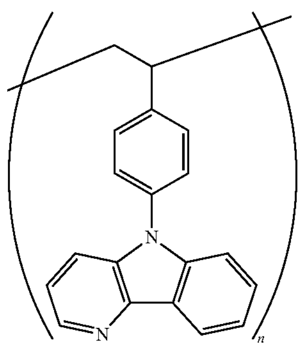
168
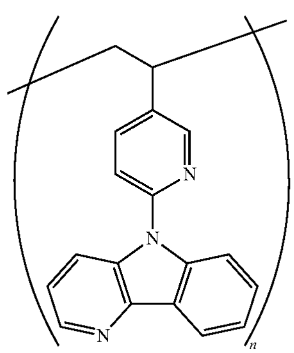
169
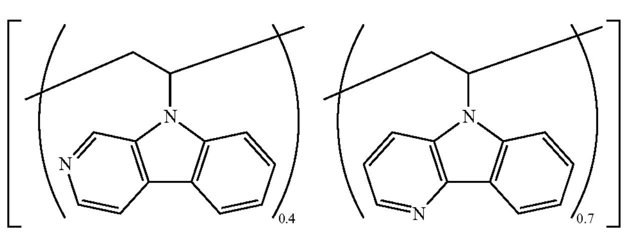

-continued
170
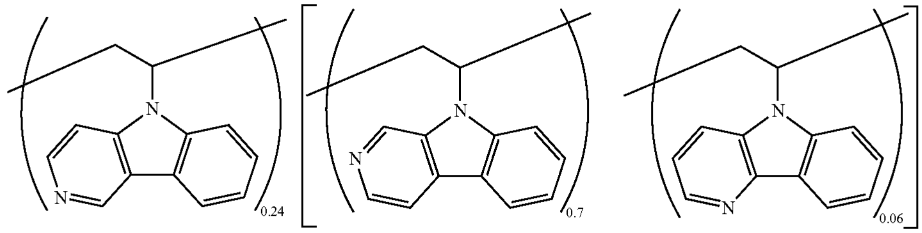
171
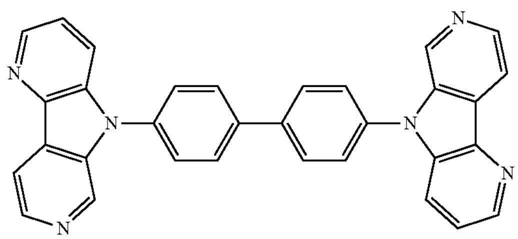
172
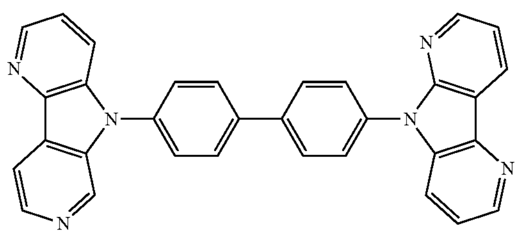
173
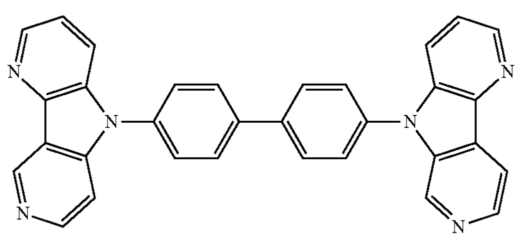
174
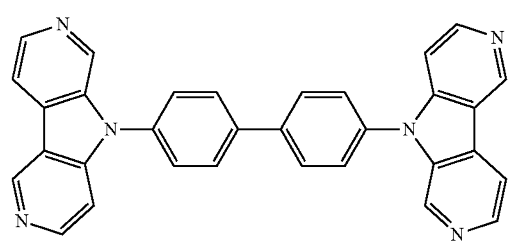
175
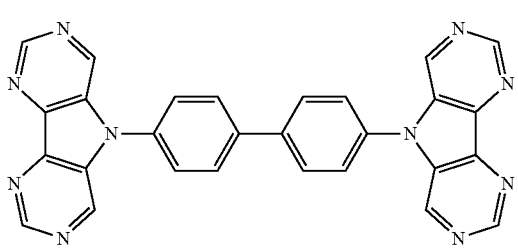

-continued
176
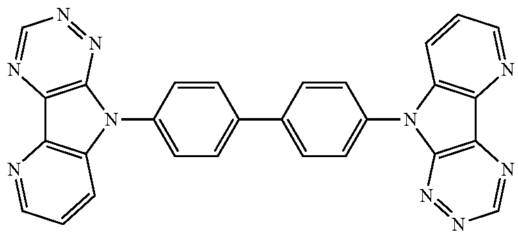
177
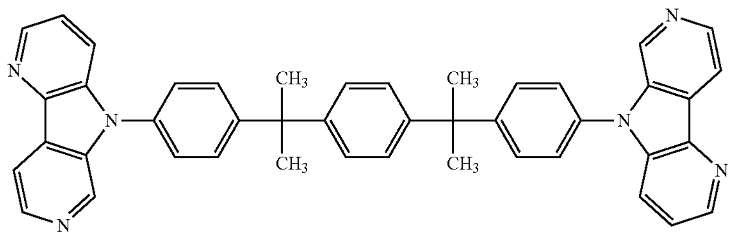
178
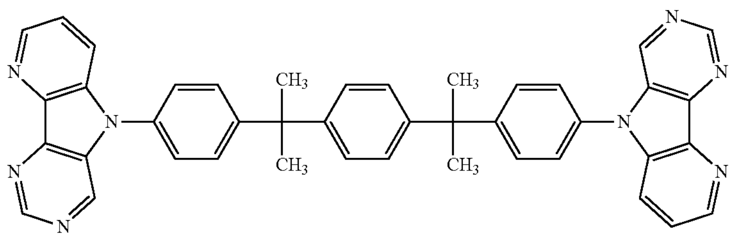
179
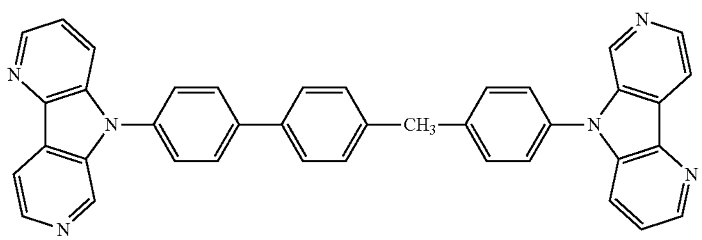
180
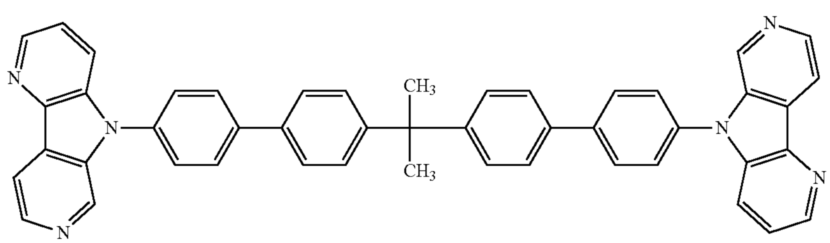
181
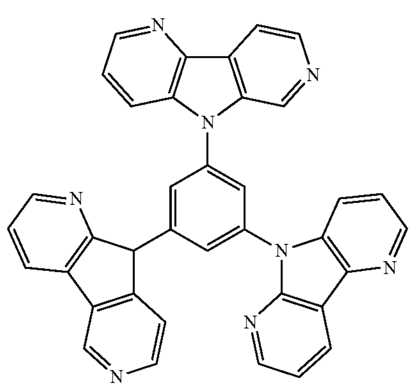

-continued
182
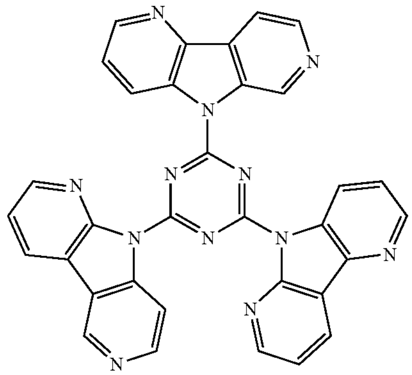
183
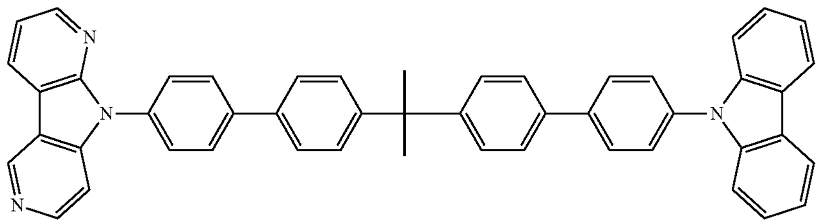
184
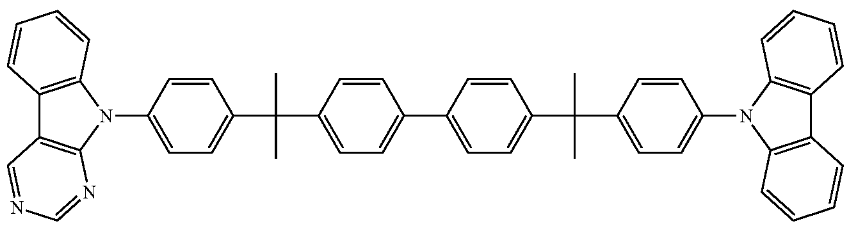
185
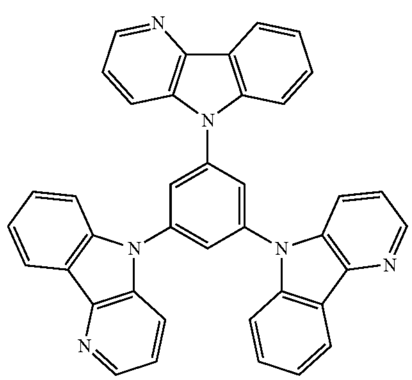
186
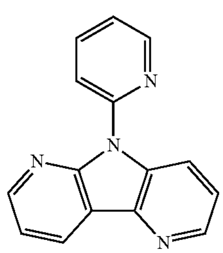

-continued

187

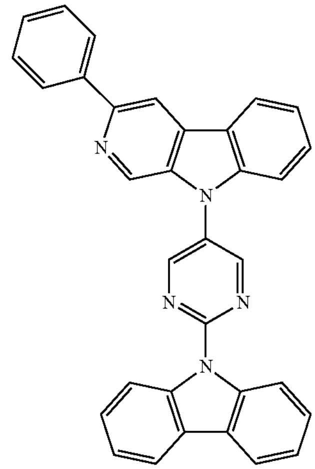

188

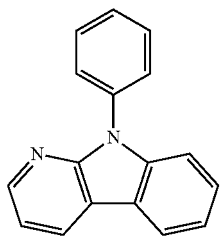

The emission host employed in the present invention may be a low molecular weight compound, a polymer compound having a repeat unit, or a low molecular compound having a polymerizable group, for example. a vinyl group or an epoxy group (a vacuum evaporated polymerizable host).

The emission host is preferably a compound which prevents elongation of the wavelength of the emission and has a high Tg (a glass transition temperature), while having a hole transport property or an electron transport property.

As specific examples of an emission host, preferable are the compounds described in the following documents, for example: JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Next, constitutions of typical organic EL elements will be described.

<<Constituting Layers of Organic EL Element>>

The constituting layers of the organic EL element of the present invention will be explained.

Preferable examples of the constituting layers of the organic EL element of the present invention will be shown below, however, the present invention is not limited thereto. (i) Anode/Hole transport layer/Light emission layer/Hole blocking layer/Electron transport layer/Cathode (ii) Anode/Electron blocking layer/Light emission layer/Hole blocking layer/Electron transport layer/Cathode (iii) Anode/Hole transport layer/Electron blocking layer/Light emission layer/Hole blocking layer/Electron transport layer/Cathode (iv) Anode/Hole transport layer/Electron blocking layer/Light emission layer/Hole blocking layer/Electron transport layer/Cathode (v) Anode/Hole transport layer/Electron blocking layer/Light emission layer/Hole blocking layer/Electron transport layer/Cathode buffer layer/Cathode (vi) Anode/Anode buffer layer/Hole transport layer/Electron blocking layer/Light emission layer/Hole blocking layer/Electron transport layer/Cathode buffer layer/Cathode (vii) Anode/Anode buffer layer/Hole transport layer/Electron blocking layer/Light emission layer/Hole blocking layer/Electron transport layer/Cathode buffer layer/Cathode <<Blocking Layer (Electron Blocking Layer, Hole Blocking Layer>>

A blocking layer of the present invention (for example, an electron blocking layer, an electron hole blocking layer) will be explained.

In the present invention, the material for the organic EL element of the present invention is preferably used, for example, in the hole blocking layer or in the electron blocking layer, and more preferably in the hole blocking layer.

When the material for the organic EL element of the present invention is used, for example, in the hole blocking layer or in the electron blocking layer, the metal complex of the present invention described in any one of the above Items (1) to (17) may be incorporated in the hole blocking layer or in the electron blocking layer, in a state of 100% by weight or in a state of being mixed with another organic compound (for example, a compound used in the constituting layer of the organic EL element of the present invention).

The thickness of the blocking layer of the present invention is preferably 3 nm-100 nm, and more preferably 5 nm-30 nm.

<<Hole Blocking Layer>>

The hole blocking layer has a function of an electron transport layer in a broad sense and contains a material having an ability of transporting electrons, however, an extremely poor ability of transporting holes, which can increase a recombination probability of electrons and holes by transporting electrons while blocking holes.

The hole blocking layer, for example, disclosed in JP-A Nos. 11-204258 and 11-204359, and the hole blocking layer described in page 237 of "Organic EL element and its frontier of industrialization" (published by NTS Corporation, Nov. 30, 1998), can be used as the hole blocking layer of the present invention. Further, when necessary, the constitution of an electron transport layer which will be described later can also be used as the hole blocking layer of the present invention.

In the present invention, it is preferable to use a compound represented by the above Formula (33) in a layer adjacent to the light emission layer, namely, in a hole blocking layer or in an electron blocking layer, and specifically preferable is to use it in the hole blocking layer.

<<Hole Transport Layer>>

The hole transport layer contains a hole transport material having a hole transport ability. A hole injection layer and an electron blocking layer are included in a hole transport layer in a broad sense. The hole transport layer may either be an single layer or a lamination layer containing a plurality of layers.

The hole transport material is not specifically limited, and can be arbitrarily selected from commonly used hole injection-transport materials in a photo conduction material or from the materials known in the art in a hole injection layer or in a hole transport layer of an organic EL element.

A hole transport material means a compound having a hole injection ability, a hole transport ability or an electron blocking ability, and it may be an organic substance or an inorganic substance. Examples of a hole transport material include: a triazole derivative, an oxadiazole derivative, an imidazole derivative, a polyarylalkane derivative, a pyrazoline derivative, a pyrazolone derivative, a phenylenediamine derivative, an arylamine derivative, an amino substituted chalcone derivative, an oxazole derivative, a styrylanthracene derivative, a fluorenone derivative, a hydrazone derivative, a stilbene derivative, a silazane derivative, an aniline-containing copolymer, and an electroconductive oligomer, specifically, a thiophene oligomer.

As the hole transport material, those described above are used, however, a porphyrin compound, an aromatic tertiary amine compound and a styrylamine compound are preferable, and, specifically, an aromatic tertiary amine compound is preferable.

Typical examples of the aromatic tertiary amine compound and styrylamine compound include: N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the above mentioned material as the polymer main chain can also be used.

As a hole injecting material or a hole transport material, inorganic compounds such as p-Si and p-SiC are usable. Further, the hole transport material preferably has a high Tg.

The hole transport layer can be formed by preparing a thin layer of the above-mentioned hole transport material using a known method such as a vacuum deposition method, a spin coat method, a cast method, an inkjet method, or an LB method. The thickness of the hole transport layer is not specifically limited, however, it is ordinarily from 5 nm to 5000 nm. The hole transport layer may be composed of a single layer structure containing one or more of the materials mentioned above.

<<Electron Transport Layer>>

The electron transport layer contains a material having an electron transport ability, and in a broad sense an electron injection layer or a hole blocking layer are included in an electron transport layer. The electron transport layer can be provided as a single layer or as a plurality of layers.

The following materials have been known as an electron transport material (which serves also as a hole blocking material) used in a single electron transport layer or in the electron transport layer closest to the cathode when plural electron transport layers are employed.

The electron transport layer has a function of transporting electrons injected from a cathode to a emission layer, and the material used in the electron transport layer can be optionally selected from the compounds known in the art.

Examples of the material used in the electron transport layer (hereafter, referred to as the electron transport material) include: a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transport material.

A polymer in which the material mentioned above is introduced in the polymer chain or a polymer having the material as the polymer main chain can be also used.

A metal complex of an 8-quinolynol derivative such as aluminum tris(8-quinolynol) (Alq), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) (Znq), and a metal complex formed by replacing the central metal of the foregoing complexes with another metal atom such as In, Mg, Cu, Ca, Sn, Ga or Pb, can be used as the electron transport material. Furthermore, a metal free or metal-containing phthalocyanine, and a derivative thereof, in which the molecular terminal is replaced by a substituent such as an alkyl group or a sulfonic acid group, are also preferably used as the electron transport material. The distyrylpyrazine derivative exemplified as a material for the emission layer may preferably be employed as the electron transport material. An inorganic semiconductor such as n-Si and n-SiC may also be used as the electron transport material in a similar way as in the hole injection layer or in the hole transport layer.

The electron transport layer can be formed employing the above described electron transport materials and by forming into a film using a known method such as a vacuum deposition method, a spin coat method, a cast method, an inkjet method or an LB method. The thickness of electron transport layer is not specifically limited, however, is ordinarily from 5 to 5000 nm. The electron transport layer may be composed of a single layer containing one kind or two or more kinds of the above-mentioned electron transport materials.

Next, the injection layer used as one of the constituting layers of the organic EL element of the present invention will be explained.

<<Injection Layer>>: Electron Injection Layer, Hole Injection Layer

The injection layer is optionally provided, for example, an electron injection layer or a hole injection layer, and may be provided between the anode and the emission layer or the hole transport layer, and between the cathode and the emission layer or the electron transport layer as described above.

The injection layer herein referred to is a layer provided between the electrode and an organic layer in order to reduce the driving voltage or to improve of light emission efficiency. As the injection layer, there are a hole injection layer (an anode buffer layer) and an electron injection layer (a cathode buffer layer), which are described in "Electrode Material" pages 123-166, Div. 2 Chapter 2 of "Organic EL element and its frontier of industrialization" (published by NTS Corporation, Nov. 30, 1998) in detail.

The anode buffer layer (a hole injection layer) is described in, for example, JP-A Nos. 9-45479, 9-260062, and 8-288069, and its examples include a phthalocyanine buffer layer represented by a copper phthalocyanine layer, an oxide buffer layer represented by a vanadium oxide layer, an amorphous carbon buffer layer, and a polymer buffer layer employing an electroconductive polymer such as polyaniline (emeraldine) or polythiophene.

The cathode buffer layer (an electron injection layer) is described in, for example, JP-A Nos. 6-325871, 9-17574, and 10-74586, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (an injection layer) is preferably very thin and has a thickness of preferably from 0.1 to 100 nm depending on the kind of the material used.

The injection layer can be formed by preparing a thin layer of the above-mentioned injection material using a known method such as a vacuum deposition method, a spin coat method, a cast method, an inkjet method, or an LB method. The thickness of the injection layer is not specifically limited, however, it is ordinarily from 5 nm to 5000 nm. The injection layer may be composed of a single layer structure containing one kind or two or more kinds of the materials mentioned above.

<<Anode>>

For the anode of the organic EL element, a metal, an alloy, or an electroconductive compound each having a high working function (not less than 4 eV), and mixture thereof are preferably used as the electrode material. Specific examples of such an electrode material include a metal such as Au, CuI and a transparent electroconductive material such as indium tin oxide (ITO), $SnO_2$, or ZnO. A material capable of forming an amorphous and transparent conductive layer such as IDIXO ($In_2O_3$—ZnO) may also be used. The anode may be prepared by forming a thin layer of the electrode material according to a depositing or sputtering method, and by forming the layer into a desired pattern according to a photolithographic method. When required precision of the pattern is not so high (not less than 100 μm), the pattern may be formed by depositing or sputtering of the electrode material through a mask having a desired form. When light is emitted through the anode, the transmittance of the anode is preferably 10% or more, and the sheet resistance of the anode is preferably not more than several hundred ohm/sq. The thickness of the layer is ordinarily within the range of from 10-1000 nm, and preferably from 10-200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof are used as the electrode material. Specific examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred ohm/sq, and the thickness of the layer is ordinarily from 10 nm-1000 nm, and preferably from 50 nm-200 nm. It is preferable in increasing the light emission efficiency that either the anode or the cathode of the organic EL element is transparent or semi-transparent.

<<Substrate (Also Referred to as Base Plate, Base or Support)>>

The substrate employed for the organic EL element of the present invention is not restricted to specific kinds of materials such as glass and plastic, as far as it is transparent. Examples of the substrate preferably used include glass, quartz and light transmissible plastic film. Specifically preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC) and cellulose acetate propionate (CAP).

The surface of the resin film may have a layer of an inorganic or organic compound or a hybrid layer of both compounds which is preferably a high barrier film having a moisture permeability of not more than 0.01 $g/m^2 \cdot day \cdot at$.

The external light emission efficiency of the organic electroluminescence element of the present invention is preferably not less than 1%, and more preferably not less than 2% at room temperature. Herein, external quantum yield (%) is represented by the following formula:

External quantum yield(%)=((the number of photons emitted to the exterior of the organic EL element)/(the number of electrons supplied to the organic EL element))×100

A hue improving filter such as a color filter may be used in combination.

When used as an illuminator, a film being subjected to a surface roughening treatment (for example, an antiglare film) may be used together, in order to reduce the emission irregularity.

When used as a multicolored display, at least two organic EL elements having different emission maximum wavelengths are used. A preferable example of manufacturing an organic EL element will now be explained.

<<Preparation Method of Organic EL Element>>

For one example, the preparation of the organic EL element, which has the following constitution will be described: Anode/Hole injection layer/Hole transport layer/Emission layer/Electron transport layer/Cathode buffer layer/Cathode.

A thin layer of a desired material for an electrode such as a material of the anode is formed on a suitable substrate by a vacuum deposition or sputtering method to prepare the anode so that the thickness of the layer is not more than 1 μm and preferably within the range of from 10 to 200 nm. Then organic compound thin layers including the hole injection layer, the hole transport layer, the emission layer, the hole blocking layer and the electron transport layer, which constitute the organic EL element, are formed on the resulting anode.

As methods for formation of the thin layers, as the same as described above, there are a vacuum deposition method and a wet process (for example, a spin coating method, a cast method, an inkjet method, and a printing method), however, a vacuum deposition method, a spin coating method, an inkjet method and a printing method are preferably used, since a uniform layer without a pinhole can be formed. Different methods may be used for formation of different layers. When the vacuum deposition method is used for the thin layer formation method, although conditions of the vacuum deposition differs due to kinds of materials used, vacuum deposition is preferably carried out at a boat temperature of 50-450° C., at a degree of vacuum of from $10^{-6}$ to $10^{-2}$ Pa, at a deposition speed of 0.01-50 nm/second, and at a substrate temperature of −50-300° C. to form a layer with a thickness of 0.1 nm-5 μm.

After these layers has been formed, a thin layer of a material for a cathode is formed thereon to prepare a cathode, employing, for example, a vacuum deposition method or sputtering method to give a thickness of not more than 1 μm, and preferably 50-200 nm. Thus, a desired organic EL element is obtained. It is preferred that the layers from the hole injection layer to the cathode are continuously formed under one time of vacuuming to obtain an organic EL element. However, on the way of the layer formation under vacuum, a different layer formation method by taking the layer out of the vacuum chamber may be inserted. When the different method is used, the process is required to be carried out under a dry inert gas atmosphere.

<<Display>>

The display of the present invention will now be explained.

In the present invention, the display may be single color or may be multicolor, however, a multicolor display will now be explained. In the multicolor display of the present invention, the emission layer only is formed using a shadow mask, and the other layers, besides the emission layer, can be formed all over the substrate employing a vacuum method, a cast method, a spin coat method an inkjet method or a printing method.

When the emission layer only is formed by patterning, the layer formation, although not specifically limited, is carried out preferably according to a vacuum deposition method, an inkjet method or a printing method. When a vacuum deposition method is used as the layer formation method, patterning of the layer is preferably carried out employing a shadow mask.

Further, the organic EL element can be prepared in the reverse order, in which the cathode, the electron transport layer, the hole blocking layer, the emission layer, the hole transport layer, and the anode are formed in that order. When a direct current voltage, a voltage of 2 to 40 V is applied to thus obtained multicolor display, setting the anode as a + polarity and the cathode as a − polarity, light emission is observed. When a voltage with the reverse polarity is applied, no current flows and no light emission is observed. When an alternating current is applied, light emission is observed only when + is applied to the anode and − is applied to the cathode. Arbitrary wave shape of alternating current may be used.

The multicolor display can be used as a display for indication, a display, or various light emission sources. The display for indication or the display, which employs three kinds of organic EL elements emitting a blue light, a red light and a green light can present a full color image.

Examples of the display or the display include a television, a personal computer, a mobile device or an AV device, a display for text broadcasting, and an information display used in a car. The display may be used as specifically a display for reproducing a still image or a moving image. When the display is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

<<Illuminator>>

The illuminator of the present invention will now be explained.

The organic EL element of the present invention may be an organic EL element having a resonator structure. The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image by employing two or more kinds of organic EL elements each emitting light with a different color.

One of the examples of the display containing the organic EL element of the present invention will be explained below employing Figures.

FIG. 1 is a schematic drawing of one example of a display containing an organic EL element. FIG. 1 is a display such as that of a cellular phone, displaying image information due to light emission from the organic EL.

Display 1 contains a display section A having plural pixels and a control section B carrying out image scanning based on image information to display an image in the display section A.

The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
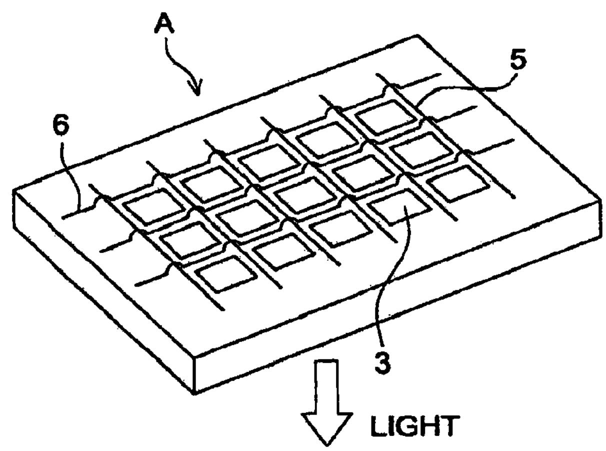
FIG. 2 is a schematic drawing of display portion A.

FIG. 2 is a schematic drawing of a display section A.

The display section A contains a substrate, plural pixels 3, and a wiring section containing plural scanning lines 5 and plural data lines 6. The main members of the display section A will be explained below.

In FIG. 2, light from pixels 3 is emitted in the direction of an arrow (downward).

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The pixel 3, when the scanning signal is applied from the scanning lines 5, receives the data signal from the data lines 6, and emits light corresponding to the image data received. By providing red light emitting pixels, green light emitting pixels, and blue light emitting pixels side by side on the same substrate, a full color image can be displayed.

Next, an emission process of pixels will be explained.

Figure 3:
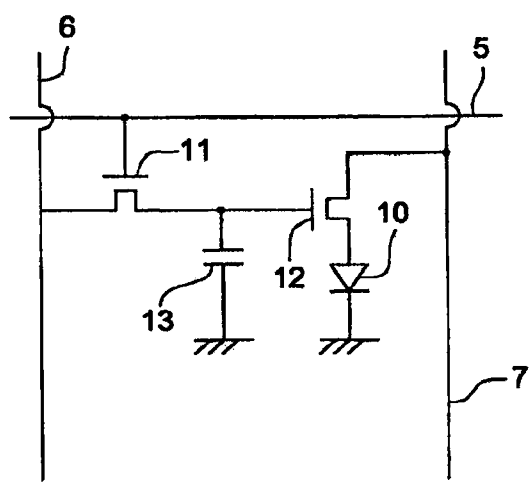
FIG. 3 is an equivalent circuit diagram of a drive circuit constituting a pixel.

FIG. 3 is a schematic drawing of a pixel.

The pixel contains an organic EL element 10, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals.

The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

Figure 4:
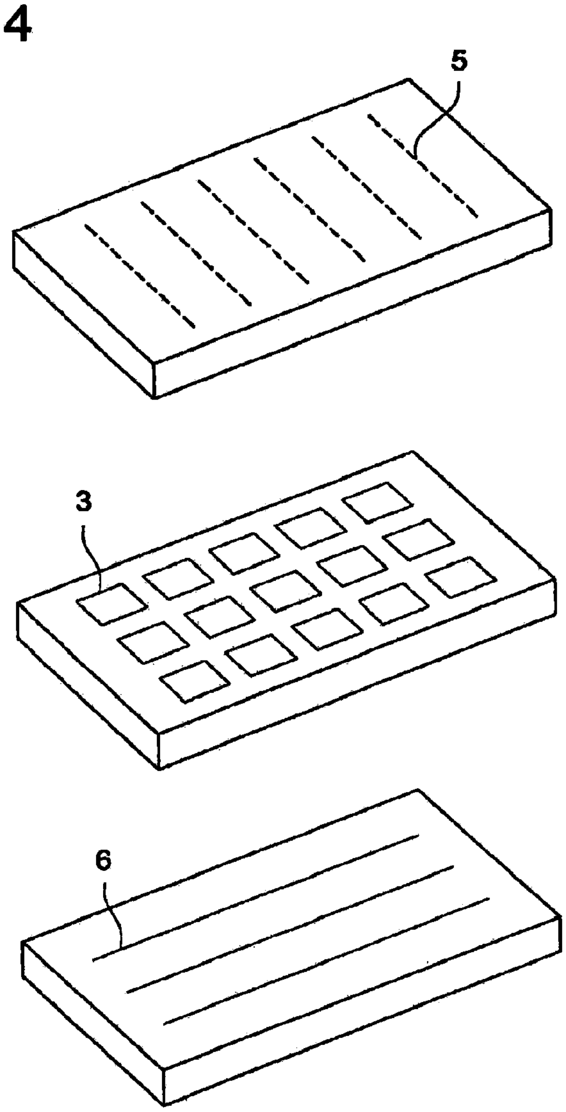
FIG. 4 is a schematic drawing of a display based on a passive matrix method.

FIG. 4 is a schematic drawing of a display employing a passive matrix method. In FIG. 4, pixels 3 are provided between the scanning lines 5 and the data lines 6, crossing with each other.

When scanning signal is applied to scanning line 5 according to successive scanning, pixel 3 connecting the scanning line 5 emits according to the image data signal. The passive matrix method has no active element in the pixel 3, which reduces manufacturing cost of a display.

The organic EL element of the present invention can be applied to an organic EL element emitting substantially white light as an illuminator. White light is obtained by mixing plural color lights, which are emitted from plural emission compounds. A combination of the plural color lights may be that of lights of three primary colors, blue, green, and red colors, each having a different emission maximum wavelength, or that of lights of complementary colors such as blue and yellow colors, or blue green and orange colors, each having a different emission maximum wavelength.

A combination of light emitting materials for obtaining plural color lights may be a combination of materials emitting plural fluorescent or phosphorescent light (light emission dopants), or a combination of a fluorescent or phosphorescent light emitting-material and a colorant which emit light under excitation due to excitation light from the light emitting-material. In the white light emitting organic EL element of the present invention, preferable is a combination of only plural light emitting dopants.

Examples of a layer construction of an organic EL element to obtain a plurality of emitting colors include: a method to mix a plurality of emitting dopants in an emitting layer; a method to provide a plurality of emitting layers each containing an emitting dopant exhibiting a different emitting wavelength from other dopant; and a method to mount minute pixels emitting lights of different wavelengths in a matrix arrangement on a substrate.

In the organic EL element emitting white light of the present invention, pattering may be carried out by using a mask, if necessary, while a layer is formed or by ink-jet printing. Patterning may be carried out only for an electrode, for an electrode and an emitting lay or for all the layers of the organic EL element.

Light emitting materials used in the light emitting layer are not specifically limited. For example, a back light used in a liquid crystal display is prepared by arbitrary selecting materials from platinum-complexes relating to the present invention or from known light emitting compounds and by using the selected materials in combination to emit white light, so that the emitted light fits the wavelength range corresponding to the CF (color filter) property.

The white light emitting organic EL element of the present invention may be suitably used for a variety of emitting light source, an illuminator for household use or in a vehicle, a kind of a lamp such as a light source for exposure, or for a display device, for example, as a back light of a liquid crystal display.

Other examples of the usage include: a backlight of a watch, an advertisement signboard, a traffic light, a light source for an optical memory medium, a light source for an electrophotographic copier, a light source for an optical communication processor, a light source for a light sensor and electric appliances for household use having a display device.

EXAMPLES

In the following, the present invention will be explained using examples, however, the present invention is not limited thereto.

Here, a list of compounds used in the examples (the compounds listed in the tables as well as those which are not listed in the tables but evaluated and only the results are given) will be shown.

BDM-1

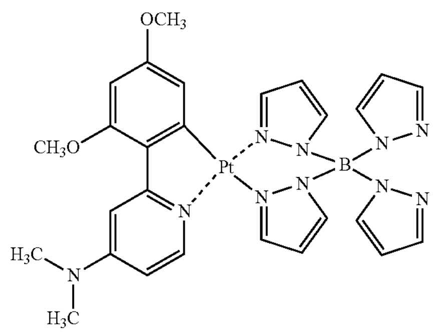

BDM-2

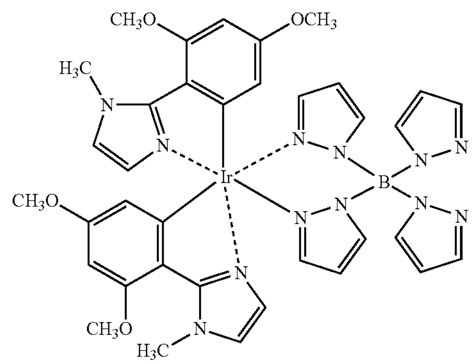

BDM-3

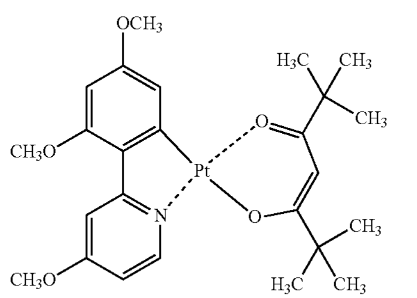

BDM-4

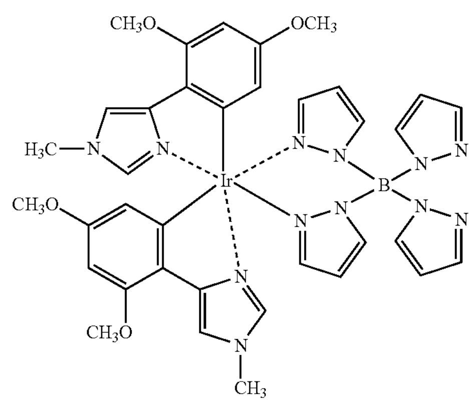

BDM-5

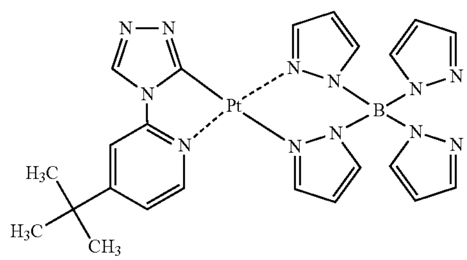

BDM-6

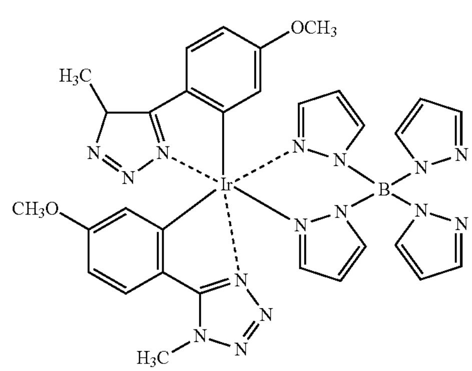

-continued
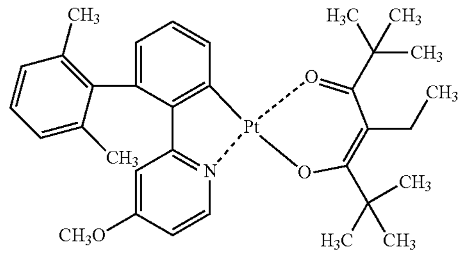
BDM-7
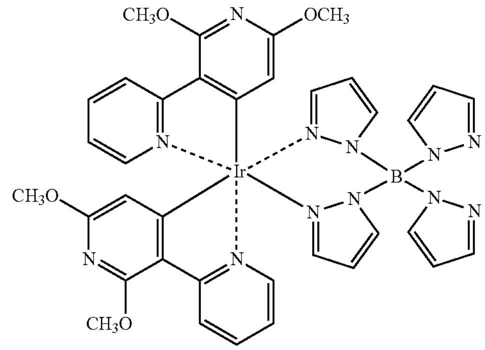
BDM-8
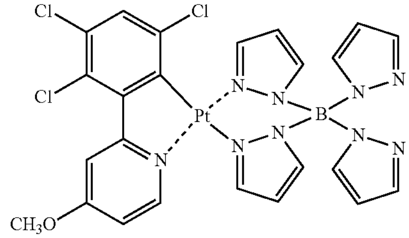
BDM-9
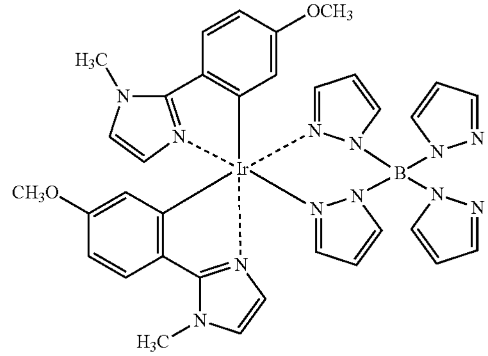
BDM-10
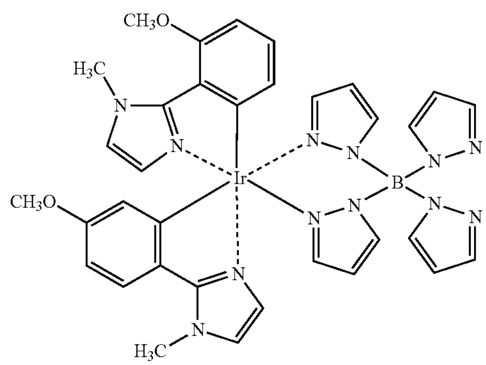
BDM-11
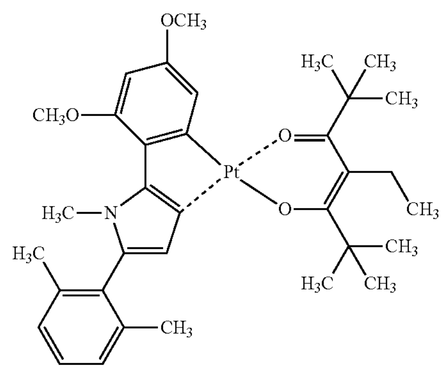
BDM-12
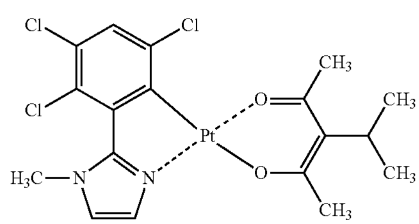
BDM-13
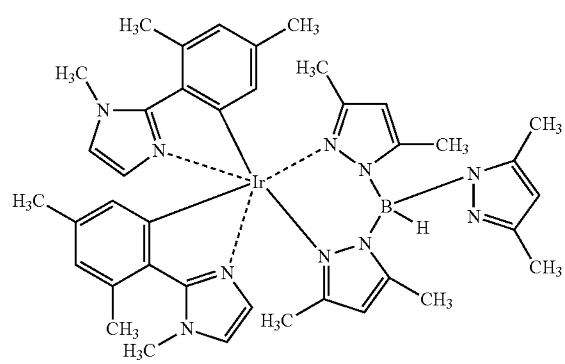
BDM-14

-continued
BDM-15
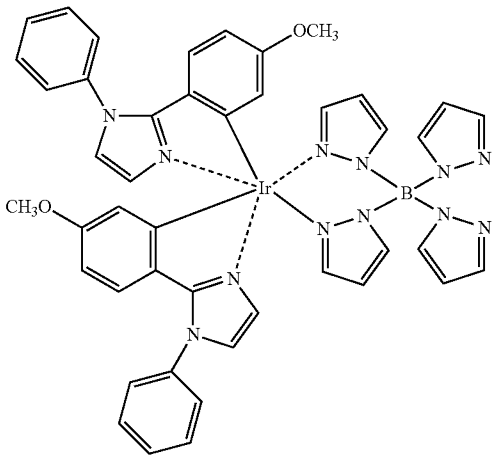
BDM-16
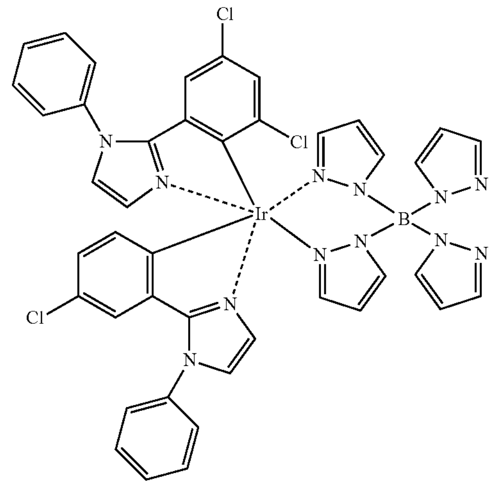
BDM-17
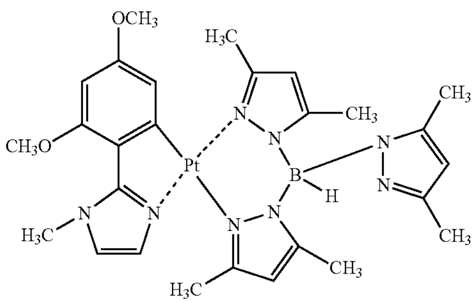
BDM-18
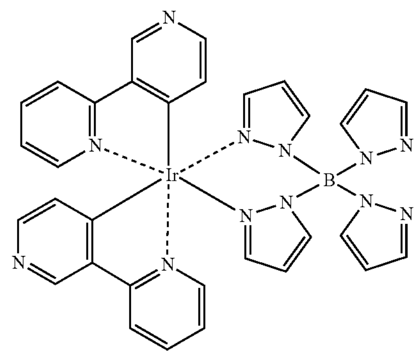
BDM-19
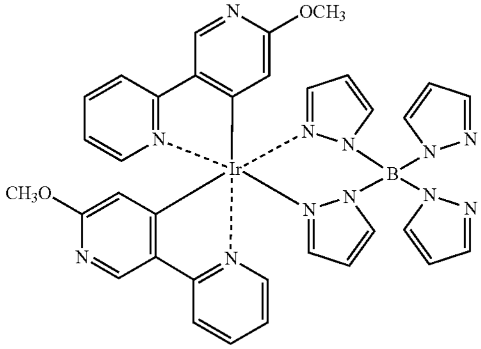
BDM-20
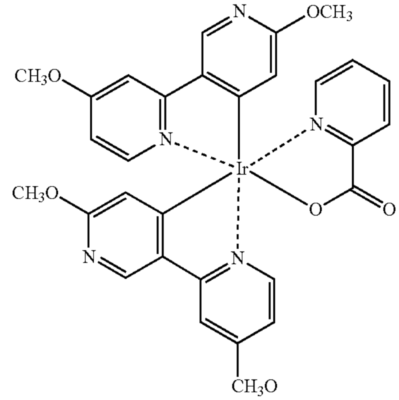

-continued
BDM-21
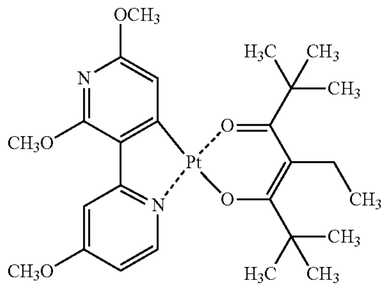
BDM-22
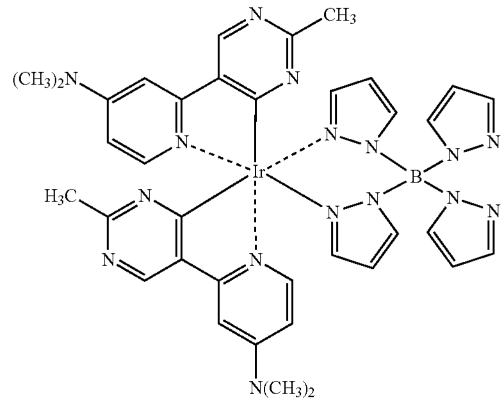
BDM-23
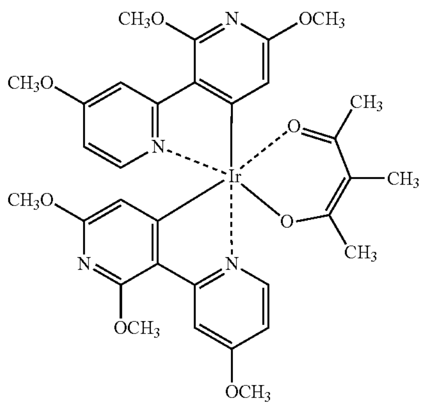
BDM-24
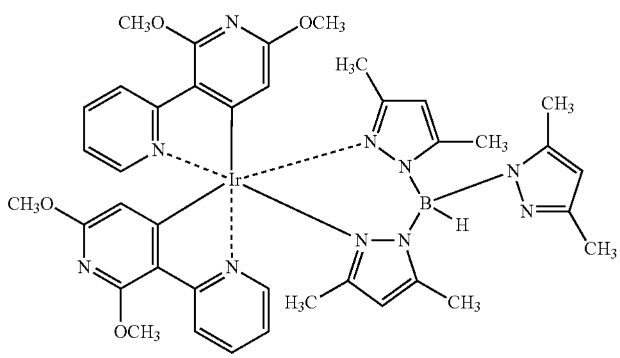
BDM-25
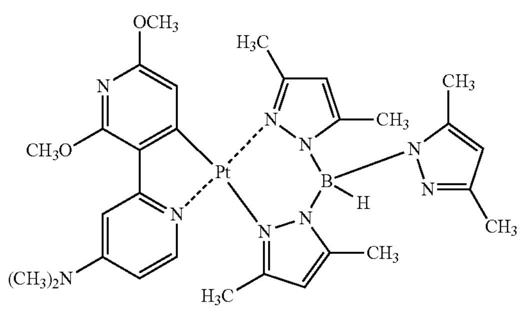
BDM-26
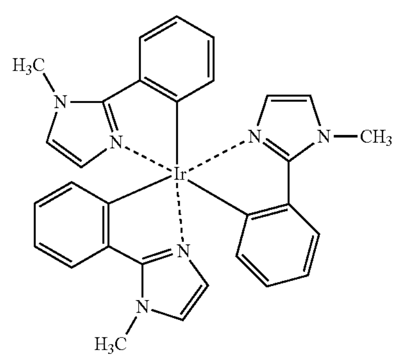

-continued
BDM-27
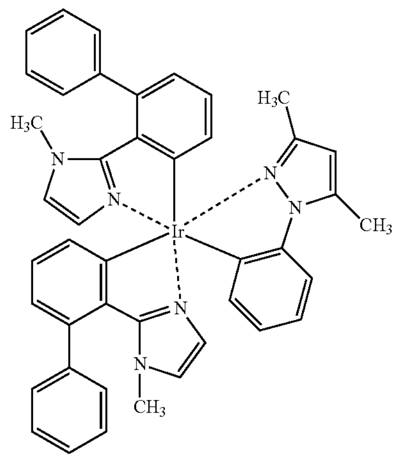
BDM-28
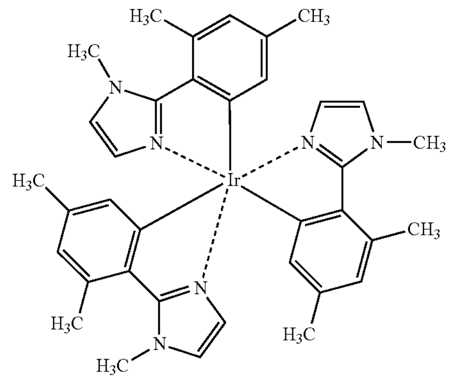
BDM-29
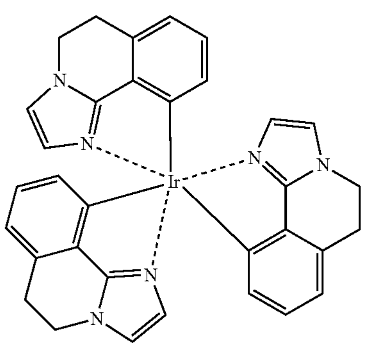
BDM-30
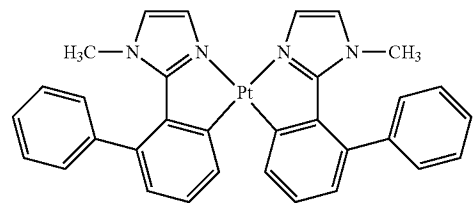
BDM-31
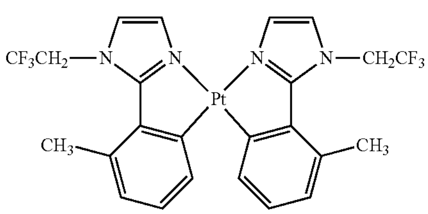
BDM-32
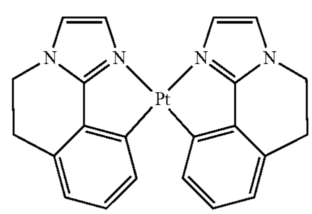
BDM-33
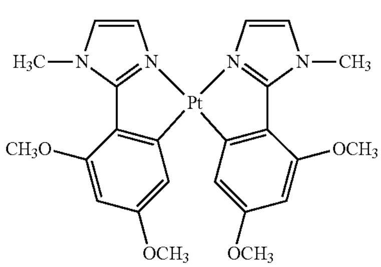
BDM-34
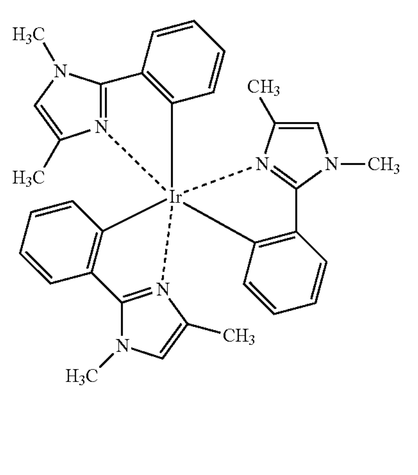

-continued
BDM-35
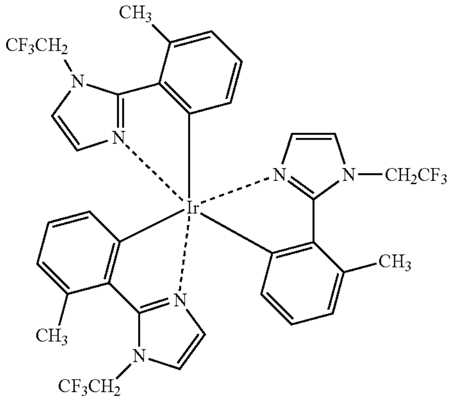
BDM-36
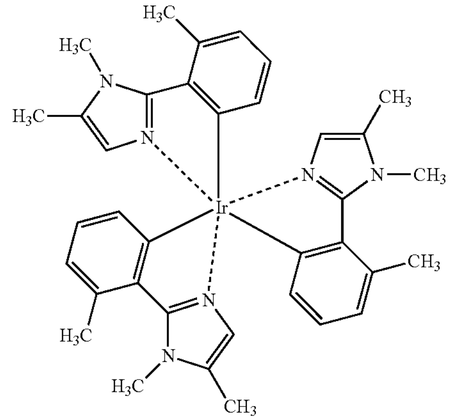
BDM-37
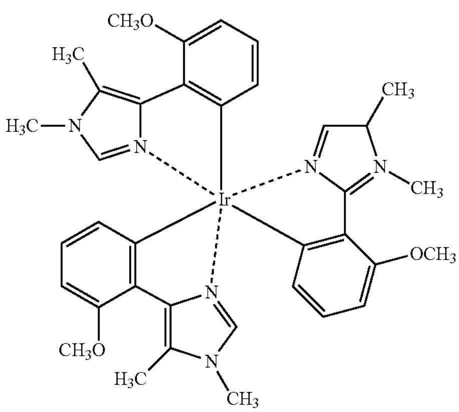
BDM-38
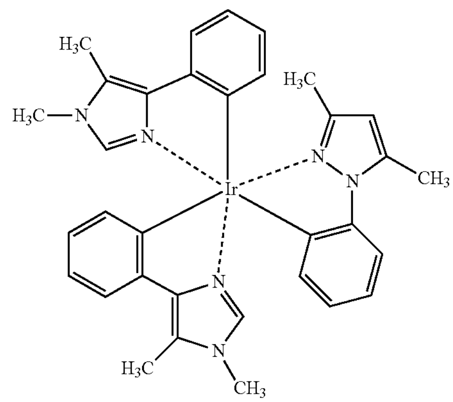
BDM-39
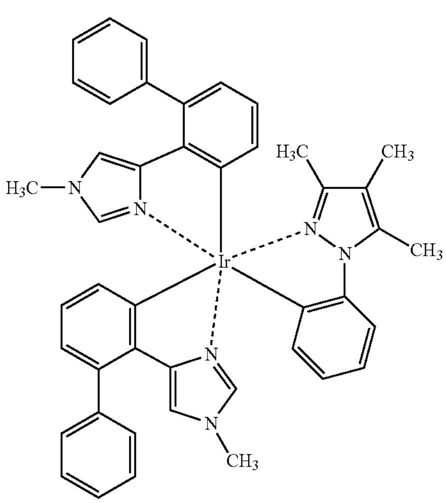
BDM-40
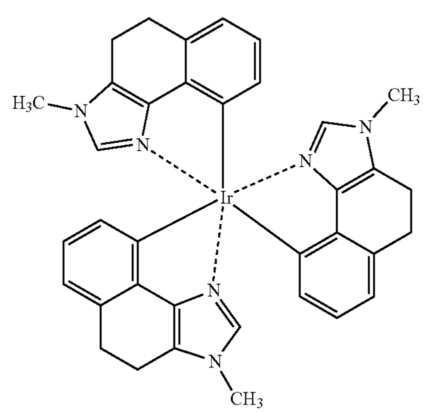

-continued
BDM-41
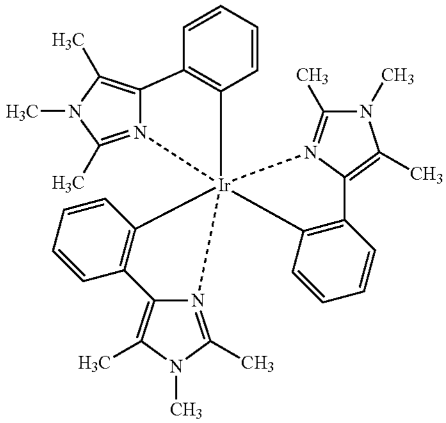
BDM-42
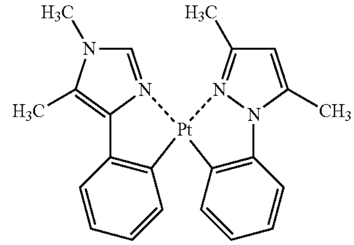
BDM-43
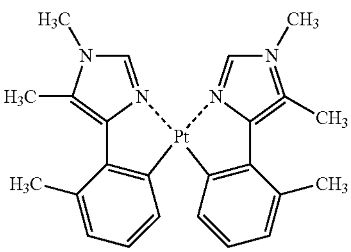
BDM-44
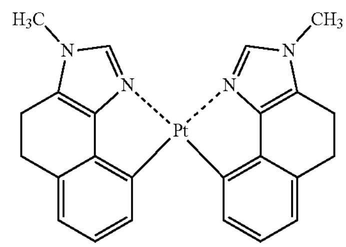
BDM-45
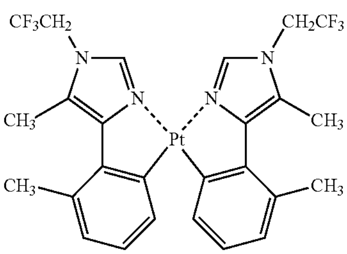
CBP
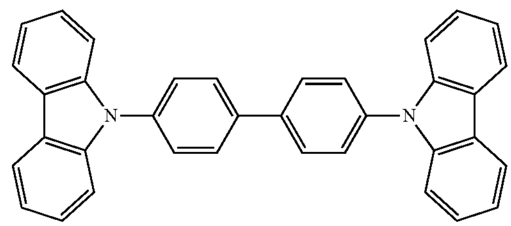
HM-1
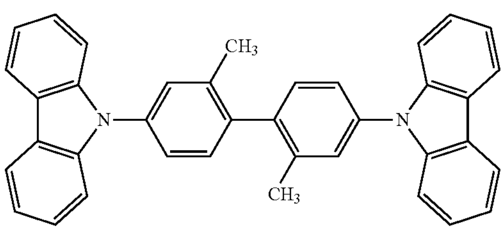
HM-2
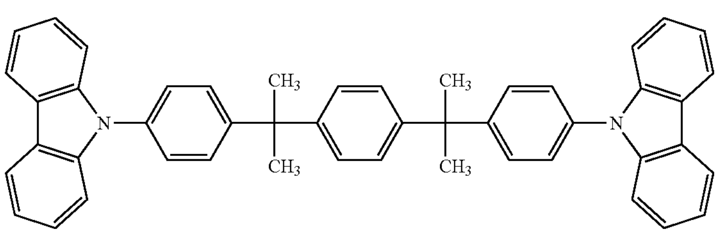
HM-3
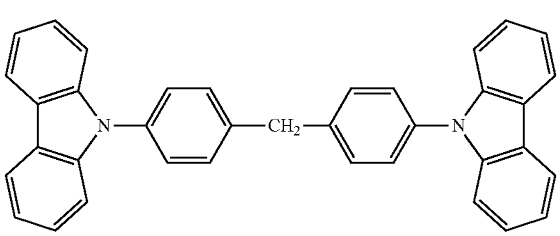

-continued
HM-4
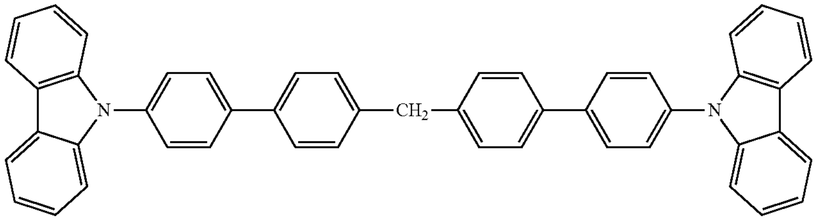
HM-5
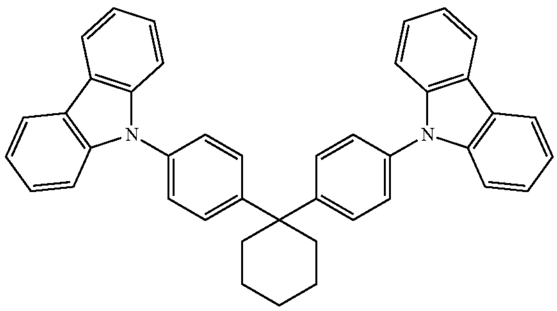
HT-1
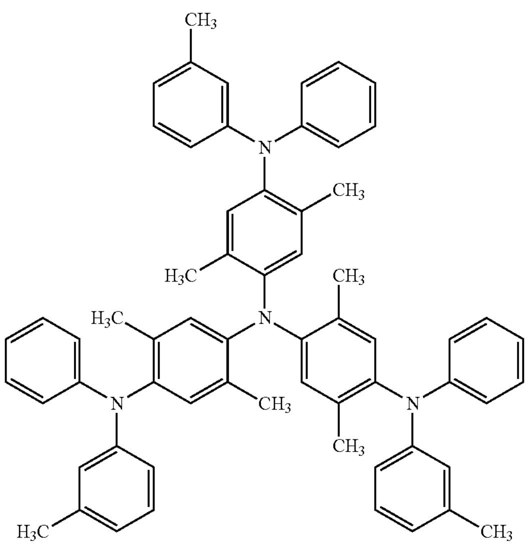
BCP
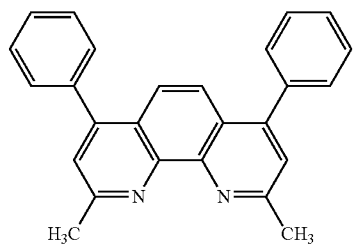
BAlq$_3$
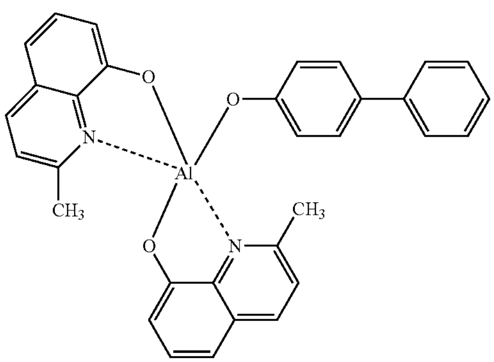
Alq$_3$
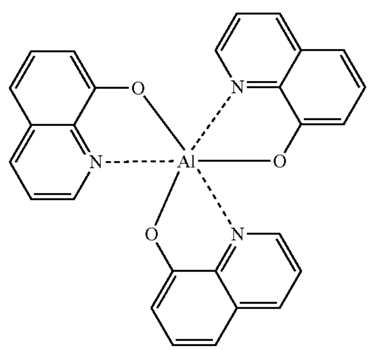

-continued
HB-1
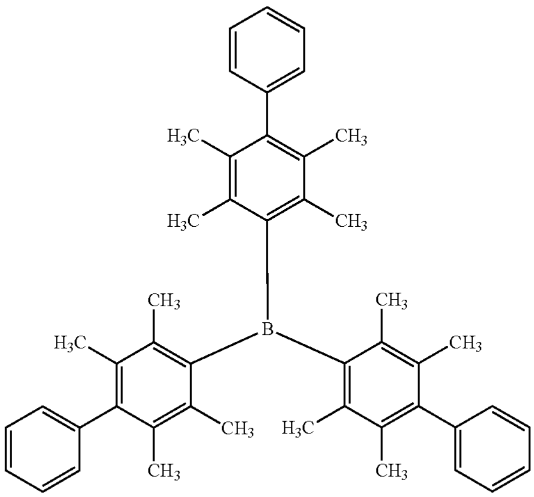
ET-1
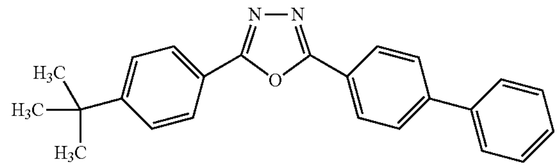
ET-2
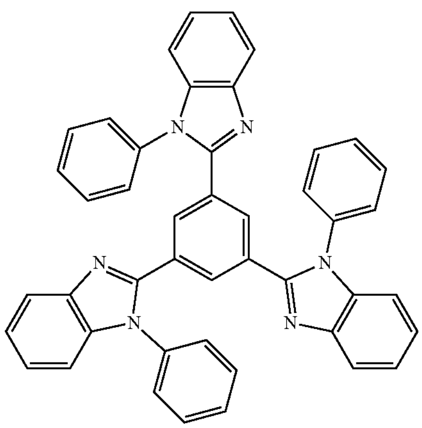
BGD-1
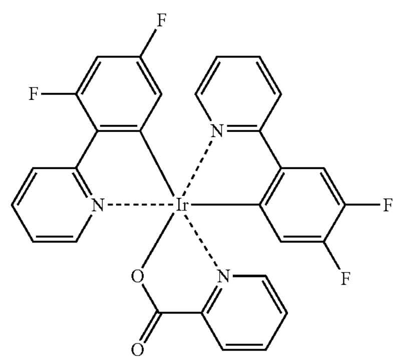
BD-1
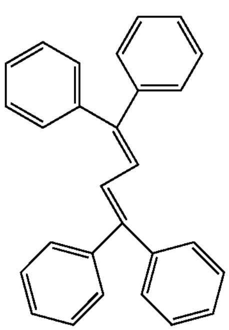
BD-2
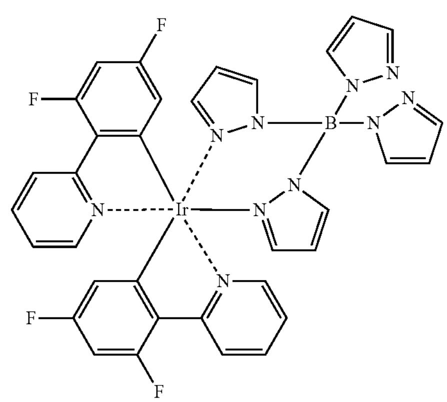

-continued

BM-1

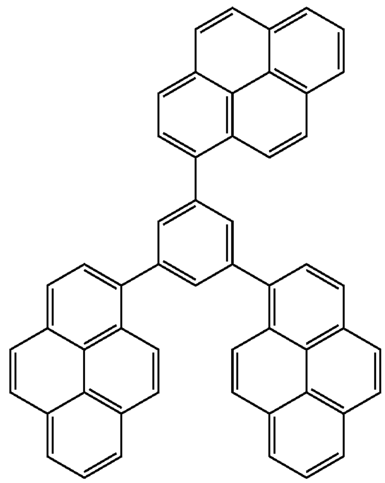

α-NPD

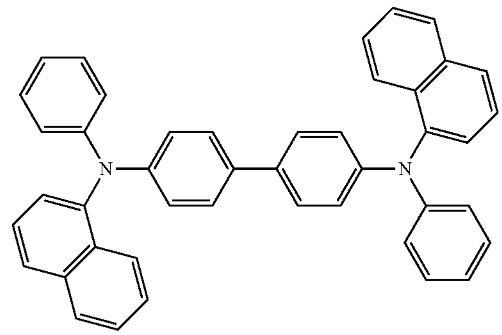

Example 1

Preparation of White Light Emitting Organic EL Element 1-1

Inventive

On a 25 mm×25 mm×0.5 mm glass substrate, an indium-tin oxide anode (ITO, indium/tin=95/5 in molar ratio) was formed via a sputtering method employing a direct current power source (thickness: 200 nm). The surface resistance of the anode was 10 Ω/sq. Subsequently, in order to obtain 65% of emission component of green light when a current of 10 mA/cm$^2$ was passed through the fabricated element, prepared was: polyvinylcarbazole (hole transporting binder polymer)/BDM-1 (blue light emitting ortho metalated complex)/GDM-1:tris(2-phenylpyridine)iridium complex (green light emitting ortho metalated complex)/RDM-1:bis(2-benzothiophene[b]-2-yl-pyridine)acetylacetonate-iridium complex (red light emitting ortho metalated complex)/2-(4-biphenilyl)-5-(4-t-butylphenyl)-1,3,4-oxadiazole (electron transport material)=200/2/5/2/50 (in weight ratio), followed by dissolving in dichloroethane and spin coating to form a light emission layer of the thickness of 100 nm.

Figure 5:
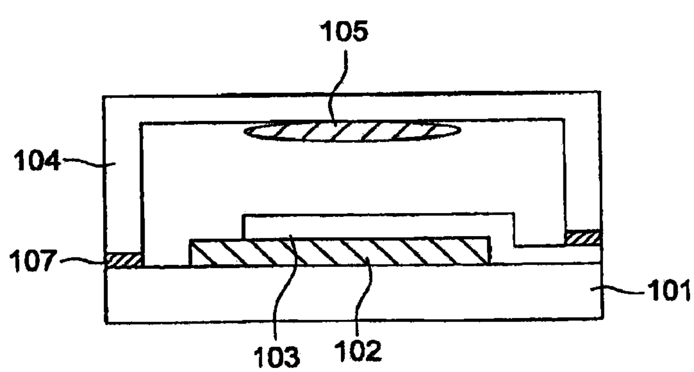
FIG. 5 is a simple schematic drawing of a sealing structure of white light emitting organic EL element-1.

A patterned mask (a mask to form an emission area of 5 mm×5 mm) was placed on the obtained light emission layer, and 0.5 nm thickness of lithium fluoride layer as a cathode buffer layer and 150 nm thickness of aluminum layer as the cathode were deposited in a vacuum evaporation apparatus. Aluminum lead wires were connected to the anode and the cathode to prepare an emission element. The emission element was sealed with a glass container using a UV-curable adhesive (XNR5493, produced by Nagase-Ciba Ltd.) in a nitrogen-filled glove box to obtain a White Light Emitting Organic EL Element 1-1 (Inventive) as shown in FIG. 5.

Preparation of White Light Emitting Organic EL Elements 1-2 to 1-15

White Light Emitting Organic EL Elements 1-2 to 1-12 (Inventive) and 1-13 to 1-15 (Comparative) were prepared in the same manner as White Light Emitting Organic EL Element 1-1 except that the materials listed in Table 1 were used and the spectral ratio of green light emission in the emission spectrum of each element was adjusted as shown in Table 1.

Preparation of GOLED-1 for Measuring Spectral Ratio of Green Light Emission

In order to use for measuring the spectral ratio of green light emission of a white light emitting organic EL element while a current of 10 mA/cm$^2$ is passed, GOLED-1 for measuring spectral ratio of green light emission was prepared as follows.

Figure 7:
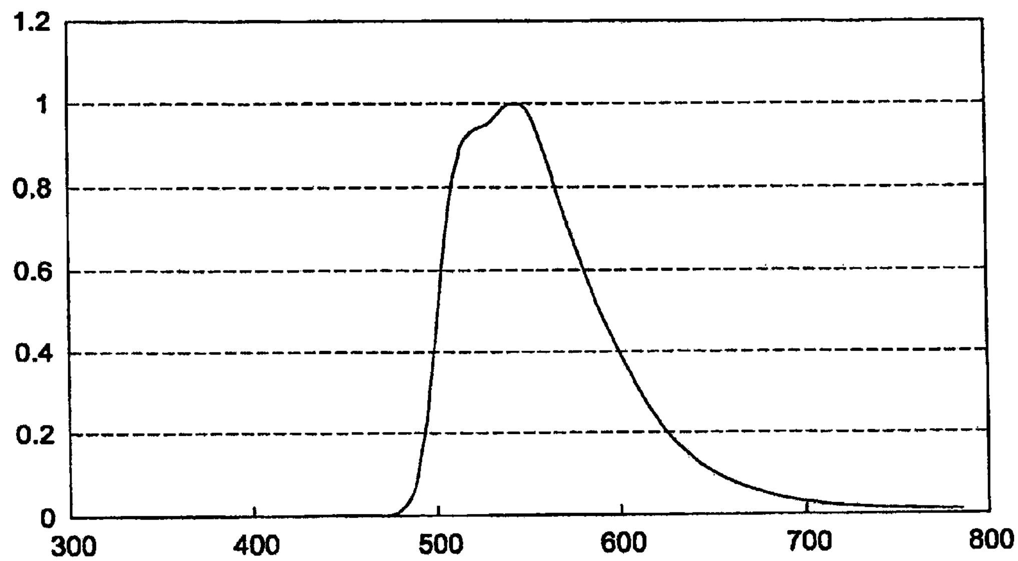
FIG. 7 shows a spectral curve of sample GOLED-1 for measuring spectrum component of green light.

On a 25 mm×25 mm×0.5 mm glass substrate, an indium-tin oxide anode (ITO, indium/tin=95/5 in molar ratio) was formed via a sputtering method employing a direct current power source (thickness: 200 nm). The surface resistance of the anode was 10 Ω/sq. Subsequently, a solution of: polyvinylcarbazole (hole transporting binder polymer)/tris(2-phenylpyridine)iridium complex (green light emitting ortho metalated complex)/2-(4-biphenilyl)-5-(4-t-butylphenyl)-1,3,4-oxadiazole (electron transport material)=200/10/50 (in weight ratio) dissolving in dichloroethane was spin coated to form a light emission layer of the thickness of 100 nm. A patterned mask (a mask to form an emission area of 5 mm×5 mm) was placed on the obtained light emission layer, and 0.5 nm thickness of lithium fluoride layer as a cathode buffer layer and 150 nm thickness of aluminum layer as the cathode were deposited in a vacuum evaporation apparatus. Aluminum lead wires were connected to the anode and the cathode to prepare an emission element. The emission element was sealed with a glass container using a UV-curable adhesive (XNR5493, produced by Nagase-Ciba Ltd.) in a nitrogen-filled glove box to obtain a green light emitting element as a comparative sample. The spectral curve of green emission obtained from the green light emitting element is shown in FIG. 7.

Preparation of GOLED-2 to 4 for Measuring Spectral Ratio of Green Light Emission GOLED-2 to 4 for Measuring Spectral Ratio of Green Light Emission were prepared in the same manner as GOLED-1 except that materials for green light emission were changed as shown in Table 1.

TABLE 1

| Sample name | Hole transport material | Blue light emitting material | Green light emitting material | Red light emitting material | Electron transport material | Spectral ratio of green light emission (%) *1 | Remarks |
|---|---|---|---|---|---|---|---|
| | Constitution of light emission layer (thickness 100 nm) Used material and added amount (in weight ratio) | | | | | | |
| 1-1 | PVK 200 | BMD-1 2 | GDM-1 5 | RDM-1 2 | ET-1 50 | 65 | Inventive |
| 1-2 | PVK 200 | BMD-1 2 | GDM-2 5 | RDM-2 2 | ET-2 50 | 67 | Inventive |
| 1-3 | PVK 200 | BMD-2 2 | GDM-1 5 | RDM-1 2 | ET-1 50 | 69 | Inventive |
| 1-4 | PVK 200 | BMD-3 2 | GDM-1 5 | RDM-2 2 | ET-2 50 | 66 | Inventive |
| 1-5 | PVK 200 | BMD-4 2 | GDM-1 5 | RDM-1 2 | ET-1 50 | 68 | Inventive |
| 1-6 | PVK 200 | BMD-5 2 | GDM-3 5 | RDM-2 2 | ET-2 50 | 70 | Inventive |
| 1-7 | PVK 200 | BMD-6 2 | GDM-1 5 | RDM-1 2 | ET-1 50 | 68 | Inventive |
| 1-8 | PVK 200 | BMD-7 2 | GDM-1 5 | RDM-2 2 | ET-2 50 | 70 | Inventive |
| 1-9 | PVK 200 | BMD-8 2 | GDM-1 5 | RDM-2 2 | ET-2 50 | 63 | Inventive |
| 1-10 | PVK 200 | BMD-9 2 | GDM-4 5 | RDM-2 2 | ET-1 50 | 67 | Inventive |
| 1-11 | PVK 200 | BMD-10 4 | GDM-4 5 | RDM-2 2 | ET-1 50 | 65 | Inventive |
| 1-12 | PVK 200 | BMD-11 5 | GDM-1 5 | RDM-2 2 | ET-1 50 | 66 | Inventive |
| 1-13 | PVK 200 | BD-1 1 | GDM-1 5 | RDM-1 1 | ET-1 50 | 59 | Comparative |
| 1-14 | PVK 200 | BD-2 10 | GDM-1 0.5 | RDM-2 2 | ET-2 50 | 55 | Comparative |
| 1-15 | PVK 200 | BGD-1 8 | GDM-1 0.3 | RDM-2 0.1 | ET-2 50 | 35 | Comparative |
| GOLED-1 | PVK 200 | — | GDM-1 10 | — | 50 | | *2 |
| GOLED-2 | PVK 200 | — | GDM-2 10 | — | 50 | | *2 |
| GOLED-3 | PVK 200 | — | GDM-3 10 | — | 50 | | *2 |
| GOLED-4 | PVK 200 | — | GDM-4 10 | — | 50 | | *2 |

*1 Measured while 10 mA/cm$^2$ of current was passed through the element
*2 Comparative Sample <<Spectral Ratio of Green Light Emission of Green Light Emitting Ortho Metalated Complex>>

Comparison of the spectral curves was carried out using the spectral curve of white light emission obtained from each obtained element and the spectral curve of green light emission obtained from each of GOLED-1 to 4 for measuring the spectral ratio (for example, when an element employing GDM-1 was measured, comparison of the spectral curve was carried out using GOLED-1 in which GDM-1 was employed), and the spectral ratio of a green light emitting ortho metalated complex in the emission spectrum of a white light was calculated.

Here, the emission spectrum in the wavelength range of 400 nm-800 nm obtained when 10 mA/cm$^2$ of current was passed through each element was used as the white light emission spectrum.

The calculation method of the spectral ratio was as follows: The two spectral curves of white light emission and green light emission were standardized using the emission maximum of the green light emission. When the areas surrounded by each standardized spectral curve and the abscissa axis (wavelength axis) were designated as white light emission intensity (ELwhite) and green light emission intensity (ELgreen), the value of: Agreen=(Elgreen)/(Elwhite) was adopted as a spectral ratio of green light emitting ortho metalated complex. When a white light emitting element contains no green light emitting compound, the spectral ratio of green light emission is 0 without calculation.

<<Emission Luminance, Emission Efficiency>>

Light emission was carried out by passing a direct current through each of the obtained Organic El Elements 1-1 to 1-15 using Source measure unit 2400 produced by Toyo Technica Inc., and measured were an emission luminance (cd/m$^2$) while 10 V direct current was applied and an emission efficiency (lm/W) while a current of 2.5 mA/cm$^2$ was passed through.

<<CIE Chromaticity of White Light>>

A direct current of 10 mA/cm$^2$ was passed through each of the obtained Organic El Elements 1-1 to 1-15 and each light emission spectrum was measured using Spectrum Analyzer PMA-11 produced by Hamamatsu Photonics K.K. The results were shown in the values of CIE chromaticity coordinates.

The CIE chromaticity coordinate of the white light of the present invention is preferably (0.28-0.38, 0.28-0.38) and specifically preferably (0.33, 0.33).

The results were shown in Table 2.

TABLE 2

| Sample name | Emission Luminance while 10 V applied (cd/m$^2$) | Emission efficiency while 2.5 mA/cm$^2$ passed (lm/W) | CIE chromaticity of white light while 10 mA/cm$^2$ passed | Wavelength of blue light emission peak while 10 mA/cm$^2$ passed (nm) | Remarks |
|---|---|---|---|---|---|
| 1-1 | 37000 | 9.6 | (0.31, 0.33) | 448 | Inventive |
| 1-2 | 39000 | 10.2 | (0.33, 0.33) | 448 | Inventive |
| 1-3 | 40000 | 10.5 | (0.34, 0.33) | 450 | Inventive |
| 1-4 | 37000 | 9.8 | (0.33, 0.33) | 450 | Inventive |
| 1-5 | 39000 | 10.3 | (0.33, 0.36) | 454 | Inventive |
| 1-6 | 37000 | 10.9 | (0.32, 0.34) | 443 | Inventive |
| 1-7 | 38000 | 10.4 | (0.33, 0.35) | 445 | Inventive |
| 1-8 | 42000 | 11.2 | (0.35, 0.35) | 452 | Inventive |

TABLE 2-continued

| Sample name | Emission Luminance while 10 V applied (cd/m$^2$) | Emission efficiency while 2.5 mA/cm$^2$ passed (lm/W) | CIE chromaticity of white light while 10 mA/cm$^2$ passed | Wavelength of blue light emission peak while 10 mA/cm$^2$ passed (nm) | Remarks |
|---|---|---|---|---|---|
| 1-9 | 35000 | 9.2 | (0.30, 0.33) | 446 | Inventive |
| 1-10 | 38000 | 10.1 | (0.32, 0.33) | 445 | Inventive |
| 1-11 | 41000 | 9.8 | (0.35, 0.36) | 452 | Inventive |
| 1-12 | 39000 | 10.1 | (0.35, 0.35) | 456 | Inventive |
| 1-13 | 25000 | 5.6 | (0.35, 0.36) | 450 | Comparative |
| 1-14 | 36000 | 8.3 | (0.38, 0.45) | 460 | Comparative |
| 1-15 | 27000 | 6.8 | (0.31, 0.36) | 471 | Comparative |

It is clear, from Table 2, that the white light emitting organic EL elements of the present invention each exhibit a high emission luminance and a high emission efficiency as well as exhibiting a CIE chromaticity lying in the preferable range. The element samples in which BDM-1 in element sample 1-1 was replaced with each of the above described blue light emitting dopants BDM-10 to 45 also exhibited preferable effects.

Example 2

Preparation of White Light Emitting Organic EL Element 2-1

On a 25 mm×25 mm×0.5 mm glass substrate, an indium-tin oxide anode (ITO, indium/tin=95/5 in molar ratio) was formed via a sputtering method employing a direct current power source (thickness: 200 nm). The surface resistance of the anode was 10 Ω/sq. On the anode, N,N'-dinaphthyl-N,N'-diphenylbenzidine (α-NPD) was deposited by vacuum evaporation with a thickness of 30 nm as a hole transport layer. After that, host material HM-1 and blue light emitting material BDM-1 were co-deposited in depositing rates of 3 nm/sec and 0.3 nm/sec, respectively, by vacuum evaporation to form a first light emission layer having a thickness of 10 nm. Subsequently, a host material 4,4'-N,N'-dicarbazolebiphenyl (CBP) and green light emitting material. GDM-1 were co-deposited in depositing rates of 3 nm/sec and 0.5 nm/sec, respectively, by vacuum evaporation to form a second light emission layer having a thickness of 20 nm. Further, a host material CBP and red light emitting material RDM-1 were co-deposited in depositing rates of 3 nm/sec and 0.1 nm/sec, respectively, by vacuum evaporation to form a third light emission layer having a thickness of 10 nm.

After that, a BCP layer having a thickness of 10 nm was formed as a hole blocking layer.

Further, an $Alq_3$ layer having a thickness of 25 nm was vacuum evaporated to form an electron transport layer. On the organic compound layers, a patterned mask (a mask to form an emission area of 5 mm×5 mm) was placed, and 0.5 nm thickness of lithium fluoride layer as a cathode buffer layer and 150 nm thickness of aluminum layer as the cathode were deposited in a vacuum evaporation apparatus. Aluminum lead wires were connected to the anode and the cathode to prepare an emission element. The emission element was sealed with a glass container using a UV-curable adhesive (XNR5493, produced by Nagase-Ciba Ltd.) in a nitrogen-filled glove box to obtain White Light Emitting Organic EL Element 2-1 of the present invention.

Preparation of White Light Emitting Organic EL Elements 2-2 to 2-19

White Light Emitting Organic EL Elements 2-2 to 2-19 each were prepared in the same manner as White Light Emitting Organic EL Elements 2-1, except that the materials and layer constitutions listed in Tables 3-5 were employed.

Preparation of GOLED-5 for Measuring Spectral Ratio of Green Light Emission

In order to use for measuring the spectral ratio of green light emission of the elements prepared in Example 2 while a current of 10 mA/cm$^2$ is passed, GOLED-5 for measuring spectral ratio of green light emission was prepared as follows.

On a 25 mm×25 mm×0.5 mm glass substrate, an indium-tin oxide anode (ITO, indium/tin=95/5 in molar ratio) was formed via a sputtering method employing a direct current power source (thickness: 200 nm). The surface resistance of the anode was 10 Ω/sq. On the anode, α-NPD was deposited by vacuum evaporation with a thickness of 30 nm as a hole transport layer. After that, host material CBP and green light emitting material GDM-1 were co-deposited in depositing rates of 3 nm/sec and 0.5 nm/sec, respectively, by vacuum evaporation to form a green light emission layer having a thickness of 40 nm. Subsequently, a BCP layer having a thickness of 10 nm was formed as a hole blocking layer. Further, an $Alq_3$ layer having a thickness of 25 nm was vacuum evaporated to form an electron transport layer.

Figure 8:
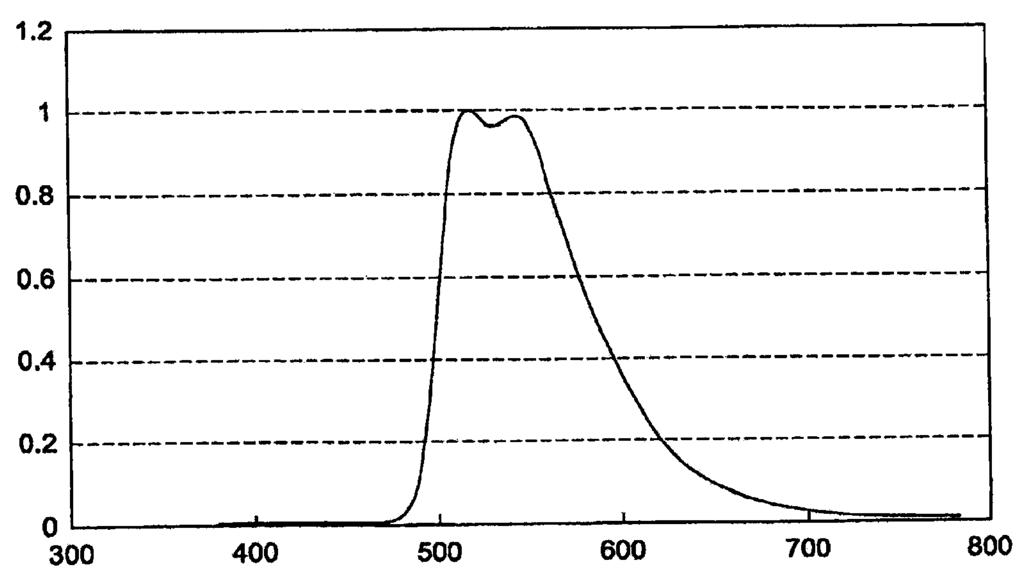
FIG. 8 shows a spectral curve of sample GOLED-5 for measuring spectrum component of green light.

On the electron transport layer, a patterned mask (a mask to form an emission area of 5 mm×5 mm) was placed, and 0.5 nm thickness of lithium fluoride layer as a cathode buffer layer and 150 nm thickness of aluminum layer as the cathode were deposited in a vacuum evaporation apparatus. Aluminum lead wires were connected to the anode and the cathode to prepare an emission element. The emission element was sealed with a glass container using a UV-curable adhesive (XNR5493, produced by Nagase-Ciba Ltd.) in a nitrogen-filled glove box to obtain a green light emitting element as a comparative sample. The spectral curve of green light emission obtained from the green light emitting element is shown in FIG. 8.

Preparation of GOLED-6 to 8 for Measuring Spectral Ratio of Green Light Emission GOLED-6 to 8 for Measuring Spectral Ratio of Green Light Emission were prepared in the same manner as GOLED-5 except that materials for green light emission were changed as shown in Table 1.

TABLE 3

| | First emission layer (material and added amount (wt %)) | | | Second emission layer (material and added amount (wt %)) | | | Third emission layer (material and added amount (wt %)) | | | Spectral ratio of green emission | |
|---|---|---|---|---|---|---|---|---|---|---|---|
| Sample name | *1 | Host material | Emission material | *1 | Host material | Emission material | *1 | Host material | Emission material | while 10 mA/cm² passed (%) | Remarks |
| 2-1 | 20 | HM-1 90 | BDM-1 10 | 20 | CBP 93 | GDM-1 7 | 20 | CBP 85 | RDM-1 15 | 68 | Inv. |
| 2-2 | 30 | HM-2 90 | BDM-1 10 | 20 | GBP 87 | GDM-1 10<br>RDM-2 3 | — | — | — | 66 | Inv. |
| 2-3 | 30 | HM-1 85 | BDM-2 10<br>GDM-1 5 | 20 | CBP 85 | RDM-1 15 | — | — | — | 69 | Inv. |
| 2-4 | 30 | HM-2 85 | BDM-2 10<br>GDM-2 5 | 20 | CBP 85 | RDM-2 15 | — | — | — | 70 | Inv. |
| 2-5 | 30 | HM-1 84 | BDM-1 10<br>GDM-1 4<br>RDM-1 2 | — | — | — | — | — | — | 66 | Inv. |
| 2-6 | 30 | HM-2 84 | BDM-2 10<br>GDM-1 4<br>RDM-2 2 | — | — | — | — | — | — | 67 | Inv. |
| 2-7 | 10 | HM-3 90 | BDM-3 10 | 10 | CBP 87 | GDM-3 10<br>RDM-1 3 | — | — | — | 68 | Inv. |
| 2-8 | 10 | HM-3 85 | BDM-4 10<br>GDM-4 5 | 10 | CBP 85 | RDM-2 15 | — | — | — | 65 | Inv. |
| 2-9 | 20 | HM-4 84 | BDM-5 10<br>GDM-1 4<br>RDM-1 2 | — | — | — | — | — | — | 70 | Inv. |
| 2-10 | 20 | HM-5 84 | BDM-6 10<br>GDM-2 4<br>RDM-2 2 | — | — | — | — | — | — | 64 | Inv. |

*1 Layer thickness (nm)
Inv.: Inventive

TABLE 4

| | First emission layer (material and added amount (wt %)) | | | Second emission layer (material and added amount (wt %)) | | | Third emission layer (material and added amount (wt %)) | | | Spectral ratio of green emission | |
|---|---|---|---|---|---|---|---|---|---|---|---|
| Sample name | *1 | Host material | Emission material | *1 | Host material | Emission material | *1 | Host material | Emission material | while 10 mA/cm² passed (%) | Remarks |
| 2-11 | 20 | HM-1 84 | BDM-7 10<br>GDM-1 4<br>RDM-2 2 | — | — | — | — | — | — | 68 | Inv. |
| 2-12 | 20 | HM-2 84 | BDM-8 10<br>GDM-1 4<br>RDM-2 2 | — | — | — | — | — | — | 70 | Inv. |
| 2-13 | 20 | HM-1 84 | BDM-9 10<br>GDM-2 4<br>RDM-2 2 | — | — | — | — | — | — | 65 | Inv. |
| 2-14 | 20 | HM-2 90 | BDM-9 10 | 20 | CBP 87 | GDM-1 10<br>RDM-1 3 | — | — | — | 70 | Inv. |
| 2-15 | 30 | HM-1 84 | BDM-10 10<br>GDM-1 4<br>RDM-2 2 | — | — | — | — | — | — | 68 | Inv. |
| 2-16 | 30 | HM-2 84 | BDM-11 10<br>GDM-1 4<br>RDM-2 2 | — | — | — | — | — | — | 69 | Inv. |
| 2-17 | 20 | — | BM-1 100 | 20 | CBP 93 | GDM-1 7 | 20 | CBP 85 | RDM-1 15 | 65 | Comp. |
| 2-18 | 20 | HM-1 90 | BD-2 10 | 20 | CBP 93 | GDM-1 7 | 20 | CBP 85 | RDM-2 15 | 55 | Comp. |
| 2-19 | 25 | HM-1 90 | BGD-1 10 | — | — | — | 20 | CBP 85 | RDM-2 15 | — | Comp. |
| GOLED-5 | 30 | CBP 93 | GDM-1 7 | — | — | — | — | — | — | | *2 |
| GOLED-6 | 30 | CBP 93 | GDM-2 7 | — | — | — | — | — | — | | *2 |
| GOLED-7 | 30 | CBP 93 | GDM-3 7 | — | — | — | — | — | — | | *2 |
| GOLED-8 | 30 | CBP 93 | GDM-4 7 | | | | | | | | *2 |

*1 Layer thickness (nm),
*2 Comparative Sample
Inv.: Inventive, Comp.: Comparative

TABLE 5

| | Hole transport layer | | Hole blocking layer | | Electron transport layer | | |
|---|---|---|---|---|---|---|---|
| Sample name | Thickness (nm) | Hole transport material | Thickness (nm) | Hole blocking material | Thickness (nm) | Electron transport layer | Remarks |
| 2-1 | 40 | α-NPD | 10 | BCP | 20 | $Alq_3$ | Inv. |
| 2-2 | 40 | α-NPD | 10 | BAlq | 20 | ET-2 | Inv. |
| 2-3 | 40 | α-NPD | 10 | BAlq | 20 | $Alq_3$ | Inv. |
| 2-4 | 40 | α-NPD | 10 | BAlq | 20 | ET-2 | Inv. |
| 2-5 | 40 | HT-1 | 10 | HB-1 | 20 | $Alq_3$ | Inv. |
| 2-6 | 40 | HT-1 | 10 | HB-1 | 20 | ET-2 | Inv. |
| 2-7 | 40 | α-NPD | 10 | BAlq | 20 | $Alq_3$ | Inv. |
| 2-8 | 40 | α-NPD | 10 | BAlq | 20 | $Alq_3$ | Inv. |
| 2-9 | 40 | HT-1 | 10 | HB-1 | 20 | $Alq_3$ | Inv. |
| 2-10 | 40 | HT-1 | 10 | HB-1 | 20 | $Alq_3$ | Inv. |
| 2-11 | 40 | HT-1 | 10 | HB-1 | 20 | $Alq_3$ | Inv. |
| 2-12 | 40 | HT-1 | 10 | HB-1 | 20 | $Alq_3$ | Inv. |
| 2-13 | 40 | HT-1 | 10 | HB-1 | 20 | $Alq_3$ | Inv. |
| 2-14 | 40 | HT-1 | 10 | HB-1 | 20 | ET-2 | Inv. |
| 2-15 | 40 | HT-1 | 10 | HB-1 | 20 | $Alq_3$ | Inv. |
| 2-16 | 40 | HT-1 | 10 | HB-1 | 20 | $Alq_3$ | Inv. |
| 2-17 | 40 | α-NPD | — | — | 30 | ET-2 | Comp. |
| 2-18 | 40 | α-NPD | 10 | BCP | 20 | ET-2 | Comp. |
| 2-19 | 40 | α-NPD | 10 | BCP | 20 | ET-2 | Comp. |
| GOLED-5 | 40 | α-NPD | 10 | BCP | 20 | $Alq_3$ | *1 |
| GOLED-6 | 40 | α-NPD | 10 | BCP | 20 | $Alq_3$ | *1 |
| GOLED-7 | 40 | α-NPD | 10 | BCP | 20 | $Alq_3$ | *1 |
| GOLED-8 | 40 | α-NPD | 10 | BCP | 20 | $Alq_3$ | *1 |

*1 Comparative Sample
Inv.; Inventive, Comp.; Comparative

Obtained White Light Emitting Organic EL Elements 2-1 to 2-19 each were evaluated in the same manner as described in Example 1.

The obtained results are shown in Table 6.

TABLE 6

| Sample name | Emission Luminance while 10 V applied ($cd/m^2$) | Emission efficiency while 2.5 $mA/cm^2$ passed (lm/W) | CIE chromaticity of white light while 10 $mA/cm^2$ passed | Wavelength of blue light emission peak while 10 $mA/cm^2$ passed (nm) | Remarks |
|---|---|---|---|---|---|
| 2-1 | 71000 | 13.5 | (0.31, 0.33) | 447 | Inventive |
| 2-2 | 75000 | 10.7 | (0.33, 0.33) | 447 | Inventive |
| 2-3 | 81000 | 11.0 | (0.34, 0.36) | 450 | Inventive |
| 2-4 | 83000 | 14.0 | (0.34, 0.35) | 450 | Inventive |
| 2-5 | 80000 | 11.6 | (0.33, 0.33) | 447 | Inventive |
| 2-6 | 76000 | 11.9 | (0.32, 0.34) | 450 | Inventive |
| 2-7 | 76000 | 12.0 | (0.33, 0.33) | 449 | Inventive |
| 2-8 | 73000 | 11.2 | (0.34, 0.35) | 453 | Inventive |
| 2-9 | 88000 | 13.6 | (0.33, 0.36) | 442 | Inventive |
| 2-10 | 86000 | 10.7 | (0.33, 0.35) | 445 | Inventive |
| 2-11 | 87000 | 11.0 | (0.33, 0.35) | 452 | Inventive |
| 2-12 | 83000 | 10.5 | (0.33, 0.35) | 446 | Inventive |
| 2-13 | 79000 | 10.8 | (0.32, 0.34) | 445 | Inventive |
| 2-14 | 82000 | 10.3 | (0.30, 0.33) | 445 | Inventive |
| 2-15 | 85000 | 11.1 | (0.35, 0.36) | 452 | Inventive |
| 2-16 | 83000 | 10.6 | (0.36, 0.36) | 446 | Inventive |
| 2-17 | 40000 | 7.2 | (0.35, 0.36) | 450 | Comparative |
| 2-18 | 62000 | 10.3 | (0.38, 0.35) | 460 | Comparative |
| 2-19 | 58000 | 8.6 | (0.31, 0.33) | 471 | Comparative |

It is clear, from Table 6, that the white light emitting organic EL elements of the present invention each exhibit a high emission luminance and a high emission efficiency as well as exhibiting a CIE chromaticity lying in the preferable range. The element samples in which BDM-1 in element sample 1-1 was replaced with each of the above described blue light emitting dopants BDM-10 to 45 also exhibited preferable effects.

Example 3

Figure 6:
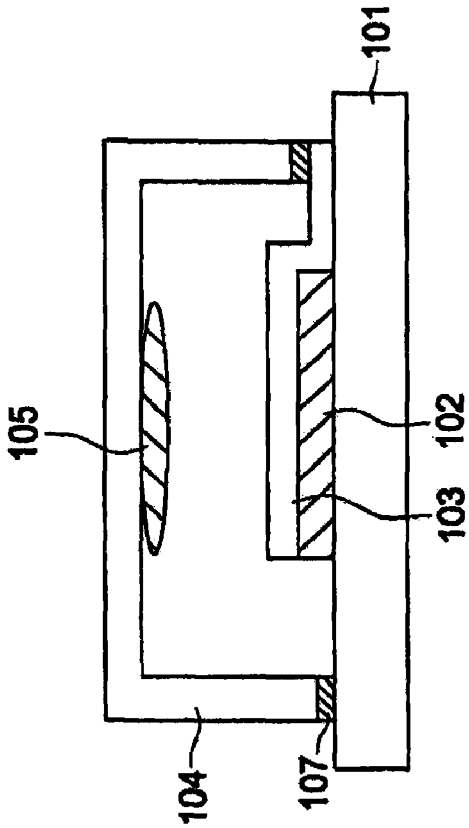
FIG. 6 is a schematic drawing of an illuminator equipped with a white emitting organic EL element.
Figure 6:
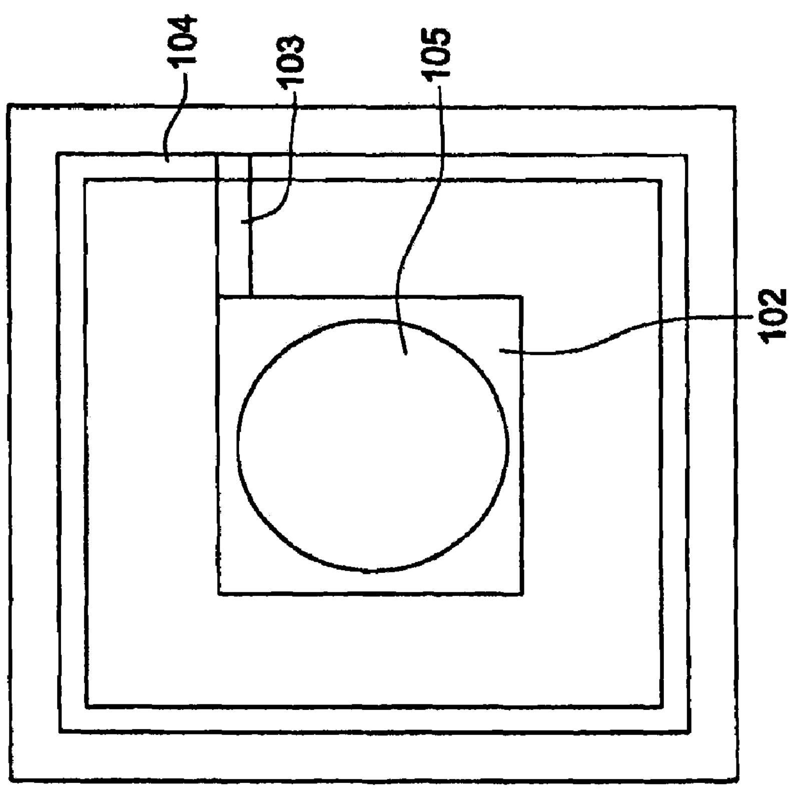

Preparation of White Light Emitting Element and White Light Emitting Illuminator Each of the elements prepared in Example 1 or in Example 2 was provided with the sealing container having the same structure in the same method as in Example 1 to form flat lamps. In FIG. 6 a schematic illustration of the flat lamp is shown. FIG. 6(*a*) shows a schematic illustration of a plain view and FIG. 6(*b*) shows a schematic illustration of the cross-section.

When an electric current was passed through the flat lamp, almost white light emission was obtained, and it was found that the flat lamp can be used as an illuminator.

POSSIBILITY FOR THE PRACTICAL USE

According to the present invention, obtained were an organic EL element exhibiting a high emission luminance, a high emission efficiency and a high purity CIE chromaticity of white light, and a display and an illuminator employing the above organic EL element.

What is claimed is:

1. A white light emitting organic electroluminescent element comprising two electrodes having therebetween one or more constituting layers including a light emission layer, the one or more constituting layers comprising at least two phosphorescent compounds, wherein at least one of the phosphorescent compounds is a green light emitting ortho metalated complex; and a spectral ratio of the green light emitting ortho metalated complex in an emission spectral distribution in a range of 400-800 nm is not less than 60%, wherein at least one of the phosphorescent compounds is a blue light emitting ortho metalated complex; and a shortest emission peak wavelength of the blue light emitting ortho metalated complex is not more than 455 nm, wherein the blue light emitting ortho metalated complex has a substructure represented by Formula (3) or a tautomer of the substructure represented by Formula (3):

Formula (3)

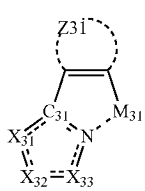

wherein, Z31 is an atomic group necessary to form an aromatic hydrocarbon ring; $X_{31}$ is —N($R_3$)—, and $X_{32}$ and $X_{33}$ each are —C($R_3$)—, wherein $R_3$ is a hydrogen atom or a substituent, provided that, when one of $X_{32}$ and $X_{33}$ has a substituent as $R_3$, the other has a hydrogen atom as $R_3$; $C_{31}$ is a carbon atom; $M_{31}$ is a metal belonging to one of Groups 8 to 10 of the periodic table; and a bond between $C_{31}$ and N, and a bond between $X_{32}$ and $X_{33}$ each are a double bond, wherein the light emission layer or a layer adjacent to the light emission layer comprises a compound represented by Formula (33):

Formula (33)

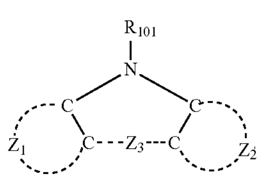

wherein, $Z_1$ is an aromatic heterocyclic ring which may have a substituent; $Z_2$ is an aromatic heterocyclic ring or an aromatic hydrocarbon ring each of which may have a substituent; and $Z_3$ is a divalent linkage group or a single bonding arm; and $R_{101}$ is a hydrogen mom or a substituent, wherein the compound represented by Formula (33) further has at least one of the groups represented by Formulas (34-1)-(34-4) and (34-7)-(34-8):

Formula (34-1)

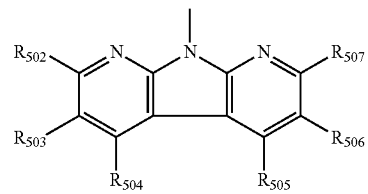

Formula (34-2)

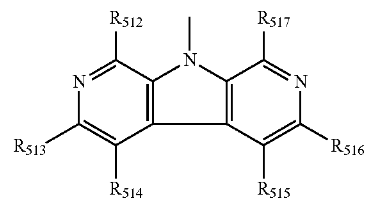

Formula (34-3)

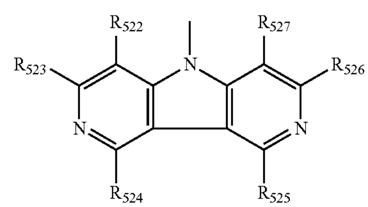

Formula (34-4)

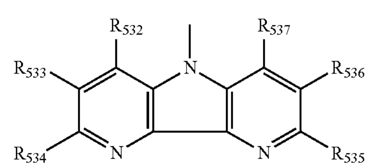

Formula (34-7)

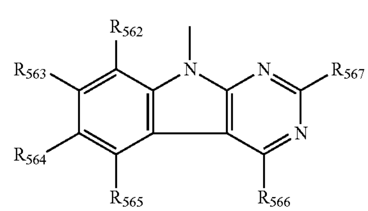

-continued

Formula (34-8)

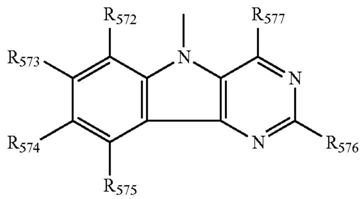

wherein,
R502—R507, R512—R517, R522—R527, R532—R537, R562—R567
and R572—R577 each wherein, $R_{502}$-$R_{507}$, $R_{512}$-$R_{517}$, $R_{522}$-$R_{527}$, $R_{532}$-$R_{537}$, $R_{562}$-$R_{567}$ and $R_{572}$-$R_{577}$ each independently are a hydrogen atom or a substituent, and the substituents may be the same with each other or may be different.

2. The white light emitting organic electroluminescent element of claim 1, wherein the compound represented by Formula (33) is represented by Formula (33-3):

Formula (33-3)

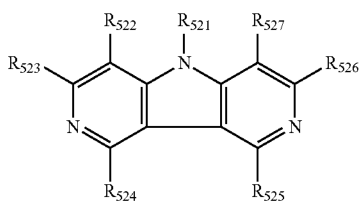

wherein, $R_{521}$-$R_{527}$ each independently are a hydrogen atom or a substituent.

3. The white light emitting organic electroluminescent element of claim 1, wherein the compound represented by Formula (33) further has a group represented by Formula (34-1):

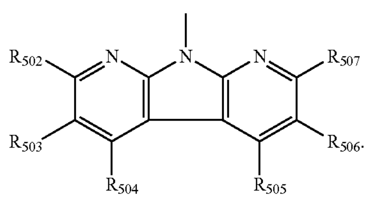

4. The white light emitting organic electroluminescent element of claim 1, wherein the compound represented by Formula (33) further has a group represented by Formula (34-2):

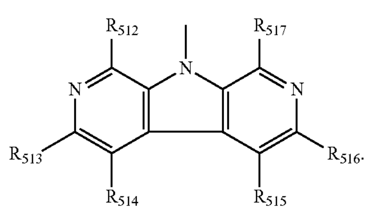

5. The white light emitting organic electroluminescent element of claim 1, wherein the compound represented by Formula (33) further has a group represented by Formula (34-3):

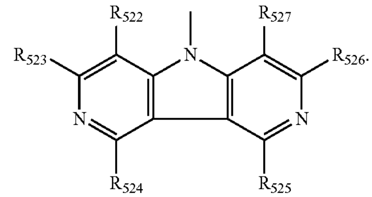

6. The white light emitting organic electroluminescent element of claim 1, wherein the compound represented by Formula (33) further has a group represented by Formula (34-4):

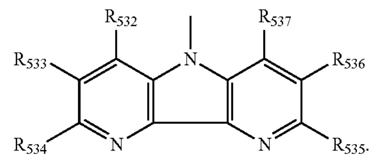

7. The white light emitting organic electroluminescent element of claim 1, wherein the compound represented by Formula (33) further has a group represented by Formula (34-7):

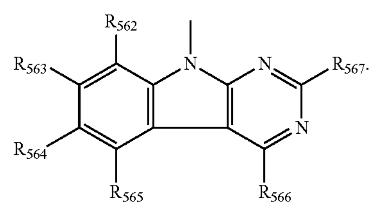

8. The white light emitting organic electroluminescent element of claim 1, wherein the compound represented by Formula (33) further has a group represented by Formula (34-8):

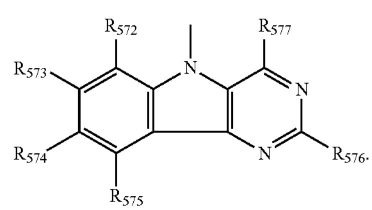

9. The white light emitting organic electroluminescent element of claim 1, wherein $Z_2$ in Formula (33) is an aromatic heterocyclic ring.

* * * * *